US011894928B2

(12) United States Patent
Murakami et al.

(10) Patent No.: US 11,894,928 B2
(45) **Date of Patent: *Feb. 6, 2024**

(54) WIRELESS COMMUNICATION BASE STATION APPARATUS, WIRELESS COMMUNICATION TERMINAL, COMMUNICATION METHOD OF A WIRELESS COMMUNICATION BASE STATION APPARATUS AND COMMUNICATION METHOD OF A WIRELESS COMMUNICATION TERMINAL

(71) Applicant: Panasonic Intellectual Property Corporation of America, Torrance, CA (US)

(72) Inventors: Yutaka Murakami, Kanagawa (JP); Shutai Okamura, Kanagawa (JP); Kiyotaka Kobayashi, Kanagawa (JP); Masayuki Orihashi, Chiba (JP); Kazuaki Takahashi, Tokyo (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/068,464

(22) Filed: Dec. 19, 2022

(65) Prior Publication Data

US 2023/0124557 A1 Apr. 20, 2023

Related U.S. Application Data

(63) Continuation of application No. 17/590,761, filed on Feb. 1, 2022, now Pat. No. 11,563,522, which is a (Continued)

(30) Foreign Application Priority Data

Nov. 2, 2006 (JP) ................................ 2006-299533
Jun. 29, 2007 (JP) ................................ 2007-173156
Oct. 31, 2007 (JP) ................................ 2007-284582

(51) Int. Cl.
*H04L 1/00* (2006.01)
*H04L 1/22* (2006.01)
(Continued)

(52) U.S. Cl.
CPC .......... *H04L 1/0071* (2013.01); *H03M 13/15* (2013.01); *H04L 1/0003* (2013.01);
(Continued)

(58) Field of Classification Search
CPC ..... H04L 27/38; H04L 1/0071; H04L 1/0003; H04L 1/0009; H04L 1/0059;
(Continued)

(56) References Cited

U.S. PATENT DOCUMENTS 6,658,381 B1 12/2003 Hellwig et al.
7,069,489 B2 6/2006 Murakami et al.
(Continued)

FOREIGN PATENT DOCUMENTS

JP 2003-046586 A 2/2003
JP 2003-158506 A 5/2003
(Continued)

OTHER PUBLICATIONS

B. Lu, et al., "Performance Analysis and Design Optimization of LDPC-Coded MIMO OFDM Systems," IEEE Transactions on Signal Processing, vol. 52, No. 2, Feb. 2004, pp. 348-361.
(Continued)

*Primary Examiner* — Wednel Cadeau
(74) *Attorney, Agent, or Firm* — Seed IP Law Group LLP

(57) ABSTRACT

A transmitter apparatus wherein a simple structure is used to successfully suppress the degradation of error rate performance that otherwise would be caused by fading or the like. There are included encoding parts that encode transport
(Continued)

data; a mapping part that performs such a mapping that encoded data sequentially formed by the encoding parts are not successively included in the same symbol, thereby forming data symbols; and a symbol interleaver that interleaves the data symbols. In this way, a low computational complexity can be used to perform an interleaving process equivalent to a bit interleaving process to effectively improve the reception quality at a receiving end.

16 Claims, 87 Drawing Sheets

Related U.S. Application Data continuation of application No. 16/859,731, filed on Apr. 27, 2020, now Pat. No. 11,277,226, which is a continuation of application No. 15/621,752, filed on Jun. 13, 2017, now Pat. No. 10,680,752, which is a continuation of application No. 14/487,908, filed on Sep. 16, 2014, now Pat. No. 9,712,280, which is a continuation of application No. 13/766,557, filed on Feb. 13, 2013, now Pat. No. 8,869,012, which is a continuation of application No. 12/447,885, filed as application No. PCT/JP2007/071337 on Nov. 1, 2007, now Pat. No. 8,401,110.

(51) Int. Cl.

| | |
|---|---|
| ***H04L 5/00*** | (2006.01) |
| ***H04L 27/00*** | (2006.01) |
| ***H03M 13/15*** | (2006.01) |
| ***H04L 27/36*** | (2006.01) |
| ***H04L 27/38*** | (2006.01) |
| ***H04L 27/26*** | (2006.01) |

(52) U.S. Cl.

CPC .......... *H04L 1/0009* (2013.01); *H04L 1/0059* (2013.01); *H04L 1/22* (2013.01); *H04L 5/0007* (2013.01); *H04L 27/0008* (2013.01); *H04L 27/36* (2013.01); *H04L 27/38* (2013.01); *H04L 27/2647* (2013.01)

(58) Field of Classification Search

CPC . H04L 27/2647; H04L 27/36; H04L 27/0008; H04L 5/0007; H03M 13/15

See application file for complete search history.

(56) References Cited

U.S. PATENT DOCUMENTS 8,098,773 B1 * 1/2012 Piesinger .............. H04L 27/362 375/316
2003/0138056 A1 7/2003 Uesugi et al.
2004/0059988 A1 * 3/2004 Murakami .............. H04L 27/20 714/776
2005/0128966 A1 * 6/2005 Yee ....................... H04L 1/0068 370/310
2005/0163067 A1 7/2005 Okamoto et al.
2005/0232135 A1 10/2005 Mukai et al.
2007/0147481 A1 6/2007 Bottomley et al.
2009/0180495 A1 7/2009 Li et al.
2010/0046675 A1 2/2010 Collins et al.
2011/0013727 A1 1/2011 Seller

FOREIGN PATENT DOCUMENTS

JP 2003-169036 A 6/2003
JP 2003-304214 A 10/2003
JP 2004-023691 A 1/2004
JP 2005-294895 A 10/2005
WO 2006/076451 A2 7/2006

OTHER PUBLICATIONS

B. Hochwald, et al., "Achieving Near-Capacity on a Multiple Antenna Channel," IEEE Transactions on Communications, vol. 51, No. 3, Mar. 2003, pp. 389-399.
"High Speed Physical Layer in the 5 GHZ band," IEEE std 802.11a-1999, Sep. 1999, pp i-viii and 1-82.
International Search Report dated Jan. 15, 2008.
Japanese Office Action dated Jun. 5, 2012.
K. Kobayashi, et al., "Varying Interleave Patterns With Iterative Decoding For Improved Performance In MIMO Systems," Proc. of IEEE PIMRC, Sep. 2004, vol. 2, pp. 1429-1433.
"Low Density Parity Check Code and Decoding Method," Triceps 2002, pp. 1, 9-12, cover page, and 58-62 and 74-81, with English Translation.
P. Robertson, et al., "A Comparison of Optimal and Sub-Optimal MAP Decoding Algorithms Operating in the Log Domain," Proc. IEEE ICC, Jun. 1995, DD 1009-1013.
S. Baro, et al., "Iterative Detection of MIMO Transmission Using List-Sequential (LISS) Detector," Proc. of IEEE ICC, May 2003, pp. 2653-2657.
S. Sanpei, "Digital Wireless Transmission Technology," Pearson Education Japan, Sep. 1, 2002, pp viii-xix and 235-236, with English Translation.
T. Ohgane, et al., "Applications of Space Division Multiplexing and Those Performance In a MIIVIO Channel," IEICE Transactions on Communications, vol. E88-B, No. 5, Mav 2005, pp. 1843-1851.
T. Wadayama, "A Coded Modulation Scheme Based on Low Density Parity Check Codes," IEICE Trans. Fundamentals, 0610839, vol. E84-A, No. 10, Oct. 2001, pp. 1-5.
Y. Yasuda, et al., "Maximum Likelihood Decoding of Convolution Codes and Its Performance Characteristics," IEICE Technical Report, vol. J73-A, No. 2, Feb. 1990, pp. 218-224, with English Translation.

* cited by examiner

3500 RECEIVING APPARATUS

FIG.38A QPSK
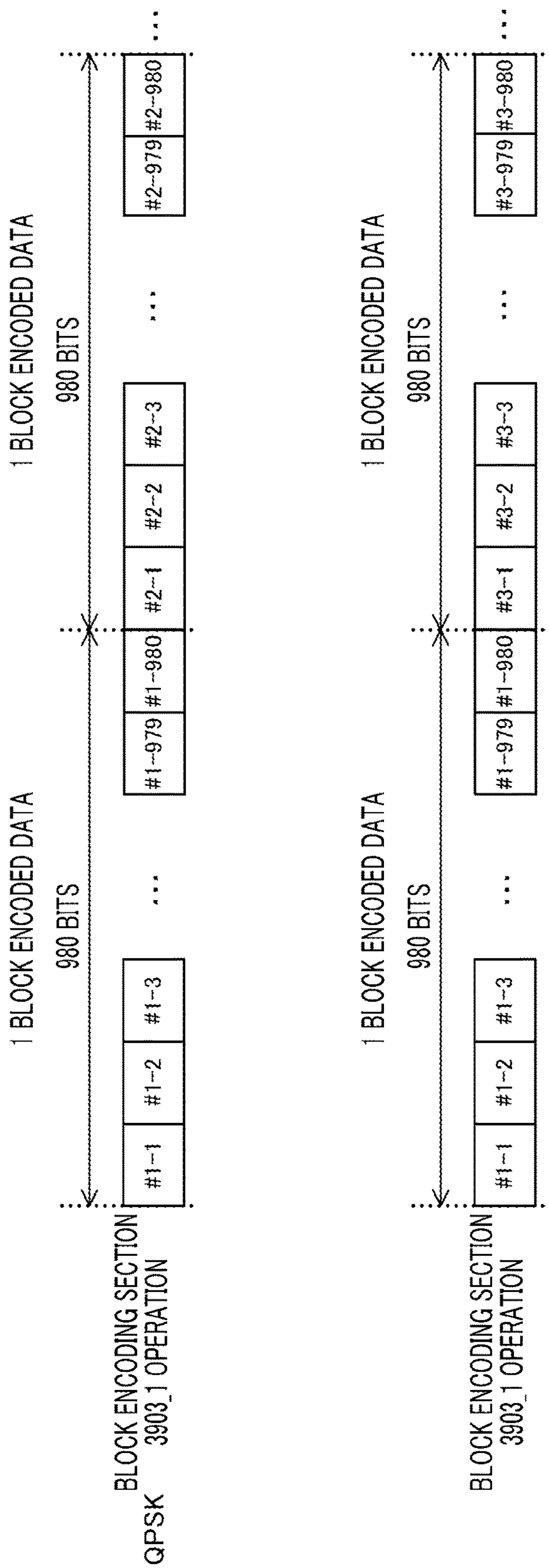
FIG.38B 16QAM
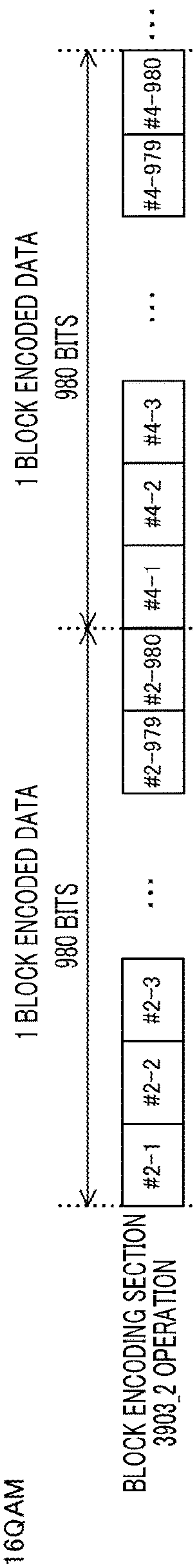

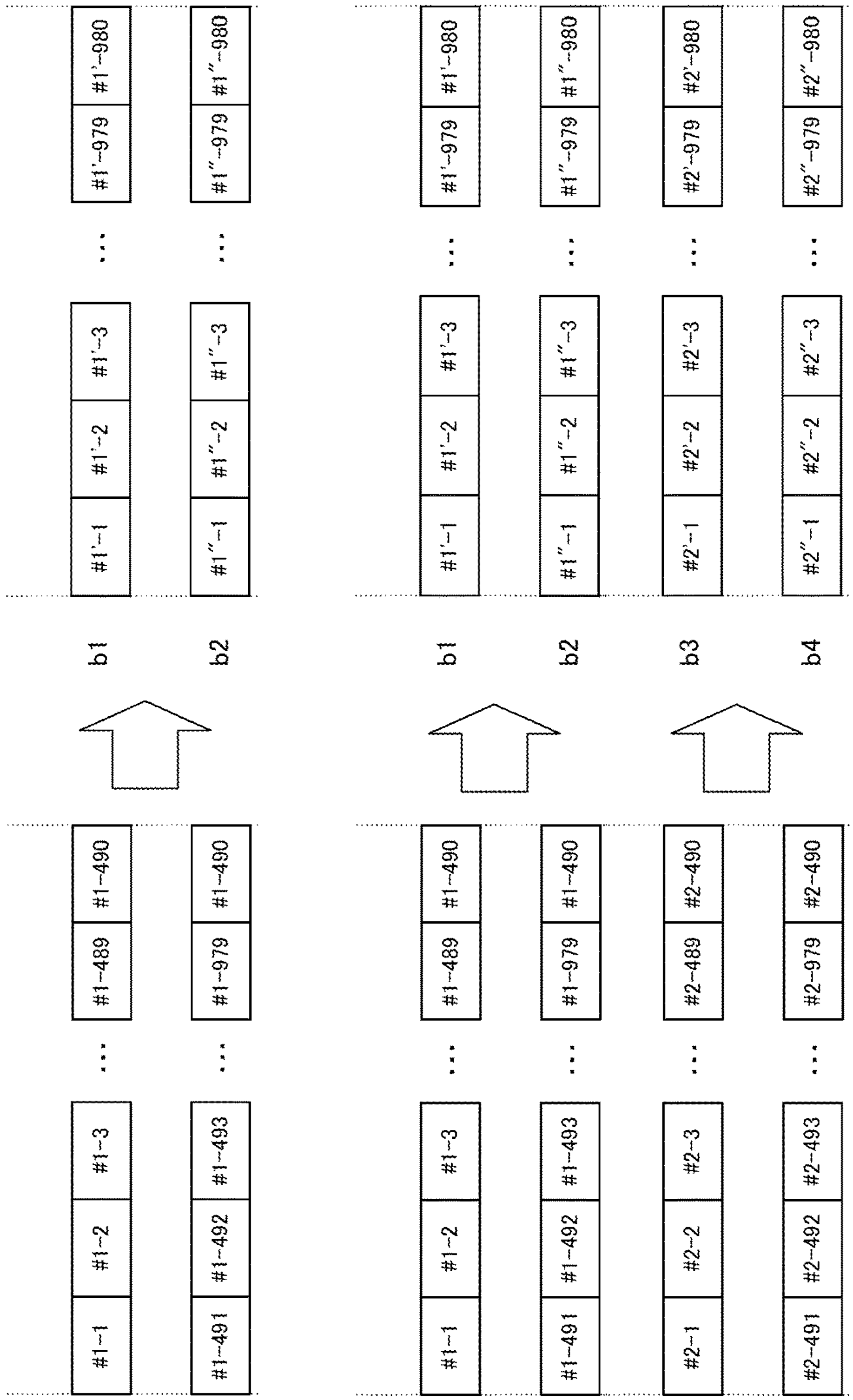
FIG.39A QPSK
FIG.39B 16QAM

WIRELESS COMMUNICATION BASE STATION APPARATUS, WIRELESS COMMUNICATION TERMINAL, COMMUNICATION METHOD OF A WIRELESS COMMUNICATION BASE STATION APPARATUS AND COMMUNICATION METHOD OF A WIRELESS COMMUNICATION TERMINAL

BACKGROUND

Technical Field

The present disclosure relates to a transmitting method and transmitting apparatus that encode transmit data and form one symbol from a plurality of encoded data, and a receiving method thereof.

Description of the Related Art

In radio communication, provision is generally made for transmit data to be encoded before transmission in order to increase error correction capability. One such encoding method is LDPC encoding such as described in Non-patent Document 1. Since this LDPC encoding enables error correction to be performed using an extremely large block unit (constraint length), it is considered to be resilient to burst errors, and suitable for communication in a fading environment.

Also, a multi-antenna transmitting apparatus that transmits OFDM signals from a plurality of antennas, such as described in Non-patent Document 2, is known as a technology for increasing data transmission speed. With such a multi-antenna transmitting apparatus, interleaving data in a plurality of frequency directions (subcarrier directions) has been proposed as one method of suppressing burst errors due to frequency selective fading.

FIG. 1 shows an example of the frame configuration of a transmit signal in such a multi-antenna transmitting apparatus. In FIG. 1, distortion due to fading fluctuation—that is, a channel estimate—and a preamble for estimating frequency offset between a transmitter and receiver, are placed at the start of a frame, and data symbols are placed thereafter. Also, pilot symbols for estimating frequency offset, which fluctuates over time, are placed on carrier Y. In FIG. 1, one square indicates one symbol. That is to say, in the example shown in FIG. 1, one OFDM symbol composed of a total of 7 symbols—data symbols and a pilot—is transmitted at each of times i, i+1 . . . . At this time, data are interleaved within one OFDM symbol, and placed in the order (1), (2), (3), . . . , (11), (12).

Non-patent Document 1: "Low-Density Parity-Check Code and Decoding Method LDPC (Low Density Parity) Code/Sum-Product Decoding Method" Triceps 2002.

Non-patent Document 2: 2High Speed Physical Layer (PHY) in 5 GHz band" IEEE802.11a 1999.

Non-patent Document 3: B. Lu, G. Yue, and X. Wang, "Performance analysis and design optimization of LDPC-coded MIMO OFDM systems" IEEE Trans. Signal Processing., vol. 52, no. 2, pp. 348-361, Feb. 2004.

Non-patent Document 4: B. M. Hochwald, and S. ten Brink, "Achieving near-capacity on a multiple-antenna channel" IEEE Trans. Commun., vol. 51, no. 3, pp. 389-399, March 2003.

Non-patent Document 5: S. Baro, J. Hagenauer, and M. Witzke, "Iterative detection of MIMO transmission using a list-sequential (LISS) detector" Proc. of IEEE ICC 2003, May 2003.

Non-patent Document 6: B. M. Hochwald, and S. ten Brink, "Achieving near-capacity on a multiple-antenna channel" IEEE Trans. Commun., vol. 51, no. 3, pp. 389-399, March 2003.

Non-patent Document 7: S. Baro, J. Hagenauer, and M. Witzke, "Iterative detection of MIMO transmission using a list-sequential (LISS) detector" Proc. of IEEE ICC 2003, May 2003.

Non-patent Document 8: P. Robertson, E. Villebrun, and P. Holler, "A comparison of optimal and sub-optimal MAP decoding algorithms in the log domain" Proc. IEEE ICC 1995, pp. 1009-1013, June 1995.

Non-patent Document 9: K. Kobayashi, Y. Murakami, M. Orihashi, and T. Matsuoka, "Varying interleave patterns with iterative decoding for improved performance in MIMO systems" Proc. of IEEE PIMRC2004, vol. 2, pp. 1429-1433, Sep. 2004.

Non-patent Document 10: T. Ohgane, T. Nishimura, and Y. Ogawa, "Applications of space division multiplexing and those performance in a MIMO channel," IEICE Trans. Commun., vol. E88-B, no. 5, pp. 1843-1851, May 2005.

Non-patent Document 11: "Digital Wireless Transmission Technology" Pearson Education.

Non-patent Document 12: "Convolutional Code Maximal Likelihood Decoding and Its Characteristics" Technical Report of IEICE A, Vol. J73-A, No. 2, pp. 218-224.

BRIEF SUMMARY

Problems to be Solved by the Disclosure

When a block code such as LDPC is used, the greater the number of modulation multi-values, the smaller is the number of symbols for transmitting one encoded block, and the shorter is the time in which one encoded block is transmitted. As a result, if there is a notch due to fading on that transmission period, a burst error is likely to occur. That is to say, the greater the number of modulation multi-values, the higher is the probability of a burst error.

With a block code such as LDPC the block size can be varied, and the greater the block size (that is, the longer the constraint length), the lower is the probability of a burst error caused by a fading notch or the like. Therefore, when the number of modulation multi-values is varied as in the case of adaptive modulation, it appears that burst errors can be suppressed if the encoded block size is increased in line with an increase in the number of modulation multi-values.

However, designing an encoder so as to vary the block size each time the number of modulation multi-values is changed is not desirable because of the complexity of the configuration of such an encoder.

Furthermore, a problem with MIMO (Multiple-Input Multiple-Output) or suchlike multi-antenna transmission is that, although high separation precision, and thus a high SNR as a received signal, can be secured for a data symbol directly following a preamble placed at the start of a frame, separation precision, and thus the received signal SNR, declines the farther a symbol is from the preamble.

Error rate performance degradation due to fading such as described above also occurs in a similar way when encoding other than block encoding is used.

A method of suppressing such error rate performance degradation due to fading is to perform bit interleaving of encoded data. However, with conventional bit interleaving, it is difficult to reconcile a reduction in computational complexity with faster processing. A problem has thus been the inadequacy of such bit interleaving circuitry for incorporation in current communication devices such as mobile terminals that require high-speed data transmission capability in a small package.

It is an object of the present disclosure to provide a transmitting method, transmitting apparatus, and receiving method that enable error rate performance degradation due to fading or the like to be suppressed with a comparatively low computational complexity, and that are also capable of high-speed transmission.

Means for Solving the Problems

One aspect of a transmitting method of the present disclosure is a transmitting method that executes encoding processing on transmit data configured by means of a plurality of bits and forms encoded data configured by means of a plurality of bits, performs arrangement (interleaving) processing on bits belonging to the encoded data, executes modulation processing on the arranged (interleaved) encoded data and outputs a baseband signal corresponding to a symbol, and transmits a transmit signal based on the baseband signal, wherein: the modulation processing can use a plurality of modulation methods, and whichever modulation method is used, two bits extracted arbitrarily from a plurality of bits configuring the symbol are bits belonging to mutually different encoded data, and the encoded data is convolutionally encoded data; in the encoding processing the encoded data can be formed using a plurality of different coding rate; in the arrangement (interleaving) processing bits belonging to the encoded data are arranged (interleaved) so that one symbol is configured by collecting together bits belonging to any of a plurality of the encoded data; and the plurality of encoded data used in arrangement (interleaving) includes at least one of encoded data formed by means of an coding rate different from an coding rate of one encoded data selected arbitrarily from the plurality of encoded data.

One aspect of a transmitting apparatus of the present disclosure has an encoding section that executes encoding processing on transmit data configured by means of a plurality of bits and forms encoded data configured by means of a plurality of bits, an arranging (interleaving) section that arranges (interleaves) bits belonging to the encoded data, a modulation section that executes modulation processing on the arranged (interleaved) encoded data and outputs a baseband signal corresponding to the symbol, and a transmitting section that transmits a modulated signal based on the baseband signal, wherein: the modulation section can use a plurality of modulation methods, and whichever modulation method is used, two bits extracted arbitrarily from a plurality of bits configuring the symbol are bits belonging to mutually different encoded data, and the encoded data formed in the encoding section is convolutionally encoded data; the encoding section can form the encoded data using a plurality of different coding rate; the arranging (interleaving) section arranges (interleaves) bits belonging to the encoded data so that one symbol is configured by collecting together bits belonging to any of a plurality of the encoded data; and the plurality of encoded data used in arrangement (interleaving) includes at least one of encoded data formed by means of an coding rate different from an coding rate of one encoded data selected arbitrarily from the plurality of encoded data.

One aspect of a receiving method of the present disclosure is a receiving method that receives a modulated signal of a transmitting method whereby: a plurality of symbols generated from the modulated signal are generated by a plurality of modulation methods, and whichever modulation method is used, two bits extracted arbitrarily from a plurality of bits configuring the symbol are bits belonging to mutually different encoded data, and the encoded data is convolutionally encoded data; and the encoded data can be formed using a plurality of different coding rate, and includes at least one of encoded data formed by means of an coding rate different from an coding rate of one encoded data selected arbitrarily from the plurality of encoded data; wherein the receiving method generates a baseband signal from a received signal, and, in a symbol corresponding to the baseband signal, generates encoded data configured by means of a plurality of bits by performing rearrangement (deinterleaving) processing on bits included in a plurality of symbols, and generates decoded data configured by means of a plurality of bits by decoding the encoded data.

One aspect of a transmitting apparatus of the present disclosure employs a configuration having a mapping section that has a plurality of lines of encoded data as parallel input and outputs one line of data symbols, and a symbol interleaver that interleaves the data symbols.

According to this configuration, through a combination of mapping processing and interleave processing it is possible to achieve high-speed operation of encoding processing and bit interleave processing, and a bit interleaver having a configuration with a reduced computational complexity can be implemented.

One aspect of a transmitting apparatus of the present disclosure employs a configuration having an encoding section that encodes transmit data, a mapping section that forms data symbols by performing mapping such that encoded data formed sequentially by the encoding section are not successively included in the same symbol, and a symbol interleaver that interleaves the data symbols. In other words, processing by this mapping section is processing that forms data symbols by assigning encoded data across a plurality of symbols.

According to this configuration, the mapping section need only perform simple processing whereby mapping is performed such that encoded data formed sequentially by the encoding section are not successively included in the same symbol, and the symbol interleaver need only perform interleave processing on one line of symbols. As a result, processing equivalent to conventional bit interleaving can be performed by a combination of simple processes, enabling the configuration to be simplified in comparison with a conventional bit interleaver.

One aspect of a transmitting apparatus of the present disclosure employs a configuration in which the encoding section comprises a plurality of encoding sections, wherein the mapping section forms one line of data symbols by performing mapping such that a plurality of lines of encoded data output from the plurality of encoding sections are mixed within one symbol, and the symbol interleaver interleaves the one line of data symbols.

According to this configuration, encoding processing can be speeded up since encoding is performed by a plurality of encoding sections. In addition, by means of mapping, one line of data symbols is formed by performing mapping such that a plurality of lines of encoded data output from a plurality of encoding sections are mixed within one symbol, and the symbol interleaver interleaves the one line of data symbols, enabling an increase in computational complexity to be suppressed in comparison with a case in which respective bit interleavers are placed in a stage subsequent to a plurality of encoding sections. As a result, high-speed bit interleaving can be performed while suppressing an increase in computational complexity.

One aspect of a receiving apparatus of the present disclosure employs a configuration having a symbol deinterleaver that deinterleaves receive symbols, a plurality of decoding sections, and an assignment section that assigns a signal after the deinterleaving to the plurality of decoding sections in parallel.

According to this configuration, decoding processing can be performed in parallel by a plurality of decoding sections, enabling decoding processing to be implemented that can keep pace with a high symbol rate.

Advantageous Effect of the Disclosure

According to the present disclosure, a transmitting apparatus, receiving apparatus, and bit interleaving method can be implemented that enable error rate performance degradation due to fading or the like to be suppressed by means of a simple configuration.

BRIEF DESCRIPTION OF THE SEVERAL VIEWS OF THE DRAWINGS

FIGS. 4A, 4B, 4C, and 4D are drawings provided to explain modulation methods, wherein FIG. 4A is a drawing provided to explain BPSK, FIG. 4B is a drawing provided to explain QPSK, FIG. 4C is a drawing provided to explain 16QAM, and FIG. 4D is a drawing provided to explain 64QAM;

FIGS. 26A, 26B, and 26C are drawings provided to explain Embodiment 4, wherein FIG. 26A is a drawing showing how the last block data is assigned when the number of encoded blocks transmitted last is one, FIG. 26B is a drawing showing how the last block data is assigned when the number of encoded blocks transmitted last is more than one and not more than two, and FIG. 26C is a drawing showing how the last block data is assigned when the number of encoded blocks transmitted last is more than two;

FIGS. 27A, 27B, and 27C are drawings provided, as an example for comparison, to explain degradation of reception quality characteristics due to the communication conditions when a conventional encoded block assignment method is applied, wherein FIG. 27A is a drawing showing the received field strength state, FIG. 27B is a drawing showing an example of a frame configuration when the modulation method is BPSK, and FIG. 27C is a drawing showing an example of a frame configuration when the modulation method is 16QAM;

FIGS. 28A, 28B, and 28C are drawings showing examples of bit assignment to each symbol according to Embodiment 5, wherein FIG. 28A is a drawing showing bit assignment to each symbol in the case of QPSK, FIG. 28B is a drawing showing bit assignment to each symbol in the case of 16QAM, and FIG. 28C is a drawing showing an example of a frame configuration;

FIGS. 31A, 31B, and 31C are drawings showing other examples of bit assignment to each symbol according to Embodiment 5, wherein FIG. 31A is a drawing showing bit assignment to each symbol in the case of QPSK, FIG. 31B is a drawing showing bit assignment to each symbol in the case of 16QAM, and FIG. 31C is a drawing showing an example of a frame configuration;

FIGS. 32A, 32B, and 32C are drawings showing examples of bit assignment to each symbol according to Embodiment 6, wherein FIG. 32A is a drawing showing bit assignment to each symbol in the case of QPSK, FIG. 32B is a drawing showing bit assignment to each symbol in the case of 16QAM, and FIG. 32C is a drawing showing an example of a frame configuration;

FIGS. 36A, 36B, and 36C are drawings showing other examples of bit assignment to each symbol according to Embodiment 6, wherein FIG. 36A is a drawing showing bit assignment to each symbol in the case of QPSK, FIG. 36B is a drawing showing bit assignment to each symbol in the case of 16QAM, and FIG. 36C is a drawing showing an example of a frame configuration;

FIGS. 38A and 38B are drawings provided to explain the operation of block encoding in Embodiment 7, wherein FIG. 38A is a drawing provided to explain the operation in the case of QPSK, and FIG. 38B is a drawing provided to explain the operation in the case of 16QAM;

FIGS. 39A and 39B are drawings provided to explain the operation of a trellis encoding section and the operation of bit assignment to symbols by a mapping section in Embodiment 7, wherein FIG. 39A is a drawing provided to explain the operation in the case of QPSK, and FIG. 39B is a drawing provided to explain the operation in the case of 16QAM;

FIGS. 41A and 41B are drawings showing the configuration of an $N_t \times N_r$ MIMO system using spatial multiplexing, wherein FIG. 41A is a drawing showing the general configuration of a transmitting apparatus, and FIG. 41B is a drawing showing the general configuration of a receiving apparatus;

FIGS. 42A and 42B are drawings showing a system model of Embodiment 8, wherein FIG. 42A is a drawing showing the general configuration of a transmitting apparatus, and FIG. 42B is a drawing showing the general configuration of a receiving apparatus;

FIGS. 54A and 54B are drawings showing examples of symbol assignment in the frequency domain direction in Embodiment 8, wherein FIG. 54A shows an example in which symbols are placed regularly in the frequency domain direction, and FIG. 54B shows an example in which symbols are placed randomly in the frequency domain direction;

FIGS. 79A and 79B are drawings showing examples of data symbol configurations in Embodiment 11, wherein FIG. 79A is a drawing showing an example of data symbol configuration in the case of QPSK, and FIG. 79B is a drawing showing an example of data symbol configuration in the case of 16QAM;

FIGS. 80A and 80B are drawings showing examples of data symbol configurations in Embodiment 11, wherein FIG. 80A is a drawing showing an example of data symbol configuration in the case of QPSK, and FIG. 80B is a drawing showing an example of data symbol configuration in the case of 16QAM;

FIGS. 83A and 83B are drawings showing examples of data symbol configurations in Embodiment 11, wherein FIG. 83A is a drawing showing an example of data symbol configuration in the case of QPSK, and FIG. 83B is a drawing showing an example of data symbol configuration in the case of 16QAM;

FIGS. 84A and 84B are drawings showing examples of data symbol configurations in Embodiment 11, wherein FIG. 84A is a drawing showing an example of data symbol configuration in the case of QPSK, and FIG. 84B is a drawing showing an example of data symbol configuration in the case of 16QAM;

DETAILED DESCRIPTION

Best Mode for Carrying Out the Disclosure

Embodiments of the present disclosure will now be described in detail with reference to the accompanying drawings.

Embodiment 1

Figure 2:
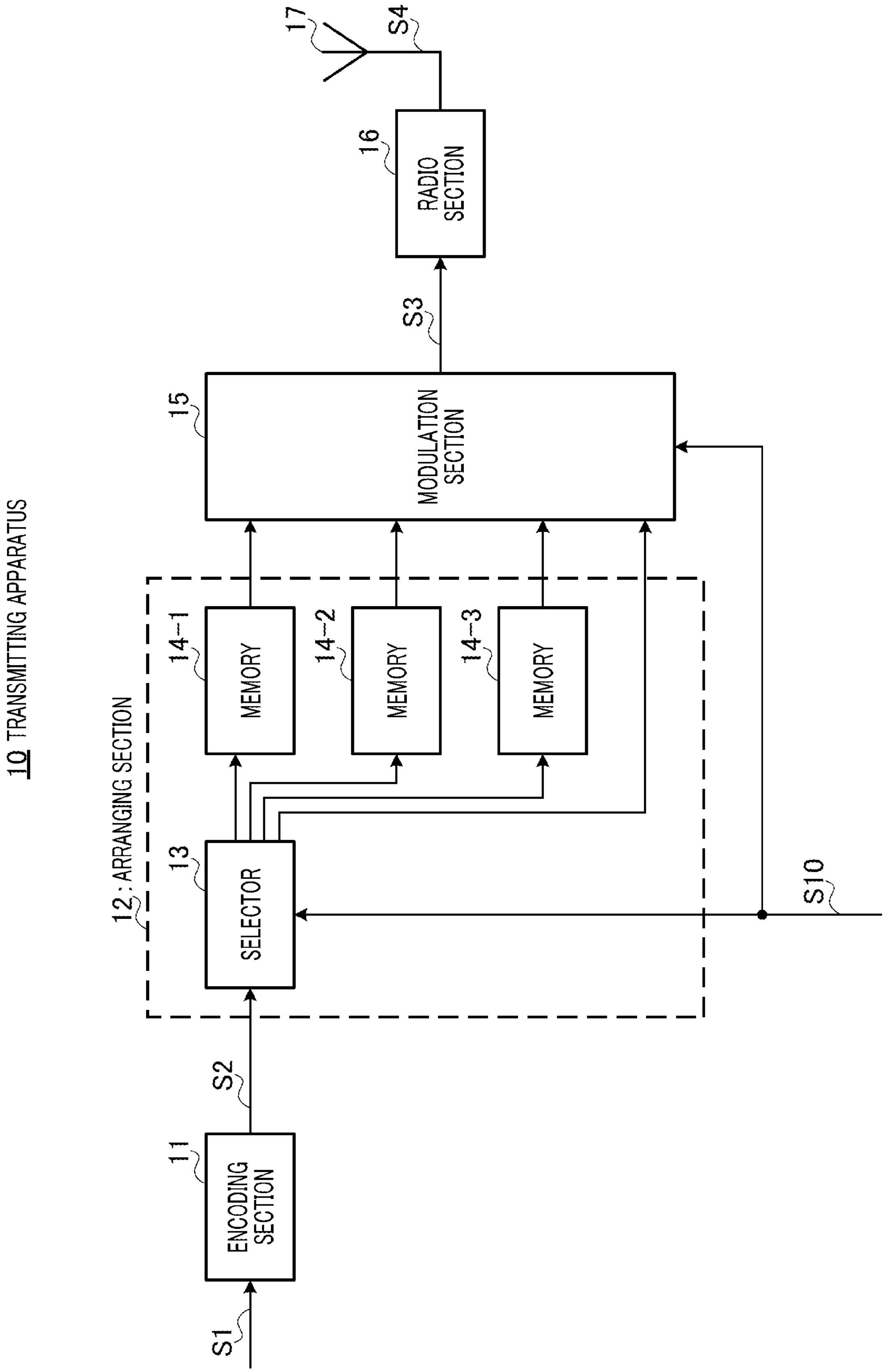
FIG. 2 is a block diagram showing the configuration of a transmitting apparatus according to Embodiment 1 of the present invention.

FIG. 2 shows the configuration of a transmitting apparatus according to Embodiment 1 of the present disclosure. In transmitting apparatus 10, transmit data S1 is input to encoding section 11. Encoding section 11 executes block encoding processing on transmit data S1, and sends block encoded data S2 thus obtained to arranging (interleaving) section 12. In this embodiment, encoding section 11 performs LDPC encoding processing.

Arranging section 12 arranges (interleaves) block encoded data S2 so that one data symbol is configured by collecting together intra-block block encoded data of different encoded blocks, and supplies arranged block encoded data S2 to modulation section 15. Specifically, block encoded data S2 is input to selector 13, and that selector 13 sends block encoded data S2 in bit units to memories 14-1 to 14-3 or modulation section 15. Memories 14-1 to 14-3 function as buffer memories, and send temporarily stored bits to modulation section 15 on a coordinated timing basis. For example, when modulation section 15 performs QPSK, memory 14-1 is used, and a bit stored in memory 14-1 is output at timing coordinated with a bit sent directly to modulation section 15 from selector 13. By this means, one QPSK symbol is formed by modulation section 15 using a total of two bits comprising a bit input from memory 14-1 and a bit input directly from selector 13. On the other hand, when modulation section 15 performs 16QAM, memories 14-1 to 14-3 are used, and bits stored in memories 14-1 to 14-3 are output at timing coordinated with a bit sent directly to modulation section 15 from selector 13. By this means, one 16QAM symbol is formed by modulation section 15 using a total of four bits comprising bits input from memories 14-1 to 14-3 and a bit input directly from selector 13.

To simplify the drawing, only three memories, 14-1 to 14-3, are shown in FIG. 2, but when modulation section 15 performs 64QAM, five memories are provided, and one 64QAM symbol is formed by modulation section 15 using a total of six bits comprising bits input from these memories and a bit input directly from selector 13.

The configuration of arranging section 12 shown in FIG. 2 is just one example, and any configuration may be used whereby block encoded data S2 is arranged and supplied to modulation section 15 so that encoded data in one block are assigned to a plurality of data symbols.

Modulation section 15 performs adaptive modulation based on control signal S10. That is to say, modulation section 15 switches its modulation processing among BPSK, QPSK, 16QAM, and 64QAM based on control signal S10. Control signal S10 is also input to selector 13 of arranging section 12, and selector 13 changes the bit arrangement rule according to which modulation processing is performed by modulation section 15. This will be explained in detail later herein.

Baseband signal S3 corresponding to a transmit symbol obtained by modulation section 15 is input to radio section 16. Radio section 16 executes predetermined modulation processing such as digital/analog conversion and up-conversion on baseband signal S3, and supplies RF signal S4 thus obtained to antenna 17.

LDPC code generation processing by encoding section 11 of this embodiment will now be described using FIG. 3. Encoding section (LDPC encoder) 11 has transmit data S1 (that is, data before LDPC encoding) as input, and outputs block encoded data S2 (that is, data after LDPC encoding) by performing LDPC encoding on transmit data S1. For example, if data before LDPC encoding is designated (m1a, m2a, . . . , m490a), and the parity check matrix is designated G, (C1a, C2a, . . . , C980a) is output as data after LDPC encoding. That is to say, post-encoding block #1 composed of 980 bits is formed from pre-encoding block #1 composed of 490 bits.

Figure 4A:
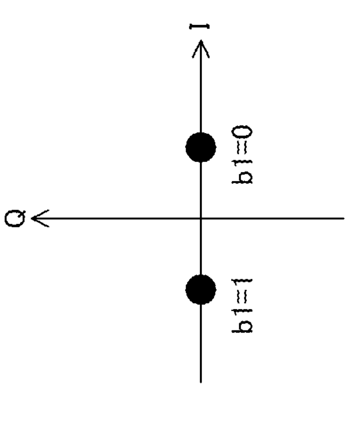
Figure 4B:
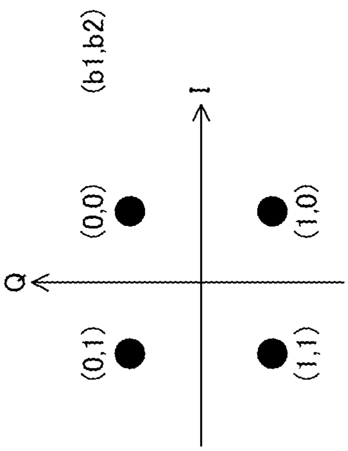
Figure 4C:
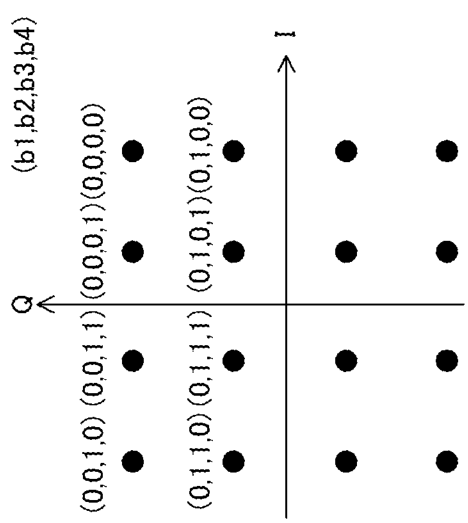
Figure 4D:
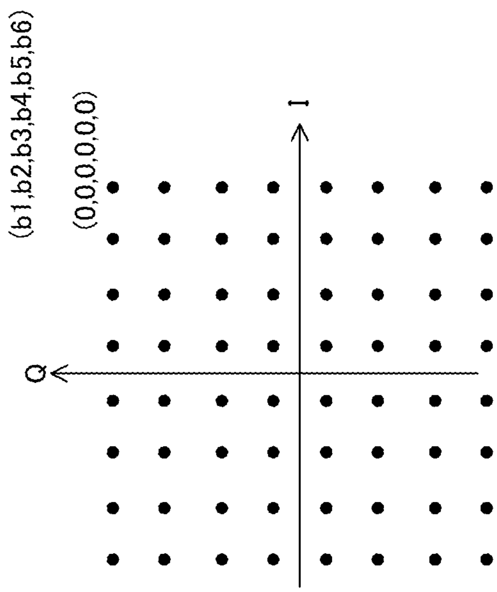

Modulation processing by modulation section 15 will now be described using FIG. 4. As this modulation processing is a known technology, it will be described briefly. FIG. 4A shows a BPSK signal point arrangement, with one bit—that is, b1— transmitted in one symbol. FIG. 4B shows a QPSK signal point arrangement, with two bits—that is, (b1, b2)— transmitted in one symbol. FIG. 4C shows a 16QAM signal point arrangement, with four bits—that is, (b1, b2, b3, b4)— transmitted in one symbol. FIG. 4D shows a 64QAM signal point arrangement, with six bits that is, (b1, b2, b3, b4, b5, b6)— transmitted in one symbol.

Arrangement processing by arranging section 12, which is a characteristic of this embodiment, will now be described using FIG. 5 to FIG. 8. FIG. 5 to FIG. 8 show to which post-modulation symbols bits in each LDPC encoded block are assigned. Specifically, these drawings show the symbols in which encoded data in one block (data after LDPC encoding) configured by means of 980 bits are placed. The horizontal axis indicates the symbol time sequence, and the vertical axis indicates the bit numbers configuring one symbol—that is, b1 in the case of BPSK; b1 and b2 in the case of QPSK; b1, b2, b3, and b4 in the case of 16QAM; and b1, b2, b3, b4, b5, and b6 in the case of 64QAM.

In these drawings, #X-Y indicates the Y'th bit (bit number Y among 980 bits) of the X'th encoded block. For example, #1-1 indicates the 1st bit of the 1st encoded block. Similarly, #3-979 indicates the 979th bit of the 3rd encoded block.

Figure 5:
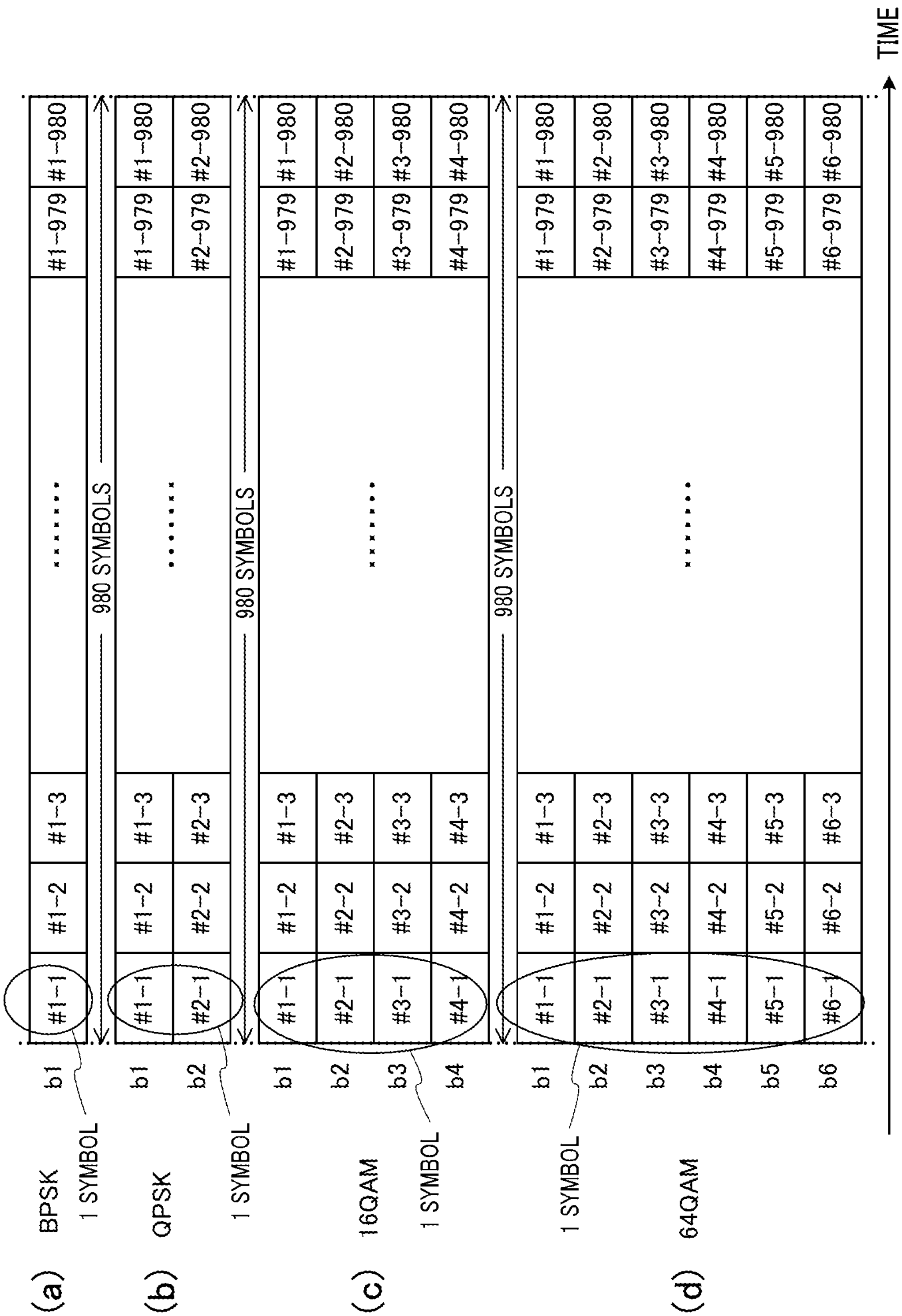
FIG. 5 is a drawing showing assignment of LDPC encoded data to each symbol by an arranging section.

FIG. 5(*a*) shows bit assignment to each symbol when the modulation method is BPSK. When the modulation method is BPSK, one bit (b1) is transmitted in one symbol, and therefore only one 980-bit encoded block is transmitted by means of 980 symbols.

FIG. 5(*b*) shows bit assignment to each symbol when the modulation method is QPSK. When the modulation method is QPSK, two bits (b1, b2) are transmitted in one symbol, and therefore two 980-bit post-encoding blocks can be transmitted by means of 980 symbols. As is clear from the drawing, each symbol here is configured by collecting together intra-block encoded data of different encoded blocks. Specifically, bits #1-1 to #1-980 of post-encoding block #1 are assigned to bit b1 of the 980 QPSK symbols, and bits #2-1 to #2-980 of post-encoding block #2 are assigned to bit b2 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 5(*c*) shows bit assignment to each symbol when the modulation method is 16QAM. When the modulation method is 16QAM, four bits (b1, b2, b3, b4) are transmitted in one symbol, and therefore four 980-bit post-encoding blocks can be transmitted by means of 980 symbols. A characteristic of bit assignment to each symbol here is that, as with QPSK, encoded data in one block are assigned to a plurality of symbols. Specifically, data #1-1 to #1-980 of post-encoding block #1 are assigned to bit b1 of the 980 16QAM symbols, data #2-1 to #2-980 of post-encoding block #2 are assigned to bit b2 of the 980 symbols, data #3-1 to #3-980 of post-encoding block #3 are assigned to bit b3 of the 980 symbols, and data #4-1 to #4-980 of post-encoding block #4 are assigned to bit b4 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 5(*d*) shows bit assignment to each symbol when the modulation method is 64QAM. When the modulation method is 64QAM, six bits (b1, b2, b3, b4, b5, b6) are transmitted in one symbol, and therefore six 980-bit post-encoding blocks can be transmitted by means of 980 symbols. A characteristic of bit assignment to each symbol here is that, as with QPSK and 16QAM, encoded data in one block are assigned to a plurality of symbols. Specifically, data #1-1 to #1-980 of post-encoding block #1 are assigned to bit b1 of the 980 64QAM symbols, data #2-1 to #2-980 of post-encoding block #2 are assigned to bit b2 of the 980 symbols, data #3-1 to #3-980 of post-encoding block #3 are assigned to bit b3 of the 980 symbols, data #4-1 to #1-980 of post-encoding block #4 are assigned to bit b4 of the 980 symbols, data #5-1 to #5-980 of post-encoding block #5 are assigned to bit b5 of the 980 symbols, and data #6-1 to #6-980 of post-encoding block #6 are assigned to bit b6 of the 980 symbols.

By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

Figure 6:
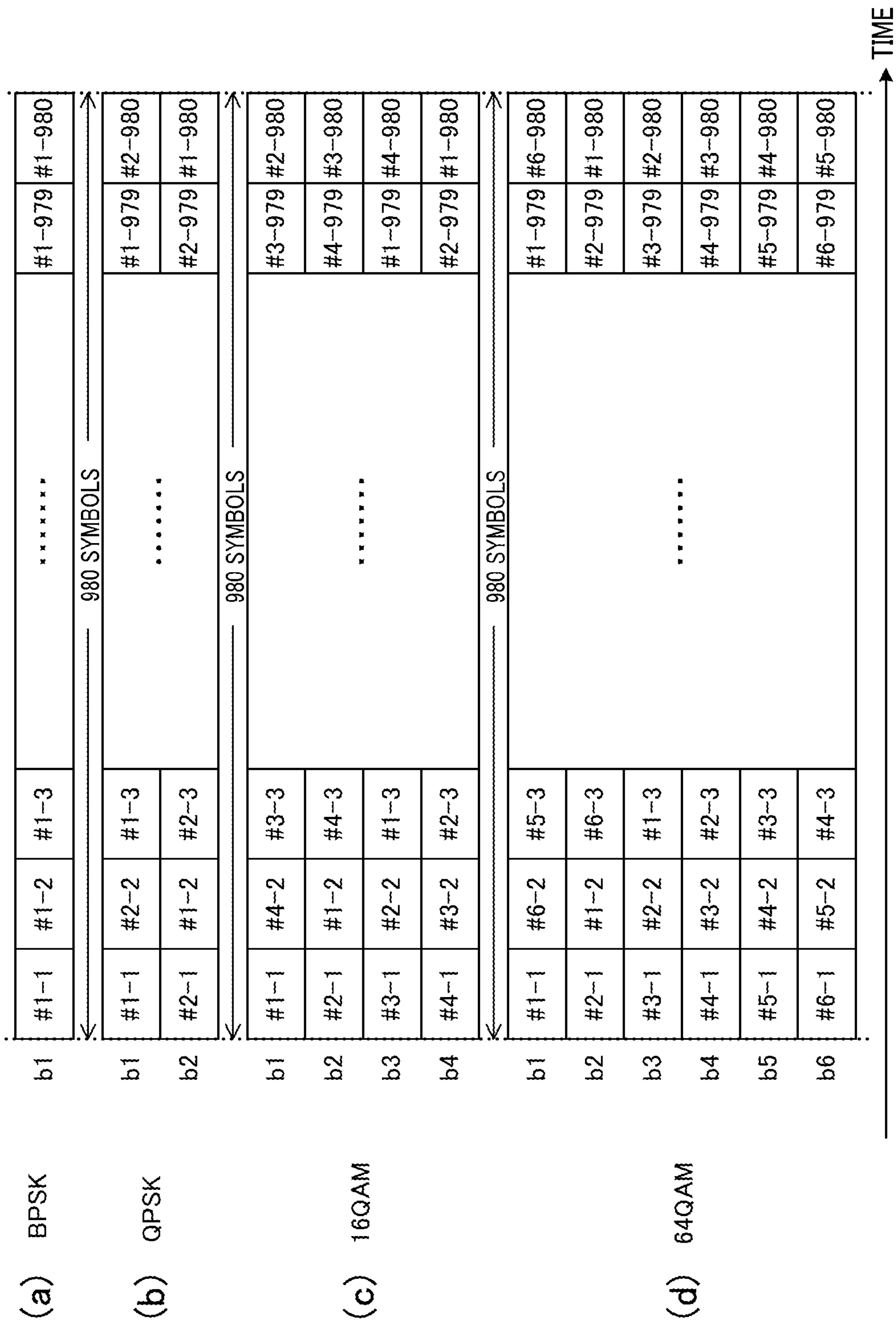
FIG. 6 is a drawing showing assignment of LDPC encoded data to each symbol by an arranging section.

Second examples of arrangement processing of arranging section 12 of this embodiment will now be described using FIG. 6. The examples shown in FIG. 6 are similar to those in FIG. 5 in that encoded data in one block are assigned to a plurality of symbols, and the same effect can be obtained as when arrangement is performed as shown in FIG. 5. FIG. 6 differs from FIG. 5 in that, with QPSK, 16QAM, and 64QAM, one post-encoding block is not assigned to a fixed bit (for example, b1 only), but is assigned to all bits (for example, in the case of 16QAM, to b1, b2, b3, and b4). Specifically, when the modulation method is 16QAM, for example, a characteristic in this case is that block #1 is transmitted using b1, b2, b3, and b4, so that, for post-encoding block #1, data #1-1 is assigned to bit b1, #1-2 to b2, #1-3 to b3, and #1-4 to b4.

The reason for using such an assignment method will now be explained. There are differences in 16QAM b1 reception quality, b2 reception quality, b3 reception quality, and b4 reception quality. It will be assumed here that b1 reception quality is the poorest. In this case, if block #1 is transmitted using only b1, block #1 will be a block with poor reception quality. When communication based on packet is performed, packet errors are affected by the reception quality of the block with the poorest reception quality. Therefore, in this case, reception quality should be made as uniform as possible for blocks #1 to #4. This can be achieved by performing such assignment shown in FIG. 6. Also, preferably, the number of times assignment is performed to b1, b2, b3, and b4 should be made as uniform as possible for blocks #1 to #4. The difference in the number of times assignment is performed should preferably be once at most. Since the number of symbols is not necessarily a multiple of 4 (bits) (the number of bits that can be transmitted in one symbol in 16QAM), a difference of one time may occur however assignment is performed.

Here, a case in which 16QAM is used has been described by way of example, but the same effect can also be obtained when the same processing is performed with 64QAM. However, the same effect cannot necessarily be obtained in the case of QPSK since there is no difference in reception quality between b1 and b2. Nevertheless, since the possibility of a difference in reception quality arising due to distortion caused by the transmitting apparatus and receiving apparatus cannot be denied, there is a possibility of such an effect being obtained.

Figure 7:
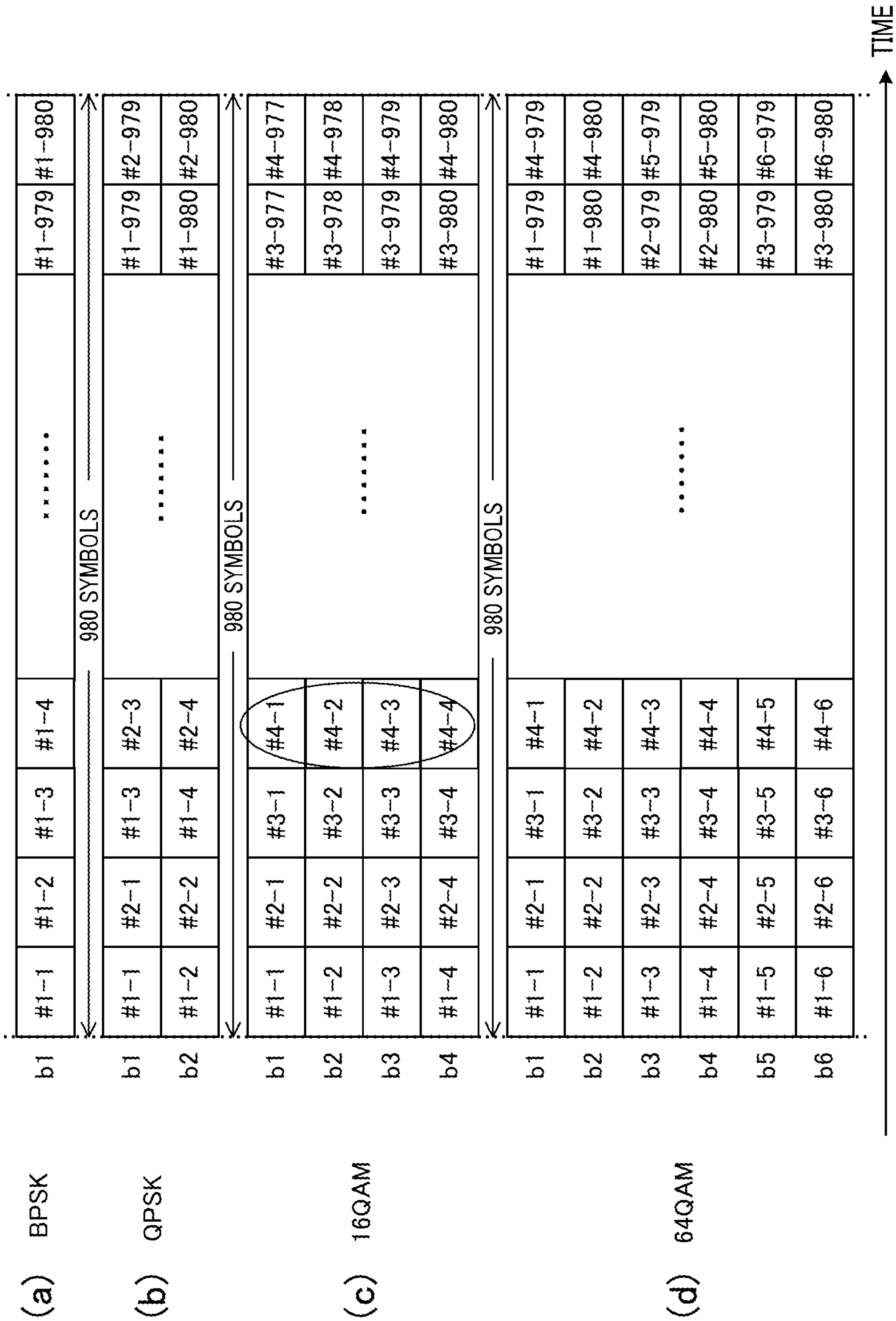
FIG. 7 is a drawing showing assignment of LDPC encoded data to each symbol by an arranging section.

Third examples of arrangement processing of arranging section 12 of this embodiment will now be described using FIG. 7. The examples shown in FIG. 7 are similar to those in FIG. 5 in that encoded data in one block are assigned to a plurality of symbols, and the same effect can be obtained as when arrangement is performed as shown in FIG. 5. FIG. 7 differs from FIG. 5 in that, while the same block data is transmitted by the same symbols, the order of transmission is block #1 data and block #2 data blocks alternately for QPSK; block #1, block #2, block #3 in that order for 16QAM; and block #1, block #2, block #3, block #4, block #5, block #6 in that order for 64QAM. That is to say, block data may be assigned to symbols at intervals instead of being assigned to successive symbols as in FIG. 5. However, the assignment methods as shown in FIG. 5 and FIG. 6 enable intra-block data to be dispersed among more symbols, and are therefore more effective in improving reception quality.

Figure 8:
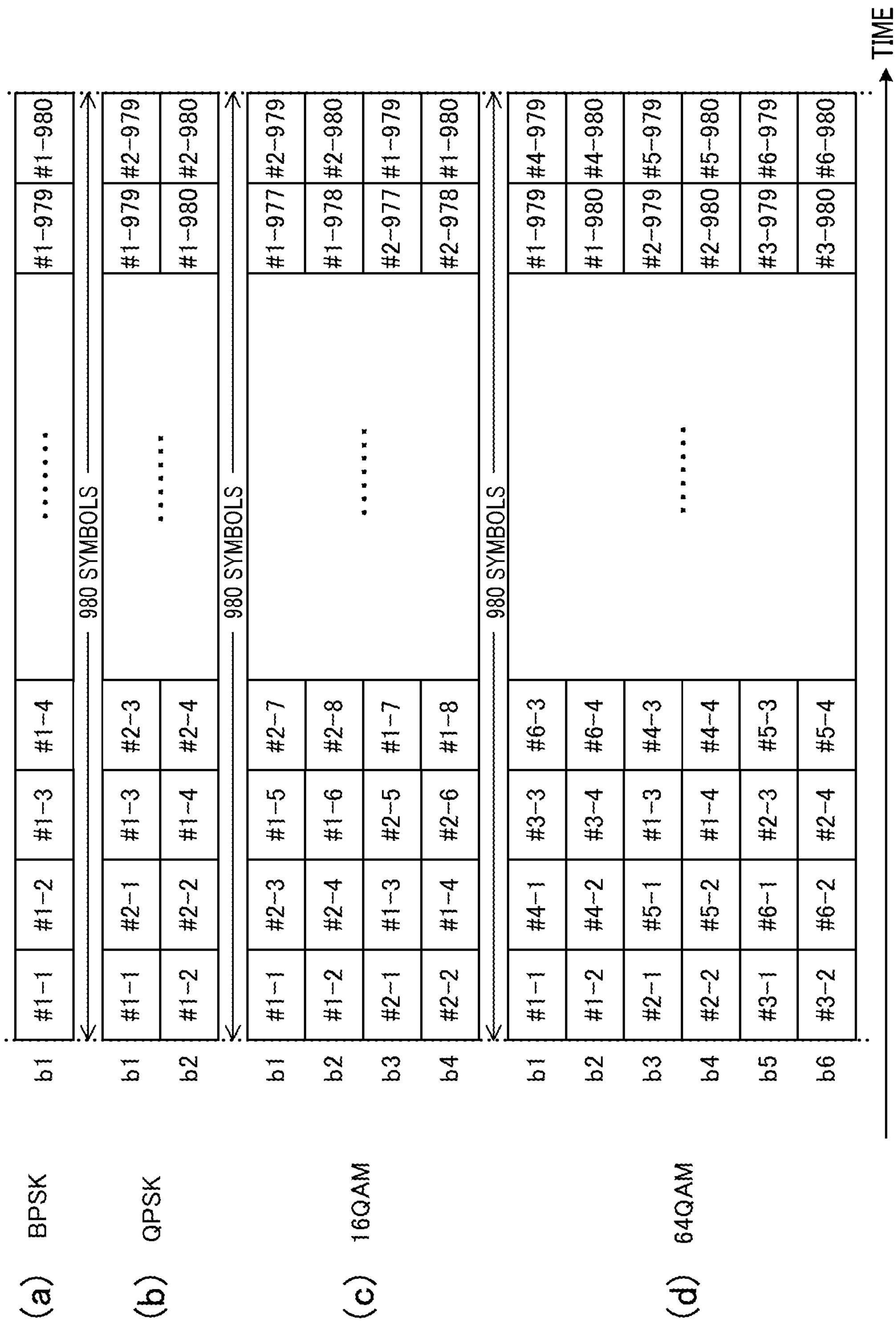
FIG. 8 is a drawing showing assignment of LDPC encoded data to each symbol by an arranging section.

Fourth examples of arrangement processing of arranging section 12 of this embodiment will now be described using FIG. 8. The examples shown in FIG. 8 are similar to those in FIG. 5 in that encoded data in one block are assigned to a plurality of symbols, and the same effect can be obtained as when arrangement is performed as shown in FIG. 5. The examples in FIG. 8 combine the concepts illustrated in FIG. 6 and FIG. 7. In FIG. 8, symbols to which assignment is performed are changed in 2-bit units. By this means, the same effect can be obtained as in FIG. 5 and FIG. 6, but the assignment methods as shown in FIG. 5 and FIG. 6 enable intra-block data to be dispersed among more symbols, and are therefore more effective in improving reception quality.

Thus, according to this embodiment, by providing encoding section 11 that executes block encoding processing on transmit data and forms block encoded data, modulation section 15 that modulates block encoded data and forms data symbols, and arranging section 12 that arranges block encoded data so that one data symbol is configured by collecting together intra-block block encoded data of different encoded blocks, and supplies the arranged block encoded data to modulation section 15, transmitting apparatus 10 can be implemented that enables burst errors to be suppressed with a comparatively simple configuration without changing the block size of an encoded block even when the number of modulation multi-values is increased.

The processing of arranging section 12 can be said to be arranging block encoded data so that one symbol is configured by collecting together block encoded data of more encoded blocks as the number of modulation multi-values of modulation section 15 increases.

In this embodiment, cases have mainly been described in which an LDPC code is used as a block code, but this embodiment can also be widely applied to block codes other than an LDPC code. Block codes other than an LDPC code include a BCH code, Reed-Solomon code, and so forth. Also, in this embodiment, cases have mainly been described by way of example in which a block code such as an LDPC code is used, but bit assignment to symbols according to this embodiment can also be applied to a case in which a trellis code such as a turbo code or convolutional code is used. A detailed description will be given in Embodiment 6.

In this embodiment, a case in which a single carrier is used has been described by way of example, but the present disclosure can also be widely applied to multicarrier methods such as OFDM.

Embodiment 2

Figure 9:
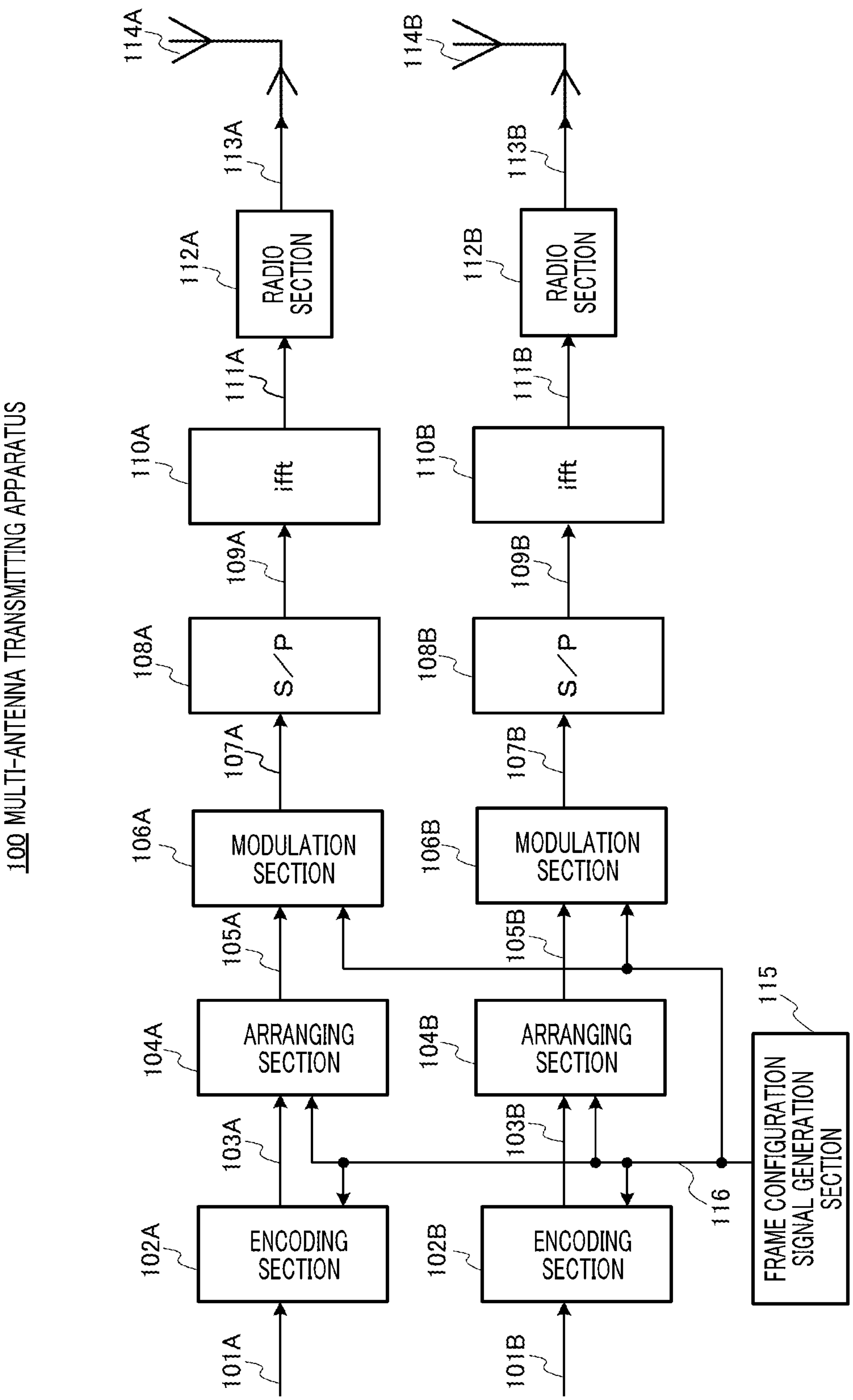
FIG. 9 is a block diagram showing the configuration of a multi-antenna transmitting apparatus of Embodiment 2.

FIG. 9 shows the configuration of a multi-antenna transmitting apparatus according to Embodiment 2 of the present disclosure.

Multi-antenna transmitting apparatus 100 is a transmitting apparatus that performs so-called OFDM-MIMO communication, and transmits different modulated signals from two antennas. Specifically, multi-antenna transmitting apparatus 100 transmits modulated signal A from antenna 114A and transmits modulated signal B from antenna 114B. In FIG. 9, virtually the same configuration is used for the signal processing system for modulated signal A and the signal processing system for modulated signal B, and therefore "A" is appended to reference codes for the modulated signal A signal processing system, and "B" is appended to reference codes for the corresponding modulated signal B signal processing system.

Frame configuration signal generation section 115 of multi-antenna transmitting apparatus 100 outputs control signal 116 with frame configuration related information, encoding method information, modulation method information, and so forth. Encoding section 102A has modulated signal A data 101A and control signal 116 as input, executes encoding based on control signal 116, and outputs post-encoding data 103A.

Arranging (interleaving) section 104A has post-encoding data 103A and control signal 116 as input, arranges (interleaves) post-encoding data 103A based on control signal 116, and outputs post-arrangement data 105A.

Modulation section 106A has post-arrangement data 105A and control signal 116 as input, executes BPSK, QPSK, 16QAM, or 64QAM modulation based on control signal 116, and outputs baseband signal 107A.

Serial/parallel conversion section (S/P) 108A has baseband signal 107A as input, executes serial/parallel conversion, and outputs parallel signal 109A. Inverse Fourier transform section (ifft) 110A has parallel signal 109A as input, executes a Fourier transform, and outputs post-Fourier-transform signal 111A— that is, an OFDM signal. Radio section 112A has post-Fourier-transform signal 111A as input, and forms modulated signal A transmit signal 113A by executing predetermined radio processing such as frequency conversion and amplification. Transmit signal A is output as a radio wave from antenna 114A.

The same processing is also executed for modulated signal B by means of encoding section 102B, arranging section 104B, modulation section 106B, serial/parallel conversion section (S/P) 108B, inverse Fourier transform section (ifft) 110B, and radio section 112B, and modulated signal B transmit signal 113B is transmitted as a radio wave from antenna 114B.

Figure 10:
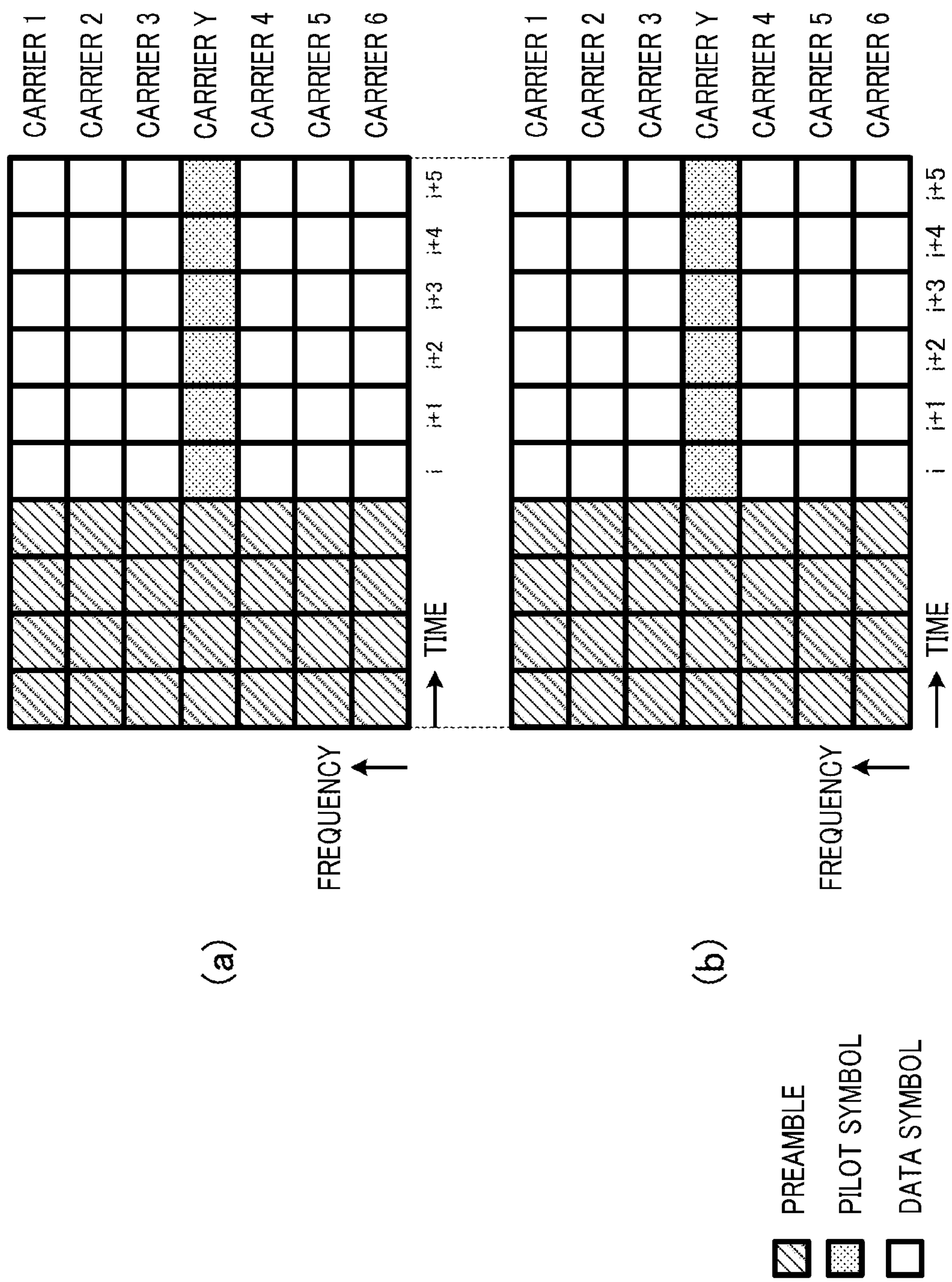
FIG. 10 is a drawing showing an example of the frame configurations of modulated signals transmitted from each antenna of a multi-antenna transmitting apparatus.

FIG. 10 shows an example of the frame configurations of modulated signal A and modulated signal B transmitted from antennas 114A and 114B of multi-antenna transmitting apparatus 100. FIG. 10(*a*) shows a frame configuration of modulated signal A transmitted from antenna 114A, and FIG. 10(*b*) shows a frame configuration of modulated signal B transmitted from antenna 114B. In this embodiment, transmission scheme using MIMO (Multiple-Input Multiple-Output) spatial multiplexing is used as the communication method, and therefore modulated signal A and modulated signal B symbols of the same carrier and the same time are transmitted simultaneously from different antennas, and multiplexed spatially.

A preamble placed at the start of a frame is for estimating channel condition. A receiver estimates channel condition using the preamble, and can separate modulated signal A and modulated signal B by executing ZF (Zero Forcing) or MMSE (Minimum Mean Square Error) processing.

Pilot symbols placed in the time direction of carrier Y are symbols used by a receiving apparatus to estimate and eliminate frequency offset that cannot be eliminated by means of the preamble and distortion (amplitude/phase) due to device characteristics.

Data symbols are symbols for transmitting data, and are transmitted after the preamble.

Figure 11:
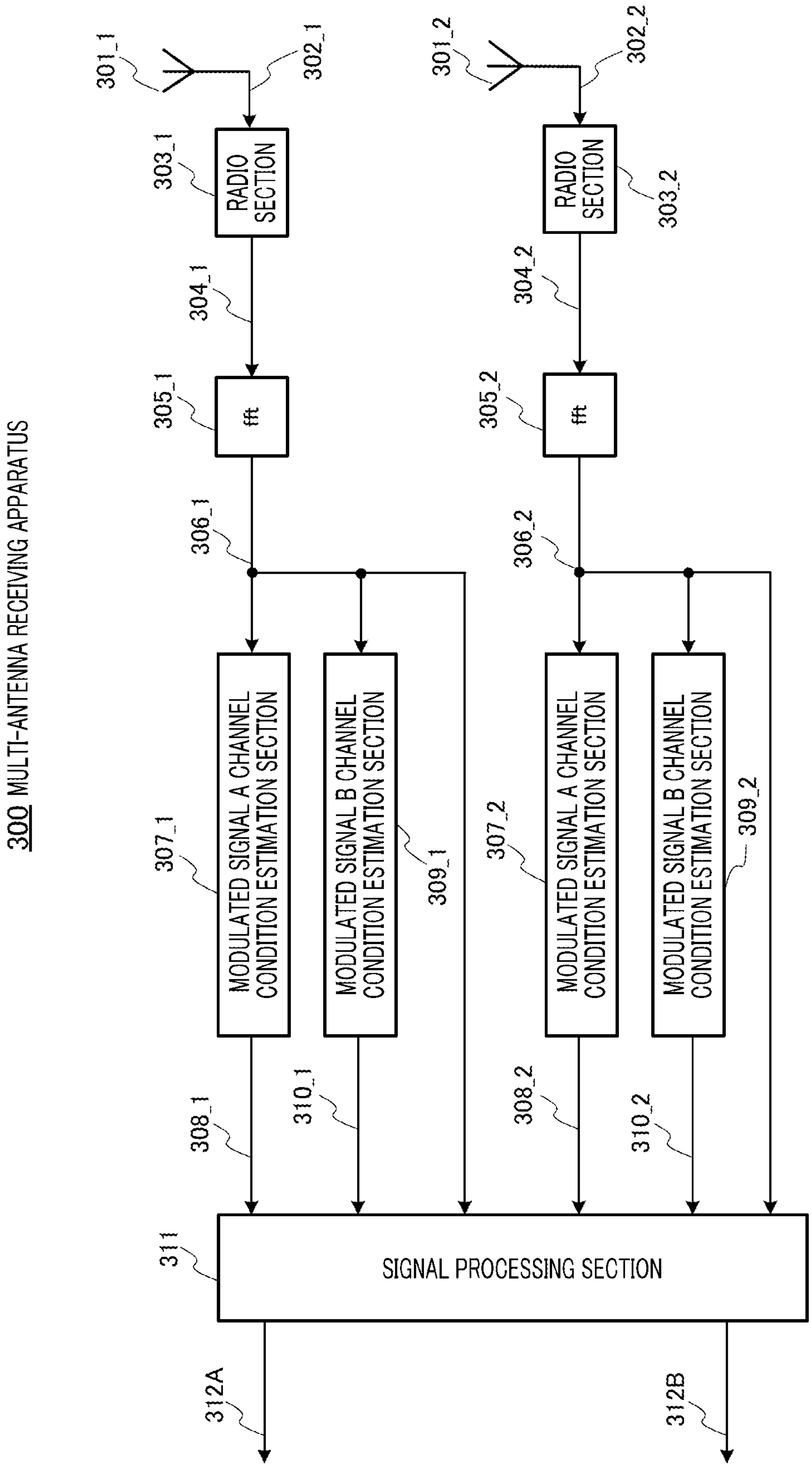
FIG. 11 is a block diagram showing the configuration of a multi-antenna receiving apparatus of Embodiment 2.

FIG. 11 shows the configuration of a multi-antenna receiving apparatus that receives and demodulates a signal transmitted from multi-antenna transmitting apparatus 100.

Radio section 303_1 of a multi-antenna receiving apparatus 300 has received signal 302_1 received by antenna 301_1 as input, executes amplification, frequency conversion, and so forth, and outputs baseband signal 304_1. Fourier transform section (fft) 305_1 has baseband signal 304_1 as input, executes a Fourier transform, and outputs post-Fourier-transform signal 306_1.

Modulated signal A channel condition estimation section 307_1 has post-Fourier-transform signal 306_1 as input, extracts the modulated signal A preamble shown in FIG. 10(*a*), estimates modulated signal A channel condition based on this preamble, and outputs modulated signal A channel condition estimation signal 308_1.

Modulated signal B channel condition estimation section 309_1 has post-Fourier-transform signal 306_1 as input, extracts the modulated signal B preamble shown in FIG. 10(*b*), estimates modulated signal B channel condition based on this preamble, and outputs modulated signal B channel condition estimation signal 310_1.

Radio section 303_2, Fourier transform section 305_2, modulated signal A channel condition estimation section 307_2, and modulated signal B channel condition estimation section 309_2 operate in the same way as described above.

Signal processing section 311 has post-Fourier-transform signals 306_1 and 306_2, modulated signal A channel condition estimation signals 308_1 and 308_2, and modulated signal B channel condition estimation signals 310_1 and 310_2 as input, and obtains modulated signal A receive data 312A and modulated signal B receive data 312B by performing ZF (Zero Forcing), MMSE (Minimum Mean Square Error), or suchlike processing, and also performing decoding. The operation of signal processing section 311 will be described in detail later herein using FIG. 13.

Figure 12:
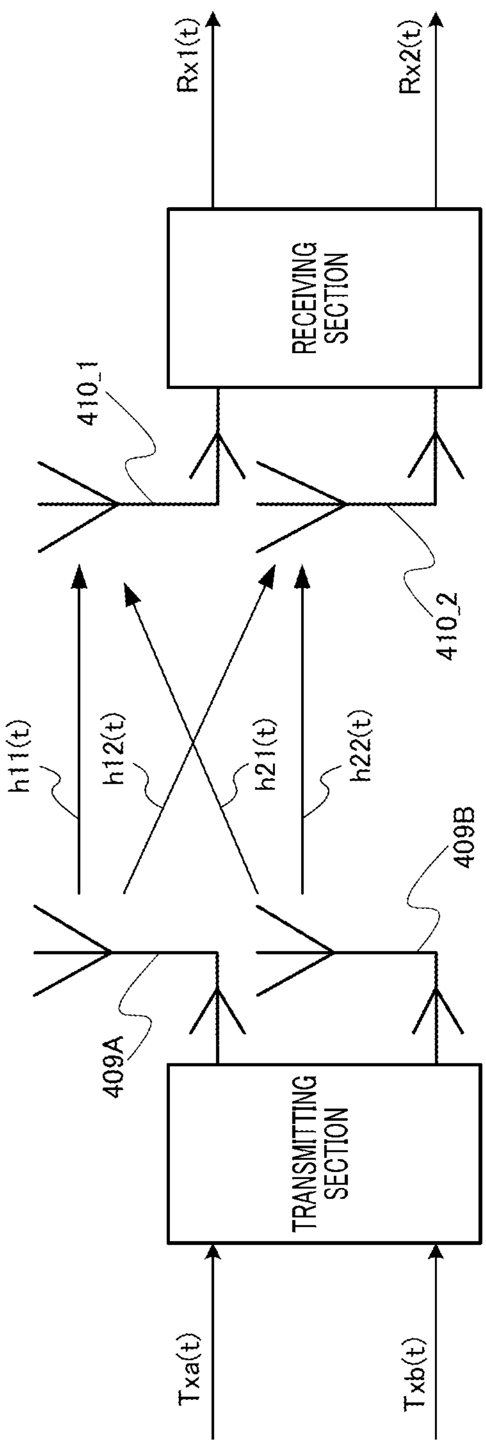
FIG. 12 is a drawing showing a model of communication between a multi-antenna transmitting apparatus and a multi-antenna receiving apparatus.

FIG. 12 shows a model of communication between a multi-antenna transmitting apparatus and a multi-antenna receiving apparatus. Here, a modulated signal transmitted from an antenna 409A is designated Txa(t), and a modulated signal transmitted from an antenna 409B is designated Txb(t) (t: time). Also, if channel conditions between the respective transmit and receive antennas are designated h11(t), h12(t), h21(t), and h22(t), a received signal received by antenna 410_1 is designated Rx1(t), and a received signal received by antenna 410_2 is designated Rx2(t), the following relational expression holds true.

(Equation 1)

$$\begin{pmatrix} R\times 1(t) \\ R\times 2(t) \end{pmatrix} = \begin{pmatrix} h11(t) & h21(t) \\ h12(t) & h22(t) \end{pmatrix} \begin{pmatrix} T\times a(t) \\ T\times b(t) \end{pmatrix} \quad [1]$$

Figure 13:
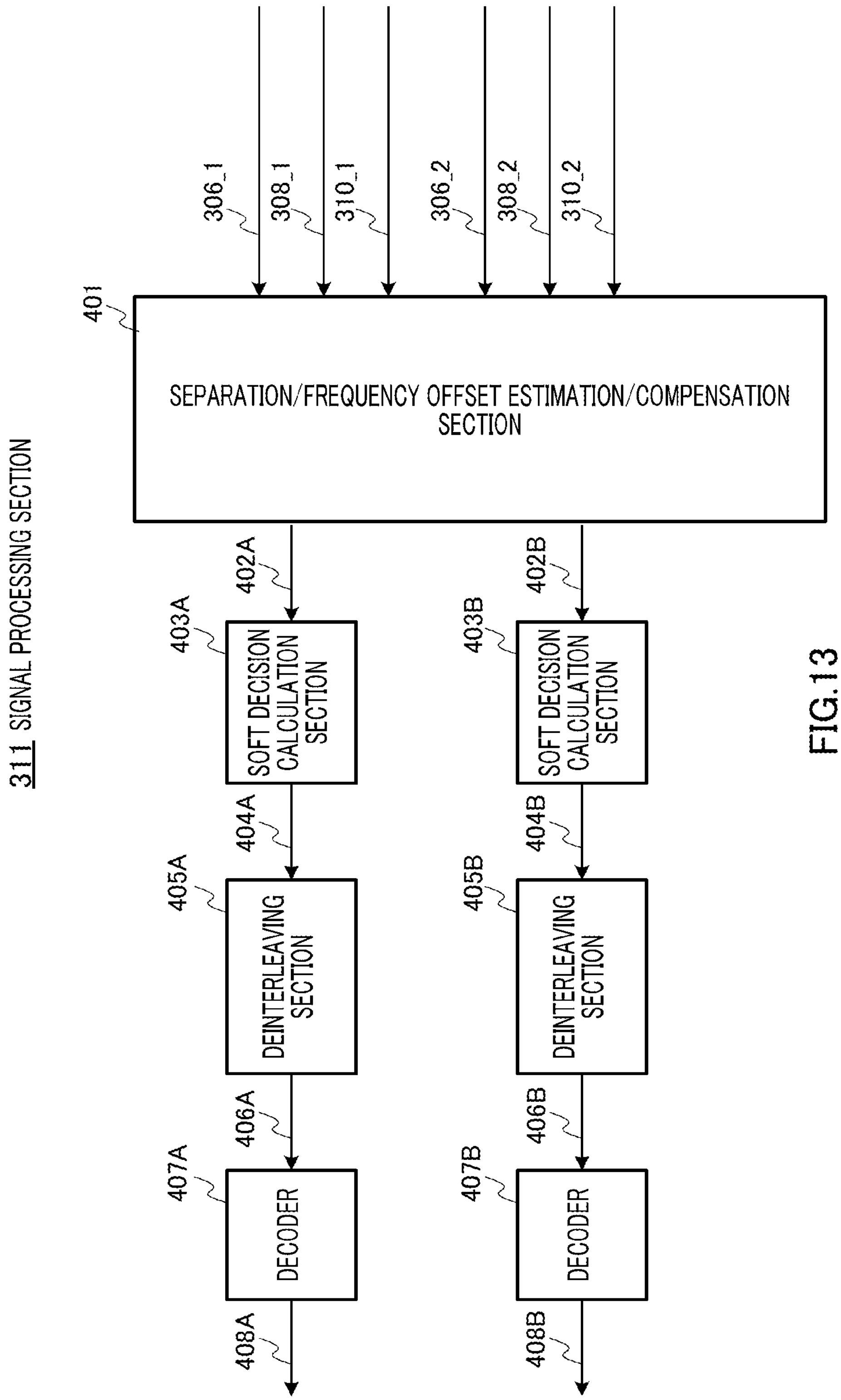
FIG. 13 is a block diagram showing the configuration of the signal processing section of a multi-antenna receiving apparatus.

FIG. 13 shows the configuration of signal processing section 311 of multi-antenna receiving apparatus 300. Separation/frequency offset estimation/compensation section 401 has post-Fourier-transform signals 306_1 and 306_2, modulated signal A channel condition estimation signals 308_1 and 308_2, and modulated signal B channel condition estimation signals 310_1 and 310_2 as input, and separates modulated signal A and modulated signal B by performing Equation (1) inverse matrix computation (ZF). Also, separation/frequency offset estimation/compensation section 401 estimates frequency offset and distortion (amplitude/phase) due to device characteristics using the pilot symbols shown in FIG. 10, compensates for these based on the estimation results, and obtains modulated signal A post-compensation baseband signal 402A and modulated signal B post-compensation baseband signal 402B.

Soft decision calculation section 403A has modulated signal A post-compensation baseband signal 402A as input, and obtains soft decision value 404A by calculating a branch metric. Deinterleaving section 405A has soft decision value 404A as input, and obtains post-deinterleaving soft decision value 406A by performing deinterleaving (the reverse of the processing performed by arranging section 104A). Decoder 407A has post-deinterleaving soft decision value 406A as input, and obtains modulated signal A receive data 408A by decoding this post-deinterleaving soft decision value 406A.

Soft decision calculation section 403B, deinterleaving section 405B, and decoder 407B perform the same operations as described above, and obtain modulated signal B receive data 408B.

Figure 14:
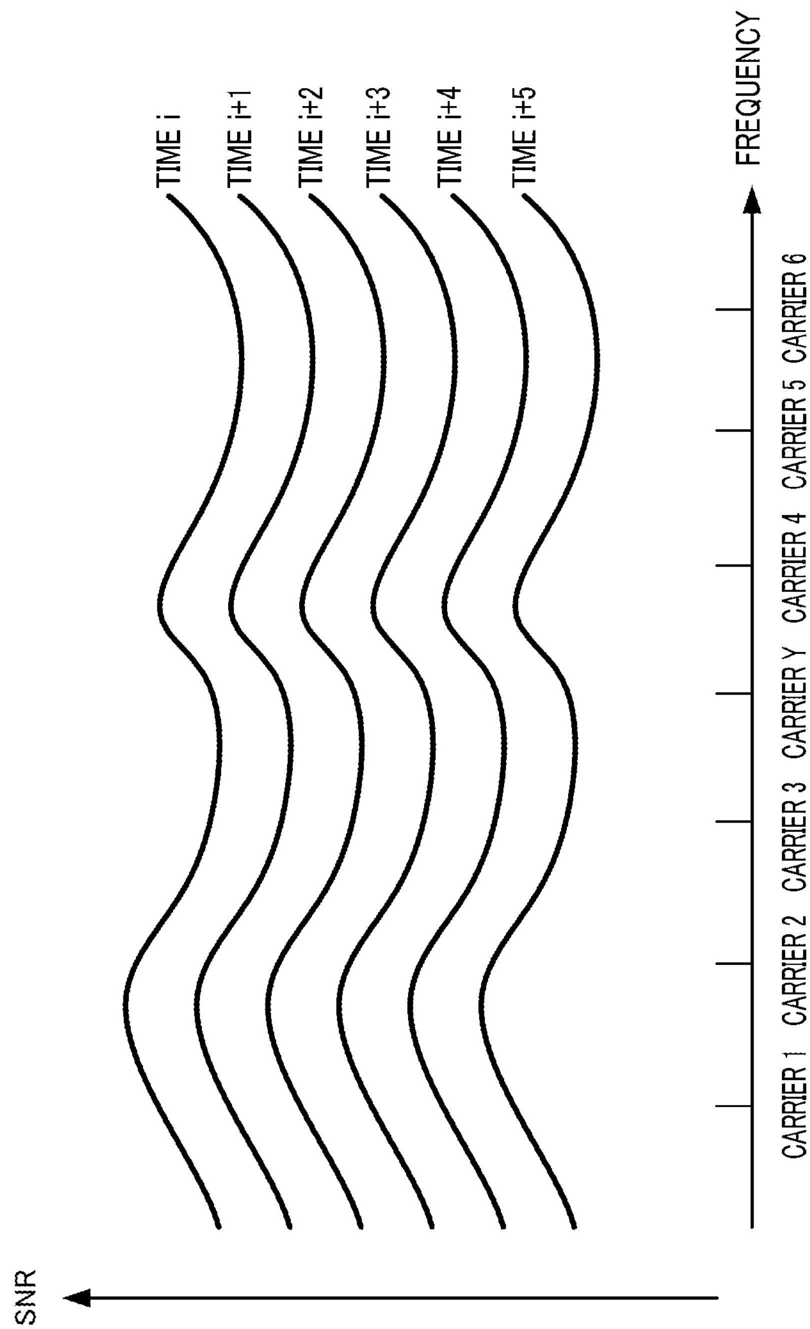
FIG. 14 is a drawing showing the relationship between the SNR characteristics of a signal at different points in time in a receiving apparatus.

FIG. 14 shows an example of the relationship between the signal power to noise power ratios (SNRs) of carriers 1 to 6 at times i, i+1, i+2, i+3, i+4, and i+5, obtained in a receiving apparatus when modulated signals are transmitted with the frame configurations shown in FIG. 10. As shown in FIG. 14, the SNR of a data symbol falls with temporal distance from the preamble. This is because the frequency estimation error and the estimation error of distortion (amplitude/phase)

due to device characteristics in the receiving apparatus increase with temporal distance from the preamble.

Figure 1:
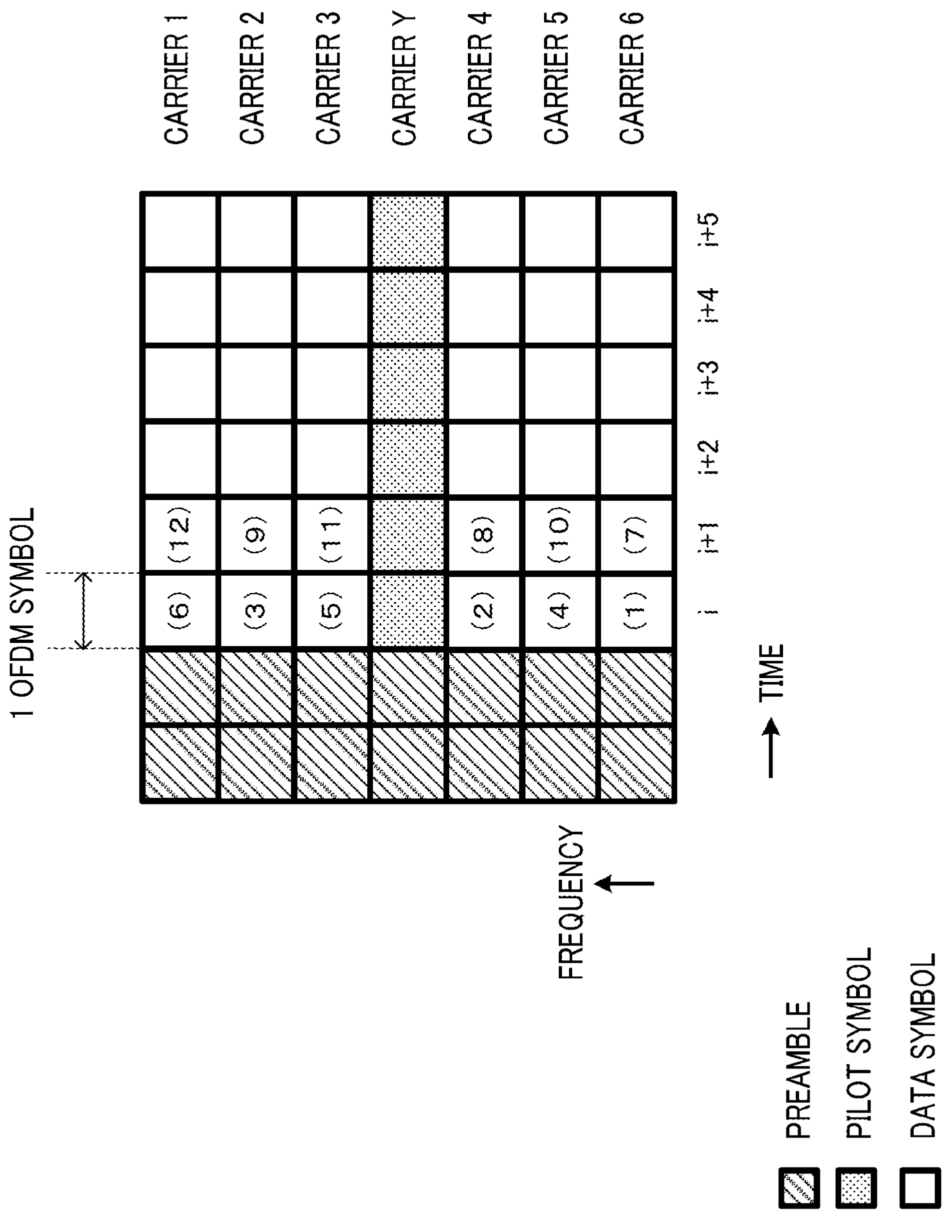
FIG. 1 is a drawing showing an example of the frame configuration of a transmit signal of a conventional multi-antenna transmitting apparatus.

When interleaving is executed within one OFDM symbol and deinterleaving is executed by the receiving apparatus, as in FIG. 1 for example, data belonging to an OFDM symbol temporally distant from the preamble, such as at times i+4 and i+5, is configured by means of only data symbols with a degraded SNR in consideration of the phenomenon in FIG. 14, even though interleaving is executed, and therefore it is difficult to obtain coding gain even though error correction is performed, and the error rate performance degrades.

In a conventional system in which the transmitting and receiving apparatuses each have only one antenna, this problem can be solved very easily. It is only necessary to insert symbols for frequency offset and distortion estimation, such as pilot symbols for example. In this case, pilot symbols need not be inserted so frequently, and therefore the drop in transmission speed due to pilot symbol insertion is small, and pilot symbol insertion is not such a major disadvantage for the system.

On the other hand, in a multi-antenna system such as a MIMO system that uses spatial multiplexing, separation symbols (comprising the preamble in FIG. 10) for separating modulated signals mixed on the transmission path are essential. Also, channel conditions h11 to h22 are estimated using these separation symbols.

Here, causes of degradation of the estimation precision of channel conditions hl l to h22 include temporal fluctuation of frequency offset and distortion. However, it is difficult to prevent an above-described drop in SNR simply by inserting pilot symbols and estimating temporal fluctuation of frequency offset and distortion estimation.

This is because, in the final analysis, it is difficult to prevent an above-described drop in SNR unless the estimation precision of channel conditions h11 to h22 is ensured. A possible method of achieving this is to increase the frequency of separation symbol insertion. That is to say, a solution is difficult even if the frequency of pilot symbol insertion is increased.

However, since it is necessary for separation symbols to be placed on all carriers, there is a problem of transmission speed falling significantly if the frequency of separation symbol insertion is increased. It is therefore important to improve the SNR while keeping the frequency of separation symbol insertion as low as possible.

In this embodiment, a multi-antenna transmitting apparatus is proposed that enables degradation of the error rate performance of data placed in a symbol distant from the preamble to be suppressed without increasing the frequency of preamble insertion.

In this embodiment, the above-described problem is solved by a contrivance of the arrangement processing of arranging sections 104A and 104B provided between encoding sections 102A and 102B and modulation sections 106A and 106B. This will now be explained in detail.

Here, arranging sections 104A and 104B perform arrangement so that input m'th data is placed in a data symbol at the carrier p(m) position in the frequency domain, and in a data symbol at the time q(m) position in the time domain. This arrangement processing is expressed as $\pi(m)=(p(m),q(m))$.

Figure 15:
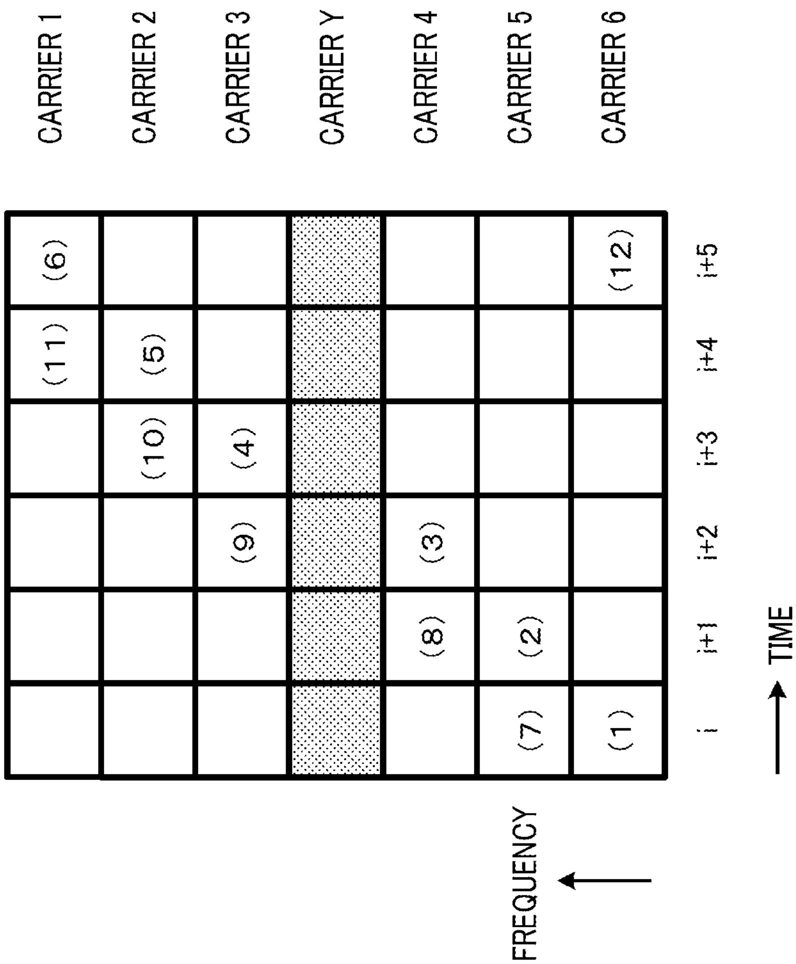
FIG. 15 is a drawing showing an example of arrangement processing of data after encoding.
Figure 16:
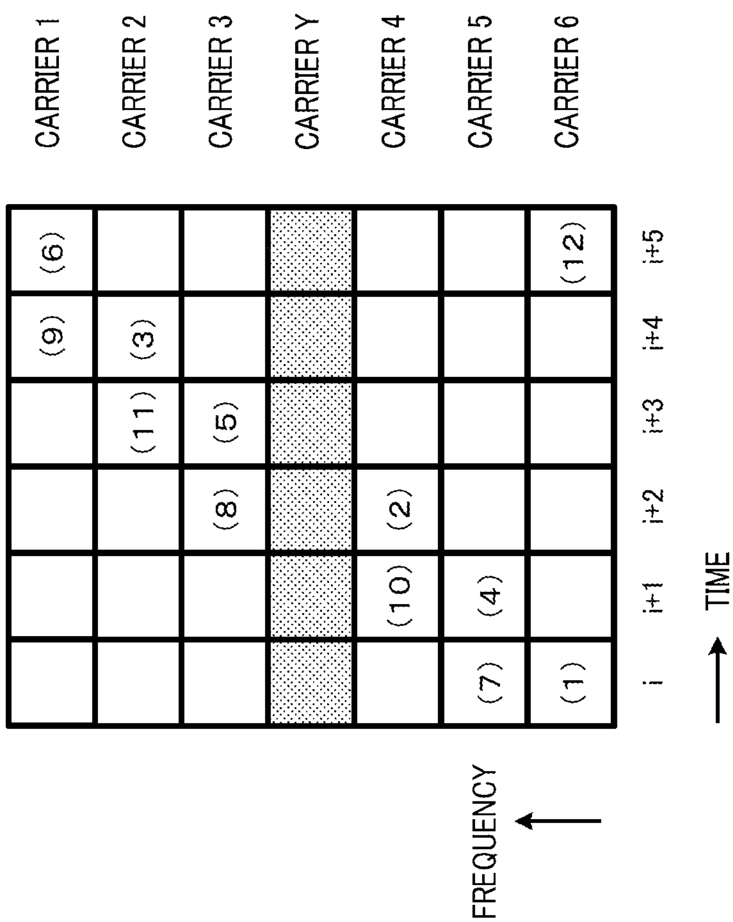
FIG. 16 is a drawing showing an example of arrangement processing of data after encoding.

FIG. 15 and FIG. 16 show examples of arrangement processing of data after encoding by arranging sections 104A and 104B. By way of illustration, FIG. 15 and FIG. 16 show examples in which data arrangement is performed within six OFDM symbols. The preambles are omitted. In FIG. 15 and FIG. 16, (1), (2), (3) . . . indicate the order of data placement, meaning, for example, that the data input first is placed in data symbol (1), and the data input second is placed in data symbol (2).

The important point in the arrangement shown in FIG. 15 and FIG. 16 is that the 1st data and 2nd data are placed in data symbol positions of different times. For example, when encoding sections 102A and 102B execute block encoding processing for a block size of 6, arranging sections 104A and 104B assign the six data items in an encoded block to symbols at temporally different positions. Thus, for example, data after block encoding is assigned to symbols so that $q(1)\neq q(2)\neq q(3)$ $q(4)\neq q(5)\neq q(6)$ and $q(7)\neq q(8)\neq q(9)\neq q(10)\neq q(11)\neq q(12)$.

By this means, it no longer happens that data with a degraded SNR are positioned consecutively in a data sequence on which the receiving apparatus has performed deinterleaving, and therefore coding gain can be obtained by performing error correction, and degradation of the error rate performance can be suppressed.

Taking SNR correlation in the frequency domain into consideration (SNR correlation being higher between close carriers), degradation of the error rate performance can be further suppressed by arranging encoded data so that, in addition to the above conditions, $p(1)\neq p(2)\neq p(3)\neq p(4)\neq p(5)\neq p(6)$ and $p(7)\neq p(8)\neq p(9)\neq p(10)\neq p(11)\neq p(12)$.

Thus, according to this embodiment, by providing arranging sections 104A and 104B that arrange encoded data so that encoded data within the same encoded block is assigned to a plurality of data symbols in the time direction, it is possible to prevent all data within an encoded block from being assigned to data symbols at positions distant from the preamble. In other words, distances from the preamble can be made virtually uniform among encoded blocks, making it possible to implement multi-antenna transmitting apparatus 100 that enables degradation of the error rate performance due to distance from the preamble to be suppressed. In addition, the influence of notches due to fading can also be reduced.

In the description of this embodiment, a frame configuration configured by means of only a preamble, data symbols, and pilot symbols, such as shown in FIG. 10, has been taken as an example, but the frame configuration is not limited to this, and symbols that transmit control information, for example, may also be included. In short, this embodiment is suitable for application to a wide range of cases in which data symbols are preceded by a preamble.

In the configuration example shown in FIG. 9, a configuration is illustrated in which encoding sections 102A and 102B are provided respectively for modulated signals A and B, but this embodiment can also be applied to a configuration in which encoding processing of both modulated signals A and B is performed by one encoding section.

Figure 17:
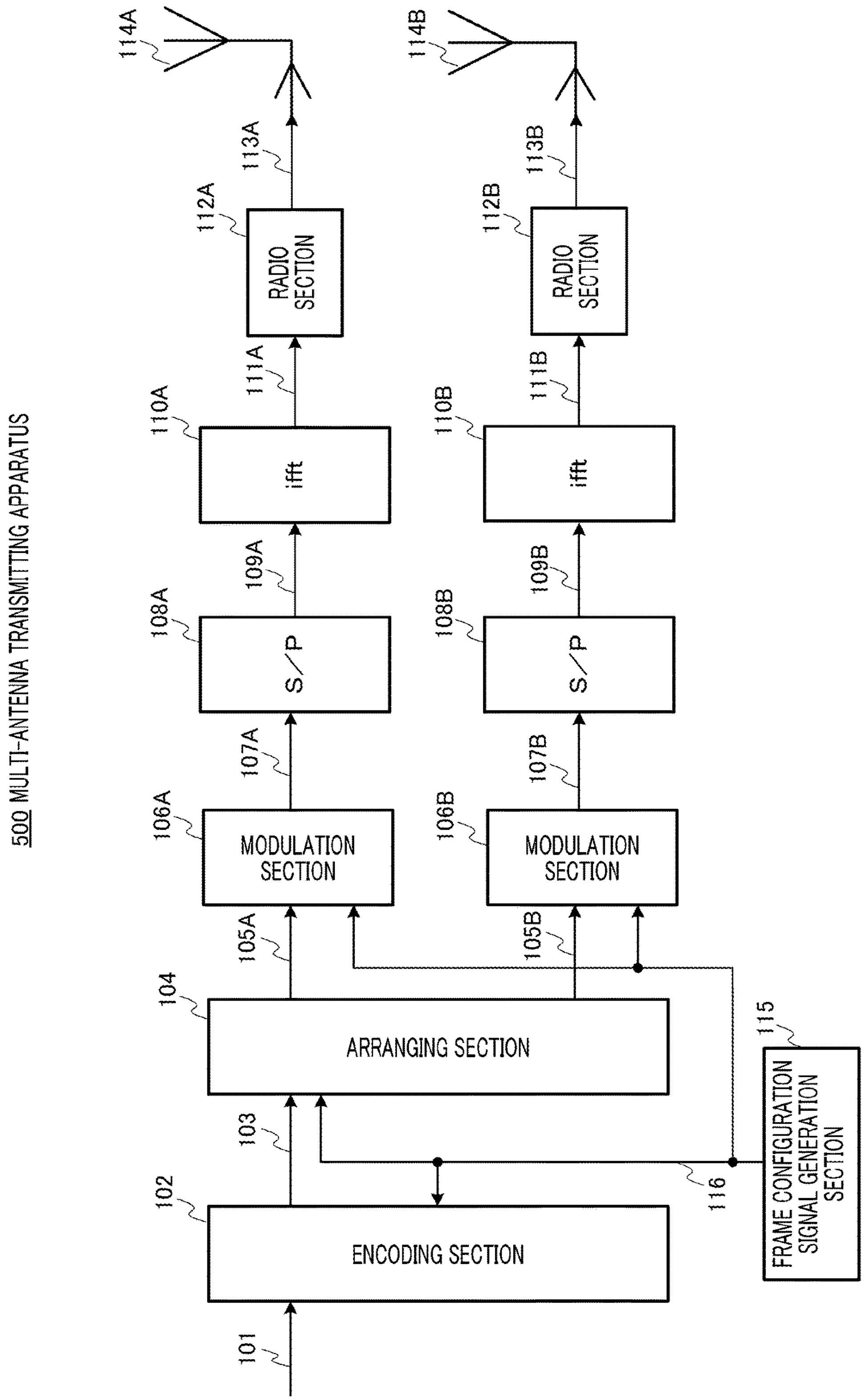
FIG. 17 is a block diagram showing another example of the configuration of a multi-antenna transmitting apparatus of Embodiment 2.

FIG. 17 shows an example of such a configuration. In FIG. 17, in which parts corresponding to those in FIG. 9 are assigned the same reference codes as in FIG. 9, encoding section 102 and arranging section 104 in multi-antenna transmitting apparatus 500 are the only points of difference from multi-antenna transmitting apparatus 100.

Encoding section 102 has data 101 and control signal 116 as input, executes encoding based on control signal 116, and outputs post-encoding data 103. Arranging section 104 has post-encoding data 103 and control signal 116 as input, arranges post-encoding data 103 based on frame configuration information contained in control signal 116, and supplies post-arrangement data 105A and 105B to modulation sections 106A and 106B respectively.

Figure 18:
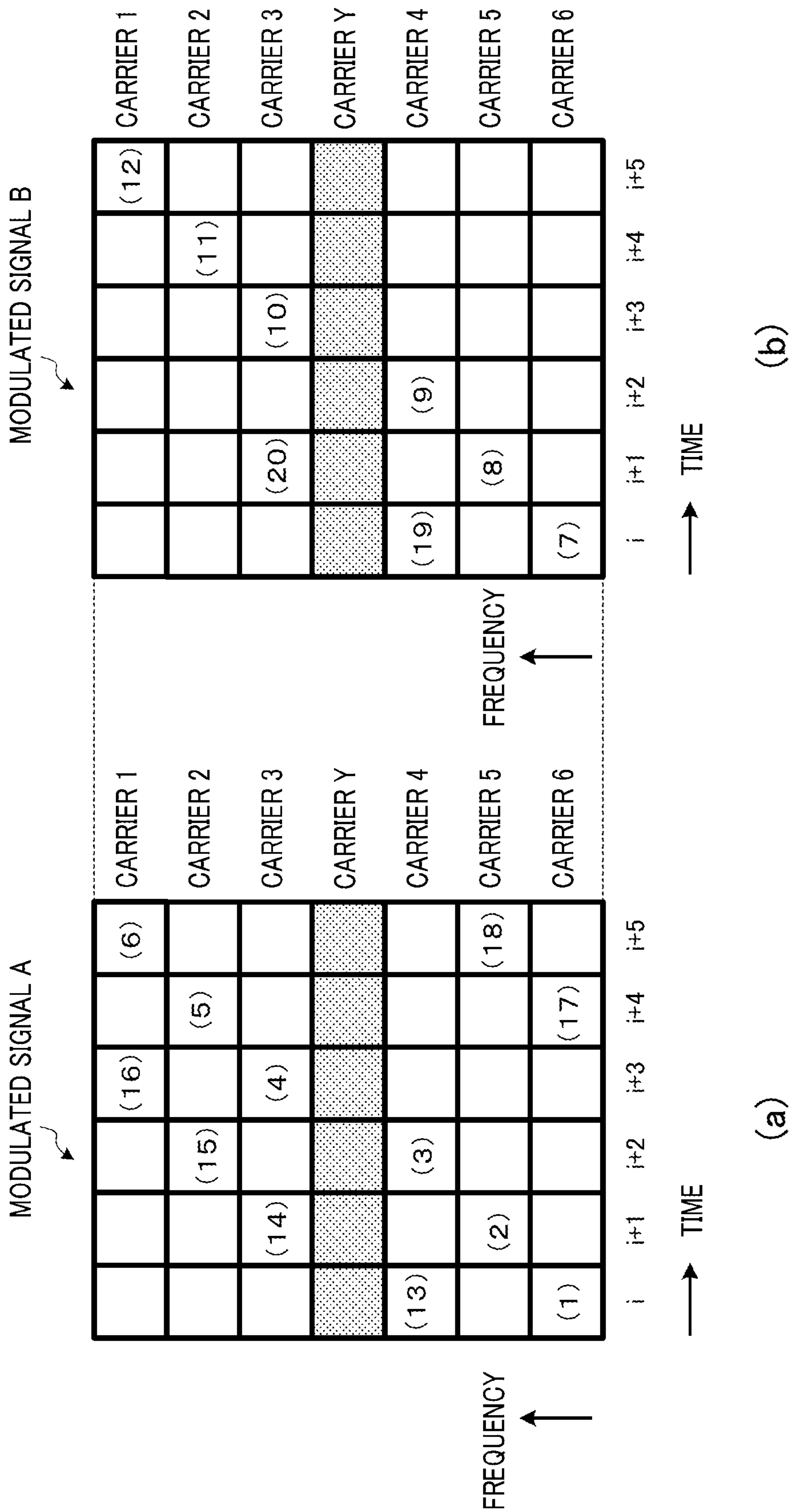
FIG. 18 is a drawing showing an example of arrangement processing of data after encoding.
Figure 19:
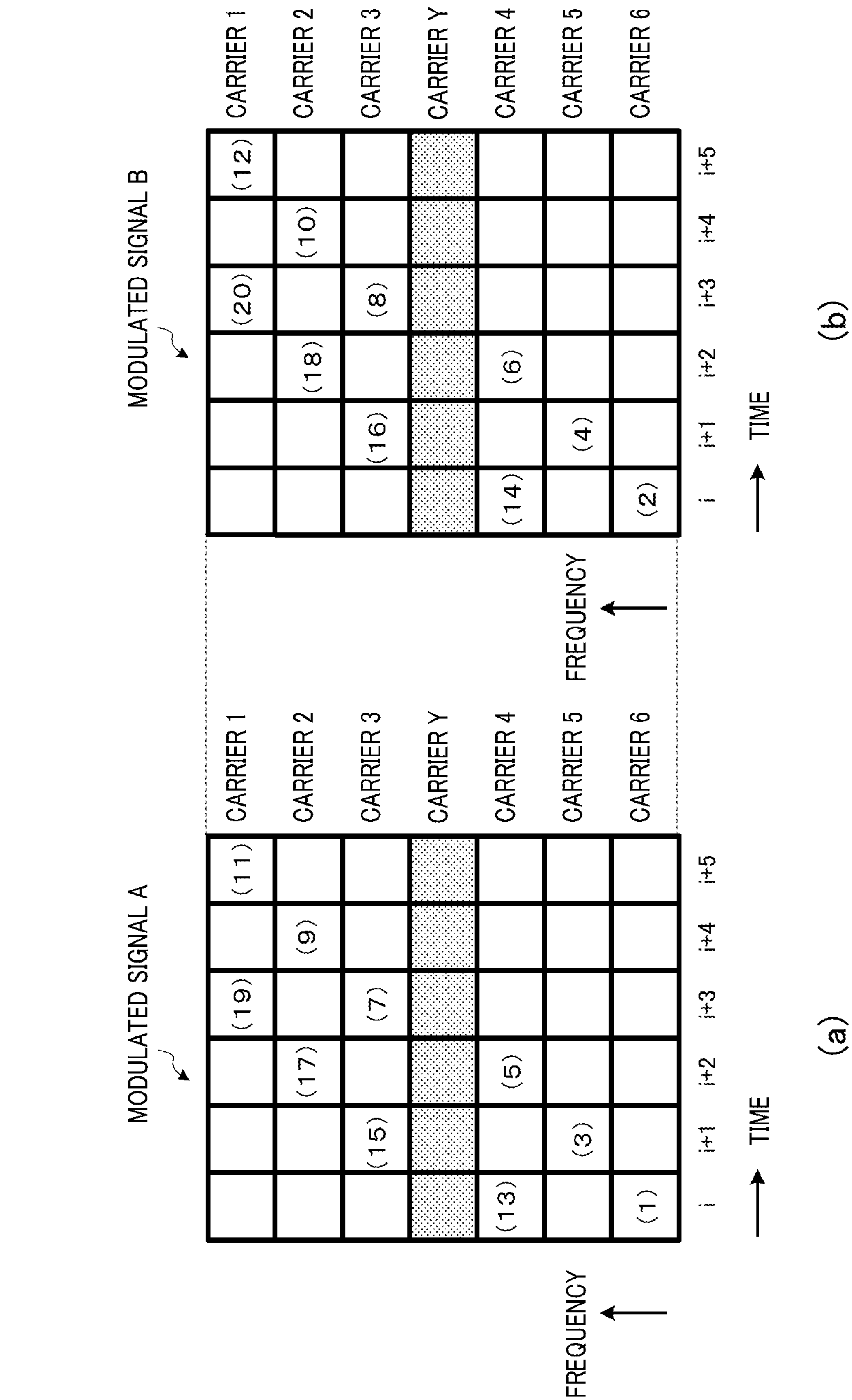
FIG. 19 is a drawing showing an example of arrangement processing of data after encoding.
Figure 20:
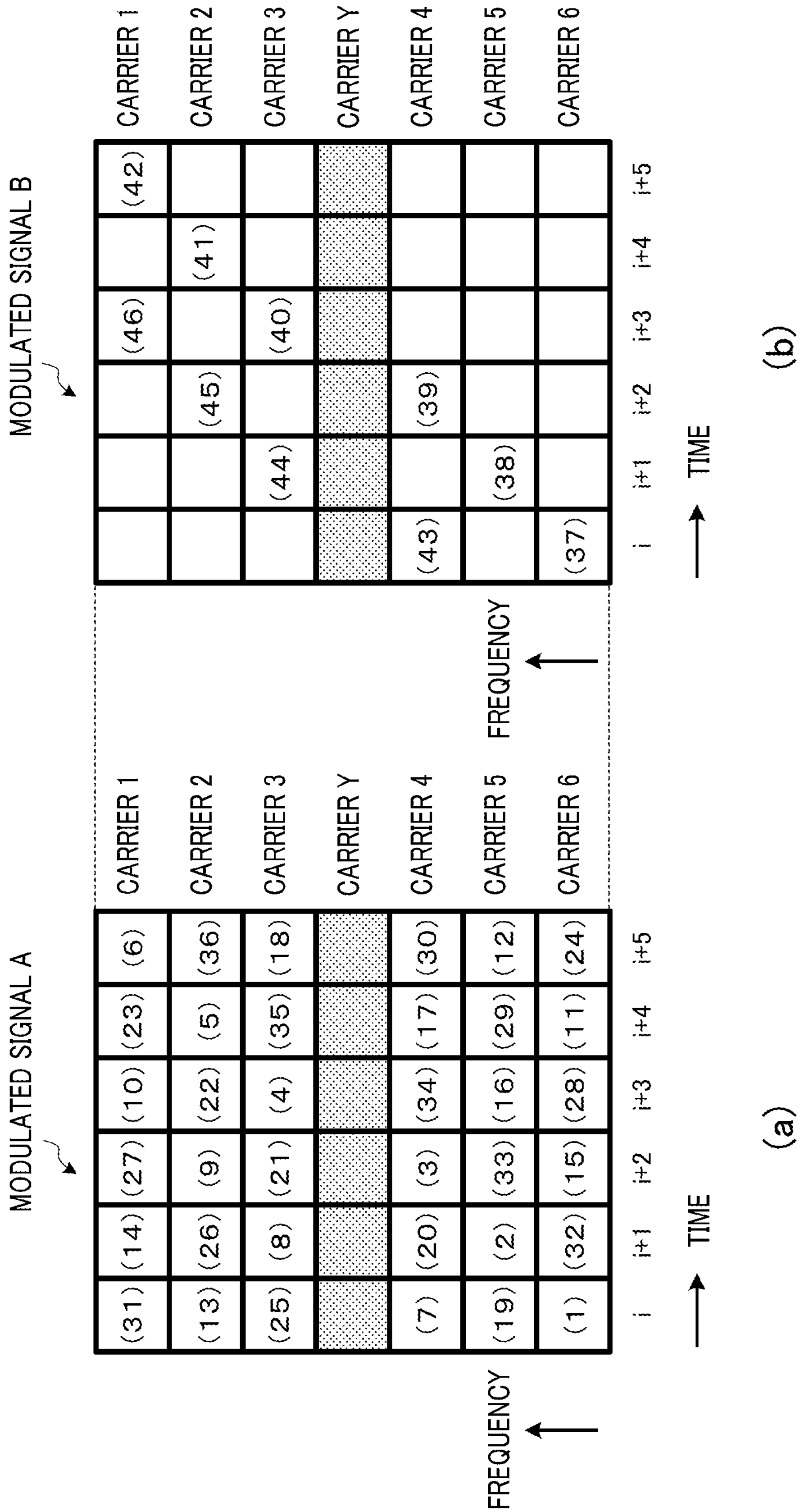
FIG. 20 is a drawing showing an example of arrangement processing of data after encoding.

FIG. 18, FIG. 19, and FIG. 20 show examples of arrangement processing of data after encoding by arranging section 104.

In FIG. 18, 6-bit data after encoding is first assigned to modulated signal A data symbols of different times (corresponding to (1), (2), (3), (4), (5), (6) in FIG. 18). Then 6-bit data after encoding is assigned to modulated signal B data symbols of different times (corresponding to (7), (8), (9), (10), (11), (12) in FIG. 18). Next, 6-bit data after encoding is assigned to modulated signal A. In this way, data after encoding is assigned to data symbols of different times, and is assigned alternately to modulated signal A and modulated signal B. By this means, not only can the same effect be obtained as in the assignment examples shown in FIG. 15 and FIG. 16, but in addition, since assignment is performed to modulated signal A and modulated signal B alternately, a further effect can be achieved of being able to obtain spatial diversity gain.

In FIG. 19, data assignment is performed alternately to modulated signal A and modulated signal B. At this time, 6-bit data in which only odd-numbered items have been extracted, or 6-bit data in which only even-numbered items have been extracted, is placed in symbols of different times. This is clear if, for example, data symbols (1), (3), (5), (7), (9), (11) of modulated signal A are looked at. By this means, not only can the same effect be obtained as in the assignment examples shown in FIG. 15 and FIG. 16, but in addition, since assignment is performed to modulated signal A and modulated signal B alternately, a further effect can be achieved of being able to obtain spatial diversity gain.

In FIG. 20, data is first assigned to modulated signal A, and then data is assigned to modulated signal B. These are then placed in symbols of different times, taking 6 bits after encoding as a unit. By this means, the same effect can be obtained as in the assignment examples shown in FIG. 15 and FIG. 16.

Figure 21:
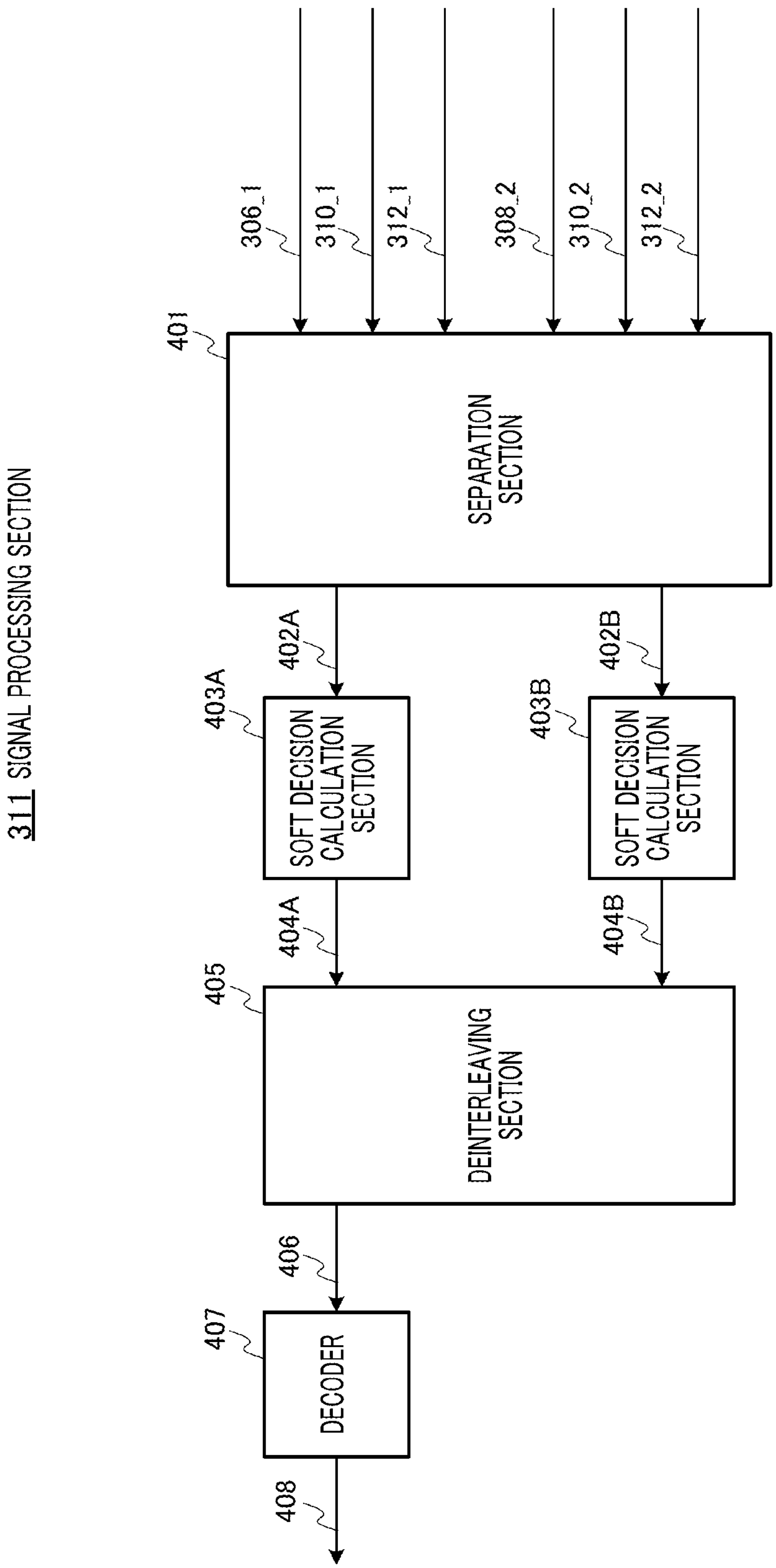
FIG. 21 is a block diagram showing the configuration of a signal processing section.

FIG. 21 shows the configuration of the signal processing section of a multi-antenna receiving apparatus that receives and demodulates signals transmitted from multi-antenna transmitting apparatus 500 configured as shown in FIG. 17. The overall configuration of the multi-antenna receiving apparatus here may be as shown in FIG. 11, and signal processing section 311 may be configured as shown in FIG. 21.

Signal processing section 311 in FIG. 21, in which parts corresponding to those in FIG. 13 are assigned the same reference codes as in FIG. 13, has a similar configuration to signal processing section 311 in FIG. 13, differing only in having only one deinterleaving section 405 and one decoder 407. Deinterleaving section 405 has modulated signal A soft decision value 404A and modulated signal B soft decision value 404B as input, performs deinterleaving according to the frame configuration (the reverse of the processing performed by arranging section 104 in FIG. 17), and obtains post-deinterleaving soft decision value 406. Decoder 407 has post-deinterleaving soft decision value 406 as input, and obtains receive data 408 by decoding this post-deinterleaving soft decision value 406.

Embodiment 3

In this embodiment, an actual mode is described for a case in which LDPC encoding is performed by a multi-antenna transmitting apparatus. In addition, an actual mode is described for a case in which adaptive modulation is performed.

Figure 22:
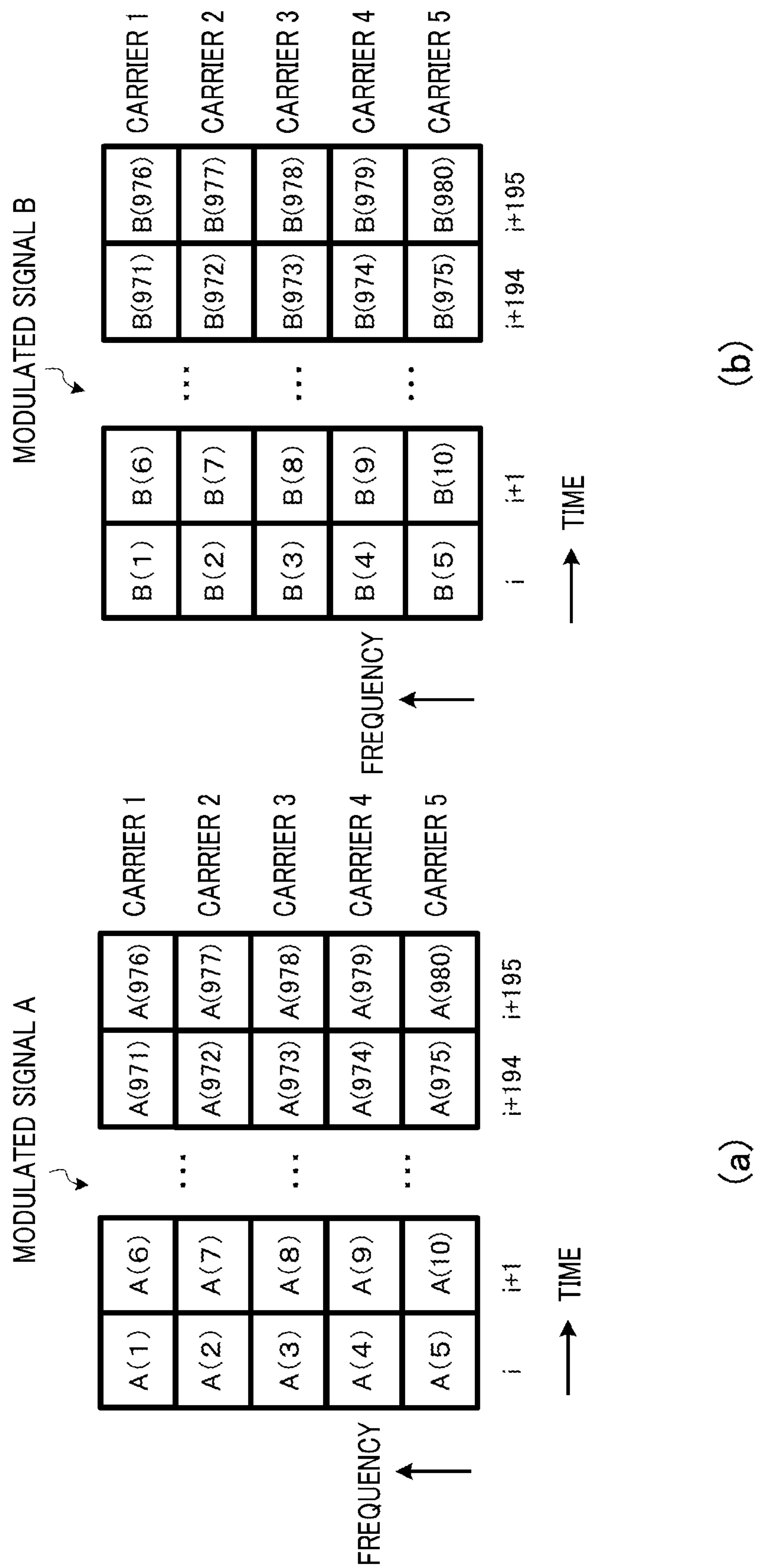
FIG. 22 is a drawing showing an example of arrangement processing of LDPC encoded data.

FIG. 22 shows an example of assignment of post-encoding data to data symbols by arranging sections 104A and 104B when encoding sections 102A and 102B in FIG. 9 perform LDPC encoding with respective post-encoding block sizes of 980 bits. In this case, 980 bits in one encoded block are assigned to 980 modulated signal A symbols A(1), A(2), . . . , A(980). Here, (1), (2), . . . , (980) indicate the data order. Similarly, 980 bits in one encoded block are assigned to 980 modulated signal B symbols B(1), B(2), . . . , B(980). Thus, data (bits) in one encoded block are assigned to a plurality of data symbols. By this means, burst errors can be suppressed more effectively than when data in one encoded block is assigned to a small number of data symbols.

Figure 23:
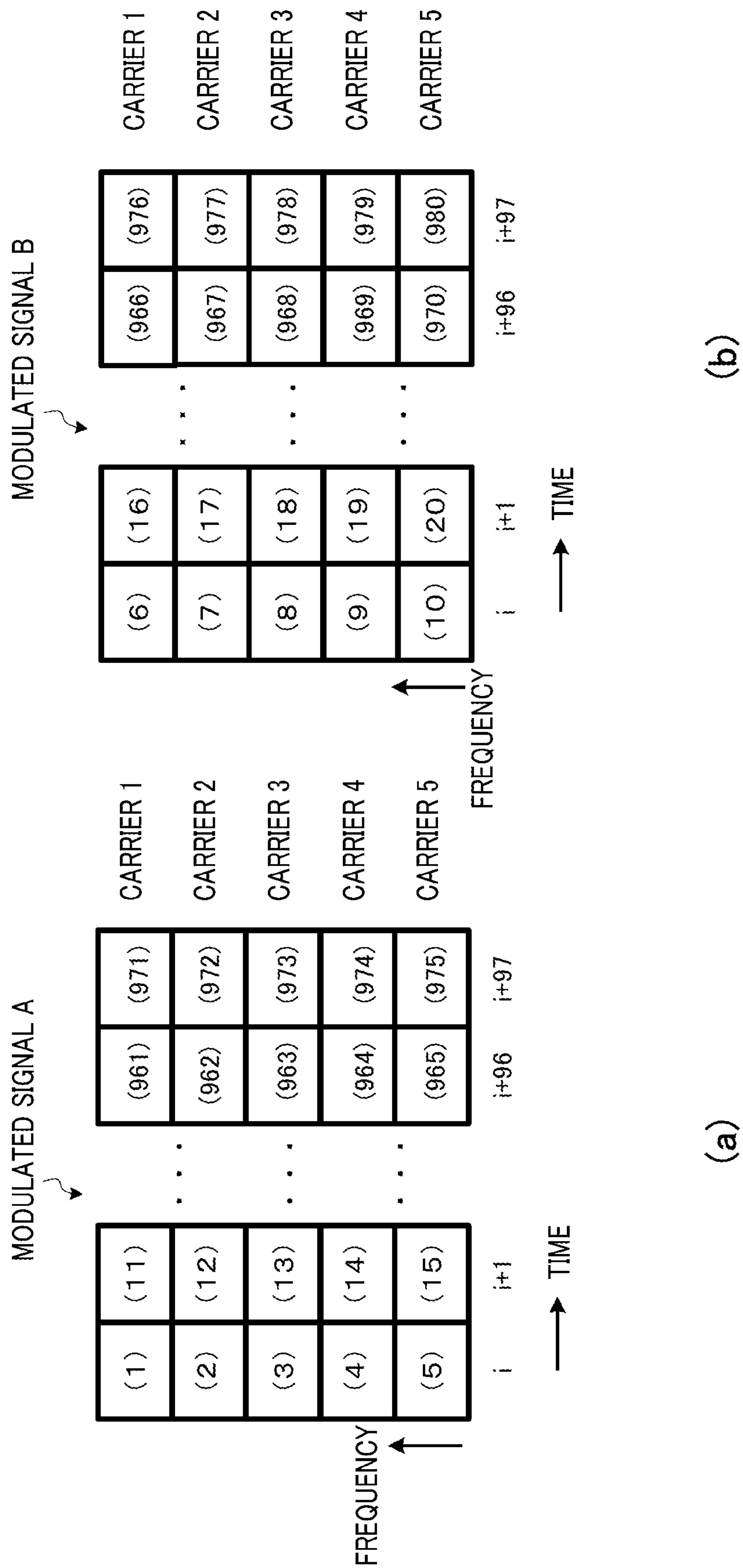
FIG. 23 is a drawing showing an example of arrangement processing of LDPC encoded data.

FIG. 23 shows an example of assignment of post-encoding data to data symbols by arranging section 104 when encoding section 102 in FIG. 17 performs LDPC encoding with a block size of 980 bits. In this case, 980 bits in one encoded block are assigned to 980 modulated signal A and modulated signal B symbols. Here, (1), (2), . . . , (980) indicate the data order. By assigning data (bits) in one encoded block to a plurality of data symbols and a plurality of antennas in this way, burst errors can be suppressed more effectively than when data in one encoded block is assigned to a small number of data symbols, and a further effect can also be achieved of being able to obtain spatial diversity gain.

Next, a mode will be described for a case in which the present disclosure is applied to a multi-antenna transmitting apparatus that performs adaptive modulation (that is, switches the modulation method) according to the communication conditions.

Figure 24:
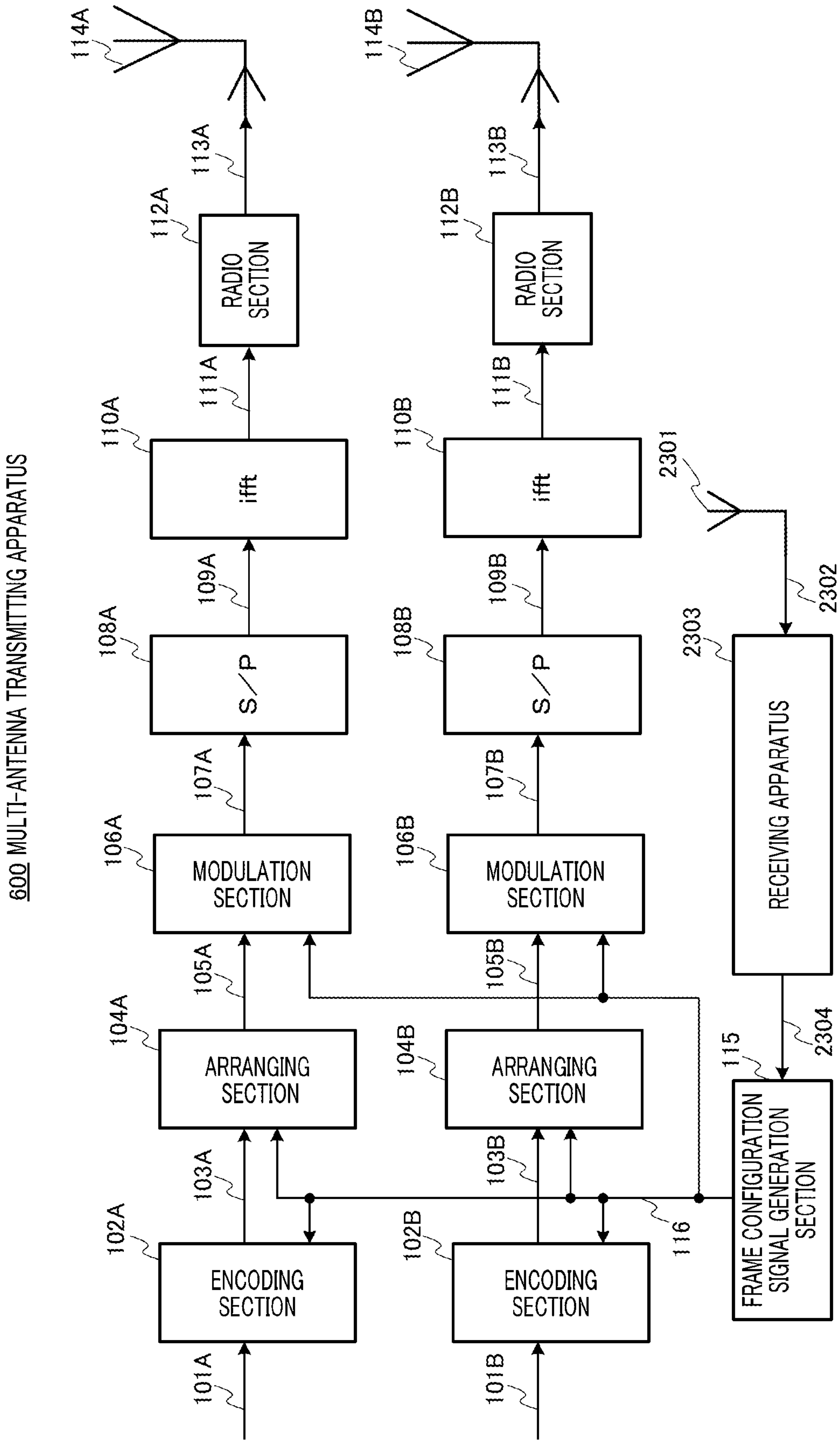
FIG. 24 is a block diagram showing the configuration of a multi-antenna transmitting apparatus that performs adaptive modulation.

FIG. 24 shows the configuration of a multi-antenna transmitting apparatus that performs adaptive modulation. Multi-antenna transmitting apparatus 600 in FIG. 24, in which parts corresponding to those in FIG. 9 are assigned the same reference codes as in FIG. 9, is provided in a base station, for example. Receiving apparatus 2303 has received signal 2302 received by antenna 2301 as input, performs reception processing and obtains communication condition information transmitted by a communicating-party terminal (for example, information such as the bit error rate, packet error rate, frame error rate, received signal strength, and multipath conditions), determines the modulation method therefrom, and outputs this as control information 2304. Frame configuration signal generation section 115 has control information 2304 as input, determines the modulation method and frame configuration based on control information 2304, and sends these to modulation sections 106A and 106B, encoding sections 102A and 102B, and arranging sections 104A and 104B as frame configuration signal 116.

Arranging sections 104A and 104B change their arrangement according to the modulation method in the same way as described in Embodiment 1.

Figure 25:
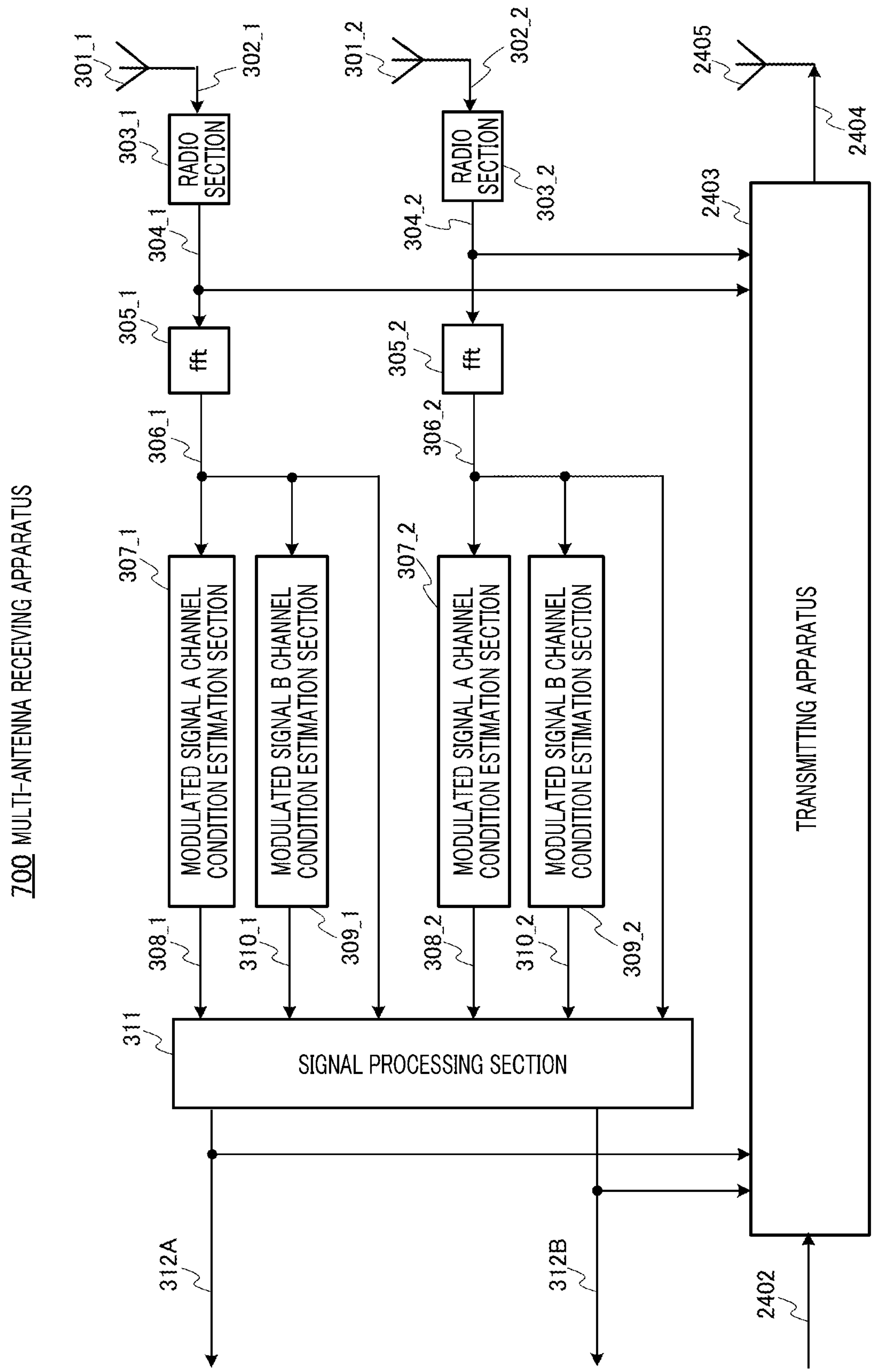
FIG. 25 is a block diagram showing the configuration of a multi-antenna receiving apparatus that receives an adaptive modulation signal.

FIG. 25 shows an example of the configuration of a communicating-party terminal that performs communication with multi-antenna transmitting apparatus 600. Transmitting apparatus 2403 of multi-antenna receiving apparatus 700 in FIG. 25, in which parts corresponding to those in FIG. 11 are assigned the same reference codes as in FIG. 11, has transmit data 2402, baseband signals 304_1 and 304_2, and receive data 312A and 312B as input, and, for example, estimates the received signal strength from baseband signals 304_1 and 304_2, finds the bit error rate, packet error rate, and frame error rate from receive data 312A and 312B, forms transmit signal 2404 containing these items of information and transmit data, and outputs this as a radio wave from antenna 2405. By this means, the modulation method of the base station (multi-antenna transmitting apparatus 600) is changed.

The method of changing the modulation method is not limited to this, and a similar effect can be achieved by having a communicating-party terminal specify a desired modulation method, or having the base station receive a modulated signal transmitted from a communicating-party terminal, and determine the modulation method of a modulated signal to be transmitted based on the reception state of the received signal.

Embodiment 4

In this embodiment, a contrivance of the assignment method of last block data after LDPC encoding will be described. In FIG. 26, the vertical axis indicates frequency, with data being transmitted using carriers 1 to n, and the horizontal axis indicates time.

In FIG. 26, it is assumed that one packet of data is first transmitted using 16QAM. Therefore, four post-encoding blocks #1 to #4 are transmitted in parallel in 980 symbols, as in the method described in Embodiment 1, for example. Assuming that the quantity of one packet of data is variable, the amount of data transmitted last will not necessarily be an amount that fills four encoded blocks in 16QAM. What is important here is for one data symbol to be configured by collecting together intra-block block encoded data of different encoded blocks, and the configuration method of Embodiment 5 described later herein may be used.

Figure 26A:
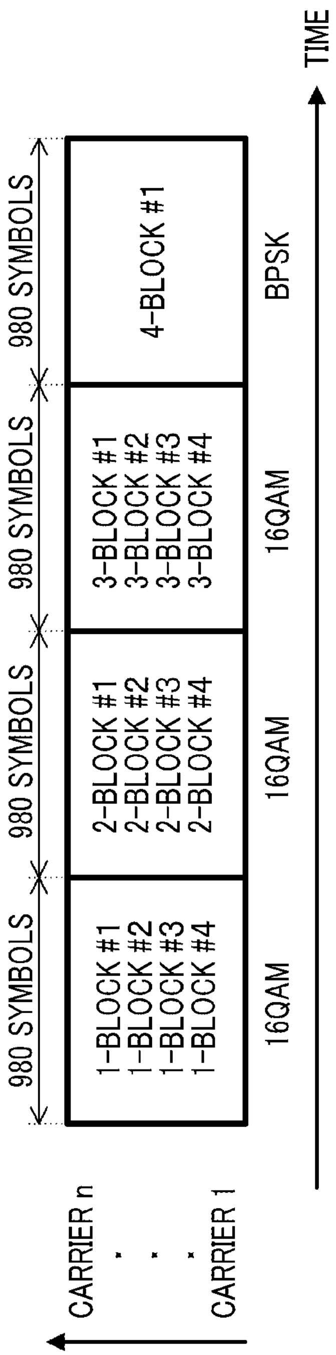

In this embodiment, if the number of encoded blocks transmitted last is one, BPSK is selected as the modulation method of the last block, and only one encoded block, #1, is transmitted, as shown in FIG. 26A.

Figure 26B:
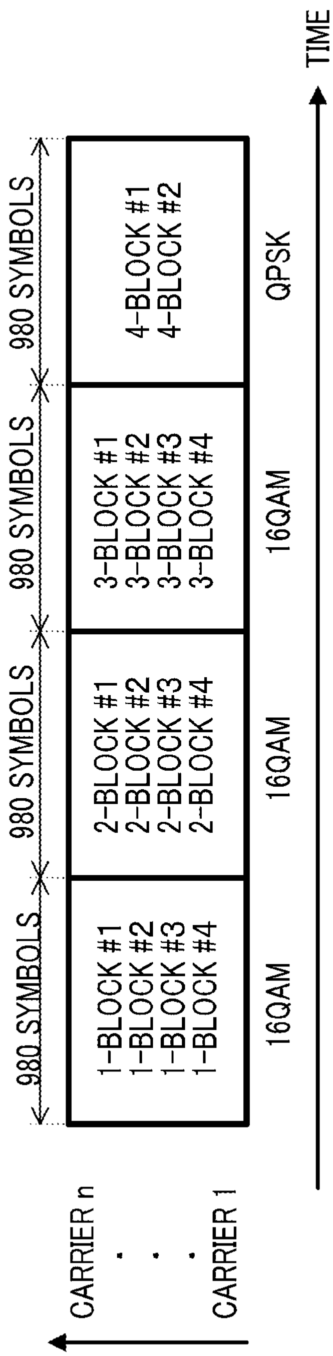

If the number of encoded blocks transmitted last is more than one and not more than two, QPSK is selected as the modulation method of the last blocks, and two encoded blocks, #1 and #2, are transmitted, as shown in FIG. 26B. In this case, the arrangement as described in FIG. 5(*b*), FIG. 6(*b*), FIG. 7(*b*), or FIG. 8(*b*) may be performed.

Figure 26C:
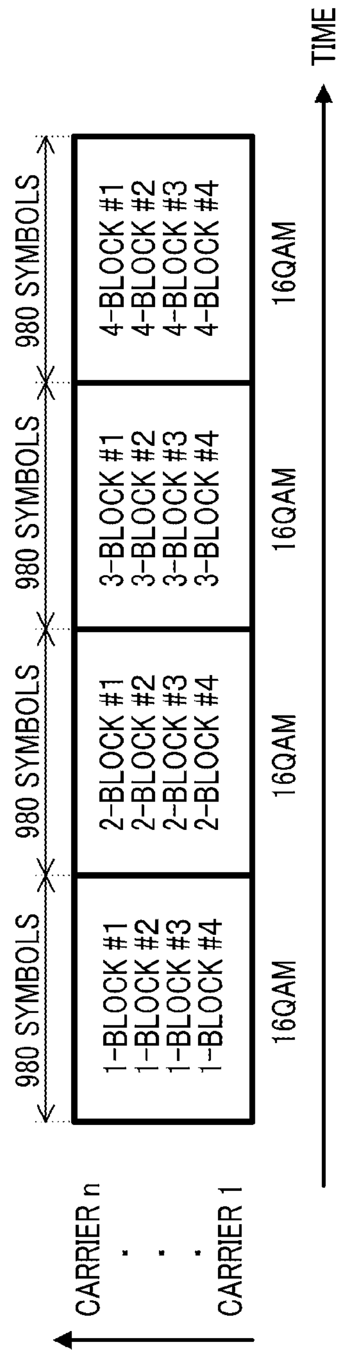

If the number of encoded blocks transmitted last is more than two, 16QAM is selected as the modulation method of the last blocks, and four encoded blocks, #1 to #4, for example, are transmitted, as shown in FIG. 26C. In this case, the arrangement as described in FIG. 5(*c*), FIG. 6(*c*), FIG. 7(*c*), or FIG. 8(*c*) may be performed.

By transmitting in this way, one encoded block of data is always transmitted by means of 980 symbols, enabling the influence of fading notches to be reduced, and reception quality to be improved.

As another assignment method, 16QAM may be selected regardless of the number of encoded blocks, and "0" dummy data, for example, may be transmitted for the entire deficient amount of data. With such transmission, one encoded block is still always transmitted by means of 980 symbols, enabling the influence of fading notches to be reduced, and reception quality to be improved.

The above operations are extremely important in order to make reception quality as uniform as possible when communication based on packet is performed. That is to say, if data of the last encoded block is transmitted as fewer than 980 symbols, the error rate performance of the last encoded block will degrade, and the probability of packet error occurrence will increase. The method described in this embodiment is effective in preventing this.

Examples for Comparison

Using FIG. 27, conventionally commonly implemented assignment methods and their drawbacks will now be described for comparison with the method of uniformly assigning encoded block data to a plurality of symbols according to the present disclosure.

Figures 27A, 27B, 27C:
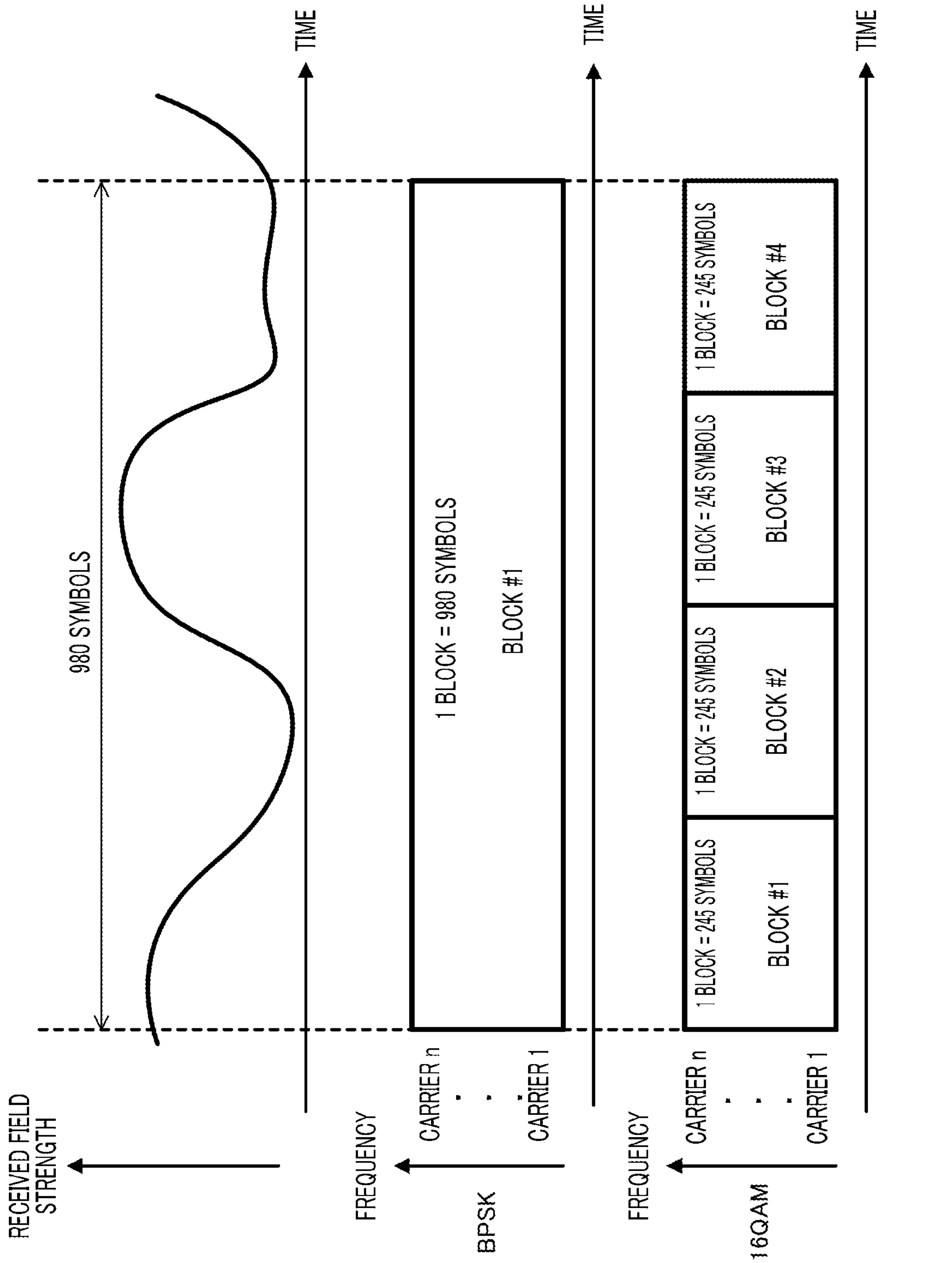

FIG. 27A shows the received field strength state in a 980-symbol interval as an example of the relationship between time and received field strength as a communication condition.

FIG. 27B shows an example of a frame configuration when the modulation method is BPSK. As an example, FIG. 27B shows the case of a multicarrier transmission method that uses carrier 1 to carrier n, such as OFDM for instance. Therefore, the vertical axis is the frequency domain, on which carriers 1 to n are represented. When the modulation method is BPSK, 980 symbols are necessary to transmit one post-encoding block (block #1) as shown in FIG. 27B.

On the other hand, when the modulation method is 16QAM, since 4 bits can be transmitted in one symbol with 16QAM, 245 symbols are necessary to transmit one post-encoding block. Therefore, if 980 symbols are used, four blocks— block #1, block #2, block #3, and block #4— can be transmitted.

Conventionally, as with BPSK, the usual order of assignment in the time direction is block #1 symbols, block #2 symbols, block #3 symbols, block #4 symbols, as shown in FIG. 27C.

When BPSK is used as in FIG. 27B, there are times when the received field strength is high and times when the received field strength is low for one encoded block even with the communication conditions as in FIG. 27A, and therefore if decoding is performed in encoded block units the possibility of errors being corrected through the influence of data with high received field strength is high.

On the other hand, when 16QAM is used as in FIG. 27C, the received field strength is high and therefore reception quality is good for block #1 and block #3, whereas the received field strength is low and therefore reception quality is poor for block #2 and block #4. Since the number of symbols required by one encoded block decreases as the number of modulation multi-values of the modulation method increases in this way, the system is susceptible to the influence of received field strength notches due to fading. That is to say, the system is susceptible to a fall in reception quality due to notches.

As explained in the above embodiments, a transmitting apparatus of the present disclosure effectively solves this problem without changing the code length (block size).

Embodiment 5

In this embodiment, a simple variant of Embodiment 1 will be described. That is to say, the basic configuration whereby "one data symbol is configured by collecting together intra-block block encoded data of different encoded blocks" is the same in this embodiment as in Embodiment 1, with this embodiment presenting a variant thereof.

An example of the configuration of a transmitting apparatus in this embodiment is as shown in FIG. 2, and the operation thereof is also similar to that of Embodiment 1. Furthermore, the configuration relating to LDPC code generation processing by encoding section 11 in this embodiment is as shown in FIG. 3, and the operation thereof is also similar to that of Embodiment 1.

In this embodiment, a case is described by way of example in which modulation processing by modulation section 15 is QPSK and 16QAM. That is to say, in the case of this embodiment, it is assumed that modulation section 15 performs signal point arrangement and bit arrangement such as shown in FIG. 4.

FIG. 28 shows to which post-modulation symbols a transmitting apparatus of this embodiment assigns bits in each LDPC encoded block. Specifically, FIG. 28 shows the symbols in which encoded data in one block (data after LDPC encoding) configured by means of 980 bits are placed. The horizontal axis indicates the symbol time sequence, and the vertical axis indicates the bit numbers configuring one symbol—that is, b1 and b2 in the case of QPSK, and b1, b2, b3, and b4 in the case of 16QAM.

In FIG. 28, #X-Y indicates the Y'th bit (bit number Y among 980 bits) of the X'th encoded block. For example, #1-1 indicates the 1st bit of the 1st encoded block. Similarly, #2-979 indicates the 979th bit of the 2nd encoded block.

Figures 28A, 28B, 28C:
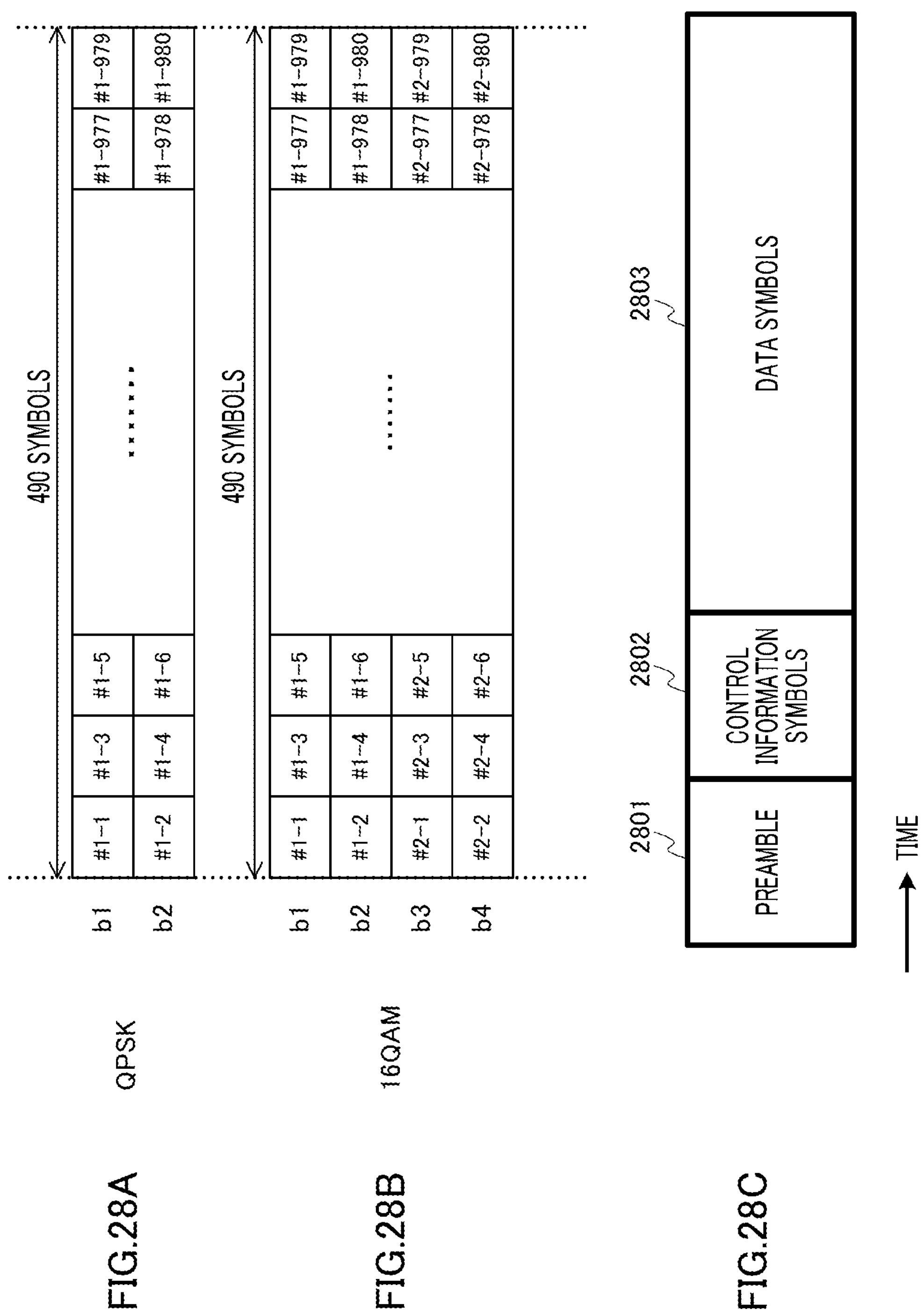

FIG. 28A shows bit assignment to each symbol when the modulation method is QPSK. In this embodiment, when the modulation method is QPSK, two bits (b1, b2) are transmitted in one symbol, and data of the 1st encoded block is transmitted using both bits. Therefore, one encoded block configured by means of 980 bits is transmitted using 490 symbols.

FIG. 28B shows bit assignment to each symbol when the modulation method is 16QAM. When the modulation method is 16QAM, four bits (b1, b2, b3, b4) are transmitted in one symbol, and therefore two post-encoding blocks configured by means of 980 bits can be transmitted by means of 490 symbols. A characteristic of bit assignment to each symbol here is that encoded data in one block are assigned to a plurality of symbols. Specifically, data #1-1 to #1-980 of post-encoding block #1 are assigned to bits b1 and b2 of 980 16QAM symbols, and data #2-1 to #2-980 of post-encoding block #2 are assigned to bits b3 and b4 of 980 symbols.

By this means, bits (data) in each encoded block can be dispersed temporally (or on a frequency basis (particularly in the case of OFDM or suchlike multicarrier transmission), or spatially (particularly in the case of transmission scheme using MIMO scheme)) across a number of symbols equal to that of QPSK, enabling an overall drop in the quality of data within an encoded block because of a notch due to fading to be avoided. Thus, since the probability of most data within an encoded block being erroneous in a burst fashion is low, the error rate performance can be improved.

FIG. 28C shows an example of a frame configuration in this embodiment when single-carrier transmission is used. Preamble 2801 comprises symbols used by a receiving apparatus, for example, to perform signal detection, frequency offset estimation and compensation, and gain control. Control information symbols 2802 are symbols for transmitting modulation method information, coding rate information, and packet length information, for example. Data symbols 2803 are symbols for transmitting data, with data being transmitted using the configuration in FIG. 28A when the modulation method is QPSK, and being transmitted using the configuration in FIG. 28B when the modulation method is 16QAM.

Figure 29:
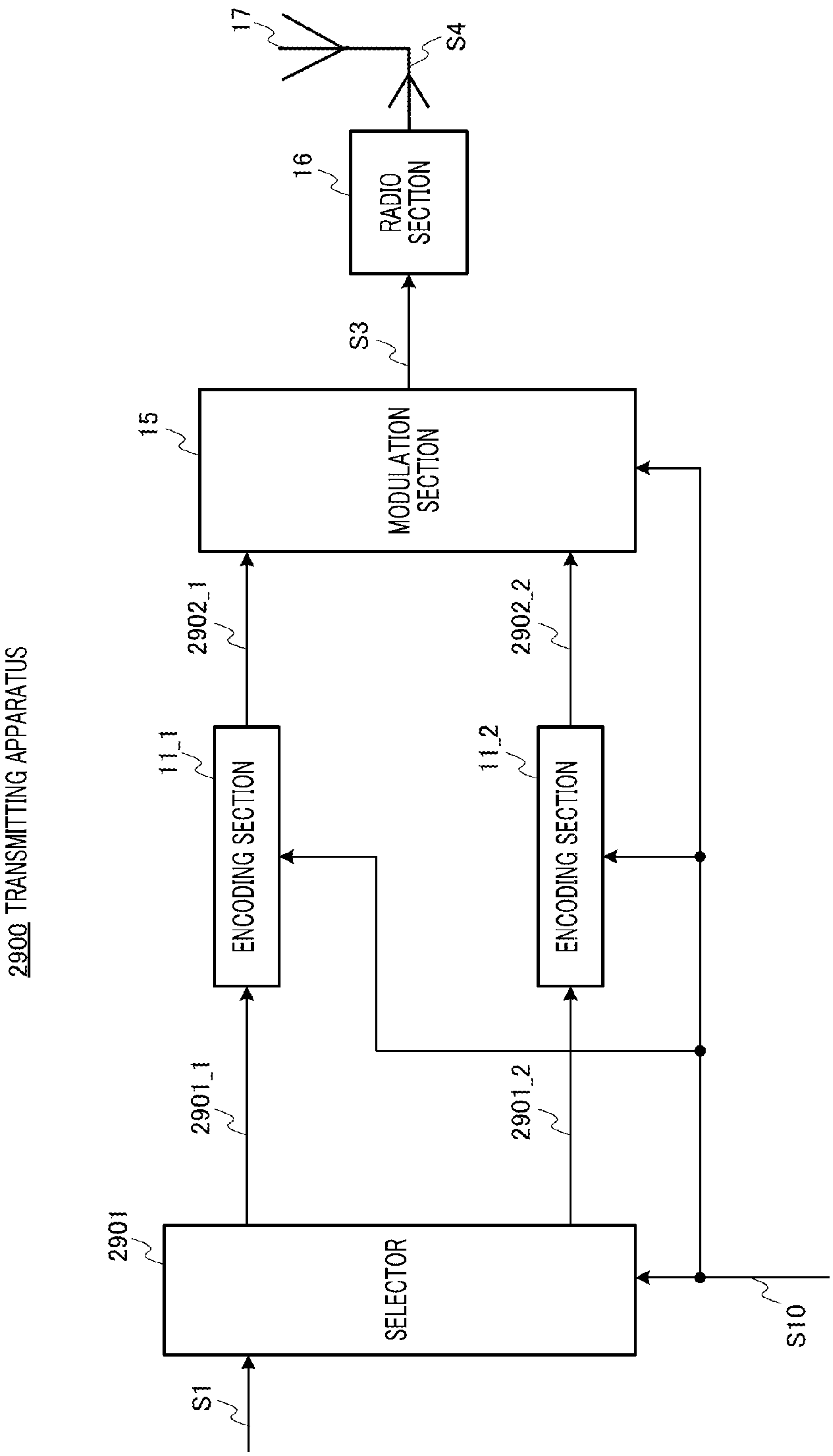
FIG. 29 is a block diagram showing the configuration of a transmitting apparatus of Embodiment 5.

FIG. 29 shows an example of the configuration of a transmitting apparatus of this embodiment. In FIG. 29, items that operate in the same way as in FIG. 2 are assigned the same reference codes as in FIG. 2. Transmitting apparatus 2900 has selector 2901. Selector 2901 has transmit data S1 and control signal S10 as input, and assigns transmit data S1 according to modulation method information included in control signal S10. In this embodiment, when the modulation method is QPSK, selector 2901 outputs assignment data #1 to encoding section 11_1 as output signal 2901_1. At this time, selector 2901 does not output output signal 2901_2 to encoding section 112. On the other hand, when the modulation method is 16QAM, selector 2901 outputs assignment data #1 to encoding section 11_1 as output signal 2901_1, and also outputs assignment data #2 to encoding section 11_2 as output signal 2901_2.

Encoding sections 11_1 and 11_2 encode their respective input data, and output post-encoding data 2902_1 and 2902_2. When the modulation method is QPSK, encoding section 11_2 does not perform an encoding operation. Encoding sections 11_1 and 11_2 can obtain modulation method information from control signal S10.

Modulation section 15 has post-encoding data 2902_1 and 2902_2 and control signal S10 as input, obtains transmit symbols—that is, baseband signal S3— by performing modulation according to the modulation method of control signal S10, and outputs this baseband signal S3 to radio section 16. At this time, modulation section 15 also adds a preamble and control information symbols. Subsequent operation of radio section 16 is the same as in FIG. 2.

In transmitting apparatus 2900 in FIG. 29, encoding sections 11_1 and 11_2 are provided in parallel, and the higher the number of modulation multi-values of the modulation method, the more encoding sections are operated in parallel. By this means, a higher transmission processing speed is possible than with the configuration shown in FIG. 2. A particular advantage is that even if a switch is made to a modulation method with a large number of modulation multi-values, a symbol rate equal to that of a modulation method with a small number of modulation multi-values can be maintained. However, even with the configuration shown in FIG. 2, it is possible to form a transmit frame such as shown in FIG. 28. Although the configuration in FIG. 2 achieves a lower transmission processing speed than the configuration in FIG. 29, it offers a lower computational complexity since it has fewer encoding sections.

Figure 30:
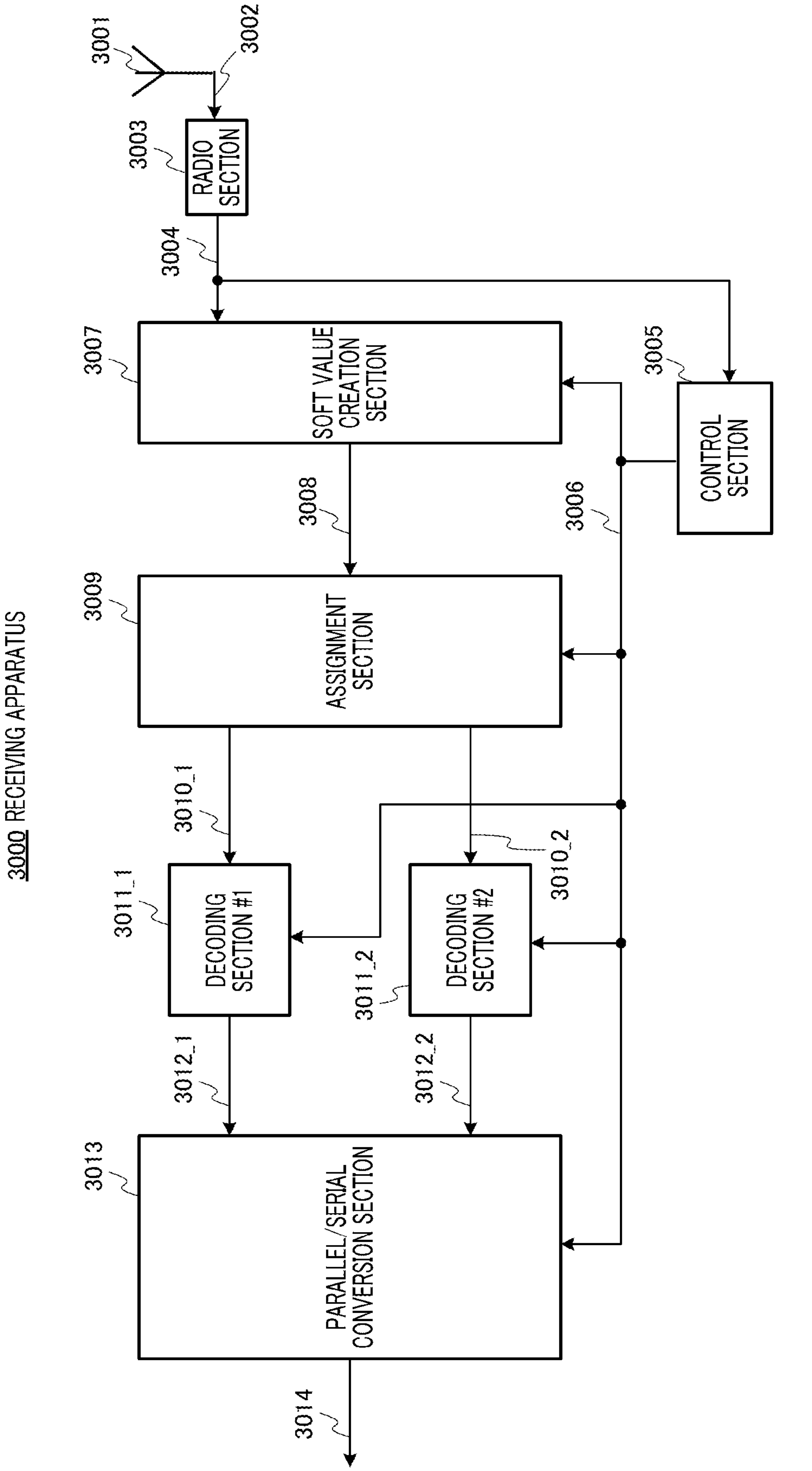
FIG. 30 is a block diagram showing the configuration of a receiving apparatus of Embodiment 5.

FIG. 30 shows an example of the configuration of a receiving apparatus in this embodiment. In receiving apparatus 3000, received signal 3002 received by antenna 3001 is input to radio section 3003, baseband signal 3004 is obtained by executing frequency conversion, quadrature demultiplexing, and suchlike processing on received signal 3002, and this baseband signal 3004 is output.

Control section 3005 has baseband signal 3004 as input, detects preamble 2801 and control information symbols 2802 shown in FIG. 28C, performs signal detection, frequency offset estimation, and channel estimation based on these symbols and also extracts modulation method information, and outputs control signal 3006 including these items of information to the other sections.

Soft value creation section 3007 has baseband signal 3004 and control signal 3006 as input, obtains soft value signal 3008 by calculating a soft value of each bit for decoding from channel estimation information included in control signal 3006 and baseband signal 3004, and outputs this soft value signal 3008.

Assignment section 3009 has control signal 3006 and soft value signal 3008 as input, and if modulation method information included in control signal 3006 indicates QPSK, outputs soft value signal 3008 to decoding section 3011_1 as soft value #1 signal 3010_1. On the other hand, if the modulation method information indicates 16QAM, assignment section 3009 assigns soft value signal 3008 to soft value #1 signal 3010_1 and soft value #2 signal 3010_2, and outputs these to decoding sections 3011_1 and 3011_2 respectively. Here, soft value #1 signal 3010_1 is a soft value relating to block #1 in FIG. 28A and FIG. 28B, and soft value #2 signal 3010_2 is a soft value relating to block #2 in FIG. 28B.

Decoding section 3011_1 has soft value #1 signal 3010_1 and control signal 3006 as input, obtains post-decoding data #1 signal 3012_1 by performing decoding based on soft value #1 signal 3010_1, and outputs this post-decoding data #1 signal 3012_1. This post-decoding data #1 signal 3012_1 corresponds to #1 block data in FIG. 28A and FIG. 28B.

Decoding section 3011_2 has soft value #2 signal 3010_2 and control signal 3006 as input, obtains post-decoding data #2 signal 3012_2 by performing decoding based on soft value #2 signal 3010_2, and outputs this post-decoding data #2 signal 3012_2. This post-decoding data #2 signal 3012_2 corresponds to #2 block data in FIG. 28B. Decoding section 3011_2 does not perform a decoding operation when the modulation method is QPSK.

Parallel/serial conversion section 3013 has post-decoding data #1 signal 3012_1, post-decoding data #2 signal 3012_2, and control signal 3006 as input, obtains post-rearrangement data 3014 by performing rearrangement according to the modulation method, and outputs this post-rearrangement data 3014.

By means of the above configuration, when a modulated signal with a frame configuration such as shown in FIG. 28 is received from transmitting apparatus 10 or 3000 having the configuration as shown in FIG. 2 or FIG. 29, post-rearrangement data 3014 corresponding to transmit data S1 can be obtained from the received signal.

In particular, in a receiving apparatus of this embodiment, decoding sections are provided in parallel as shown in FIG. 30, and the higher the number of modulation multi-values of a received signal, the more decoding sections are operated in parallel. By this means, a higher reception processing speed is possible. A particular advantage is that even if the number of modulation multi-values of a received signal is large, reception processing can be performed at a symbol rate equal to that of a received signal with a small number of modulation multi-values. Furthermore, even if a modulated signal with a frame configuration such as shown in FIG. 28 is transmitted in order to improve the error rate performance on the receiving side, use of apparatus 3000 having the configuration shown in FIG. 30 enables reception processing to be performed without lowering the symbol rate.

As described above, according to this embodiment reception quality can be improved, as with Embodiment 1, by arranging block encoded data so that one symbol is configured by collecting together block encoded data of more blocks, in the same way as in Embodiment 1.

Furthermore, according to this embodiment, by placing a plurality of encoding sections in parallel on the transmitting side, and providing for more encoding sections to be operated in parallel the larger the number of modulation multi-values of the modulation method, even if a switch is made to a modulation method with a large number of modulation multi-values, a symbol rate equal to that of a modulation method with a small number of modulation multi-values can be maintained. Also, by placing a plurality of decoding sections in parallel on the receiving side, and providing for more decoding sections to be operated in parallel the larger the number of modulation multi-values of a received signal, even if the number of modulation multi-values of a received signal is large, reception processing can be performed at a symbol rate equal to that of a received signal with a small number of modulation multi-values. That is to say, a faster symbol rate can be handled easily, enabling faster data transmission to be implemented.

Figure 31A:
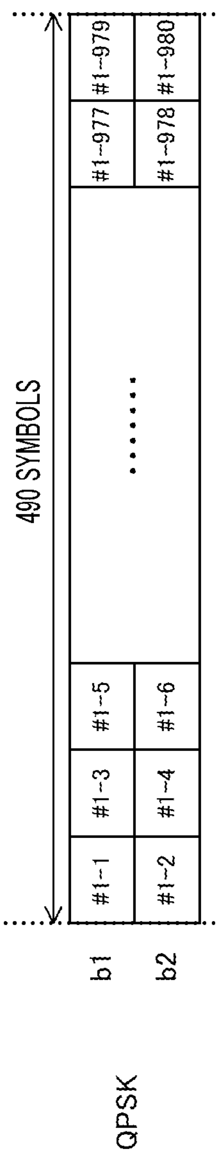
Figure 31B:
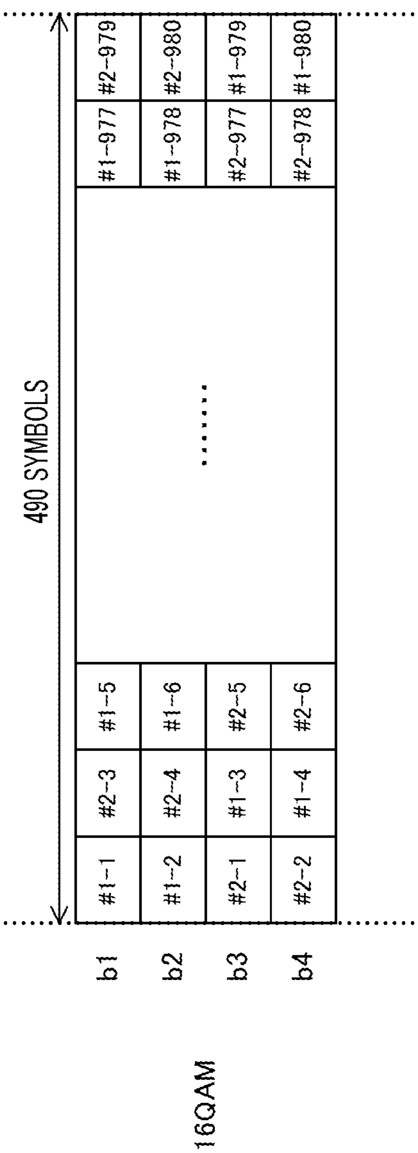
Figure 31C:
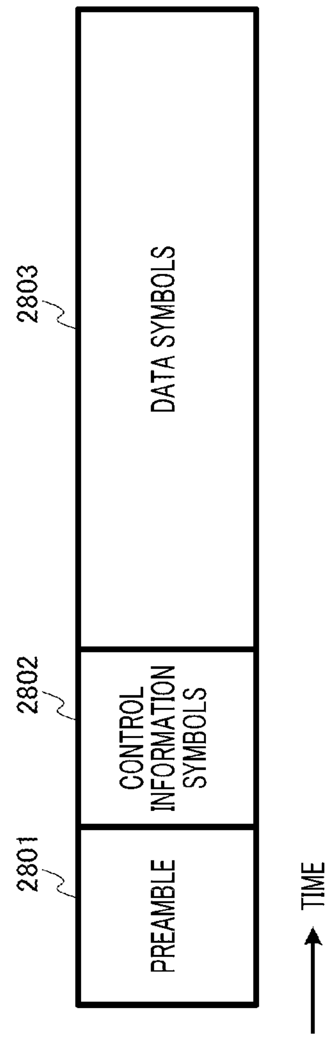

Whereas in Embodiment 1 examples were described in which block data is assigned to each symbol in bit units, as shown in FIG. 5 to FIG. 8 for instance, in this embodiment an example has been described in which block data is assigned to each symbol in 2-bit units, as shown in FIG. 28 for instance. That is to say, to consider 16QAM, in Embodiment 1 block data was assigned independently to each of bits b1, b2, b3, and b4 configuring one symbol, whereas in this embodiment bits b1 and b2 are treated as one unit and block data #1 is assigned to these two bits, and bits b3 and b4 are treated as one unit and block data #2 is assigned to these two bits. However, a transmitting apparatus and receiving apparatus described in this embodiment can also be applied to a frame configuration such as described in Embodiment 1. FIG. 31C shows an example of a frame configuration allowing such application.

In this embodiment, processing for a block code such as an LDPC code has been described as an example, but the same method as described above can also be applied to a trellis code such as a turbo code or convolutional code. A detailed description will be given in Embodiment 6.

In this embodiment, configurations of a transmitting apparatus and receiving apparatus that perform single-carrier communication have been described as an example, but this embodiment is not limited to this, and can be similarly implemented with a transmitting apparatus and receiving apparatus that perform OFDM or suchlike multicarrier communication.

Furthermore, this embodiment can be similarly implemented with a transmitting apparatus and receiving apparatus that perform multi-antenna communication such as communication using MIMO scheme. The technology described in this embodiment can be widely applied irrespective of the multiplexing method.

In particular, with a multicarrier method such as OFDM, a method of arranging symbols is to arrange them on the frequency domain—that is, in the (sub-) carrier direction—as well as the time domain (see FIG. 10, FIG. 15, FIG. 26, and so forth, for example).

The technology of this embodiment can be applied to a case in which symbols are aligned on the time domain or a case in which symbols are aligned in the frequency domain, and enables the same effect as described above to be obtained in either case. Furthermore, the technology of this embodiment can also be applied, and enables the same effect as described above to be obtained, when symbols are aligned on the space axis, as in the case of a transmission scheme using MIMO scheme.

Embodiment 6

In Embodiment 1 and Embodiment 5, cases have been described in which the present disclosure is applied to a block code such as an LDPC code. In this embodiment, a case is described in which the present disclosure is applied to a trellis code such as a turbo code or convolutional code.

A characteristic of this embodiment is that, after data formed sequentially by trellis encoding are assigned to a plurality of symbols to form transmit symbols, those transmit symbols are interleaved in symbol units.

By this means, processing similar to random bit interleave processing can be performed at high speed with a low computational complexity. That is to say, in this embodiment, processing that assigns sequentially formed trellis encoded data across a plurality of symbols is extremely simple processing in comparison with conventional random bit interleave processing, and involves only the execution of simple processing for executing symbol-unit interleaving on those symbols, enabling processing equivalent to bit interleaving to be performed with a simple circuit as compared with conventional bit interleaving.

Figure 32A:
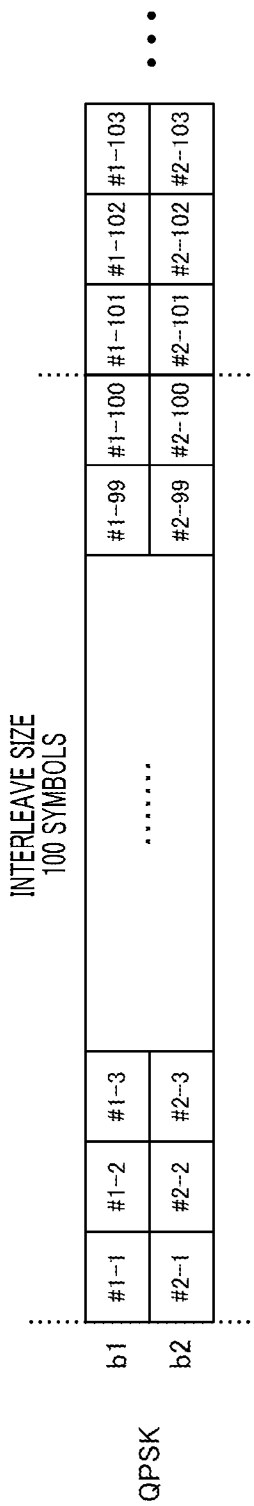
Figure 32B:
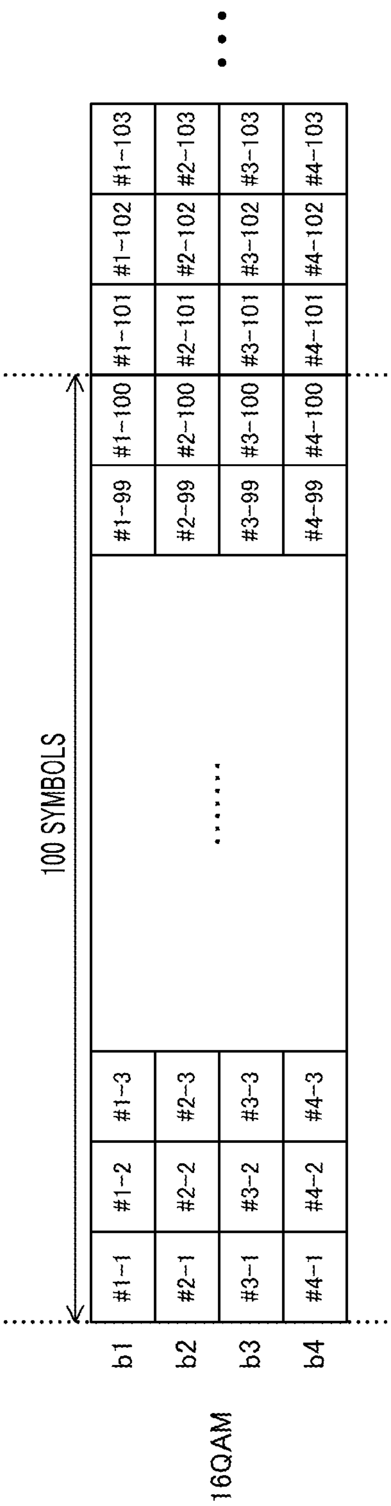

FIG. 32A and FIG. 32B show to which post-modulation symbols convolutionally encoded data are assigned, for example, in this embodiment. The horizontal axis indicates the symbol time sequence, and the vertical axis indicates the bit numbers configuring one symbol—that is, b1 and b2 in the case of QPSK, and b1, b2, b3, and b4 in the case of 16QAM.

In these drawings, #X-Y indicates the Y'th bit obtained by X'th encoding processing. For example, #1-1 indicates the 1st bit obtained by the 1st encoding processing. Similarly, #2-100 indicates the 100th bit obtained by the 2nd encoding processing. The arrangements in FIG. 32 show the order before symbol interleaving, and symbol interleaving is performed on 100 symbols. Symbol interleaving will be described in detail using FIG. 33 and FIG. 34.

FIG. 32A shows bit assignment to each symbol when the modulation method is QPSK. When the modulation method is QPSK, two bits (b1, b2) are transmitted in one symbol. In this embodiment, 1st encoded data and 2nd encoded data are transmitted using both of these bits. Here, 1st encoded data (#1-1, #1-2, #1-3 . . . ) is data on which one trellis encoding is executed, and 2nd encoded data (#2-1, #2-2, #2-3 . . . ) is data on which one trellis encoding is executed.

Here, one trellis encoding process refers to one collection of encoded data sequentially encoded and output by one trellis encoder. Therefore, as a method of creating 1st encoded data and 2nd encoded data, different encoders may be provided as described later herein, for example, with encoded data obtained by a 1st encoder being taken as 1st encoded data, and encoded data obtained by a 2nd encoder being taken as 2nd encoded data.

Alternatively, for example, among encoded data output sequentially by a single encoder, the first to 100th items of encoded data may be taken as 1st encoded data, and the 101st to 200th items of encoded data may be taken as 2nd encoded data.

FIG. 32B shows bit assignment to each symbol when the modulation method is 16QAM. When the modulation method is 16QAM, four bits (b1, b2, b3, b4) are transmitted in one symbol. In this embodiment, four encoded data are transmitted using these four bits.

In FIG. 32B, data relating to 1st encoded data #1 is transmitted using 16QAM bit b1. Similarly, data relating to 2nd encoded data #2 is transmitted using 16QAM bit b2, data relating to 3rd encoded data #3 is transmitted using 16QAM bit b3, and data relating to 4th encoded data #4 is transmitted using 16QAM bit b4.

By this means, encoded bits (data) can be dispersed temporally (or on a frequency basis (particularly in the case of OFDM or suchlike multicarrier transmission), or spatially (particularly in the case of transmission scheme using MIMO scheme)) across a number of symbols equal to that of QPSK, enabling an overall drop in the quality of encoded data because of a notch due to fading to be avoided. Thus, since the probability of data being erroneous in a burst fashion is low, the error rate performance can be improved. Naturally, the same effect can also be obtained for QPSK, since similar operations are performed in bit units.

Figure 32C:
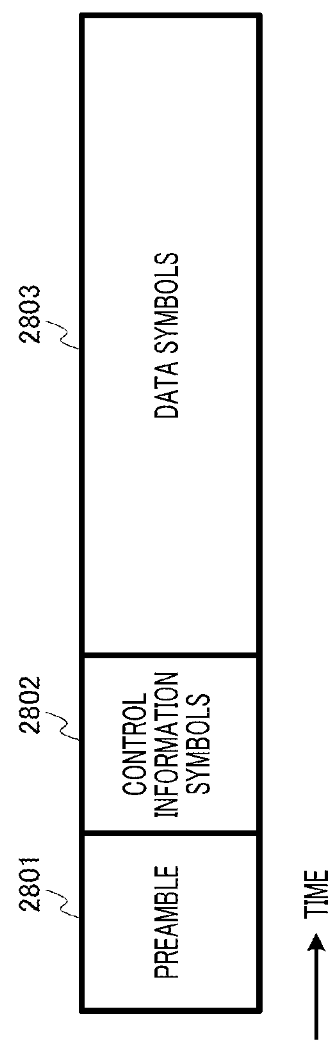

FIG. 32C shows an example of a frame configuration in this embodiment when single-carrier transmission is used. The frame configuration in FIG. 32C is the same as that in FIG. 28C already described, and therefore a description thereof will be omitted here.

Figure 33:
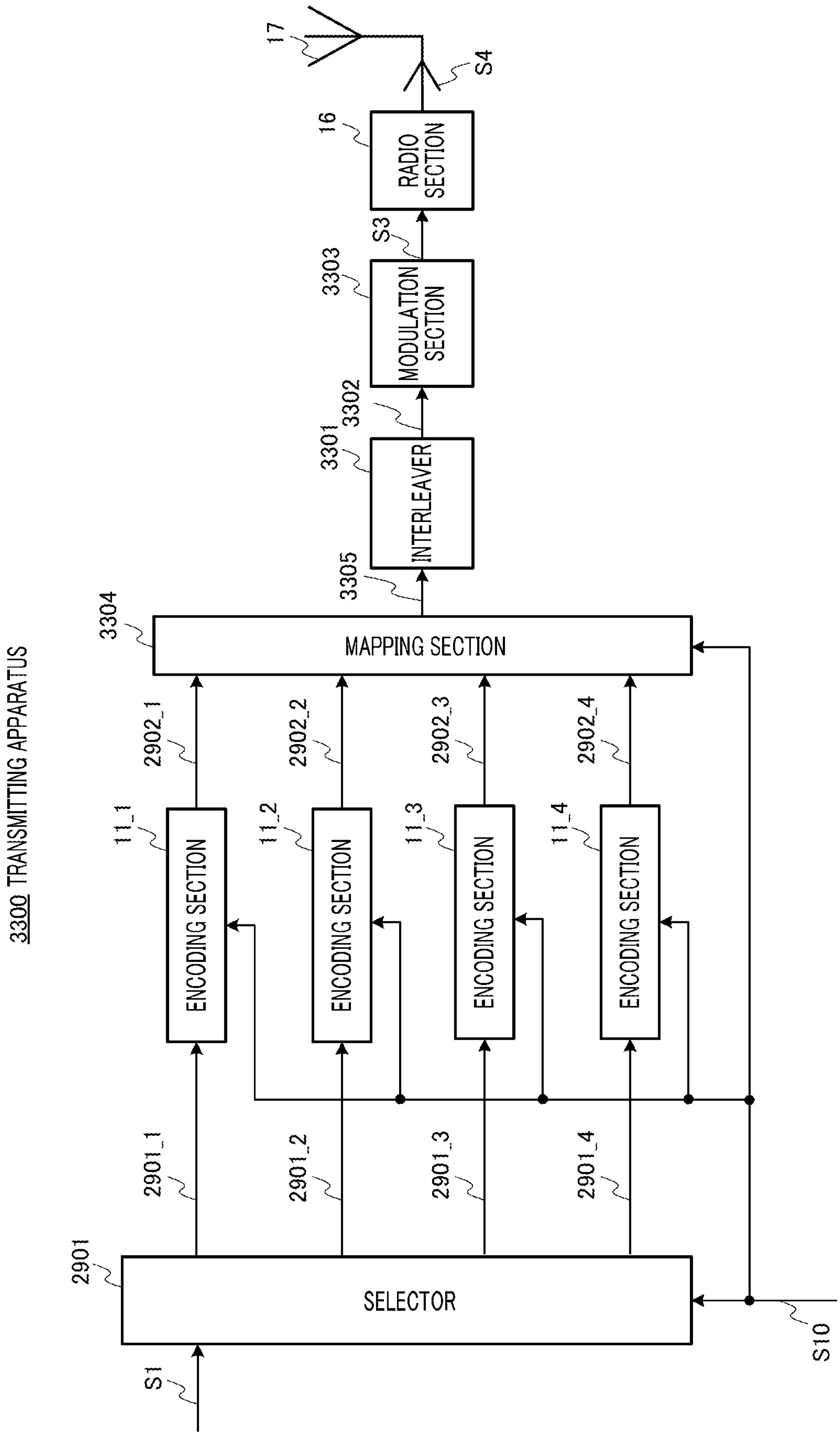
FIG. 33 is a block diagram showing the configuration of a transmitting apparatus of Embodiment 6.

FIG. 33 shows an example of the configuration of a transmitting apparatus of this embodiment. In FIG. 33, items that operate in the same way as in FIG. 2 and FIG. 29 are assigned the same reference codes as in FIG. 2 and FIG. 29. Selector 2901 has transmit data S1 and control signal S10 as input, and assigns transmit data S1 according to modulation method information included in control signal S10.

In this embodiment, when the modulation method is QPSK, selector 2901 outputs assignment data #1 to encoding section 11_1 as output signal 2901_1, and outputs assignment data #2 to encoding section 11_2 as output signal 2901_2. At this time, selector 2901 does not output output signals 2901_3 and 2901_4 to encoding sections 11_3 and 11_4.

On the other hand, when the modulation method is 16QAM, selector 2901 outputs assignment data #1 to encoding section 11_1 as output signal 2901_1, outputs assignment data #2 to encoding section 11_2 as output signal 2901_2, outputs assignment data #3 to encoding section 11_3 as output signal 2901_3, and outputs assignment data #4 to encoding section 11_4 as output signal 2901_4.

Encoding sections 11_1, 11_2, 11_3, and 11_4 obtain encoded data 2902_1, 2902_2, 2902_3, and 2902_4 by performing trellis encoding of their respective input data, and output these encoded data. When the modulation method is QPSK, encoding sections 11_3 and 11_4 do not perform an encoding operation. Encoding sections 11_1 to 11_4 can obtain modulation method information from control signal S10.

Mapping section 3304 has encoded data 2902_1, 2902_2, 2902_3, and 2902_4, and control signal S10 as input, obtains transmit symbols—that is, baseband signal 3305—by performing the mapping processing shown in FIG. 32A in the case of QPSK and the mapping processing shown in FIG. 32B in the case of 16QAM, and outputs this baseband signal 3305 to interleaver 3301.

Interleaver 3301 has baseband signal 3305 as input, executes symbol interleave processing on this signal, and outputs post-interleaving baseband signal 3302. Modulation section 3303 band-limits post-interleaving baseband signal 3302 and outputs post-band-limiting baseband signal S3.

A major advantage of transmitting apparatus 3300 of this embodiment lies in its interleave processing. This point will now be explained in detail.

Generally, an interleaver is either a bit interleaver that performs interleave processing in bit units or a symbol interleaver that performs interleave processing in symbol units. Bit interleave processing has a greater effect of improving reception quality than symbol interleave processing.

Interleaver 3301 of transmitting apparatus 3300 of this embodiment interleaves symbols obtained by mapping section 3304, and is thus a symbol interleaver. However, in this embodiment, symbol interleave processing is performed after data symbols have been formed by performing mapping by means of mapping section 3304 such that encoded data 2902_1 to 2902_4 formed sequentially by encoding sections 11_1 to 11_4 are not successively included in the same symbol, enabling processing equivalent to bit interleaving to be performed.

Specifically, in this embodiment, symbol interleaving is performed by interleaver 3301 by placing interleaver 3301 in a stage subsequent to mapping section 3304.

Since a frame configuration is set as shown in FIG. 32 in this embodiment, executing symbol interleaving results in encoded data #1, #2, #3, and #4 equivalent to data on which bit interleaving has been executed. That is to say, with this embodiment, having symbols formed as shown in FIG. 32 by mapping section 3304 and placing symbol interleaver 3301 in a later stage makes it possible for the same reception quality to be obtained on the receiving side as when bit interleaving is executed.

Also, the configuration of this embodiment is superior in terms of computational complexity to a configuration in which a bit interleaver is provided. This is because, in order to perform bit interleaving, the usual method conventionally used is to place an interleaver between encoding sections 11_1 to 11_4 and mapping section 3304, for example. However, if the interleaving function is placed between the encoding sections and mapping section in this way, four interleavers are necessary. In contrast, only one symbol interleaver 3301 is necessary in this embodiment.

Figure 34:
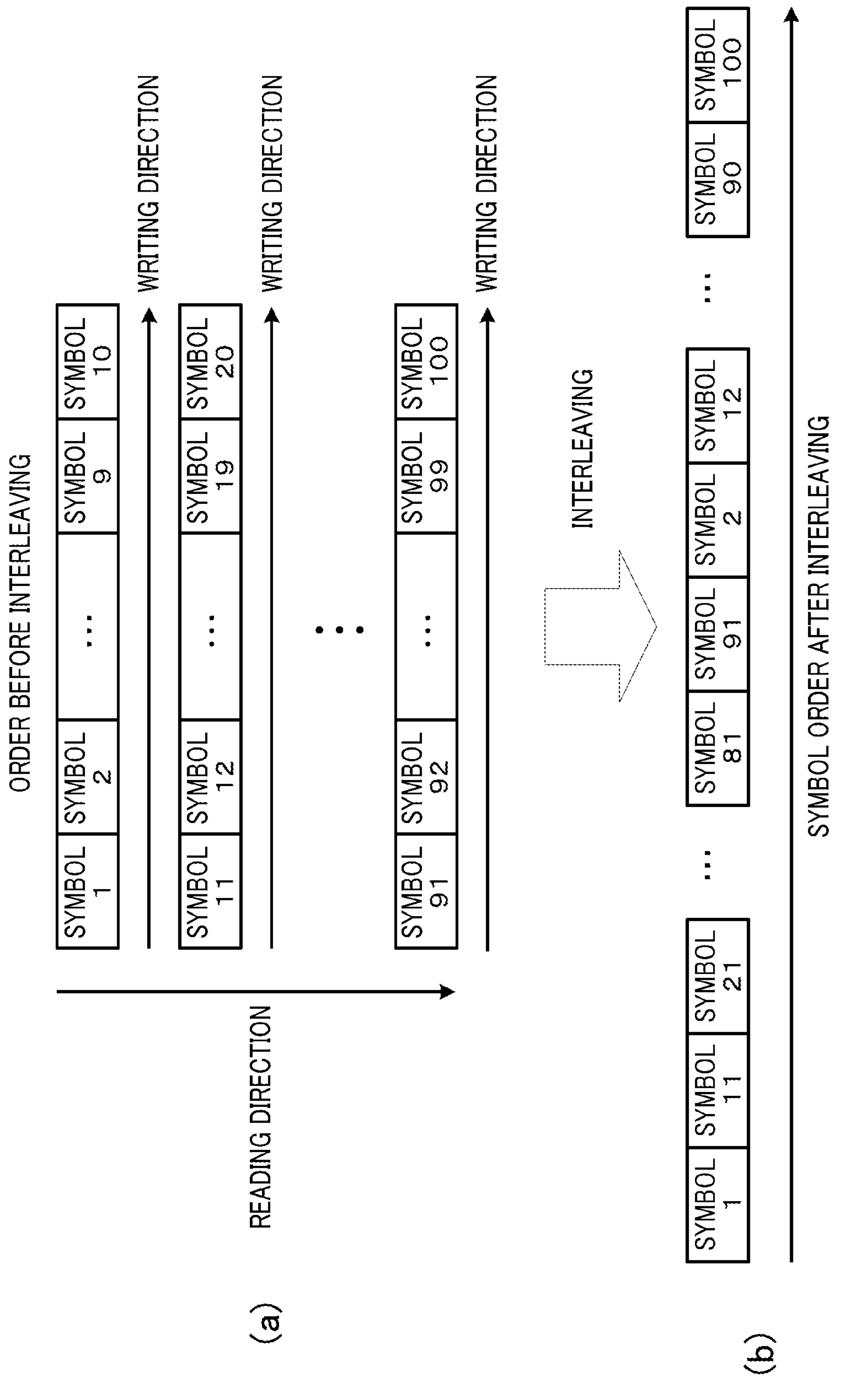
FIG. 34 is a drawing provided to explain the operation of a symbol interleaver of Embodiment 6.

An example of the operation of symbol interleaver 3301 will now be described using FIG. 34. FIG. 34(*a*) shows an example of the writing direction and reading direction of symbol data with respect to internal memory. As shown in FIG. 34, it is assumed that symbols are output from mapping section 3304 in the order "symbol 1", "symbol 2", "symbol 3", . . . , "symbol 100". Then interleaver 3301 performs writing to memory in the horizontal direction in FIG. 34(*a*). Also, interleaver 3301 performs reading in the vertical direction in FIG. 34(*a*). By this means, post-interleaving symbols are arranged as shown in FIG. 34(*b*).

Figure 35:
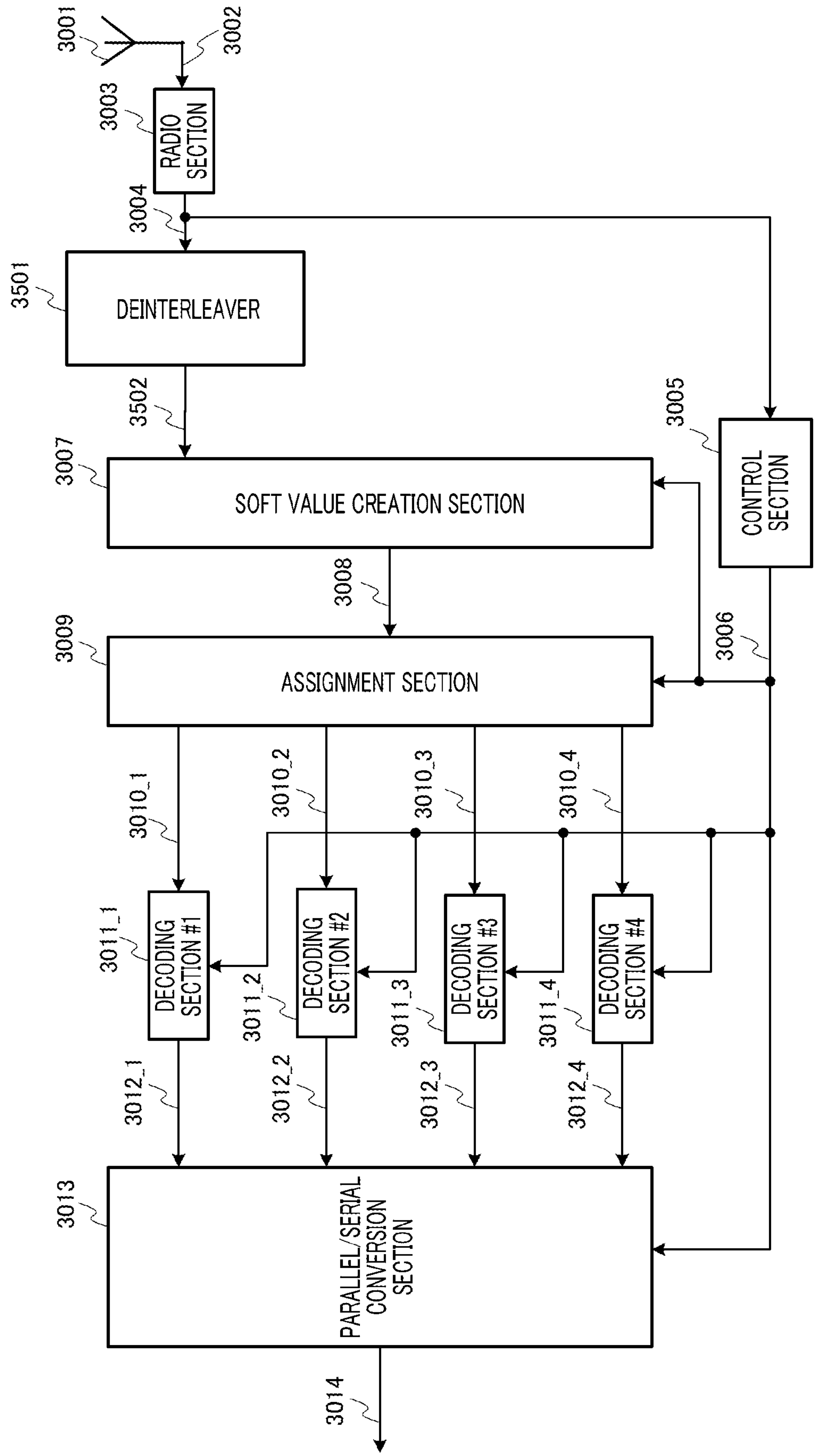
FIG. 35 is a block diagram showing the configuration of a receiving apparatus of Embodiment 6.

FIG. 35, in which parts corresponding to those in FIG. 30 are assigned the same reference codes as in FIG. 30, shows an example of the configuration of a receiving apparatus of this embodiment. FIG. 35 differs from FIG. 30 mainly in having deinterleaver 3501 inserted in order to restore symbols interleaved by transmitting apparatus 3300 to their original order, and in having four decoding sections 3011_1 to 3011_4 corresponding to the four encoding sections 11_1 to 11_4.

By means of the above configuration, receiving apparatus 3500 can receive a modulated signal transmitted from transmitting apparatus 3300 in FIG. 33 and obtain post-decoding data 3014. In particular, receiving apparatus 3500 is able to perform high-speed operation by having decoding sections 3011_1 to 30114 provided in parallel. Since receiving apparatus 3500 receives and decodes a signal equivalent to a bit-interleaved signal, it can obtain decoded data 3014 having a good error rate performance.

As described above, according to this embodiment, by providing encoding sections 11_1 to 11_4 that perform trellis encoding of transmit data, mapping section 3304 that forms data symbols by performing mapping such that encoded data formed sequentially by trellis encoding sections 11_1 to 11_4 are not successively included in the same symbol, and symbol interleaver 3301 that interleaves the data symbols, interleave processing equivalent to bit interleaving can be performed with a low computational complexity, and reception quality on the receiving side can be effectively improved.

That is to say, mapping section 3304 need only be able to perform simple processing of performing mapping such that encoded data formed sequentially by trellis encoding sections 11_1 to 11_4 are not successively included in the same symbol, and symbol interleaver 3301 need only execute interleaving on one line of symbols. With this combination of simple processes, transmitting apparatus 3300 of this embodiment can perform processing equivalent to that of a conventional bit interleaver, and moreover can perform that processing at high speed. The provision of encoding sections 11_1 to 11_4 in parallel contributes to the achievement of this high speed. However, simply providing encoding sections 11_1 to 11_4 in parallel and performing bit interleaving would require the provision of a later-stage bit interleaver for each of encoding sections 11_1 to 11_4, resulting in a high computational complexity. The configuration of this embodiment implements high-speed operation while suppressing an increase in computational complexity when bit interleaving is performed.

Figure 36A:
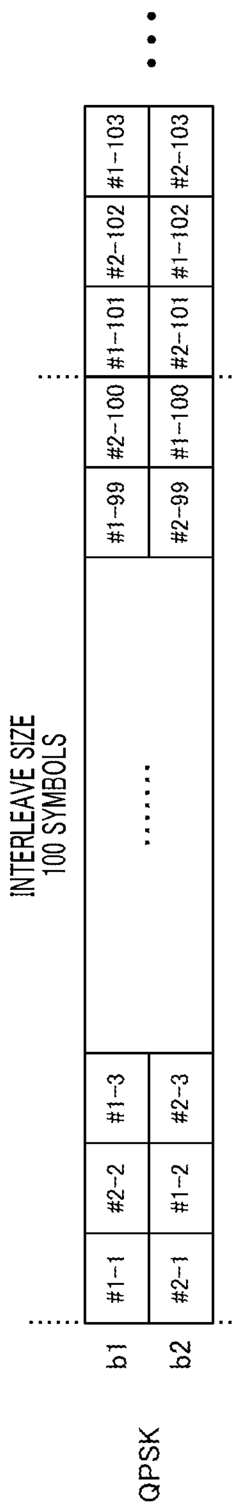
Figure 36B:
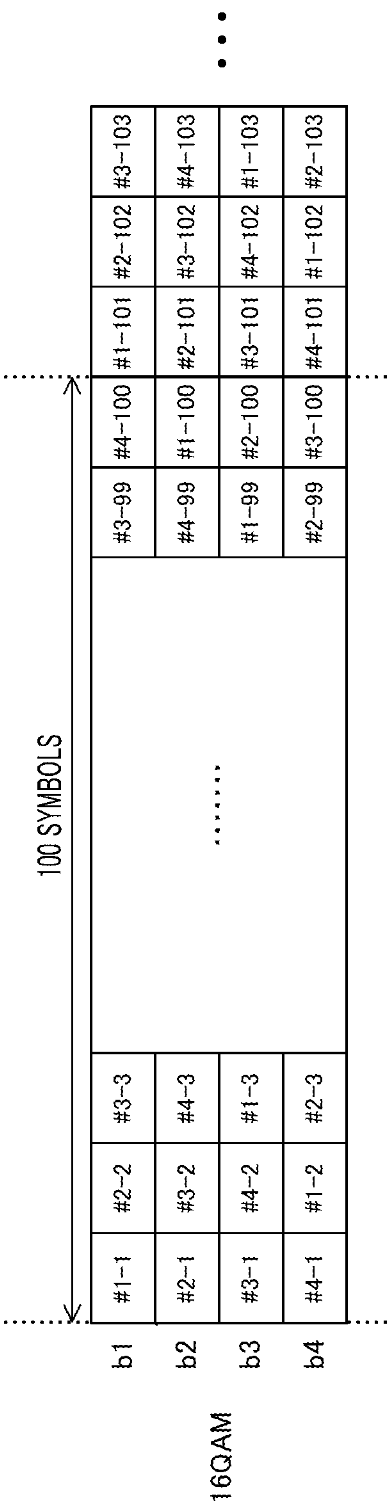

In this embodiment, processing by mapping section 3304 to perform bit assignment to each symbol has been described taking FIG. 32A and FIG. 32B as examples, but this embodiment is not limited to this, and assignment processing such as shown in FIG. 36A and FIG. 36B, for example, may also be performed. The essential requirement is for mapping to be performed such that encoded data (for example, #1-1, #1-2, #1-3, . . . ) formed sequentially by encoding sections 11_1 to 11_4 are not successively included in the same symbol, and bit assignment to symbols described as modulation section processing in Embodiment 1 and Embodiment 5 can also be applied as processing by mapping section 3304 of this embodiment as appropriate.

In this embodiment, a case has been described in which data is transmitted after being trellis encoded. In particular, interleaver and deinterleaver insertion positions have been described in detail. A trellis code according to this embodiment is assumed to include a convolutional code and a turbo code. In particular, when a turbo code is used an interleaver and deinterleaver are necessary in encoding and decoding.

In this case, a case can be conceived of in which interleaver 3301 in FIG. 33 and deinterleaver 3501 in FIG. 35 are different from an interleaver and deinterleaver in the case of turbo code encoding and decoding. As a separate case, a method can also be conceived of whereby symbol interleaver 3301 is not provided as in FIG. 33, and each turbo encoder has a different interleaver. In this case, however, data encoded by each turbo encoder requires different decoding to be performed, and therefore decoding section sharing cannot be implemented.

In this embodiment, configurations of a transmitting apparatus and receiving apparatus that perform single-carrier communication have been described as an example, but this embodiment is not limited to this, and can be similarly implemented with a transmitting apparatus and receiving apparatus that perform OFDM or suchlike multicarrier communication. Furthermore, this embodiment can be similarly implemented with a transmitting apparatus and receiving apparatus that perform multi-antenna communication such as communication using MIMO scheme. The technology described in this embodiment can be widely applied irrespective of the multiplexing method. In particular, with a multicarrier method such as OFDM, a method of arranging symbols is to arrange them in the frequency domain— that is, in the (sub-) carrier direction—as well as the time domain (see FIG. 10, FIG. 15, FIG. 26, and so forth, for example). The technology of this embodiment can be applied to a case in which symbols are aligned on the time domain or a case in which symbols are aligned in the frequency domain, and enables the same effect as described above to be obtained in either case. Furthermore, the technology of this embodiment can also be applied, and enables the same effect as described above to be obtained, when symbols are aligned on the space axis, as in the case of a transmission scheme using scheme.

That is to say, one characteristic of this embodiment is the provision of mapping section 3304 that has a plurality of lines of encoded data as parallel input and outputs one line of data symbols, and symbol interleaver 3301 that interleaves those data symbols.

By thus combining mapping processing and symbol interleave processing, high-speed operation of encoding processing and bit interleave processing becomes possible, and a bit interleaver can be implemented that features a configuration with a reduced computational complexity.

Embodiment 7

In this embodiment, a case is described in which the principles presented in Embodiment 1, Embodiment 5, and Embodiment 6 above are applied, in particular, to conjunctive coding comprising trellis coding and block coding. In this embodiment, a case is described in which block encoded data is trellis encoded.

Figure 37:
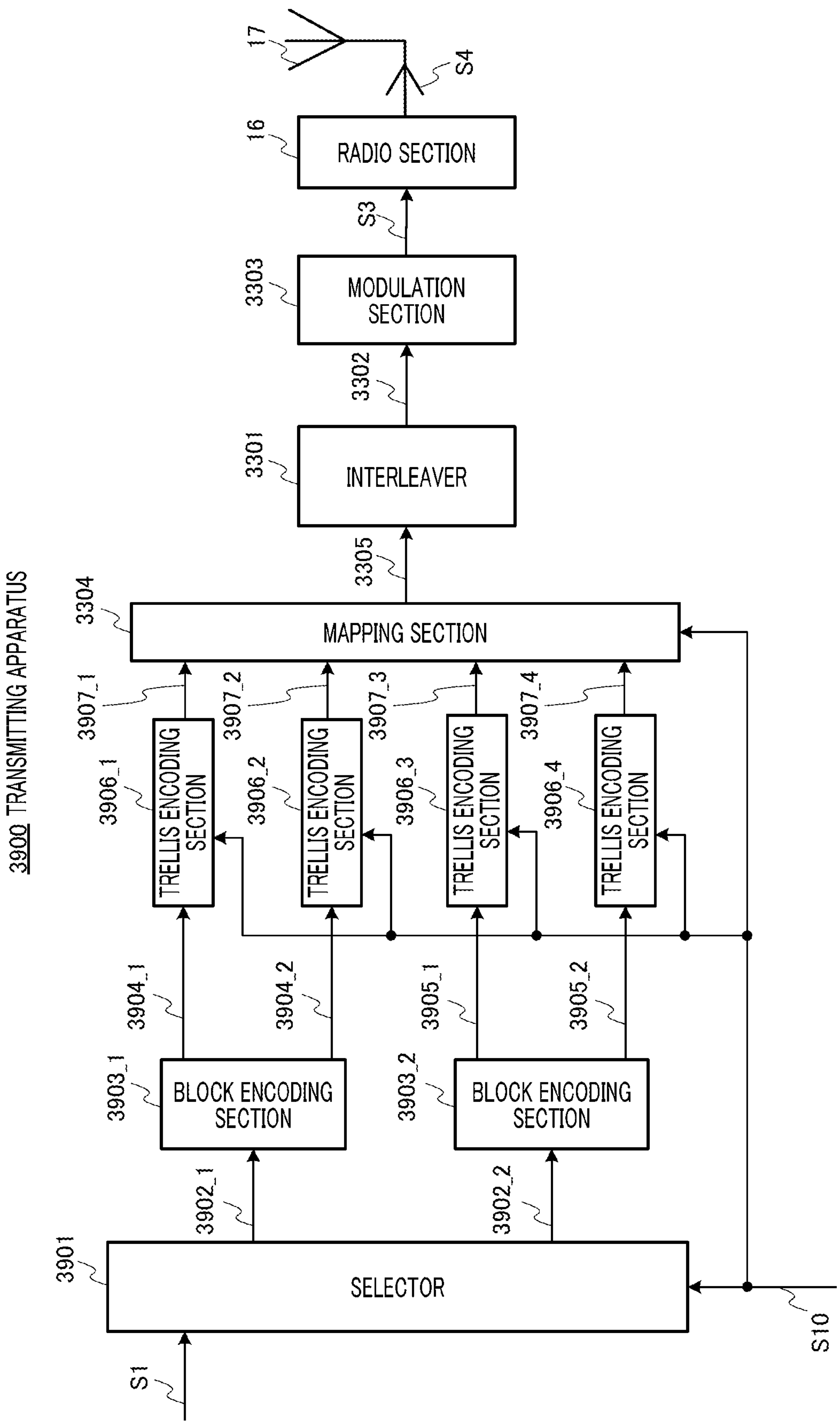
FIG. 37 is a block diagram showing the configuration of a transmitting apparatus of Embodiment 7.

FIG. 37, in which parts corresponding to those in FIG. 2 and FIG. 33 are assigned the same reference codes as in FIG. 2 and FIG. 33, shows an example of the configuration of a transmitting apparatus of this embodiment. In transmitting apparatus 3900, selector 3901 has transmit data S1 and control signal S10 as input. Selector 3901 assigns transmit data S1 according to modulation method information included in control signal S10. In this embodiment, when the modulation method is QPSK, selector 3901 outputs assignment data #1 to block encoding section 3903_1 as output signal 3902_1. At this time, selector 3901 does not output output signal 3902_2 to block encoding section 3903_2. On the other hand, when the modulation method is 16QAM, selector 3901 outputs assignment data #1 to block encoding section 3903_1 as output signal 3902_1, and also outputs assignment data #2 to block encoding section 3903_2 as output signal 3902_2.

Block encoding sections 3903_1 and 3903_2 have assignment data #1 (output signal 3902_1) and assignment data #2 (output signal 3902_2) respectively as input, perform block encoding of the respective input data, and output post-block-encoding data 3904_1, 3904_2, 3905_1, and 3905_2. The operation at this time will now be described using FIG. 38.

FIG. 38 shows examples of block encoding in this embodiment. FIG. 38A shows the operation of block encoding section 3903_1 in FIG. 37 when the modulation method is QPSK. As stated above, block encoding section 3903_2 does not operate at this time.

In these drawings, #X-Y indicates the Y'th bit (bit number Y among 980 bits) of the X'th encoded block. For example, #1-1 indicates the 1st bit of the 1st encoded block. Similarly, #2-979 indicates the 979th bit of the 2nd encoded block.

As shown in FIG. 38A, when the modulation method is QPSK, only block encoding section 3903_1 operates, and block encoded data #1-1 to #1-980 and #2-1 to #2-980 configured by means of 980 bits are generated by block encoding section 3903_1.

On the other hand, when the modulation method is 16QAM, as shown in FIG. 38B, block encoding sections 3903_1 and 3903_2 both operate and block encoded data configured by means of 980 bits are generated by each.

Trellis encoding sections 3906-1, 3906-2, 3906-3, and 3906-4 in FIG. 37 have block encoded data 3904_1, 3904_2, 3905_1, and 3905_2 respectively as input, perform trellis encoding of these data, and output post-trellis-encoding data 3907_1, 3907_2, 3907_3, and 3907_4.

The operation of trellis encoding sections 3906-1, 3906-2, 3906-3, and 3906-4 and bit assignment to symbols by mapping section 3304 will now be described using FIG. 39.

FIG. 39A shows an example of the trellis code state when block encoded data generated as shown in FIG. 38A when the modulation method is QPSK are further trellis encoded. Trellis encoded data #1'-1 to #1'-980 are generated from block encoded data #1-1 to #1-490 by means of trellis encoding by trellis encoding section 3906-1. However, the last few bits of #1' data are generated by using the next block encoded data (in the case of FIG. 38, #2 block encoded data). Then trellis encoded data #1'-1 to #1'-980 are assigned by mapping section 3304 to bit b1 of two bits transmitted by QPSK modulation.

Similarly, trellis encoded data #1"-1 to #1"-980 are generated from block encoded data #1-491 to #1-980 by means of trellis encoding by trellis encoding section 3906-2. However, the last few bits of #1" data are generated by using the next block encoded data (in the case of FIG. 38, #2 block encoded data). Then trellis encoded data #1"-1 to #1"-980 are assigned by mapping section 3304 to bit b2 of two bits transmitted by QPSK modulation.

FIG. 39B shows an example of the trellis code state when block encoded data generated as shown in FIG. 38B when the modulation method is 16QAM are further trellis encoded. Trellis encoded data #1'-1 to #1'-980 are generated from block encoded data #1-1 to #1-490 by means of trellis encoding by trellis encoding section 3906-1. However, the last few bits of #1' data are generated by using the next block encoded data (in the case of FIG. 38, #3 block encoded data). Then trellis encoded data #1'-1 to #1'-980 are assigned by mapping section 3304 to bit b1 of four bits transmitted by 16QAM.

Similarly, trellis encoded data #1"-1 to #1"-980 are generated from block encoded data #1-491 to #1-980 by means of trellis encoding by trellis encoding section 3906-2. However, the last few bits of #1" data are generated by using the next block encoded data (in the case of FIG. 38, #3 block encoded data). Then trellis encoded data #1"-1 to #1"-980 are assigned by mapping section 3304 to bit b2 of four bits transmitted by 16QAM.

Similarly, trellis encoded data #2'-1 to #2'-980 are generated from block encoded data #2-1 to #2-490 by means of trellis encoding by trellis encoding section 3906-3. However, the last few bits of #2' data are generated by using the next block encoded data (in the case of FIG. 38, #4 block encoded data). Then trellis encoded data #2'-1 to #2'-980 are assigned by mapping section 3304 to bit b3 of four bits transmitted by 16QAM.

Similarly, trellis encoded data #2"-1 to #2"-980 are generated from block encoded data #2-491 to #2-980 by means of trellis encoding by trellis encoding section 3906-4. However, the last few bits of #2" data are generated by using the next block encoded data (in the case of FIG. 38, #4 block encoded data). Then trellis encoded data #2"-1 to #2"-980 are assigned by mapping section 3304 to bit b4 of four bits transmitted by 16QAM.

By this means, encoded bits (data) can be dispersed temporally (or on a frequency basis (particularly in the case of OFDM or suchlike multicarrier transmission), or spatially (particularly in the case of transmission scheme using MIMO scheme)) across a number of symbols equal to that of QPSK, enabling an overall drop in the quality of encoded data because of a notch due to fading to be avoided. Thus, since the probability of data being erroneous in a burst fashion is low, the error rate performance can be improved. The same effect can also be obtained for QPSK, since similar operations are performed in bit units. An advantage of this embodiment is that the above effect can be obtained for both a block code and a trellis code.

The operation of mapping section 3304 and symbol interleaver 3301 in FIG. 37 is similar to that described in Embodiment 5 and Embodiment 6, and therefore a detailed description thereof will be omitted here.

Figure 40:
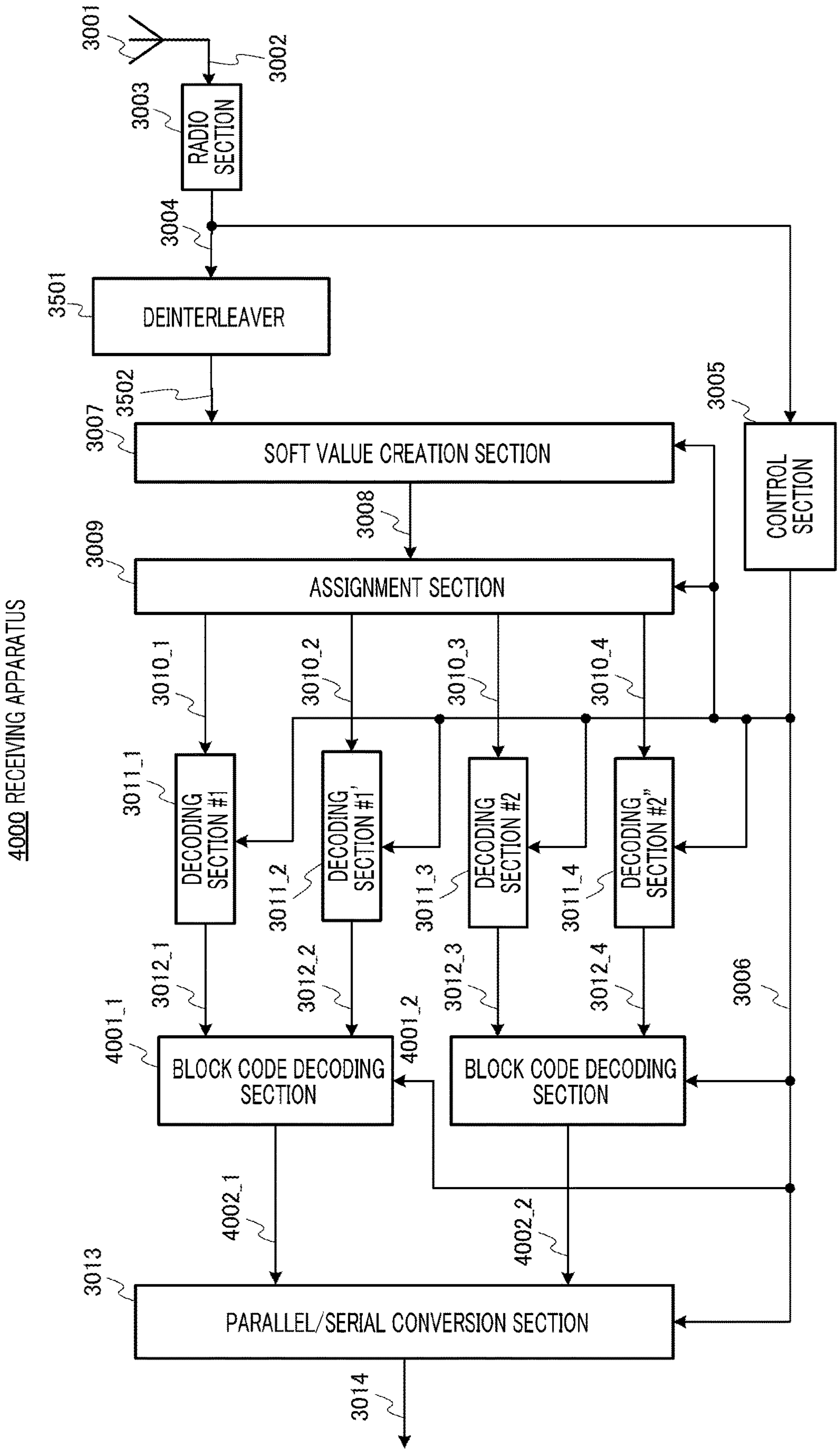
FIG. 40 is a block diagram showing the configuration of a receiving apparatus of Embodiment 7.

FIG. 40, in which parts corresponding to those in FIG. 30 and FIG. 35 are assigned the same reference codes as in FIG. 30 and FIG. 35, shows an example of the configuration of a receiving apparatus of this embodiment. FIG. 40 differs from FIG. 30 and FIG. 35 mainly in having block code decoding sections 4001_1 and 4001_2 inserted in the last stage of decoding since transmitting apparatus 3900 performs conjunctive coding by means of block encoding and trellis encoding. Block code decoding sections 4001_1 and 4001_2 have trellis decoded data 3012_1 to 3012_4 as input, perform block code decoding, and output data 4002_1 and 4002_2.

By means of the above configuration, receiving apparatus 4000 can receive a modulated signal transmitted from transmitting apparatus 3900 in FIG. 37 and obtain post-decoding data 3014. In particular, receiving apparatus 4000 is able to perform high-speed operation by having (trellis code) decoding sections 3011_1 to 3011_4, and block code decoding sections 4001_1 and 4001_2, respectively, provided in parallel. Since receiving apparatus 4000 receives and decodes a signal equivalent to a bit-interleaved signal, it can obtain decoded data 3014 having a good error rate performance.

As described above, according to this embodiment, by applying the methods in Embodiment 1, Embodiment 5, and Embodiment 6, the same effects as in Embodiment 1, Embodiment 5, and Embodiment 6 can also be obtained when conjunctive coding is used.

In this embodiment, processing by mapping section 3304 to perform bit assignment to each symbol has been described taking FIG. 39 as an example, but this embodiment is not limited to this, and the same effect can also be obtained by combining the assignment examples described in Embodiment 1, Embodiment 5, and Embodiment 6 as appropriate.

In this embodiment, a case has been described in which data is transmitted after being trellis encoded. Here, a trellis code according to this embodiment is assumed to include a convolutional code and a turbo code. In particular, when a turbo code is used an interleaver and deinterleaver are necessary in encoding and decoding. In this case, interleaver 3301 in FIG. 37 and deinterleaver 3501 in FIG. 40 may be provided separately from an interleaver and deinterleaver used for turbo code encoding and decoding. As another example, a different interleaver may be provided for each turbo encoder instead of providing symbol interleaver 3301 as in FIG. 37. In this case, however, data encoded by each turbo encoder requires different decoding to be performed, and therefore decoding section sharing is difficult.

In this embodiment, configurations of a transmitting apparatus and receiving apparatus that perform single-carrier communication have been described as an example, but this embodiment is not limited to this, and can be similarly implemented with a transmitting apparatus and receiving apparatus that perform OFDM or suchlike multicarrier communication. Furthermore, this embodiment can be similarly implemented with a transmitting apparatus and receiving apparatus that perform multi-antenna communication such as communication using MIMO scheme. The technology described in this embodiment can be widely applied irrespective of the multiplexing method. In particular, with a multicarrier method such as OFDM, a method of arranging symbols is to arrange them in the frequency domain—that is, in the (sub-) carrier direction—as well as the time domain (see FIG. 10, FIG. 15, FIG. 26, and so forth, for example). The technology of this embodiment can be applied to a case in which symbols are aligned on the time domain or a case in which symbols are aligned in the frequency domain, and enables the same effect as described above to be obtained in either case. Furthermore, the technology of this embodiment can also be applied, and enables the same effect as described above to be obtained, when symbols are aligned on the space axis, as in the case of a transmission scheme using MIMO scheme.

Embodiment 8

In this embodiment, a method and configuration are described that further improve reception quality when a data transmitting method described Embodiments 1 to 6 is applied to a MIMO system, and more particularly to MIMO system using spatial multiplexing such as shown in FIG. 9, FIG. 10, FIG. 11, and FIG. 12.

(1) Outline of a Typical MIMO System Using Spatial Multiplexing

Before describing the characteristics of this embodiment, an outline will be given of the configuration, transmitting method, and decoding method of a typical MIMO system using spatial multiplexing.

Figure 41A:
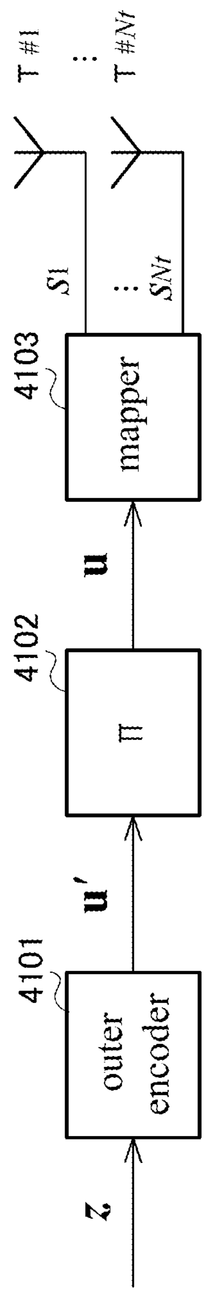
Figure 41B:
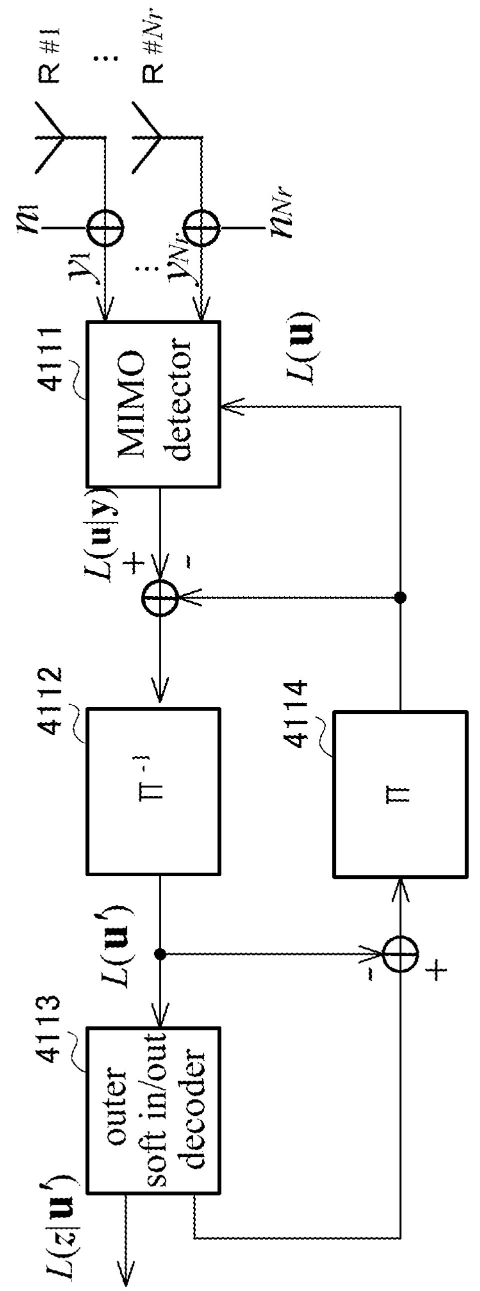

FIG. 41 shows the configuration of an $N_t \times N_r$ MIMO system using spatial multiplexing. In FIG. 41, FIG. 41A shows the general configuration of a transmitting apparatus, and FIG. 41B shows the general configuration of a receiving apparatus that receives signals transmitted from the transmitting apparatus in FIG. 41A.

The transmitting apparatus in FIG. 41A obtains encoded bit vector u' by encoding information vector z by means of encoding section (outer encoder) 4101, and obtains post-interleaving encoded bit vector $u=(u_1, \ldots, u_{Nt})$ by performing interleave processing by means of interleaving section (Π) 4102, where $u_i=(u_{i1}, \ldots, u_{iM})$ and M denotes the number of transmit bits per symbol.

When transmit vector $s=(s_1, \ldots, s_{Nt})$ and transmit signal $s_i$ transmitted from transmit antenna #1=map($u_i$), transmission energy normalized value $E\{|Si|^2\}=E_s/N_t$ ($E_s$: total energy per channel).

As shown in FIG. 41B, a receiving apparatus has detector (MIMO detector) 4111, interleaver ($\Pi^{-1}$) 4112, decoder (outer soft-in/soft-out decoder) 4113, and interleaver (Π) 4114.

If a receive vector received by the receiving apparatus is designated $y=(y_1, \ldots, y_{Nr})^T$, receive vector y is expressed as shown in the following equation.

(Equation 2)

$$\begin{aligned} y &= (y_1, \ldots, y_{Nr})^T \\ &= H_{NtNr}s + n \end{aligned} \qquad [2]$$

In Equation (2), $H_{NtNr}$ is a channel matrix, $n=(n_1, \ldots, n_{Nr})^T$ is a noise vector, and $n_i$ is i.i.d. (independent identically distributed) complex Gaussian noise of average value 0 and variance $\sigma^2$.

Since a transmit symbol and receive symbol have a multidimensional Gaussian distribution relationship, probability p(y|u) for a receive vector can be expressed as shown in the following equation.

(Equation 3)

$$p(y \mid u) = \frac{1}{(2\pi\sigma^2)^{N_r}} \exp\left(-\frac{1}{2\sigma^2}\|y - Hs(u)\|^2\right) \qquad [3]$$

Here, a case is considered in which the receiving apparatus has MIMO detector 4111 and outer soft-in/soft-out decoder 4113 as shown in FIG. 41B, and performs iterative decoding. A logarithmic likelihood ratio vector (L-value) in FIG. 41B is expressed as shown in following Equation (4), Equation (5), and Equation (6) (see Non-patent Document 3, Non-patent Document 4, and Non-patent Document 5, for example).

(Equation 4)

$$L(u) = \left(L(u_1), \ldots, L(u_{N_t})\right)^T \quad [4]$$

(Equation 5)

$$L(u_i) = (L(u_{i1}), \ldots, L(u_{iM})) \quad [5]$$

(Equation 6)

$$L(u_{ij}) = \ln\frac{P(u_{ij}=+1)}{P(u_{ij}=-1)} \quad [6]$$

(2) Outline of Iterative Detection

A description will be given here of MIMO signal iterative detection in an $N_t \times N_r$ MIMO system using spatial multiplexing.

An $X_{mn}$ logarithmic likelihood ratio is defined as shown in the following equation.

(Equation 7)

$$L(u_{mn} \mid y) = \ln\frac{P(u_{mn}=+1 \mid y)}{P(u_{mn}=-1 \mid y)} \quad [7]$$

According to Bayes' theorem, Equation (7) can be expressed as shown in the following equation.

(Equation 8)

$$\begin{aligned} L(u_{mn} \mid y) &= \ln\frac{p(y \mid u_{mn}=+1)P(u_{mn}=+1)/p(y)}{p(y \mid u_{mn}=-1)P(u_{mn}=-1)/p(y)} \\ &= \ln\frac{P(u_{mn}=+1)}{P(u_{mn}=-1)} + \ln\frac{p(y \mid u_{mn}=+1)}{p(y \mid u_{mn}=-1)} \\ &= \ln\frac{P(u_{mn}=+1)}{P(u_{mn}=-1)} + \ln\frac{\sum_{U_{mn,+1}} p(y \mid u)p(u \mid u_{mn})}{\sum_{U_{mn,-1}} p(y \mid u)p(u \mid u_{mn})} \end{aligned} \quad [8]$$

Here, it is assumed that $U_{mn,\pm i}=\{u \mid u_{mn}=\pm 1\}$. If Equation (8) is approximated using the following equation, as described in Non-patent Document 6, Non-patent Document 7, and Non-patent Document 8, for example)

$$\ln\Sigma a_j = \max \ln a_j \quad \text{(Equation 9)}$$

approximation can be performed as shown in the following equation.

(Equation 10)

$$L(u_{mn} \mid y) \approx \ln\frac{P(u_{mn}=+1)}{P(u_{mn}=-1)} + \max_{Umn,+1}\{\ln p(y \mid u) + P(u \mid u_{mn})\} - \max_{Umn,-1}\{\ln p(y \mid u) + P(u \mid u_{mn})\} \quad [10]$$

$P(u|u_{mn})$ and $\ln P(u|u_{mn})$ in Equation (10) are expressed as shown in the following equations.

(Equation 11)

$$P(u \mid u_{mn}) = \prod_{(ij)\neq(mn)} P(u_{ij}) = \prod_{(ij)\neq(mn)} \frac{\exp\left(\frac{u_{ij}L(u_{ij})}{2}\right)}{\exp\left(\frac{L(u_{ij})}{2}\right) + \exp\left(-\frac{L(u_{ij})}{2}\right)} \quad [11]$$

(Equation 12)

$$\ln P(u \mid u_{mn}) = \left(\sum_{ij} \ln P(u_{ij})\right) - \ln P(u_{mn}) \quad [12]$$

where, $$\ln P(u_{ij}) = \left|\frac{L(u_{ij})}{2}\right| (u_{ij}\ \mathrm{sign}(L(u_{ij}))$$

The logarithmic probability of the equation defined by Equation (3) is expressed as shown in the following equation.

(Equation 13)

$$\ln P(y \mid u) = -\frac{N_r}{2}\ln(2\pi\sigma^2) - \frac{1}{2\sigma^2}\|y - Hs(u)\|^2 \quad [13]$$

Therefore, from Equation (10) and Equation (13), with MAP (Maximum A posteriori Probability) or APP (A Posteriori Probability), an a posteriori L-value is expressed as shown in the following equation (see Non-patent Document 3).

(Equation 14)

$$L(u_{mn} \mid y) = \ln\frac{\sum_{U_{mn,+1}} \exp\left\{-\frac{1}{2\sigma^2}\|y - Hs(u)\|^2 + \sum_{ij} \ln P(u_{ij})\right\}}{\sum_{U_{mn,-1}} \exp\left\{-\frac{1}{2\sigma^2}\|y - Hs(u)\|^2 + \sum_{ij} \ln P(u_{ij})\right\}} \quad [14]$$

Hereinafter, iterative detection using Equation (14) is referred to as iterative APP detection.

From Equation (10) and Equation (13), with MAP (Maximum A posteriori Probability) or APP (A Posteriori Probability), an a posteriori L-value in a logarithmic likelihood ratio (Max-Log APP) utilizing Max-Log approximation is expressed as shown in the following equations (see Non-patent Document 6 and Non-patent Document 7).

(Equation 15)

$$L(u_{mn} \mid y) \approx \max_{Umn,+1}\{\Psi(u, y, L(u))\} - \max_{Umn,-1}\{\Psi(u, y, L(u))\} \quad [15]$$

(Equation 16)

$$\Psi(u, y, L(u)) = -\frac{1}{2\sigma^2}\|y - Hs(u)\|^2 + \sum_{ij} \ln P(u_{ij}) \quad [16]$$

Hereinafter, iterative detection using Equation (15) and Equation (16) is referred to as iterative Max-log APP detection. External information necessary for iterative detection can be found by subtracting input beforehand from Equation (14) and Equation (15).

(3) System Model and Iterative Decoding of this Embodiment (3-1) System Model

Figure 42A:
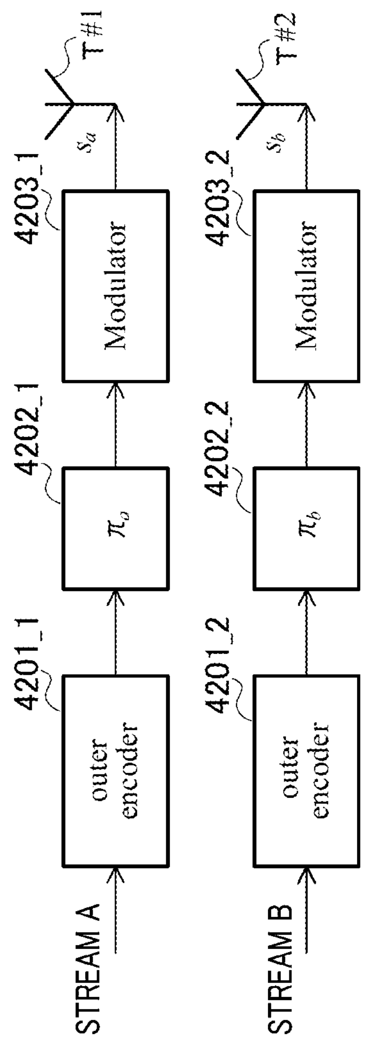
Figure 42B:
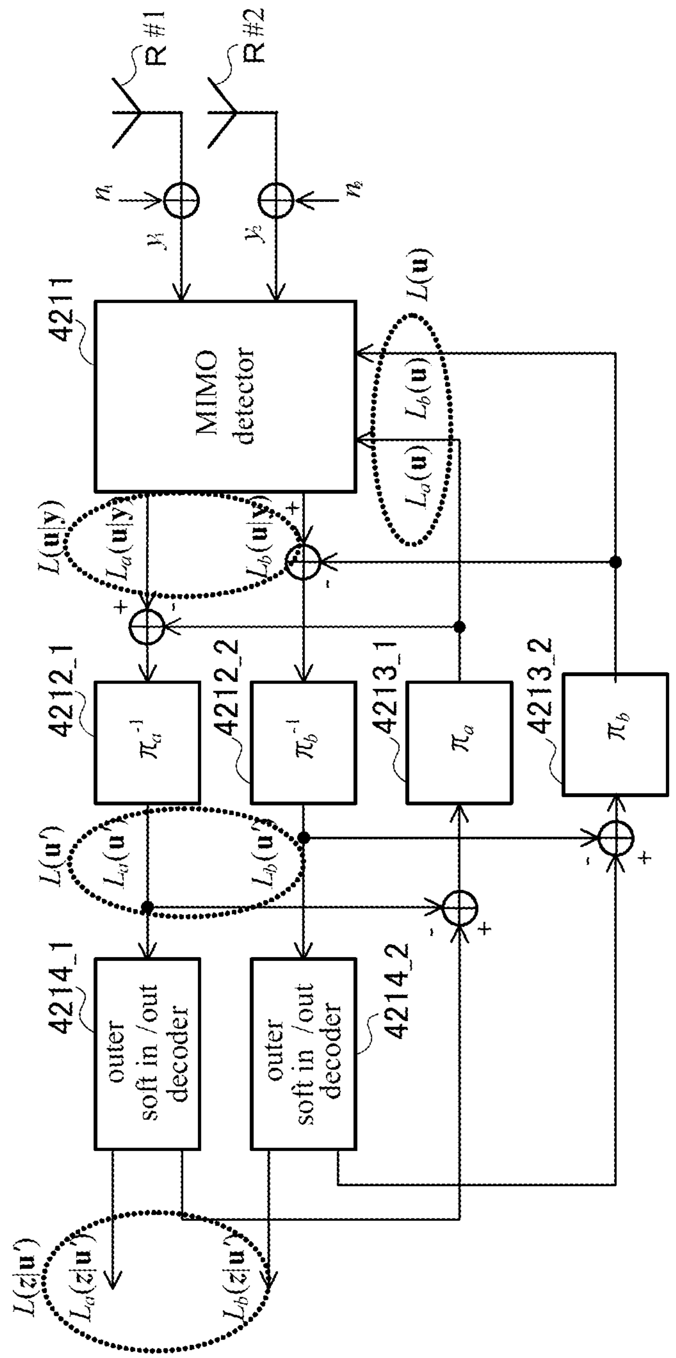

FIG. 42 shows a system model of this embodiment. To simplify the description, FIG. 42 shows the simplest 2×2MIMO system using spatial multiplexing. In FIG. 42, FIG. 42A shows the general configuration of a transmitting apparatus, and FIG. 42B shows the general configuration of a receiving apparatus that receives signals transmitted from the transmitting apparatus in FIG. 42A.

The transmitting apparatus in FIG. 42 encodes stream A by means of encoding section (outer encoder) 4201_1 and encodes stream B by means of encoding section (outer encoder) 4201_2. In the case of this embodiment, encoding section (outer encoder) 4201_1 and encoding section (outer encoder) 4201_2 are configured by means of LDPC encoders that perform encoding of the same LDPC code alternately.

Stream A encoded by encoding section 4201_1 is interleaved by interleaver ($\pi_a$) 4202_1, and stream B encoded by encoding section 4201_2 is interleaved by interleaver ($\pi_b$) 4202_2.

Stream A and stream B that have undergone interleave processing are respectively modulated by modulation sections (Modulators) 4203_1 and 42032 and then transmitted from transmit antennas T #1 and T #2. Here, the modulation method of modulation sections 4203_1 and 4203_2 is assumed to be $2^h$-QAM (in which one symbol is formed by h bits).

The receiving apparatus in FIG. 42B performs iterative detection (iterative APP (or Max-log APP) decoding) of an above MIMO signal. In the case of this embodiment, since the transmitting apparatus performs LDPC encoding, the receiver performs sum-product decoding as LDPC code decoding.

Figure 43:
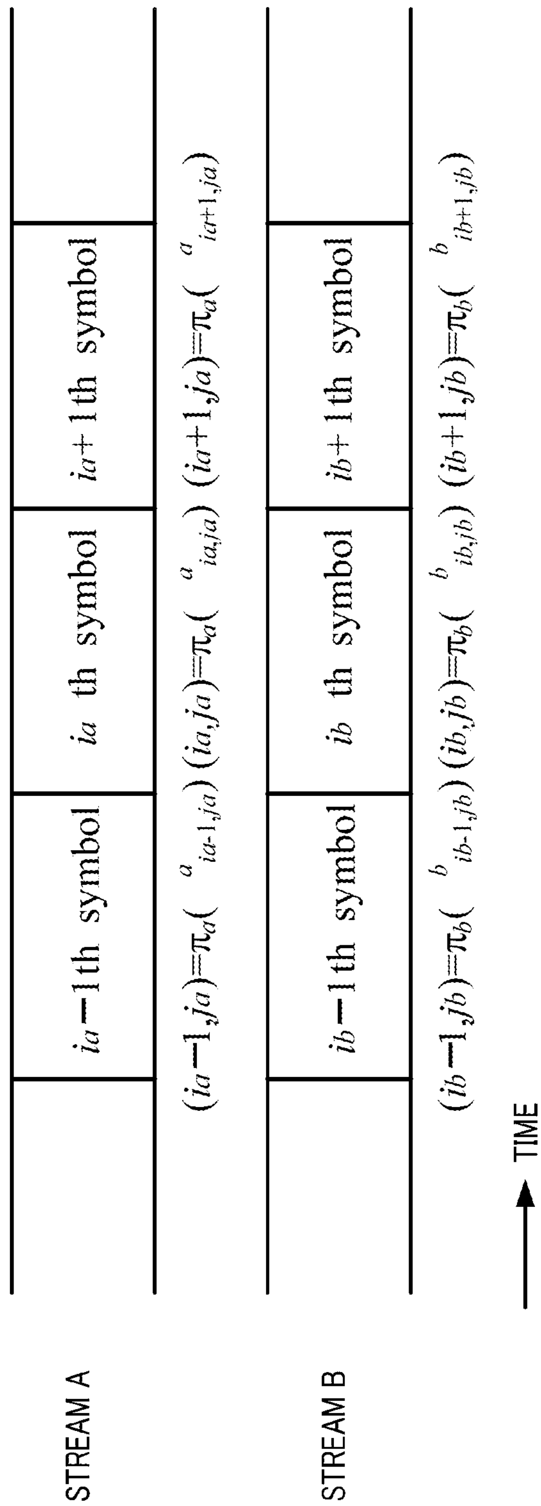
FIG. 43 is a drawing provided to explain the order of symbols after interleaving.

FIG. 43 shows transmit frame configurations, and more particularly shows the order of symbols after interleaving. In FIG. 43, $i_a$ and $i_b$ indicate the post-interleaving symbol orders for stream A and stream B, $j_a$ and $j_b$ indicate bit positions according to the modulation method ($j_a$, $j_b$=1, . . . , h), $\pi_a$ and $\pi_b$ indicate stream A and stream B interleavers, and $\Omega^b i_a$, $j_a$ and $\Omega^b i_b$, $j_b$ indicate the pre-interleaving data orders of stream A and stream B. FIG. 43 shows frame configurations when $i_a=i_b$. Here, ($i_a$, $j_a$) and ($i_b$, $j_b$) are described as shown in the following equations.

$$(i_a,j_a)=\pi_a(\Omega_{ia,ja}{}^a) \quad \text{(Equation 17)}$$

$$(i_b,j_b)=\pi_b(\Omega_{ib,jb}{}^a) \quad \text{(Equation 18)}$$

(3-2) Iterative Decoding

Here, sum-product decoding and MIMO signal iterative detection algorithms used when the receiving apparatus performs LDPC code decoding will be described in detail.

(3-2-1) Sum-Product Decoding

Here, two-dimensional (M×N) matrix H={$H_{mn}$} will be taken as an LDPC code check matrix subject to decoding. Subset A(m), B(n) of set [1, N]={1, 2, . . . , N} is defined as shown in the following equations.

$$A(m)\equiv\{n:H_{mn}=1\} \quad \text{(Equation 19)}$$

$$B(n)\equiv\{m:H_{mn}=1\} \quad \text{(Equation 20)}$$

A(m) means a set of column index 1 in the m'th row of check matrix H, and B(n) means a set of row index 1 in the n'th row of check matrix H. The sum-product decoding algorithm is as follows.

Step A·1 (initialization): A priori value logarithmic ratio $\beta_{mn}=0$ is assumed for all pairs (m,n) satisfying $H_{mn}=1$. Loop variable (number of iterations) $l_{sum}=1$ is assumed, and the maximum number of loops is set as $l_{sum,max}$.

Step A·2 (line processing): External value logarithmic ratio $\alpha_{mn}$ is updated using following update equations Equation (21) to Equation (23) for all pairs (m,n) satisfying $H_{mn}=1$ in the order m=1, 2, . . . , M.

(Equation 21)

$$\alpha_{mn}=\left(\prod_{n'\in A(m)\backslash n}\text{sign}(\beta_{mn'})\right)\times f\left(\sum_{n'\in A(m)\backslash n} f(|\beta_{mn'}|)\right) \quad [21]$$

(Equation 22)

$$\text{sign}(x)\equiv\begin{cases}1 & x\geq 0\\ -1 & x<0\end{cases} \quad [22]$$

(Equation 23)

$$f(x)\equiv\ln\frac{\exp(x)+1}{\exp(x)-1} \quad [23]$$

In the above equations, f is a Gallager function. The method of finding $\lambda_n$ will be described later herein.

Step A·3 (column processing): External value logarithmic ratio $\beta_{mn}$ is updated using the following update equation for all pairs (m,n) satisfying $H_{mn}=1$ in the order n=1, 2, . . . , N.

(Equation 24)

$$\beta_{mn}=\lambda_n+\sum_{m'\in B(n)\backslash m}\alpha_{m'n} \quad [24]$$

Step A·4 (logarithmic likelihood ratio calculation): Logarithmic likelihood ratio Ln is found for n∈[1,N] as shown in the following equation.

(Equation 25)

$$L_n=\lambda_n+\sum_{m'\in B(n)}\alpha_{m'n} \quad [25]$$

Step A·5 (count of number of iterations): If $l_{sum}<l_{sum,max}$, $l_{sum}$ is incremented, and Step A·2 is returned to. If $l_{sum}=l_{sum,max}$, $l_{sum}$, the present sum-product decoding is terminated.

The above is one sum-product decoding operation. Thereafter, MIMO signal iterative detection is performed. Variables m, n, $\alpha_{mn}$, $\beta_{mn}$, $\lambda_n$, and $L_n$ used in the above description of a sum-product decoding operation are represented by variables $m_a$, $n_a$, $\alpha^a{}_{mana}$, $\beta^a{}_{mana}$, $\lambda_{na}$, and $L_{na}$ in the case of stream A, and by variables $m_b$, $n_b$, $\alpha^b{}_{mbnb}$, $\beta^b{}_{mbnb}$, $\lambda_{nb}$, and $L_{nb}$ in the case of stream B.

(3-2-2) MIMO Signal Iterative Detection

Here, the method of finding $\lambda_n$ in MIMO signal iterative detection will be described in detail. From Equation (2), the following equation holds true.

(Equation 26)

$$\begin{aligned}y(t)&=(y_1(t),y_2(t))^T\\&=H_{22}(t)s(t)+n(t)\end{aligned} \quad [26]$$

From the frame configuration in FIG. 43 and Equation (18) and Equation (19), the following equations are defined.

$$n_a=\Omega_{ia,ja}{}^a \quad \text{(Equation 27)}$$

$$n_b=\Omega_{ib,jb}{}^b \quad \text{(Equation 28)}$$

At this time, $n_a$, $n_b \in [1,N]$. Hereinafter, $\lambda_{na}$, $L_{na}$, $\lambda_{nb}$, and $L_{nb}$ in the case of MIMO signal iterative detection number of iterations k are expressed as $\lambda_{k,na}$, $L_{k,na}$, $\lambda_{k,nb}$, and $L_{k,nb}$, respectively.

Step B·1 (initial detection; k=0): In initial detection, $\lambda_{0,na}$ and $\lambda_{0,nb}$ are found as shown in the following equation.

In the case of iterative APP decoding:

(Equation 29)

$$\lambda_{0,n_X} = \ln\frac{\sum_{U_{0,n_X,+1}} \exp\left\{-\frac{1}{2\sigma^2}\|y(i_X) - H_{22}(i_X)s(u(i_X))\|^2\right\}}{\sum_{U_{0,n_X,-1}} \exp\left\{-\frac{1}{2\sigma^2}\|y(i_X) - H_{22}(i_X)s(u(i_X))\|^2\right\}} \quad [29]$$

In the case of iterative Max-log APP decoding:

(Equation 30)

$$\lambda_{0,n_X} = \max_{U_{0,n_X,+1}}\{\Psi(u(i_X), y(i_X))\} - \max_{U_{0,n_X,-1}}\{\Psi(u(i_X), y(i_X))\} \quad [30]$$

(Equation 31)

$$\Psi(u(i_X), y(i_X)) = -\frac{1}{2\sigma^2}\|y(i_X) - H_{22}(i_X)S(u(i_X))\|^2 \quad [31]$$

where X=a,b. Then the MIMO signal iterative detection number of iterations is assumed to be $l_{mimo}=0$, and the maximum number of iterations is set as $l_{mimo,max}$.

Step B·2 (iterative detection; number of iterations k): In the case of number of iterations k, from Equation (14) to Equation (16), Equation (27), and Equation (28), $\lambda_{k,na}$ and $\lambda_{k,nb}$ are expressed as shown in following Equation (32) to Equation (35), where (X,Y)=(a,b) (b,a).

In the case of iterative APP decoding:

(Equation 32)

$$\lambda_{k,n_X} = -L_{k-1,\Omega^X_{iX,jX}}\left(u_{\Omega^X_{iX,jX}}\right) + \ln\frac{\sum_{U_{k,n_X,+1}} \exp\left\{-\frac{1}{2\sigma^2}\|y(i_X) - H_{22}(i_X)s(u(i_X))\|^2 + \rho\left(u_{\Omega^X_{iX,jX}}\right)\right\}}{\sum_{U_{k,n_X,-1}} \exp\left\{-\frac{1}{2\sigma^2}\|y(i_X) - H_{22}(i_X)s(u(i_X))\|^2 + \rho\left(u_{\Omega^X_{iX,jX}}\right)\right\}} \quad [32]$$

(Equation 33)

$$\rho\left(u_{\Omega^X_{iX,jX}}\right) = \sum_{\gamma=1}^{h}\left|\frac{L_{k-1,\Omega^X_{iX,\gamma}}\left(u_{\Omega^X_{iX,\gamma}}\right)}{2}\right|\left(u_{\Omega^X_{iX,\gamma}}\operatorname{sign}\left(L_{k-1,\Omega^X_{iX,\gamma}}\left(u_{\Omega^X_{iX,\gamma}}\right)\right)\right) + \sum_{\gamma=1}^{h}\left|\frac{L_{k-1,\Omega^Y_{iX,\gamma}}\left(u_{\Omega^Y_{iX,\gamma}}\right)}{2}\right|\left(u_{\Omega^Y_{iX,\gamma}}\operatorname{sign}\left(L_{k-1,\Omega^Y_{iX,\gamma}}\left(u_{\Omega^Y_{iX,\gamma}}\right)\right)\right) \quad [33]$$

In the case of iterative Max-log APP decoding:

(Equation 34)

$$\lambda_{k,n_X} = -L_{k-1,\Omega^X_{iX,jX}}\left(u_{\Omega^X_{iX,jX}}\right) + \max_{U_{k,n_X,+1}}\left\{\Psi\left(u(i_X), y(i_X), \rho\left(u_{\Omega^X_{iX,jX}}\right)\right)\right\} - \max_{U_{k,n_X,-1}}\left\{\Psi\left(u(i_X), y(i_X), \rho\left(u_{\Omega^X_{iX,jX}}\right)\right)\right\} \quad [34]$$

(Equation 35)

$$\Psi\left(u(i_X), y(i_X), \rho\left(u_{\Omega^X_{iX,jX}}\right)\right) = -\frac{1}{2\sigma^2}\|y(i_X) - H_{22}(i_X)s(u(i_X))\|^2 + \rho\left(u_{\Omega^X_{iX,jX}}\right) \quad [35]$$

Step B·3 (count of number of iterations, codeword estimation): If $l_{mimo} < l_{mimo,max}$, $l_{mimo}$ is incremented, and Step B·2 is returned to. If $l_{mimo} = l_{mimo,max}$, $l_{sum}$, an estimated codeword is found as shown in the following equation, where X=a,b.

(Equation 36)

$$\hat{u}_{n_X} = \begin{cases} 1 & L_{l_{mimo},n_X} \geq 0 \\ -1 & L_{l_{mimo},n_X} < 0 \end{cases} \quad [36]$$

(4) Consideration Using Factor Graphs

Here, factor graphs will be described for a case in which the interleave patterns of stream A and stream B are the same (SIP: Same Interleave Pattern), and a case in which the interleave patterns of stream A and stream B are different (VIP: Varying Interleave Pattern), and the effect of using VIP, as in this embodiment, will be considered.

(4-1) When the Interleave Patterns are the Same (SIP)

Figure 44:
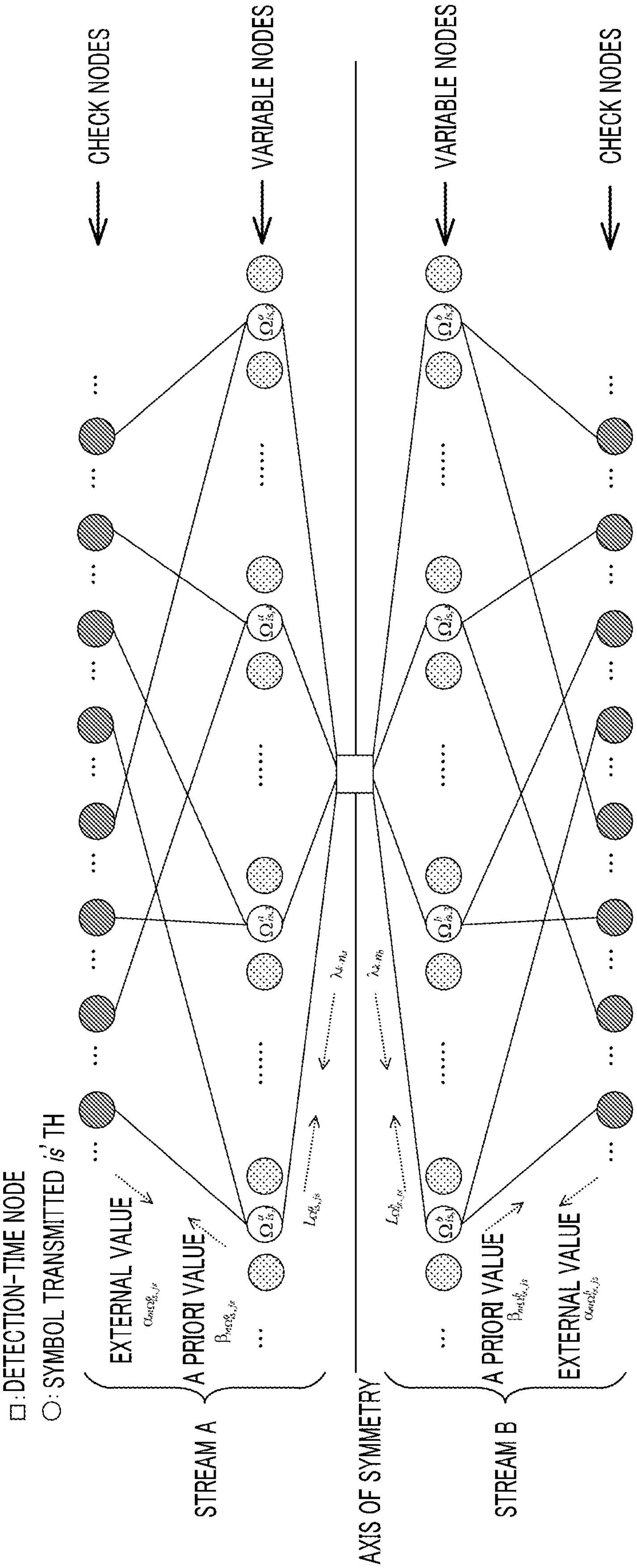
FIG. 44 is a factor graph for a case in which the interleave patterns of stream A and stream B are the same.

FIG. 44 shows a factor graph for a case in which, as an example, the modulation method is 16QAM and the interleave patterns of stream A and stream B are the same in the above system model. At this time, when the relational expression of the following equation holds true, $$n_a(=\Omega_{ia,ja}^{a}) = n_b(=\Omega_{ib,jb}^{b}) \quad \text{(Equation 37)}$$

the relational expression of the following equation holds true.

$$(i_a, j_a) = (i_b, j_b) = (i_s, j_s) \quad \text{(Equation 38)}$$

Since LDPC code is the same for stream A and stream B, nodes and edges are symmetrical about the axis of symmetry as shown in FIG. 44. When SIP is performed, Equation (38) holds true for $(i_a, j_a)$ corresponding to a stream A Variable node and $(i_b, j_b)$ corresponding to a stream B Variable node in a symmetrical relationship to the axis of symmetry.

As can be seen from FIG. 44 and Equation (32) to Equation (35), in the case of number of iterations k, $L_{k-1}$, $\Omega_{ia,\gamma}^{a}$ ($\gamma \neq j_a$, $\gamma=1, \ldots, h$) from stream A and $L_{k-1}$, $\Omega_{ib,\gamma}^{b}$ ($\gamma=1, \ldots, h$) from stream B propagated to a variable node corresponding to $n_a$ of stream A are symbols of the same time (that is, $i_a=i_b=i_s$), and therefore the influence of channel matrix $H_{22}(i_s)$ is large.

That is to say, since only limited time influence is received, there is a high possibility of stream A space-time diversity gain being small. The same also applies to stream B. However, in $L_{k-1}$, $\Omega_{ia,\gamma}^{a}$, $L_{k-1}$, $\Omega_{ib,\gamma}^{b}$, influence of a node of a position at which there is 1 in check matrix H is also received through calculation of $\alpha_{mn}$, and $\beta_{mn}$ by means of sum-product decoding, and a stream A node and stream B node that provide that influence are symbols of the same time and at the same bit position in the modulation method (incidentally, a plurality of these nodes exist since there are a plurality of 1s in check matrix H). Therefore, in sum-product decoding also, there is a high possibility of space-time diversity gain being small for both stream A and stream B since only limited time influence is received.

(4-2) When the Interleave Patterns are Different (VIP)

Figure 45:
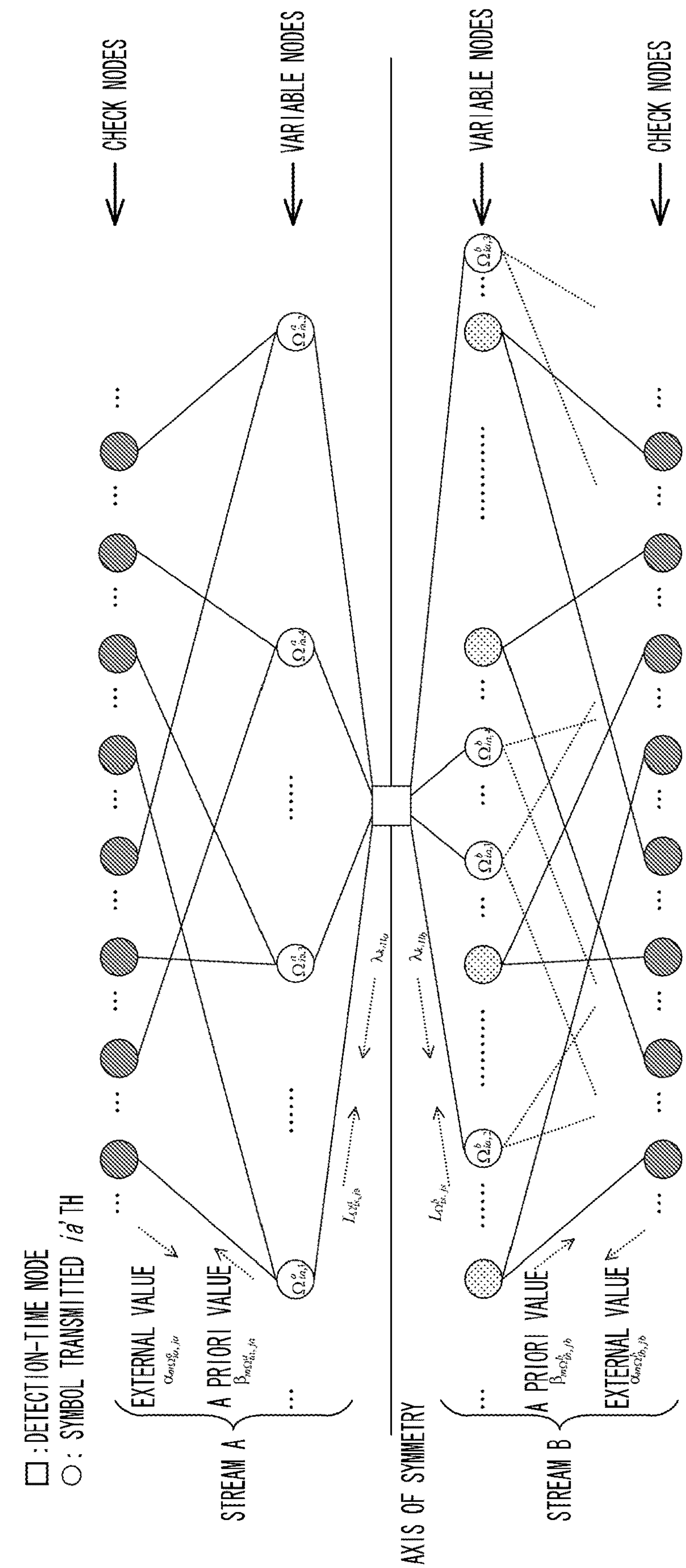
FIG. 45 is a factor graph for a case in which the interleave patterns of stream A and stream B are different.

FIG. 45 shows a factor graph for a case in which, as an example, the modulation method is 16QAM (that is, h=4) and the interleave patterns of stream A and stream B are different in the above model. Nodes and edges in FIG. 45 are symmetrical about the axis of symmetry for part of sum-product decoding. However, edges relating to MIMO signal iterative detection are not symmetrical about the axis of symmetry. Thus, in the case of VIP, reliability propagation is performed for more times (or frequencies) than in the case of SIP. Therefore, there is a higher possibility of time (or frequency depending on the case) and space diversity gain improving.

As shown in FIG. 45, in the case of number of iterations k, $L_{k-1}$, $\Omega_{ia,\gamma}^{a}$ ($\gamma \neq j_a$, $\gamma=1, \ldots, h$) from stream A and by $L_{k-1}$, $\Omega_{ib,\gamma}^{b}$ ($\gamma=1, \ldots, h$) from stream B propagated to a variable node corresponding to $n_a$ of stream A are expressed as $L_{k-1}$, $\Omega_{ia,\gamma}^{a}$, $L_{k-1}$, $\Omega_{ia,\gamma}^{b}$. In the case of number of iterations k, $L_{k-1}$, $\Omega_{ia,\gamma}^{a}$ ($\gamma=j_a$, $\gamma=1, \ldots, h$) from stream A and $L_{k-1}$, $\Omega_{ib,\gamma}^{b}$ ($\gamma=1, \ldots, h$) from stream B propagated to a variable node corresponding to $n_a$ of stream A are symbols of the same time (that is, $i_a=i_b=i_s$), and the influence of channel matrix $H_{22}(i_s)$ is large.

That is to say, since only limited time influence is received, there is a high possibility of stream A space-time diversity gain being small. The same also applies to stream B. This point is the same as when SIP is performed.

However, in $L_{k-1}$, $\Omega_{ia,\gamma}^{a}$, $L_{k-1}$, $\Omega_{ia,\gamma}^{b}$, influence of a node of a position at which there is 1 in check matrix H is also received through calculation of $a_{mn}$ and $\beta_{mn}$ by means of sum-product decoding. The majority of stream A nodes and stream B nodes that provide that influence have lost symmetry, and are therefore symbols of different times and at different bit positions in the modulation method. Therefore, in sum-product decoding, there is a high possibility of influence of many times also being received when SIP is used. Consequently, space-time diversity gain can be increased for stream A. The same also applies to stream B.

As described above, by providing for the interleave patterns of stream A and stream B to be different, reception quality when LDPC encoding is performed can be improved. In the above example, a case has been described in which LDPC encoding is performed, but this embodiment is not limited to this, and, essentially, when the above iterative decoding is performed, as long as interleave processing is executed with a different interleave pattern for each stream, reception quality can be improved in the same way as in the above example irrespective of the number of antennas (the number of transmitted modulated signals) or the modulation method.

Figure 46:
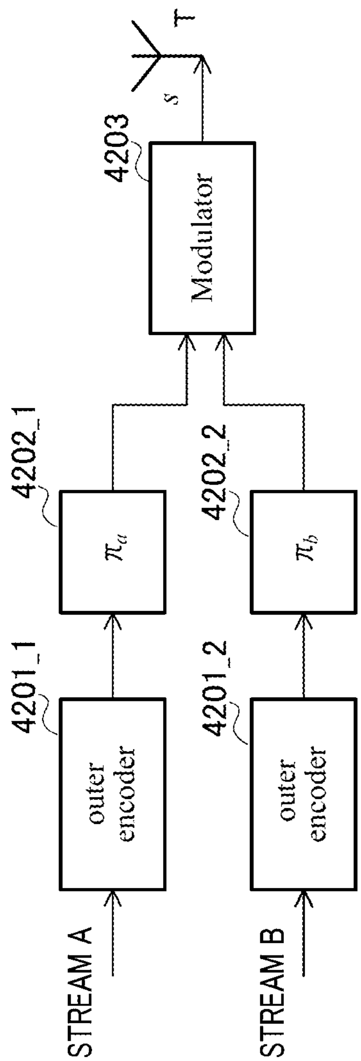
FIG. 46 is a block diagram showing the configuration of a transmitting apparatus that transmits a signal of a plurality of streams from a single antenna.

Also, in the above example, a case has been described in which interleave processing is performed with different interleave patterns for each stream, but this embodiment is not limited to this, and the same effect can also be obtained by application to a communication method whereby a signal of a plurality of streams is transmitted from a single antenna as shown in FIG. 46, in which parts corresponding to those in FIG. 42A are assigned the same reference codes as in FIG. 42A.

(5) Interleaving Method and Configuration of this Embodiment

A detailed description is given below of the interleaving method and configuration of this embodiment using the data arrangement method described in Embodiments 1 to 7 and utilizing the above characteristics in MIMO system using spatial multiplexing.

(5-1) Implementation Example 1

Figure 47:
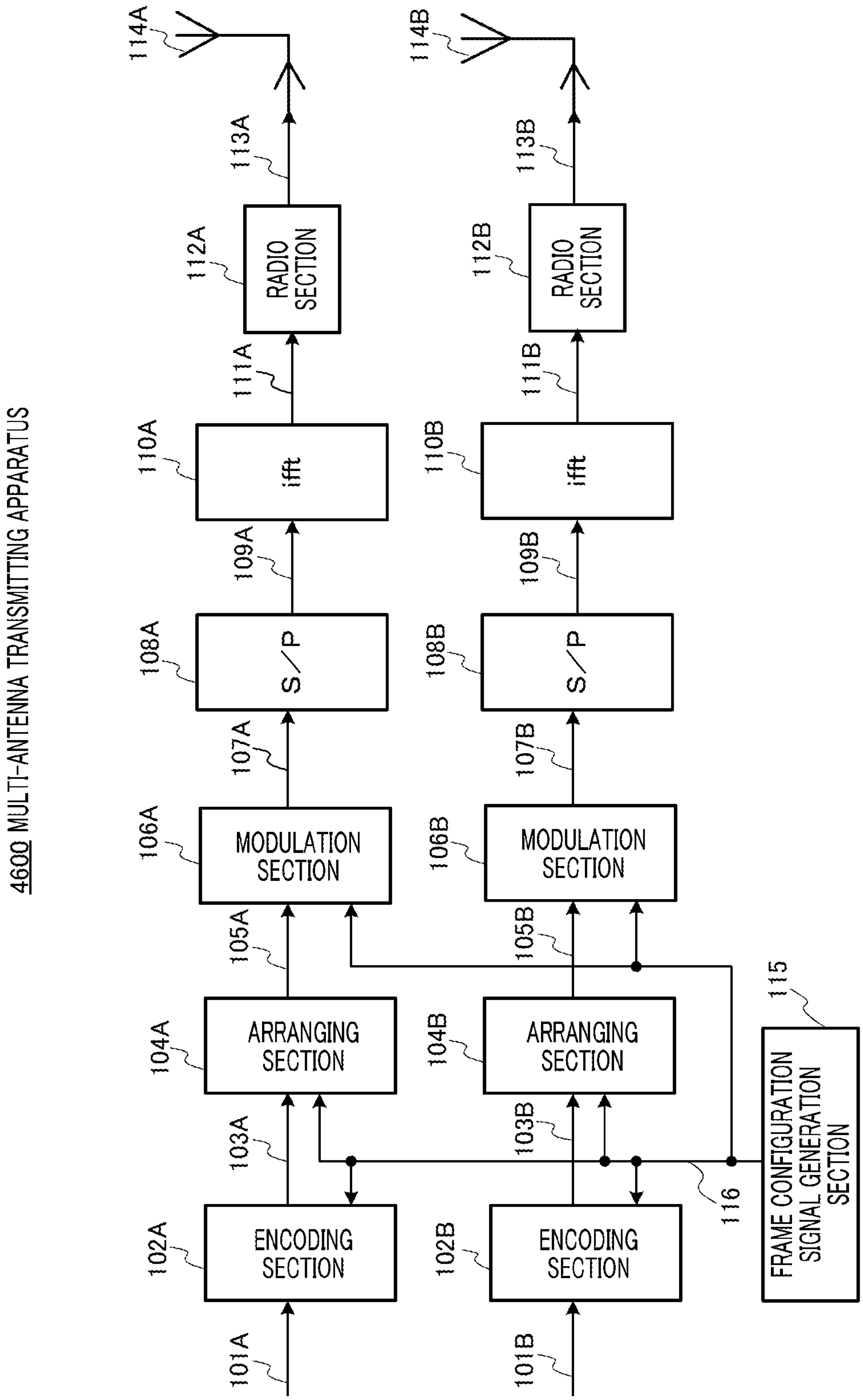
FIG. 47 is a block diagram showing an example of the configuration of a multi-antenna transmitting apparatus of Embodiment 8.

FIG. 47 shows an example of the configuration of a multi-antenna transmitting apparatus of Implementation Example 1. The general configuration of multi-antenna transmitting apparatus 4600 is almost the same as that of multi-antenna transmitting apparatus 100 in FIG. 9 described in Embodiment 2, and therefore parts corresponding to those in FIG. 9 are assigned the same reference codes as in FIG. 9, and a detailed description thereof is omitted here. The following description centers on interleave processing (corresponding to processing that assigns bits to symbols) by arranging sections 104A and 104B that is a characteristic of this embodiment.

Figure 3:
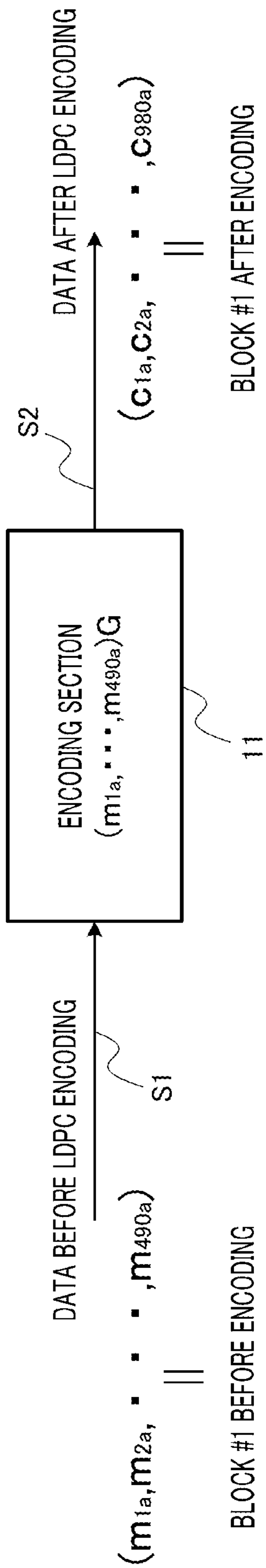
FIG. 3 is a drawing provided to explain LDPC encoding processing by an encoding section.

In this example, a case will be described by way of example in which LDPC encoding as illustrated in FIG. 3 is performed by encoding sections 102A and 102B.

Figure 48:
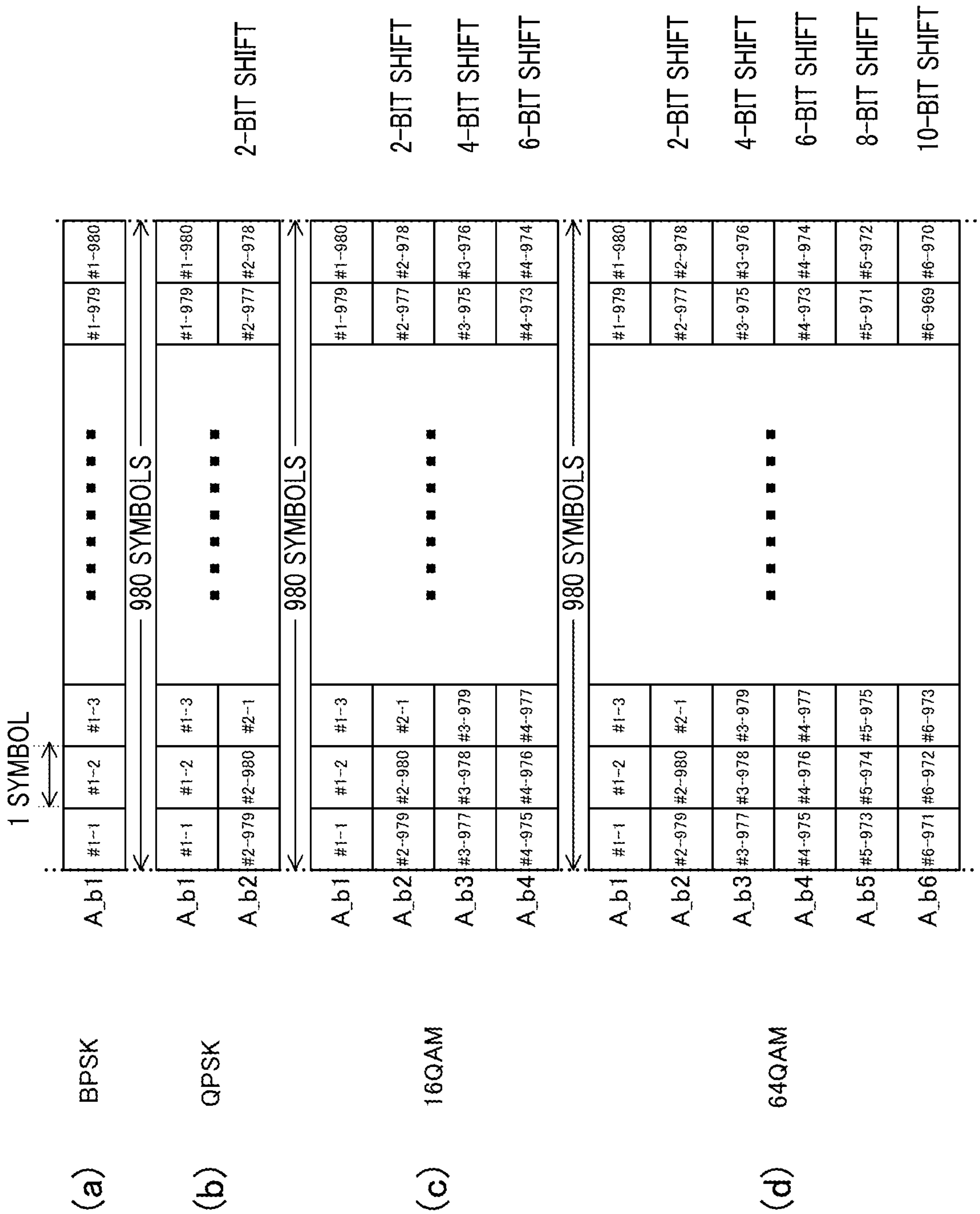
FIG. 48 is a drawing showing examples of processing that assigns bits to symbols for modulated signal (stream) A transmitted from antenna 114A.
Figure 49:
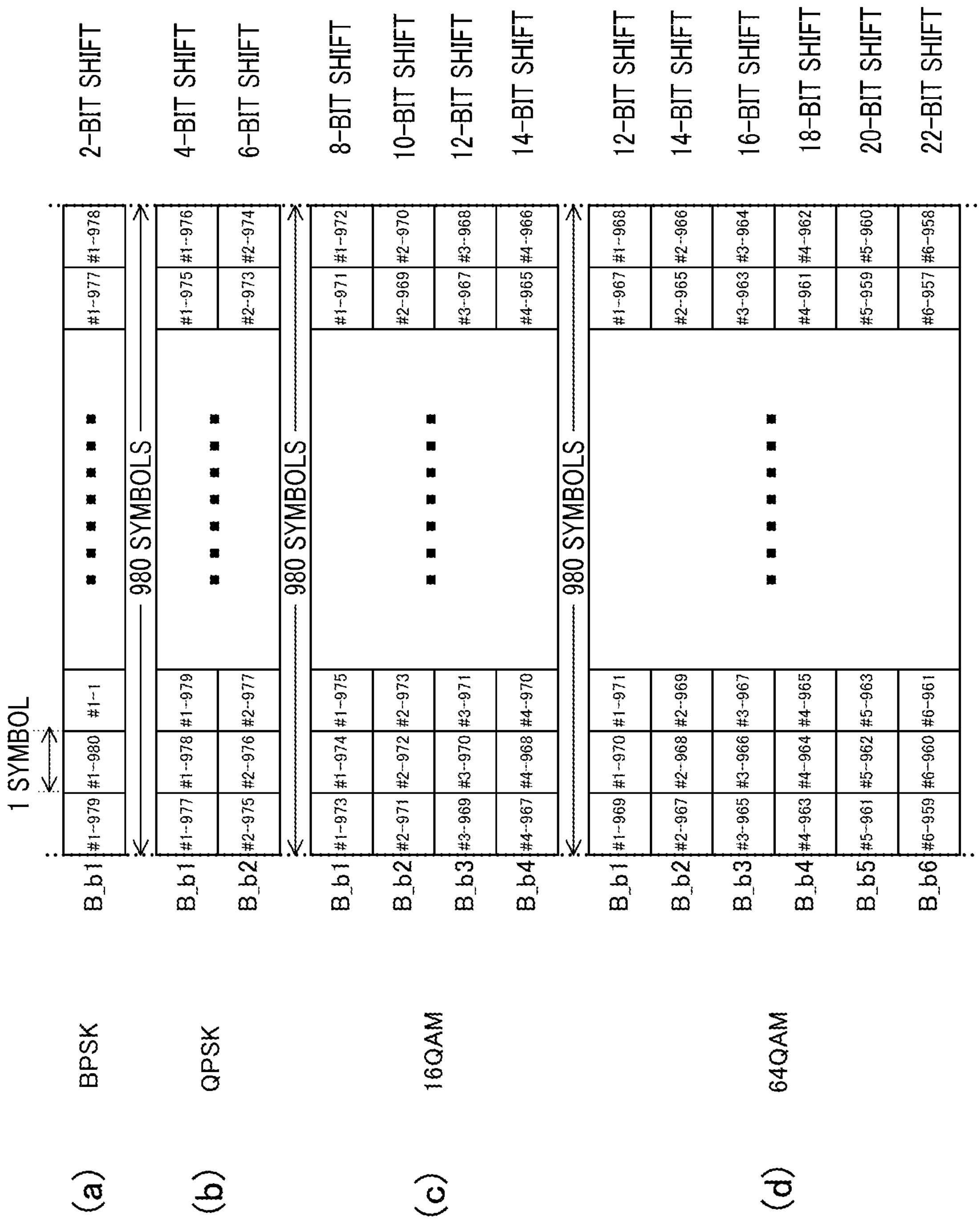
FIG. 49 is a drawing showing examples of processing that assigns bits to symbols for modulated signal (stream) B transmitted from antenna 114B.

FIG. 48 and FIG. 49 show to which post-modulation symbols bits in each LDPC encoded block are assigned. Specifically, FIG. 48 and FIG. 49 show the symbols in which encoded data in one block (data after LDPC encoding) configured by means of 980 bits are placed. The horizontal axis indicates the symbol time sequence, and the vertical axis indicates the bit numbers configuring one symbol—that is, b1 in the case of BPSK; b1 and b2 in the case of QPSK; b1, b2, b3, and b4 in the case of 16QAM; and b1, b2, b3, b4, b5, and b6 in the case of 64QAM.

FIG. 48 shows examples of interleave processing (that is, processing that assigns bits to symbols) for modulated signal (stream) A transmitted from antenna 114A in FIG. 47.

FIG. 48(*a*) shows bit assignment to each symbol when the modulation method is BPSK. When the modulation method is BPSK, one bit (A_b1) is transmitted in one symbol, and therefore only one 980-bit encoded block is transmitted by means of 980 symbols.

FIG. 48(*b*) shows bit assignment to each symbol when the modulation method is QPSK. When the modulation method is QPSK, two bits (A_b1, A_b2) are transmitted in one symbol, and therefore two 980-bit post-encoding blocks can be transmitted by means of 980 symbols. As is clear from the drawing, each symbol here is configured by collecting together intra-block encoded data of different encoded blocks. Specifically, bits #1-1 to #1-980 of post-encoding block #1 are assigned to bit A_b1 of the 980 QPSK symbols, and bits #2-1 to #2-980 of post-encoding block #2 are assigned to bit A_b2 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 48(*c*) shows bit assignment to each symbol when the modulation method is 16QAM. When the modulation method is 16QAM, four bits (A_b1, A_b2, A_b3, A_b4) are transmitted in one symbol, and therefore four 980-bit post-encoding blocks can be transmitted by means of 980 symbols. A characteristic of bit assignment to each symbol here is that, as with QPSK, encoded data in one block are assigned to a plurality of symbols. Specifically, data #1-1 to #1-980 of post-encoding block #1 are assigned to bit A_b1 of the 980 16QAM symbols, data #2-1 to #2-980 of post-encoding block #2 are assigned to bit A_b2 of the 980 symbols, data #3-1 to #3-980 of post-encoding block #3 are assigned to bit A_b3 of the 980 symbols, and data #4-1 to #4-980 of post-encoding block #4 are assigned to bit A_b4 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 48(*d*) shows bit assignment to each symbol when the modulation method is 64QAM. When the modulation method is 64QAM, six bits (A_b1, A_b2, A_b3, A_b4, A_b5, A_b6) are transmitted in one symbol, and therefore six 980-bit post-encoding blocks can be transmitted by means of 980 symbols. A characteristic of bit assignment to each symbol here is that, as with QPSK and 16QAM, encoded data in one block are assigned to a plurality of symbols. Specifically, data #1-1 to #1-980 of post-encoding block #1 are assigned to bit A_b1 of the 980 64QAM symbols, data #2-1 to #2-980 of post-encoding block #2 are assigned to bit A_b2 of the 980 symbols, data #3-1 to #3-980 of post-encoding block #3 are assigned to bit A_b3 of the 980 symbols, data #4-1 to #4-980 of post-encoding block #4 are assigned to bit A_b4 of the 980 symbols, data #5-1 to #5-980 of post-encoding block #5 are assigned to bit A_b5 of the 980 symbols, and data #6-1 to #6-980 of post-encoding block #6 are assigned to bit A_b6 of the 980 symbols.

By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 49 shows examples of interleave processing (that is, processing that assigns bits to symbols) for modulated signal (stream) B transmitted from antenna 114B in FIG. 47.

FIG. 49(*a*) shows bit assignment to each symbol when the modulation method is BPSK. When the modulation method is BPSK, one bit (B_b1) is transmitted in one symbol, and therefore only one 980-bit encoded block is transmitted by means of 980 symbols.

FIG. 49(*b*) shows bit assignment to each symbol when the modulation method is QPSK. When the modulation method is QPSK, two bits (B_b1, B_b2) are transmitted in one symbol, and therefore two 980-bit post-encoding blocks can be transmitted by means of 980 symbols. As is clear from the drawing, each symbol here is configured by collecting together intra-block encoded data of different encoded blocks. Specifically, bits #1-1 to #1-980 of post-encoding block #1 are assigned to bit B_b1 of the 980 QPSK symbols, and bits #2-1 to #2-980 of post-encoding block #2 are assigned to bit B_b2 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 49(*c*) shows bit assignment to each symbol when the modulation method is 16QAM. When the modulation method is 16QAM, four bits (B_b1, B_b2, B_b3, B_b4) are transmitted in one symbol, and therefore four 980-bit post-encoding blocks can be transmitted by means of 980 symbols. A characteristic of bit assignment to each symbol here is that, as with QPSK, encoded data in one block are assigned to a plurality of symbols. Specifically, data #1-1 to #1-980 of post-encoding block #1 are assigned to bit B_b1 of the 980 16QAM symbols, data #2-1 to #2-980 of post-encoding block #2 are assigned to bit B_b2 of the 980 symbols, data #3-1 to #3-980 of post-encoding block #3 are assigned to bit B_b3 of the 980 symbols, and data #4-1 to #4-980 of post-encoding block #4 are assigned to bit B_b4 of the 980 symbols. By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

FIG. 49(*d*) shows bit assignment to each symbol when the modulation method is 64QAM. When the modulation method is 64QAM, six bits (B_b1, B_b2, B_b3, B_b4, B_b5, B_b6) are transmitted in one symbol, and therefore six 980-bit post-encoding blocks can be transmitted by means of 980 symbols. A characteristic of bit assignment to each symbol here is that, as with QPSK and 16QAM, encoded data in one block are assigned to a plurality of symbols. Specifically, data #1-1 to #1-980 of post-encoding block #1 are assigned to bit B_b1 of the 980 64QAM symbols, data #2-1 to #2-980 of post-encoding block #2 are assigned to bit B_b2 of the 980 symbols, data #3-1 to #3-980 of post-encoding block #3 are assigned to bit B_b3 of the 980 symbols, data #4-1 to #4-980 of post-encoding block #4 are assigned to bit B_b4 of the 980 symbols, data #5-1 to #5-980 of post-encoding block #5 are assigned to bit B_b5 of the 980 symbols, and data #6-1 to #6-980 of post-encoding block #6 are assigned to bit B_b6 of the 980 symbols.

By this means, bits (data) in each encoded block can be dispersed temporally across a number of symbols equal to that of BPSK, enabling an overall drop in the quality of data within an encoded block because of a notch due to fading to be avoided. Thus, since the probability of most data within an encoded block being erroneous in a burst fashion is low, the error rate performance can be improved.

In addition to the above, in this implementation example provision is made for the pattern of bit assignment to symbols to be varied between modulated signal A and modulated signal B by varying the bit shift amount in modulated signal A and modulated signal B as shown in FIG. 48 and FIG. 49. Specifically, arranging sections 104A and 104B can be configured using different bit shifters. This enables the pattern of bit assignment to symbols to be varied between modulated signal A and modulated signal B by means of a simple circuit configuration. This point is explained in detail below.

First, as one condition, it is assumed that the same encoding method is used in FIG. 48 and FIG. 49. This makes commonality of encoding sections 102A and 102B possible, enabling the circuitry to be simplified accordingly.

Here, the simplest method of varying the pattern of bit assignment to symbols (interleave pattern) between modulated signal (stream) A and modulated signal (stream) B may be considered to be the use of different interleavers for stream A and stream B. However, this method increases the computation scale.

Thus, in this implementation example, the pattern of bit assignment to symbols (interleave pattern) is varied between modulated signal (stream) A and modulated signal (stream) B by means of bit shifting alone.

As shown in FIG. 48(*a*) and FIG. 49(*a*), when a BPSK modulated signal is transmitted as modulated signal A and modulated signal B, modulated signal B is formed by performing a 2-bit shift on modulated signal A.

Also, as shown in FIG. 48(*b*) and FIG. 49(*b*), when a QPSK modulated signal is transmitted as modulated signal A and modulated signal B, the order of transmission of A_b1 is shifted by 2 bits in A_b2, by 4 bits in B_b1, and by 6 bits in B_b2. By this means, the interleave patterns of modulated signal A and modulated signal B can be made different, and the interleave patterns of A_b1, A_b2, B_b1, and B_b2 can also be made different. In particular, making the interleave patterns of A_b1, A_b2, B_b1, and B_b2 different enables reception quality to be improved as described above using the factor graphs in FIG. 44 and FIG. 45.

Similarly, as shown in FIG. 48(*c*) and FIG. 49(*c*), and in FIG. 48(*d*) and FIG. 49(*d*), when a 16QAM or 64QAM modulated signal is transmitted as modulated signal A and modulated signal B, by executing a bit shift of a different shift amount for each bit in an encoded block transmitted by the respective bits (A_b1, A_b2, . . . , B_b1, B_b2 . . . ), the order in which data is transmitted is made different for each bit of each modulated signal (A_b1, A_b2, . . . , B_b1, B_b2 . . . ).

By making the order in which data is transmitted different for each bit of modulated signal A and modulated signal B by executing bit shifts of different shift amounts for each bit of each modulated signal in this way, reception quality in a receiver when iterative APP or iterative Max-log APP is performed can be improved.

(5-2) Implementation Example 2

Figure 50:
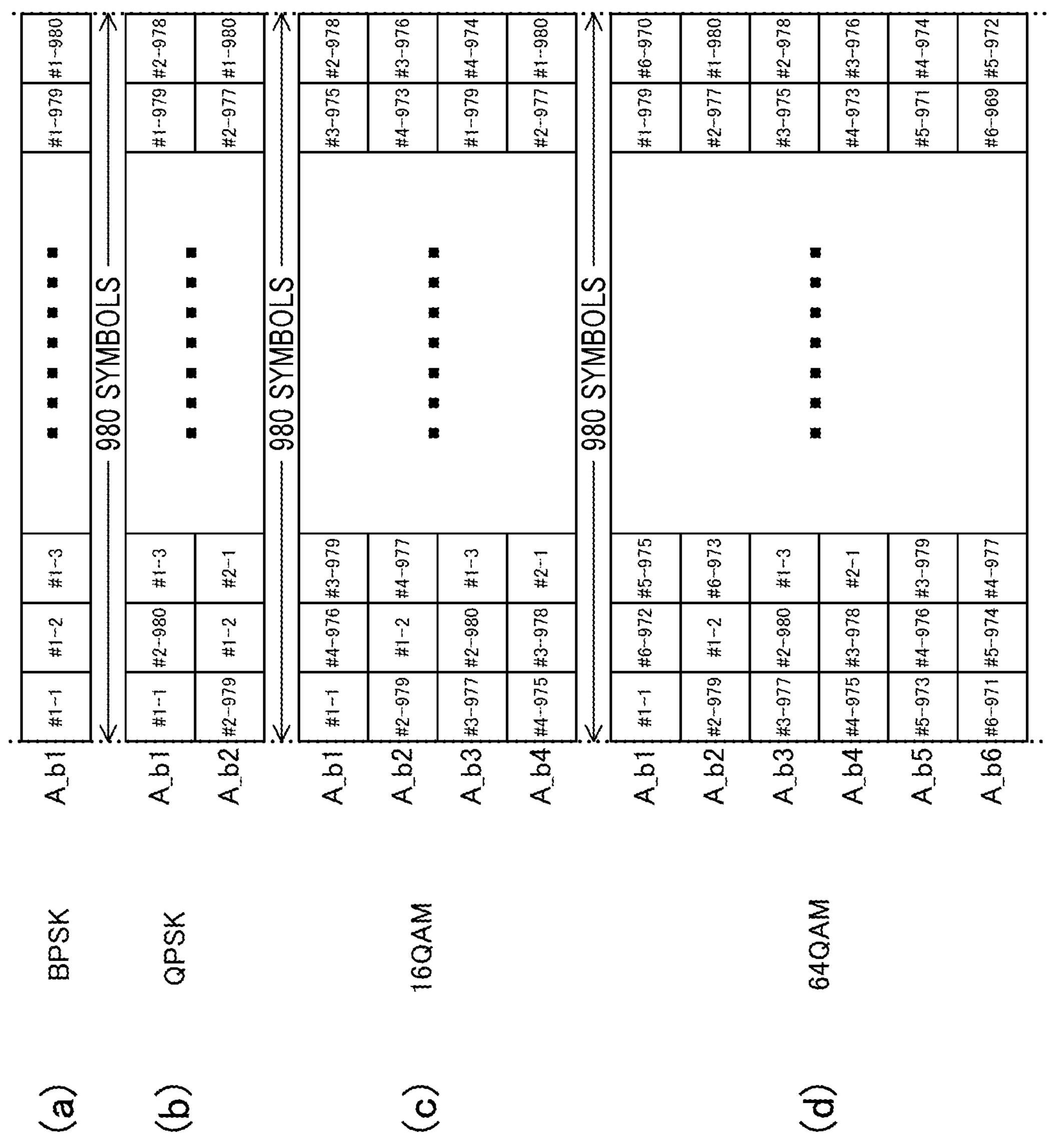
FIG. 50 is a drawing showing examples of processing that assigns bits to symbols for modulated signal (stream) A transmitted from antenna 114A.
Figure 51:
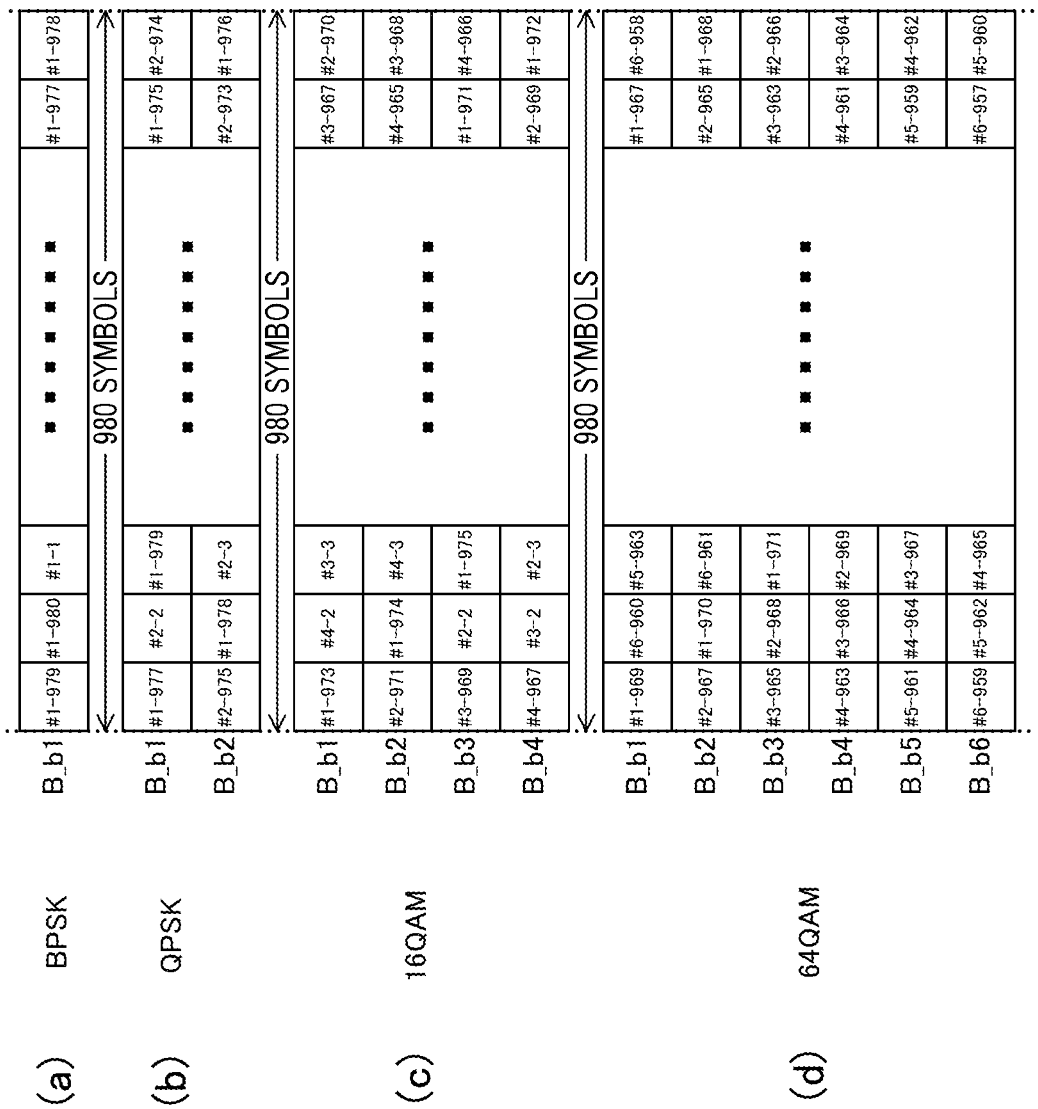
FIG. 51 is a drawing showing examples of processing that assigns bits to symbols for modulated signal (stream) B transmitted from antenna 114B.

FIG. 50 and FIG. 51 show examples of different interleave processing from that in FIG. 48 and FIG. 49. FIG. 50 shows examples of interleave processing (that is, processing that assigns bits to symbols) for modulated signal (stream) A transmitted from antenna 114A in FIG. 47, and FIG. 51 shows examples of interleave processing (that is, processing that assigns bits to symbols) for modulated signal (stream) B transmitted from antenna 114B in FIG. 47.

The relationship between FIG. 48 and FIG. 50 and the relationship between FIG. 49 and FIG. 51 are the same as the relationship between FIG. 5 and FIG. 6.

FIG. 50 and FIG. 51 are similar to FIG. 48 and FIG. 49 in that encoded data in one block are assigned to a plurality of symbols, and the same effect can be obtained in these cases as when arrangement is performed as shown in FIG. 48 and FIG. 49. FIG. 50 and FIG. 51 differ from FIG. 48 and FIG. 49 in that, with QPSK, 16QAM, and 64QAM, one post-encoding block is not assigned to a fixed bit (for example, A_b1 only), but is assigned to all bits (for example, in the case of 16QAM, A_b1, A_b2, A_b3, A_b4).

The reason for using such an assignment method will now be explained. There are differences in 16QAM A_b1 reception quality, A_b2 reception quality, A_b3 reception quality, and A_b4 reception quality. it will be assumed here that A_b1 reception quality is the poorest. In this case, if block #1 is transmitted using only A_b1, block #1 will be a block with poor reception quality. When communication based on packet is performed, packet errors are affected by the reception quality of the block with the poorest reception quality. Therefore, in this case, reception quality should be made as uniform as possible for blocks #1 to #4. This can be achieved by performing assignment as shown in FIG. 50 and FIG. 51. Also, preferably, the number of times assignment is performed to A_b1, A_b2, A_b3, and A_b4 should be made as uniform as possible for blocks #1 to #4. The difference in the number of times assignment is performed should preferably be once at most. Since the number of symbols is not necessarily a multiple of 4 (bits) (the number of bits that can be transmitted in one symbol in 16QAM), a difference of one time may occur however assignment is performed.

Here, a case in which 16QAM is used has been described by way of example, but the same effect can also be obtained when the same processing is performed with 64QAM. However, the same effect cannot necessarily be obtained in the case of QPSK since there is no difference in reception quality between A_b1 and A_b2. Nevertheless, since the possibility of a difference in reception quality arising due to distortion caused by the transmitting apparatus and receiving apparatus cannot be denied, there is a possibility of such an effect being obtained. Also, the ability to improve reception quality if transmission is performed after executing interleave processing as shown in FIG. 50 and FIG. 51 and iterative APP or iterative Max-log APP is performed by the receiver is the same as when interleave processing as shown in FIG. 48 and FIG. 49 is executed.

In the above explanation, a case has been described in which per-modulated-signal (stream) and intra-modulated-signal (stream) interleave patterns are made different by making the bit shift amounts different, but the method of making per-modulated-signal (stream) and intra-modulated-signal (stream) interleave patterns different is not limited to this. For example, as stated earlier, there is a method whereby random interleaving is performed for each modulated signal. In this case there is a drawback of the computation scale increasing, but as regards improving data reception quality the same effect can be obtained as in the above examples.

A method can also be conceived of whereby a plurality of block interleavers such as shown in FIG. 34 are provided, and different block interleave processing is executed for each bit of each modulated signal (A_b1, A_b2, . . . , B_b1, B_b2 . . . ). Essentially, the important point is that different data arrangement is performed for each bit of each modulated signal (A_b1, A_b2, . . . , B_b1, B_b2 . . . ).

The configuration of a transmitting apparatus of this implementation example will now be described in detail.

Figure 52:
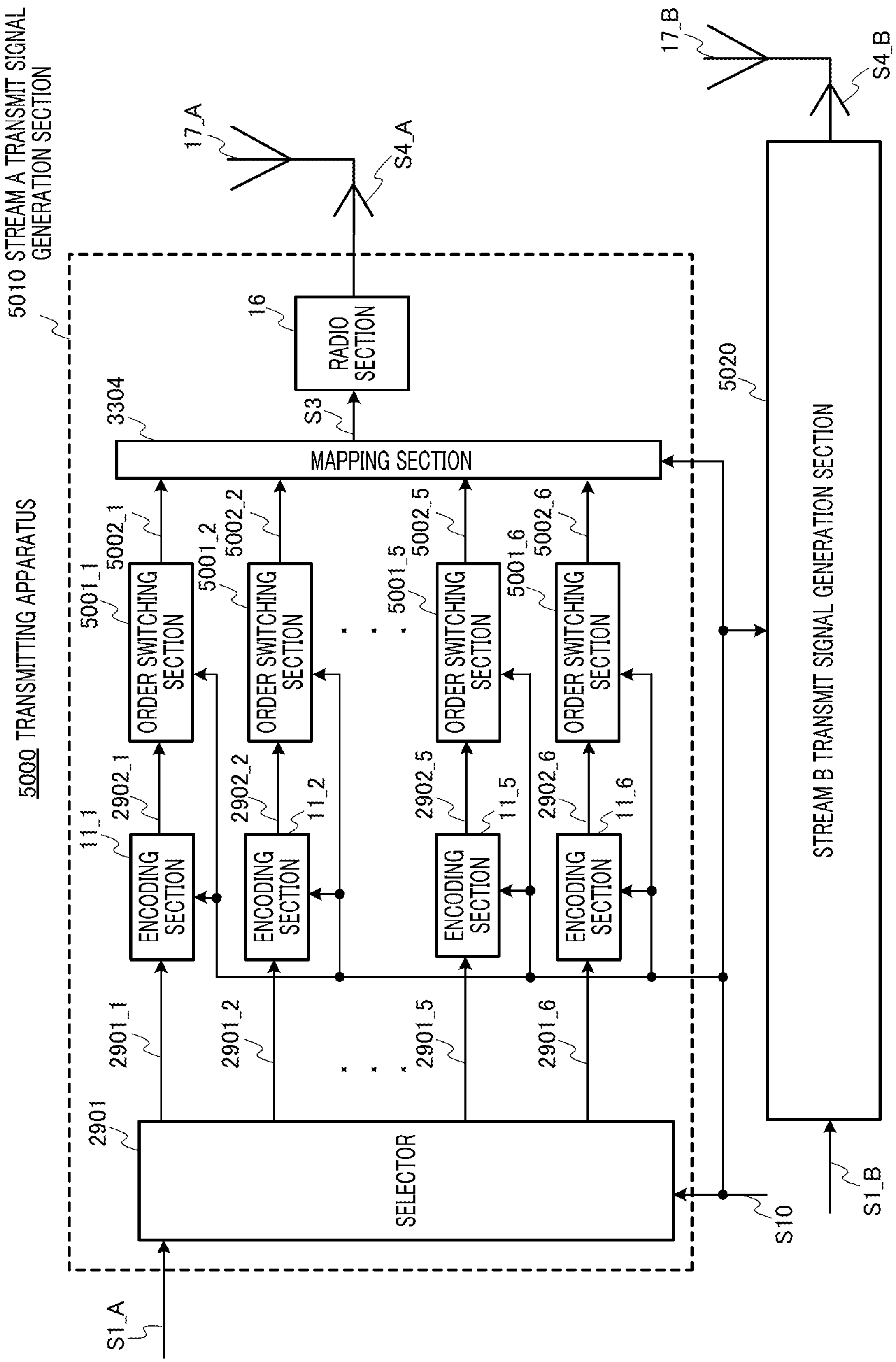
FIG. 52 is a block diagram showing an example of the configuration of a transmitting apparatus of Embodiment 8.

FIG. 52 shows a configuration of a transmitting apparatus of this implementation example. Transmitting apparatus 5000 shown in FIG. 52 is an example of a configuration for transmitting a pair of modulated signals as shown in FIG. 48 and FIG. 49 or as shown in FIG. 50 and FIG. 51 from respective antennas. In FIG. 52, configuration elements that operate in the same way as in FIG. 29 and FIG. 33 are assigned the same reference codes as in FIG. 29 and FIG. 33.

Transmitting apparatus 5000 in FIG. 52 differs from transmitting apparatus 2900 in FIG. 29 and transmitting apparatus 3300 in FIG. 33 in generating two transmit signals S4_A and S4_B from two streams S1_A and S1_B by means of stream A transmit signal generation section 5010 and stream B transmit signal generation section 5020, and transmitting these transmit signals from two antennas 17_A and 17_B.

In addition, order switching sections 5001 are provided between encoding sections 11 and mapping section 3304.

First, stream A transmit signal generation section 5010 will be described. Encoding sections 11_1, 11_2, 11_3, 114, 11_5, and 11_6 are configured by means of identical encoders. Thus, by making order switching (interleave patterns) different for following order switching sections 5001_1,

5001_2, 5001_3, 5001_4, 5001_5, and 5001_6, reception quality can be improved as described above using the factor graph in FIG. 45.

Each of order switching sections 5001_1, 5001_2, 5001_3, 5001_4, 5001_5, and 5001_6 performs different order switching. Order switching section 5001_1 actually has post-encoding data 2902_1 and control signal S10 as input, performs data order switching such as shown in FIG. 48, for example, in accordance with the control information frame configuration, and outputs post-order-switching encoded data 5002_1. Order switching sections 5001_2, 5001_3, 5001_4, 5001_5, and 5001_6 also perform the same operation as order switching section 5001_1.

Mapping section 3304 obtains transmit symbols—that is, baseband signal S3—by performing mapping processing of post-order-switching encoded data 5002_1, 5002_2, 5002_3, 5002_4, 5002_5, and 5002_6 based on frame configuration related information included in control signal S10.

Here, of course, the number of encoding sections 11 and order switching sections 5001 operated differs according to the modulation method.

The configuration of stream B transmit signal generation section 5020 is similar to the configuration of stream A transmit signal generation section 5010. The important points are that stream A encoding sections 11 and stream B encoding sections 11 (not shown) have the same encoding method, and that provision is made for all stream order switching section 5001 and stream B order switching section (not shown) order switching processing to be different, as shown in FIG. 48 and FIG. 49, for example. This enables a receiving apparatus to obtain high-quality data.

A receiving apparatus that receives transmit signals transmitted from transmitting apparatus 5000 in FIG. 51 may be configured as shown in above-described FIG. 42B, for example.

(5-3) Implementation Example 3

In (5-1) Implementation Example 1 and (5-2) Implementation Example 2 above, cases have been described in which interleave processing (that is, processing that assigns bits to symbols) is made to differ between modulated signals (streams), as with a pair of modulated signals (streams) A and B as shown in FIG. 48 and FIG. 49 or a pair of modulated signals (streams) A and B as shown in FIG. 50 and FIG. 51. A method will now be described whereby interleave processing (that is, processing that assigns bits to symbols) is made the same between modulated signals (streams), and interleaving is made to differ by other means.

For example, interleave processing (that is, processing that assigns bits to symbols) for modulated signal (stream) A transmitted from antenna 114A (or 17_A) and interleave processing (that is, processing that assigns bits to symbols) for modulated signal (stream) B transmitted from antenna 114B (or 17_B) may both be made as shown in FIG. 48. Similarly, for example, interleave processing (that is, processing that assigns bits to symbols) for modulated signal (stream) A transmitted from antenna 114A (or 17_A) and interleave processing (that is, processing that assigns bits to symbols) for modulated signal (stream) B transmitted from antenna 114B (or 17_B) may both be made as shown in FIG. 50.

If a modulated signal (stream) A frame configuration and modulated signal (stream) B frame configuration are made the same in this way, modulated signal (stream) A encoding sections and order switching sections and modulated signal (stream) B encoding sections and order switching sections can be given the same configurations, enabling corresponding circuit commonality to be achieved and the transmitting apparatus configuration to be simplified.

Figure 53:
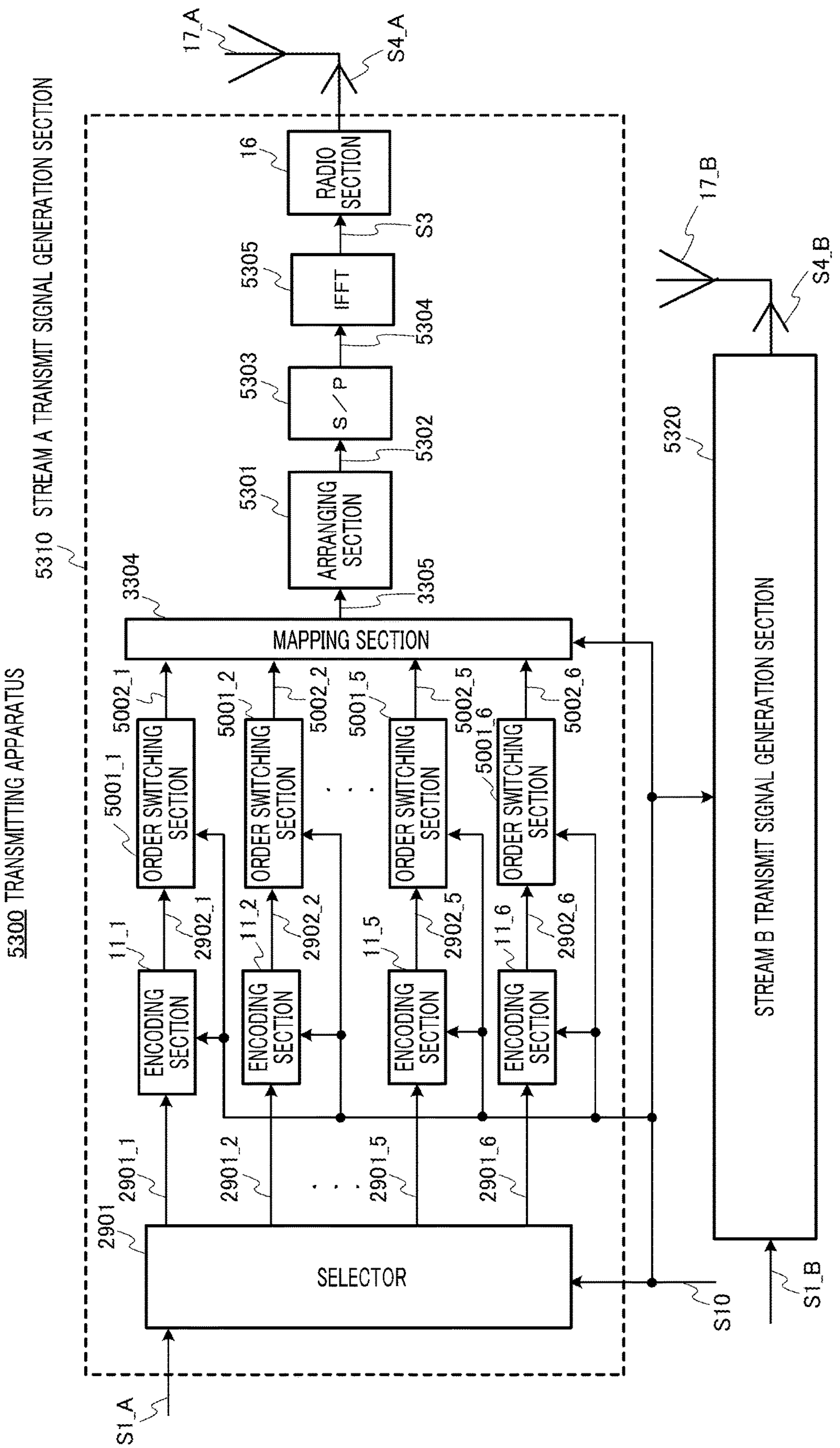
FIG. 53 is a block diagram showing an example of the configuration of a transmitting apparatus of Embodiment 8.

FIG. 53 shows a transmitting apparatus configuration of this implementation example that enables the same effect to be obtained as when different interleave patterns are used. Transmitting apparatus 5300 in FIG. 53 differs from transmitting apparatus 5000 in FIG. 52 in transmitting OFDM signals, but is similar to transmitting apparatus 5000 in FIG. 52 with regard to interleave processing (that is, processing that assigns bits to symbols) that is a characteristic of this embodiment. Distinctive important points in the configuration of this implementation example other than the characteristics in (5-2) Implementation Example 2 are described below.

In FIG. 53, in which parts corresponding to those in FIG. 52 are assigned the same reference codes as in FIG. 52, transmitting apparatus 5300 has stream A transmit signal generation section 5310 and stream B transmit signal generation section 5320. Here, the general configurations of stream A transmit signal generation section 5310 and stream B transmit signal generation section 5320 are almost the same, differing only in part, and therefore stream A transmit signal generation section 5310 will be described below as an example.

Arranging section 5301 has baseband signal 3305 as input, performs arrangement, and outputs post-arrangement baseband signal 5302. Serial/parallel conversion section (S/P) 5303 has post-arrangement baseband signal 5302 as input, performs serial/parallel conversion, and outputs parallel signal 5304. Inverse Fourier transform section (IFFT) 5305 has parallel signal 5304 as input, performs an inverse Fourier transform, and outputs post-Fourier-transform signal S3—that is, an OFDM signal. Radio section 16 has post-Fourier-transform signal S3 as input, and forms transmit signal S4_A by executing processing such as frequency conversion and amplification. Transmit signal S4_A is output as a radio wave from antenna 17_A.

An important point in transmitting apparatus 5300 is that arrangement processing differs between the arranging section (5301) of stream A transmit signal generation section 5310 and the arranging section (not shown) of stream B transmit signal generation section 5320. This point will now be explained in detail using FIG. 54.

If the arrangement processing performed by arranging section 5301 of stream A transmit signal generation section 5310 and the arrangement processing performed by the arranging section (not shown) of stream B transmit signal generation section 5320 are made to differ, symbol assignment to a frequency (subcarrier) of OFDM signals transmitted from antennas 17_A and 17_B can be made to differ between the antennas.

Figure 54A:
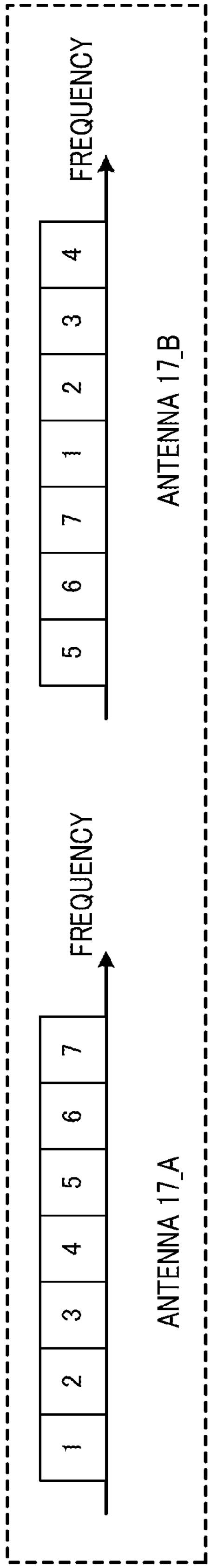
Figure 54B:
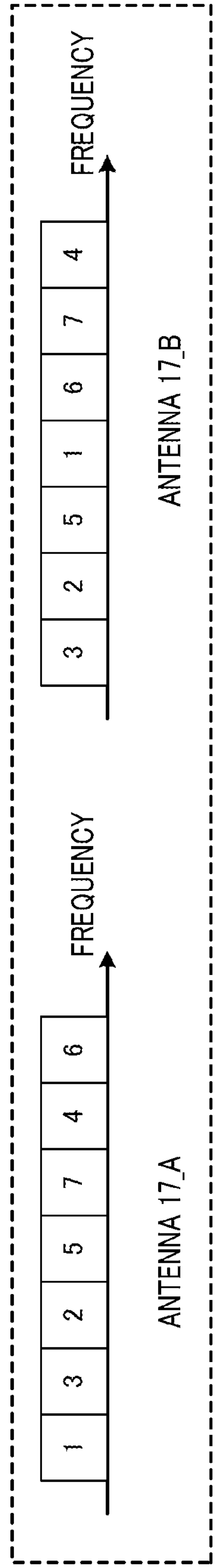

FIG. 54 shows examples of symbol assignment that enable the same effect to be obtained as when different interleave patterns are used. FIG. 54A shows an example in which symbols are placed regularly in the frequency domain direction, and FIG. 54B shows an example in which symbols are placed randomly in the frequency domain direction. The numbers in FIG. 54 indicate the order of symbol assignment. If frequency-direction symbol assignments of stream A transmitted by antenna 17_A and stream B transmitted by antenna 17_B are made to differ as shown in FIG. 54, reception quality can be improved in a receiver by performing iterative APP or iterative Max-log APP.

(5-4) Implementation Example 4

In the above-described examples in FIG. 48 and FIG. 49, an example of interleave processing (bit assignment to symbols) has been described for a case in which the stream A modulation method and stream B modulation method are the same, but a case can also be conceived of in which the stream A modulation method and stream B modulation method are different. In this case, a bit shift amount should not be fixed but varied according to the modulation method. An example illustrating this case will now be described in detail using FIG. 55.

Figure 55A:
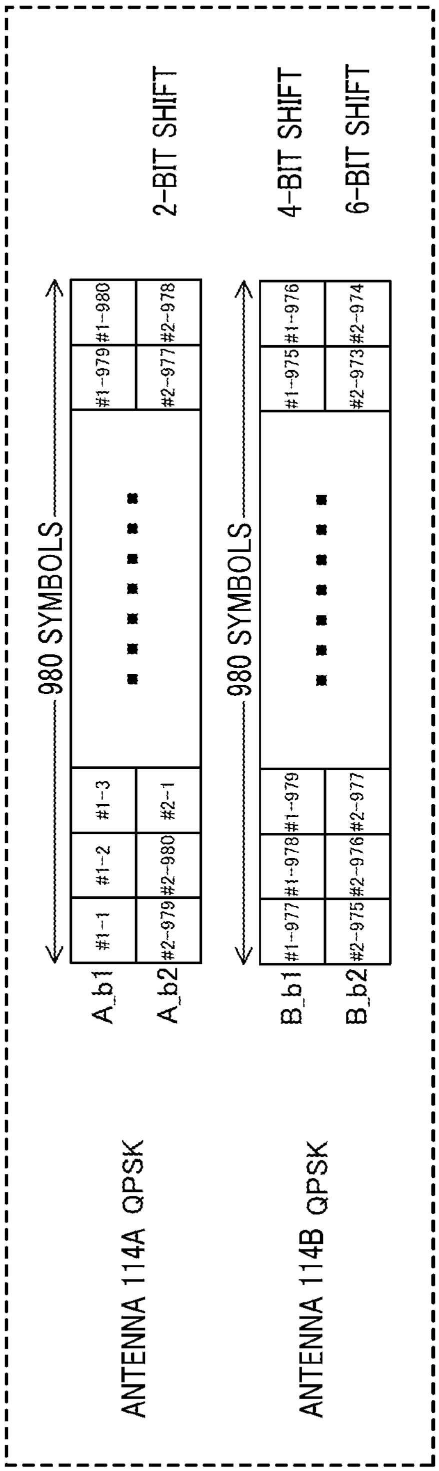
FIG. 55A is a drawing showing bit shifts for antenna 114A (stream A) and antenna 114B (stream B) in a case in which the modulation methods of stream A and stream B are the same.

FIG. 55A shows an example of interleave processing (bit assignment to symbols) for antenna 114A (stream A) and antenna 114B (stream B) when QPSK is the modulation method of both stream A and stream B. The processing shown in FIG. 55A is similar to the processing shown in FIG. 48(*b*) and FIG. 49(*b*).

Figure 55B:
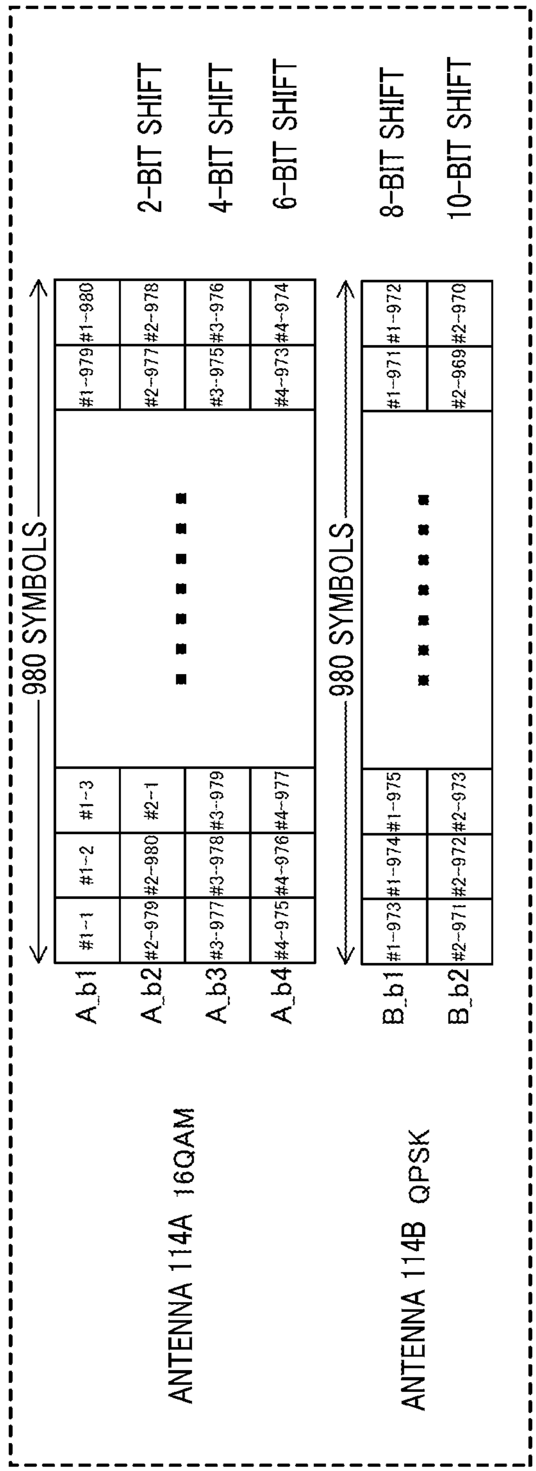
FIG. 55B is a drawing showing bit shifts for antenna 114A (stream A) and antenna 114B (stream B) in a case in which the modulation methods of stream A and stream B are different.

FIG. 55B shows an example of interleave processing (bit assignment to symbols) for antenna 114A (stream A) and antenna 114B (stream B) presented in this implementation example. FIG. 55B shows a case in which the stream A modulation method is 16QAM and the stream B modulation method is QPSK.

As can be seen by comparing processing that assigns bits to symbols for antenna 114B (stream B) shown in FIG. 55A with processing that assigns bits to symbols for antenna 114B (stream B) shown in FIG. 55B, with the interleaving method presented in this implementation example provision is made for the bit shift amount (arrangement pattern) for antenna 114B (stream B) to be made to differ according to the modulation method used for antenna 114A (stream A).

This processing is effective in a system that allows the stream A modulation method and stream B modulation method to be different. That is to say, in the case of such a system, frame configurations such as shown in FIG. 48 and FIG. 49 or FIG. 50 and FIG. 51 are not sufficient, and it is necessary also to add frame configurations (processing that assigns bits to symbols) as shown in FIG. 55B.

In order to implement this, taking transmitting apparatus 5000 in FIG. 52 as an example, the arrangement patterns of order switching sections 5001_1 to 5001_6 should be switched according to modulation method information included in control signal S10. By this means, settings can be made to make the pattern of bit assignment to symbols between streams and within each stream different not only when the stream A and stream B modulation methods are the same, but also when they are different. As a result, reception quality can also be improved in a receiver by performing iterative APP or iterative Max-log APP when the stream A and stream B modulation methods are different.

(5-5) Advantageous Effect

As described above, according to Implementation Examples 1 to 4, with a transmitting apparatus having an encoding section that forms block encoded data of each stream (transmit data) by executing block encoding processing on each stream, a plurality of arranging sections (order switching sections) that arrange block encoded data of each stream, and a modulation section (mapping section) that forms data symbols configured by collecting together encoded data of different encoded blocks by modulating post-arrangement block encoded data, burst errors can be suppressed by means of a comparatively simple configuration without varying the block size of encoded blocks even when the number of modulation multi-values is increased, and reception quality when iterative decoding is performed by a receiving apparatus can be improved, by providing for the arrangement patterns of the plurality of arranging sections (order switching sections) to be mutually different.

In Implementation Examples 1 to 4, the case of MIMO system using spatial multiplexing has mainly been described, but reception quality when iterative decoding is performed on the receiving side can also be improved when the arrangement patterns in FIG. 48 and FIG. 49 or the arrangement patterns in FIG. 50 and FIG. 51 are used as interleave patterns of interleaver ($\pi_a$) 4202_1 and interleaver (it a) 4202_2 of a transmitting apparatus that transmits a signal (encoded data) of a plurality of streams from a single antenna, as shown in FIG. 46. This can be understood by considering a factor graph.

That is to say, by executing different interleaving (arrangement) for each encoded data in a plurality of encoded data, as in the case of the frame configurations in FIG. 48, FIG. 49, FIG. 50, and FIG. 51, data reception quality can be improved when iterative detection is performed on the receiving apparatus side. The modulation method may also be switched by the transmitting apparatus according to the communication conditions, as with the frame configurations in FIG. 48, FIG. 49, FIG. 50, and FIG. 51. Such a transmitting apparatus can be implemented by using the stream A transmit signal generation section 5010, 5310, or 5610 configuration in FIG. 52, FIG. 53, or FIG. 57, for example.

With the frame configurations in FIG. 7, FIG. 8, and FIG. 28, also, for example, executing different interleaving (arrangement) for different encoded data (for example, using different interleave patterns for encoded data #1 and encoded data #2) is effective in the same way as described above. In short, when a symbol is configured using a plurality of encoded data, the use of different interleave patterns for different encoded data is effective in improving data reception quality on the receiving apparatus side.

(5-6) Implementation Example 5

In this implementation example, a configuration example will be described that differs from a configuration in which a plurality of encoding sections are provided that execute the same encoding processing for each antenna.

Figure 56:
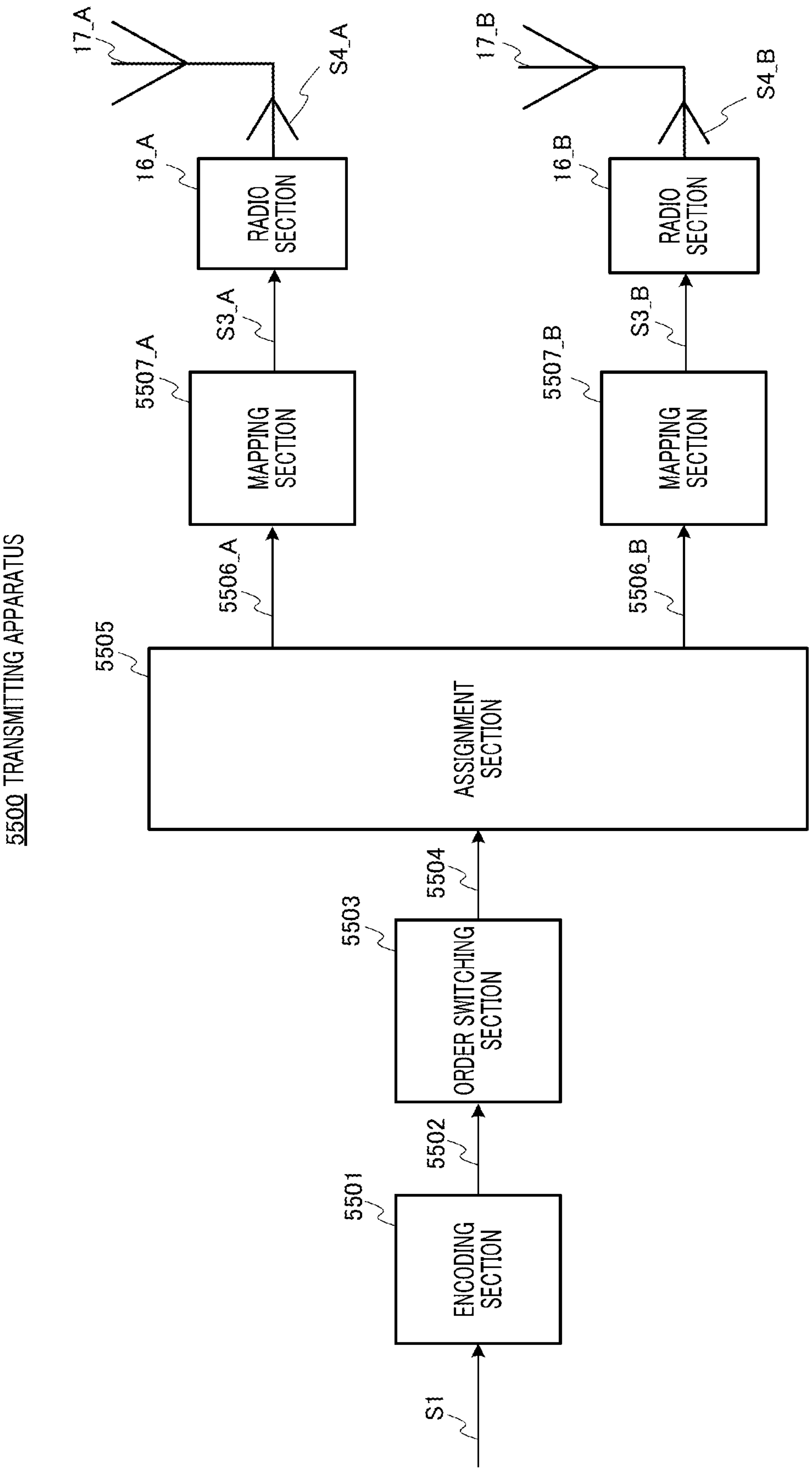
FIG. 56 is a block diagram showing an example of the configuration of a transmitting apparatus of Embodiment 8.

In FIG. 56, in which parts corresponding to those in FIG. 53 are assigned the same reference codes as in FIG. 53, transmitting apparatus 5500 inputs transmit data (stream) S1 to encoding section 5501. Encoding section 5501 encodes transmit data S1 and outputs encoded data 5502. Encoding section 5501 is essentially configured so that the functions of encoding sections 11_1 to 11_6 such as shown in FIG. 53 are performed by one encoding section. Order switching section 5503 switches the order of encoded data 5502 output from encoding section 5501, and outputs post-order-switching data 5504. Order switching section 5503 performs, for example, the order switching shown in FIG. 48, FIG. 49, FIG. 50, or FIG. 51, and outputs post-order-switching data 5504 to assignment section 5505.

Assignment section 5505 assigns and outputs post-order-switching data 5504 to mapping section 5507_A and mapping section 5507_B. Thus, in transmitting apparatus 5500, provision is made for post-order-switching data 5504 obtained by single-system encoding section 5501 and order switching section 5503 to be assigned to plurality of mapping sections 5507_A and 5507_B by assignment section 5505. By this means, with transmitting apparatus 5500, a factor graph as shown in FIG. 45 can be obtained on the receiving side, and reception quality can be improved, without arrangement processing to give post-arrangement data 5506_A and data 5506_B different arrangement patterns having to be performed by order switching section 5503 (that is, simply by having order switching section 5503 perform one of arrangement processings, such as one of processing shown in FIG. 48, FIG. 49, FIG. 50, or FIG. 51, for example). By employing a configuration whereby transmit data S1 is input to a single encoding section 5501 and post-order-switching data 5504 is assigned to antennas 17_A and 17_B in this way, the same effect as in above Implementation Examples 1 to 4 can be obtained with a simple configuration.

(5-7) Implementation Example 6

In the above example, a case has been described in which the same encoding is performed for each antenna, but based on a consideration of a factor graph, the same reception quality improvement effect as described above can also be obtained, for example, when different encoding is performed by encoding sections provided in stream A transmit signal generation section 5010 and encoding sections provided in stream B transmit signal generation section 5020 in FIG. 52. In this case, however, encoding sections cannot be shared between streams, and therefore the computational complexity and circuit scale become larger. Of course, processing that performs different encoding for each stream and processing that performs different order switching for each stream may both be executed.

In this embodiment, cases have mainly been described in which an LDPC code is used as a block code, but this embodiment can also be widely applied to block codes other than an LDPC code. Block codes other than an LDPC code include a BCH code, Reed-Solomon code, and so forth. Also, in this embodiment, cases have mainly been described by way of example in which a block code such as an LDPC code is used, but bit assignment to symbols according to this embodiment can also be applied to a case in which a trellis code such as a turbo code or convolutional code is used.

In this embodiment, single carrier and OFDM cases have been described by way of example, but the present disclosure can also be widely applied to CDMA and other multicarrier methods apart from OFDM.

In this embodiment, cases have been described by way of example in which the number of transmit antennas is two, the number of receive antennas is two, and the number of transmit modulated signals (the number of streams) is two, but the present disclosure is not limited to this, and the same effect can also be obtained by implementation in a similar way for a case in which the number of transmit antennas is three or more and the number of transmit modulated signals is three or more.

In this embodiment, MIMO system using spatial multiplexing has mainly been presupposed, and therefore data symbols are transmitted placed at the same time and the same frequency. Also, in order to estimate channel condition such as shown in Equation (1), known signals comprising a pilot symbol, preamble, and control signal for notifying a communicating party of the modulation method, are transmitted separately from data symbols.

Embodiment 9

In Embodiment 8, an embodiment in which a block code is used was described. In this embodiment, an implementation method is described in detail for a case in which a trellis code such as a turbo code or convolutional code, for example, is used.

Figure 57:
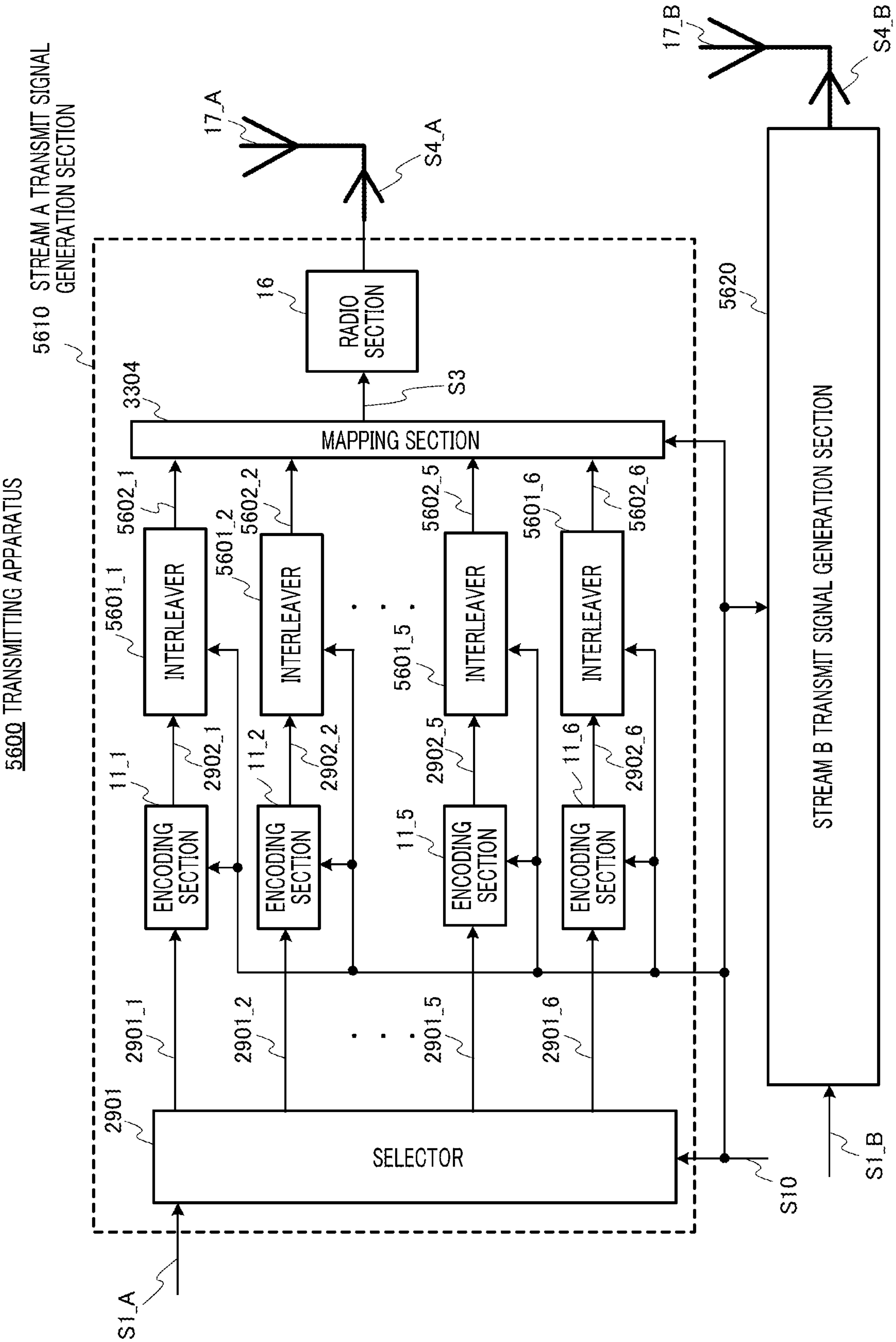
FIG. 57 is a block diagram showing an example of the configuration of a transmitting apparatus of Embodiment 9.

In FIG. 57, in which parts corresponding to those in FIG. 52 are assigned the same reference codes as in FIG. 52, transmitting apparatus 5600 has stream A transmit signal generation section 5610 and stream B transmit signal generation section 5620, and thereby generates transmit signal S4_A transmitted from antenna 17_A and transmit signal S4_B transmitted from antenna 17_B. Stream A transmit signal generation section 5610 and stream B transmit signal generation section 5620 have similar configurations, and therefore the configuration of stream A transmit signal generation section 5610 will be described in detail as representative of the two.

Stream A transmit signal generation section 5610 has interleavers 5601_1 to 5601_6 provided between encoding sections 11_1 to 11_6 and mapping section 3304. Interleavers 5601_1 to 5601_6 have encoded data 2902_1 to 2902_6 as input, and output post-interleaving data 5602_1 to 5602_6 to mapping section 3304.

Here, each of encoding sections 11_1 to 11_6 of stream A transmit signal generation section 5610 performs the same trellis encoding (for example, convolutional encoding or turbo encoding). Each encoding section (not shown) of stream B transmit signal generation section 5620 also performs the same trellis encoding as encoding sections 11_1 to 11_6 of stream A transmit signal generation section 5610. By this means, for example, high-speed encoding processing or shared use of encoding sections becomes possible. The same encoding need not necessarily be performed for stream A and stream B, but providing commonality of encoding processing is advantageous in terms of speeding up encoding processing and reducing the computational complexity.

The interleave patterns of interleavers 5601_1 to 5601_6 are set so as to be mutually different in the same way as with order switching sections 5001_1 to 5001_6 of Embodiment 8 (see FIG. 52). Not only the interleave patterns of interleavers 5601_1 to 5601_6 of stream A transmit signal generation section 5610, but also the interleave patterns of all the interleavers, including the interleavers (not shown) of stream B transmit signal generation section 5620, are set so as to be mutually different.

As a method of setting different interleave patterns, when block interleavers as shown in FIG. 34 are used, for example, settings may be made so that the number of steps in the reading direction and writing direction of the interleave patterns of interleavers 5601_1 to 5601_6 are different. Alternatively, random interleavers that are all different may be used.

A factor graph in Embodiment 8 explains the effect of a VIP (Varying Interleave Pattern) taking an LDPC code as an example, and since the same factor graph can also be drawn for a case in which a convolutional code or turbo code undergoes sum-product decoding, the same reception quality improvement effect as in Embodiment 8 can also be obtained when VIP is used for a convolutional code or turbo code.

That is to say, according to this embodiment, using VIP for a trellis code such as a convolutional code or turbo code enables reception quality to be improved in a receiving apparatus by performing iterative APP or iterative Max-log APP for the same reason as stated in Embodiment 8.

A case in which a turbo code, in particular, is used as a trellis code will now be described in detail.

Figure 58:
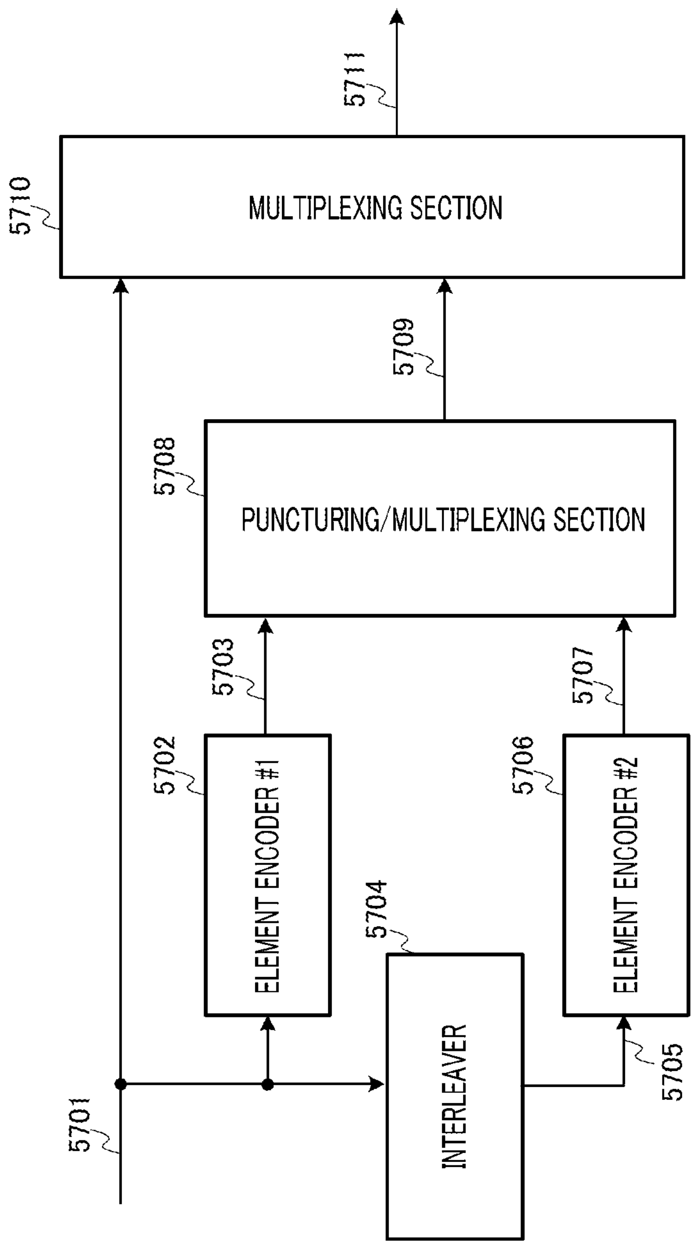
FIG. 58 is a block diagram showing an example of the configuration of a turbo encoder.

FIG. 58 shows an example of the configuration of a turbo encoder. Element encoder #1 has data 5701 as input, and outputs encoded data 5703. Interleaver 5704 has data 5701 as input, and outputs post-interleaving data 5705. Element encoder #2 has post-interleaving data 5705 as input, and outputs encoded data 5707. Puncturing/multiplexing section 5708 has encoded data 5703 and 5707 as input, performs puncturing and multiplexing processing on these, and outputs post-puncturing-and-multiplexing encoded data 5709. Multiplexing section 5710 has post-puncturing-and-multiplexing encoded data 5709 as input, multiplexes these, and outputs post-multiplexing data 5711.

Encoding sections 11_1 to 11_6 in FIG. 57 are configured by means of turbo encoders as shown in FIG. 58. Therefore, cases in which interleavers 5601_1 to 5601_6 mentioned in the above description are provided include a case in which interleaver 5704 incorporated in a turbo encoder is made use of, and a case in which an interleaver is provided separately from interleaver 5704.

If interleaver 5704 incorporated in a turbo encoder is made use of, the following problems arise if settings are made so that the interleave patterns are different, as in the above description.

<1> With a turbo code, the design of an encoder is important from the standpoint of ensuring reception quality. Also, it is difficult to provide a plurality of interleave patterns offering good performance.

<2> Even if different interleavers can be provided, it is difficult to design corresponding decoders in a receiving apparatus. Also, incorporating different decoders increases the computational complexity of a receiving apparatus. When the same code is used, commonality and so forth can easily be implemented, enabling the computational complexity of a receiving apparatus to be kept low.

Thus, when computational complexity is taken into consideration, it is not desirable for interleave patterns incorporated in turbo encoders to be made to differ.

In this embodiment, in consideration of this point, plurality of interleavers 5601_1 to 5601_6 having different interleave patterns are provided in a stage subsequent to encoding sections 11_1 to 11_6 separately from the interleavers of the turbo encoders. By this means, reception quality can be improved in a receiving apparatus by performing iterative APP or iterative Max-log APP for the same reason as stated in Embodiment 8. As in Embodiment 8, a reception quality improvement effect can be obtained irrespective of whether the stream A modulation method and stream B modulation method are the same or different.

A receiving apparatus that receives transmit signals transmitted from transmitting apparatus 5600 in FIG. 57 may be configured as shown in above-described FIG. 42B, for example.

The configuration as shown in FIG. 53 can also be considered as an example of a transmitting apparatus configuration different from that in FIG. 57. Order switching sections 5001_1 to 5001_6 in FIG. 53 correspond to interleavers 5601_1 to 5601_6 in FIG. 57. Therefore, a different switching pattern (interleave pattern) is set for each of order switching sections 5001_1 to 5001_6 in FIG. 53. However, the switching patterns of stream A transmit signal generation section 5310 and stream B transmit signal generation section 5320 are made the same. Also, the arrangement pattern of arranging section 5301 for determining symbol assignment to subcarriers is set so as to differ for stream A and stream B. By this means, the same effect as described above can be obtained, thereby improving data reception quality in the receiving apparatus.

As described above, according to this embodiment, with a transmitting apparatus having an encoding section that forms trellis encoded data by executing trellis encoding processing on each stream (transmit data), a plurality of interleavers that arrange trellis encoded data of each stream, and a modulation section (mapping section) that forms data symbols configured by collecting together different intra-trellis encoded data by modulating post-switching trellis encoded data, burst errors can be suppressed by means of a comparatively simple configuration without varying the block size of encoded blocks even when the number of modulation multi-values is increased, and reception quality when iterative decoding is performed by a receiving apparatus can be improved, by providing for the arrangement patterns of the plurality of interleavers to be mutually different.

In this embodiment, single carrier and OFDM cases have been described by way of example, but the present disclosure can also be widely applied to CDMA and other multi-carrier methods apart from OFDM.

In this embodiment, MIMO system using spatial multiplexing has been presupposed, and therefore data symbols are transmitted placed at the same time and the same frequency. Also, in order to estimate channel condition such as shown in Equation (1), known signals comprising a pilot symbol, preamble, and control signal for notifying a communicating party of the modulation method, are transmitted separately from data symbols.

In this embodiment, cases have been described by way of example in which the number of transmit antennas is two, the number of receive antennas is two, and the number of transmit modulated signals (the number of streams) is two, but the present disclosure is not limited to this, and the same effect can also be obtained by implementation in a similar way for a case in which the number of transmit antennas is three or more and the number of transmit modulated signals is three or more.

In this embodiment, the case of a trellis code has been described, but the same effect as in this embodiment can also be obtained when a trellis code and block code are combined as described in Embodiment 7.

In this embodiment, the case of MIMO system using spatial multiplexing has been described in particular, but if provision is made for trellis encoding processing to be performed by encoding sections (outer encoders) 4201_1 and 4201_2, and for the interleave patterns of interleaver aca) 4202_1 and interleaver (it a) 4202_2 to be different, in a transmitting apparatus that transmits a signal of a plurality of streams (encoded data) from a single antenna, as shown in FIG. 46, reliability propagation is performed for more times (or frequencies depending on the case) when iterative decoding is performed on the receiving apparatus side than when the interleave patterns are made the same. Therefore, there is a higher possibility of time (or frequency depending on the case) and space diversity gain improving, and data reception quality can thereby be improved. This can be understood by considering a factor graph.

That is to say, by executing different interleaving (arrangement) for each encoded data in a plurality of encoded data, as in the case of the frame configurations in FIG. 48, FIG. 49, FIG. 50, and FIG. 51, data reception quality can be improved when iterative detection is performed on the receiving apparatus side. The modulation method may also be switched by the transmitting apparatus according to the communication conditions, as with the frame configurations in FIG. 48, FIG. 49, FIG. 50, and FIG. 51. Such a transmitting apparatus can be implemented by using the stream A transmit signal generation section 5010, 5310, or 5610 configuration in FIG. 52, FIG. 53, or FIG. 57, for example.

With the frame configurations in FIG. 7, FIG. 8, and FIG. 28, also, for example, executing different interleaving (arrangement) for different encoded data (for example, using different interleave patterns for encoded data #1 and encoded data #2) is effective in the same way as described above. In short, when a symbol is configured using a plurality of encoded data, the use of different interleave patterns for different encoded data is effective in improving data reception quality on the receiving apparatus side.

Embodiment 10

In this embodiment, an implementation method is described in which a bit assignment method described in Embodiment 1, Embodiment 5, Embodiment 6, or Embodiment 7 is used, and an access method is applied that uses a multicarrier method such as OFDM. As an example, an implementation method will be described in detail here for a case in which OFDM is used.

Figure 60B:
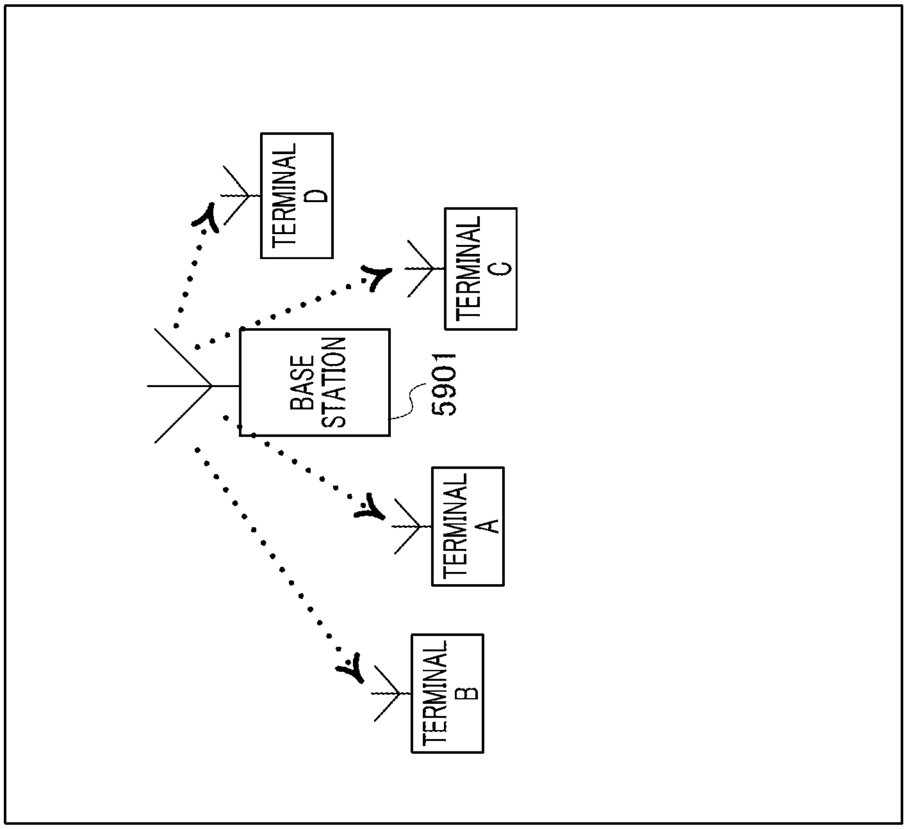
FIG. 60B is a drawing showing a case in which the distances between a base station and terminal A to terminal D are short.
Figure 60A:
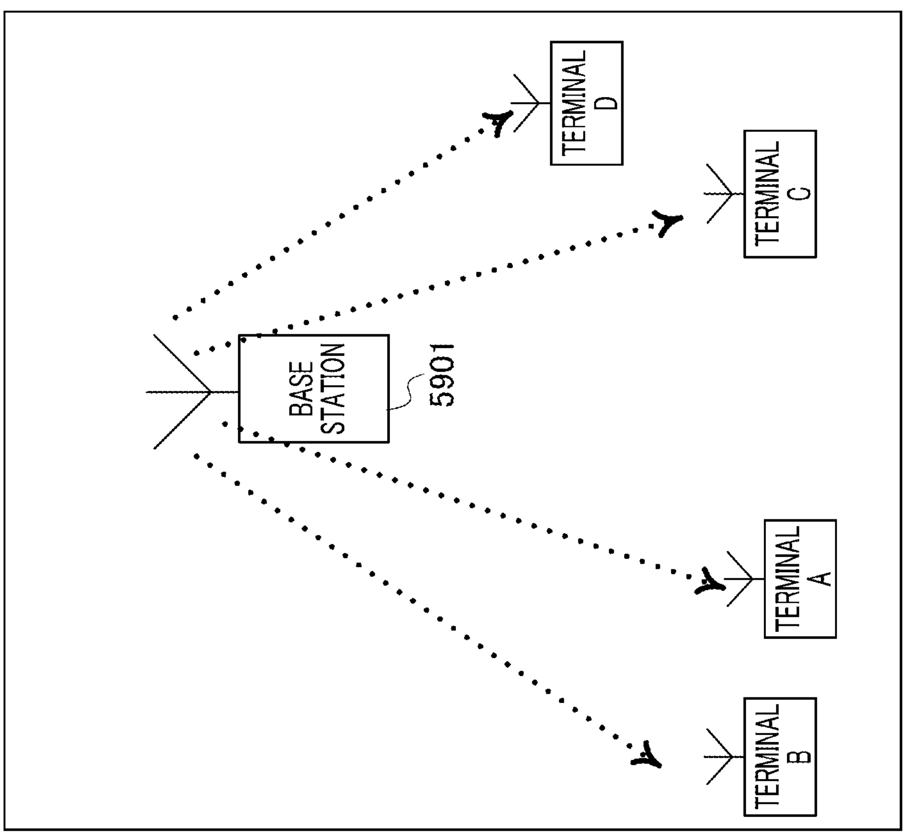
FIG. 60A is a drawing showing a case in which the distances between a base station and terminal A to terminal D are long.

FIG. 60 shows examples of communication conditions between a base station and terminals. In FIG. 60, base station 5901 communicates with terminal A, terminal B, terminal C, and terminal D. Although only terminal A to terminal D are shown here, other terminals actually exist. FIG. 60A and FIG. 60B show cases in which radio waves are transmitted from base station 5901 to terminal A to terminal D in the following cases.

Case 1 (FIG. 60A): When distances between the base station and terminal A to terminal D are long Case 2 (FIG. 60B): When distances between the base station and terminal A to terminal D are short This embodiment will be described taking these cases as examples. While the names "terminal A, terminal B, terminal C, terminal D" are assigned in this embodiment, this nomenclature is used only to identify terminals, and does not indicate that "terminal A" is always a fixed terminal.

Figure 61:
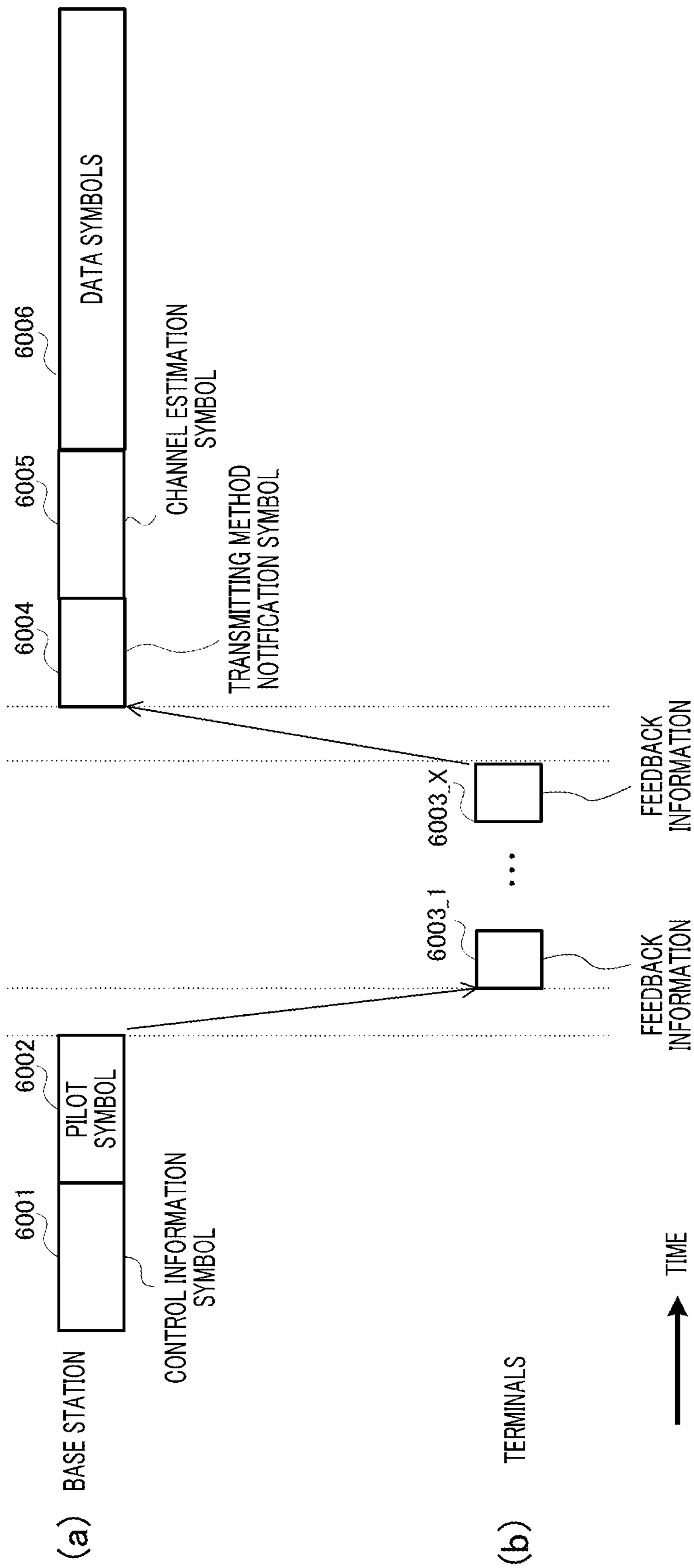
FIG. 61 is a drawing showing an example of data flow between a base station and a terminal.

FIG. 61 shows an example of data flow between a base station and a terminal. FIG. 61(*a*) shows a signal transmitted from the base station to a terminal, and FIG. 61(*b*) shows a signal transmitted from a terminal to the base station.

Control information symbol 6001 is a symbol for controlling a terminal transmitted by the base station. Pilot symbol 6002 is a symbol known to the transmitter and receiver, for example. A terminal receives a pilot symbol, and estimates channel condition or creates Channel State Information (CSI), for example, based on the reception state of this pilot symbol.

Feedback information 6003_1 indicates feedback information transmitted to the base station by terminal A. Abovementioned CSI, for example, is transmitted as feedback information 6003_1. Similarly, feedback information 6003_X indicates feedback information transmitted to the base station by terminal X.

Transmitting method notification symbol 6004 is a symbol that includes frequency assignment, modulation method, coding rate, and suchlike information. The base station determines a transmitting method based on feedback information transmitted from a terminal, and forms and transmits data symbols in accordance with the determined transmitting method. Transmitting method notification symbol 6004 is s symbol for notifying this transmitting method information. This transmitting method will be described later herein.

Channel estimation symbol 6005 is a symbol for estimation of channel condition by a terminal. A terminal estimates channel condition based on a received channel estimation symbol 6005, and modulates data symbols 6006 based on the estimated channel condition. The base station transmits data symbols 6006 after channel estimation symbol 6005.

Figure 62A:
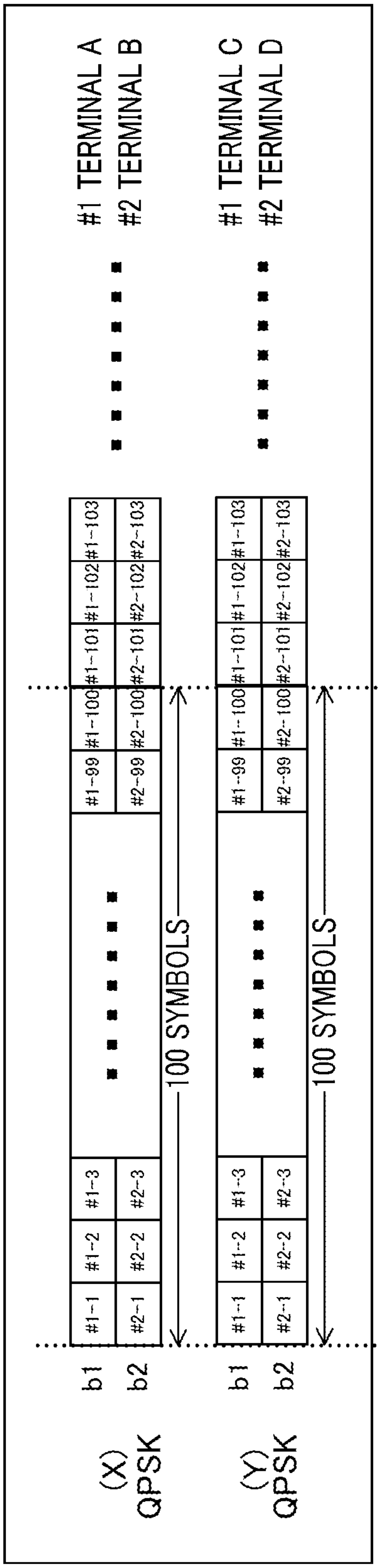
FIG. 62A is a drawing showing an example of a method of bit assignment to symbols when the distances between a base station and terminals are long.
Figure 62B:
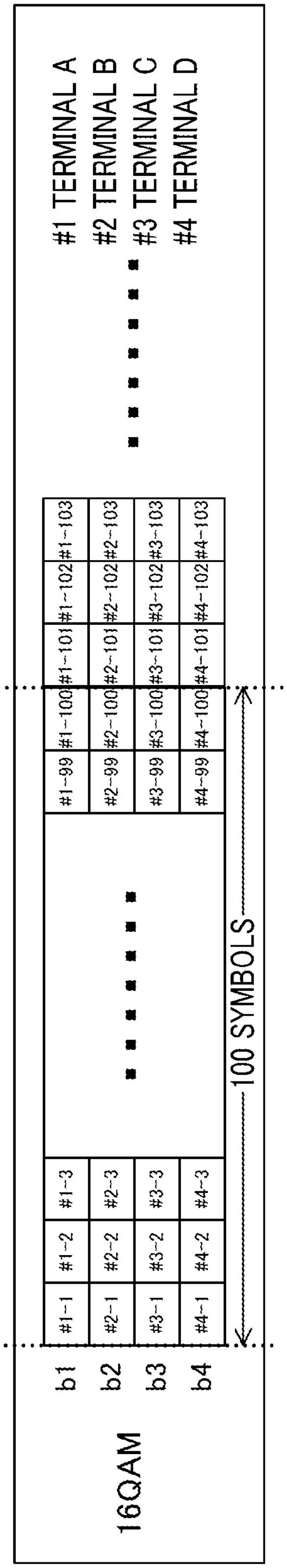
FIG. 62B is a drawing showing an example of a method of bit assignment to symbols when the distances between a base station and terminals are short.

FIG. 62 shows examples of the method of bit assignment to symbols when the modulation method is QPSK and when the modulation method is 16QAM. FIG. 62A shows an example of a method of bit assignment to symbols in Case 1 (when the distances between the base station and terminal A to terminal D are long, as shown in FIG. 60A), and FIG. 62B shows an example of a method of bit assignment to symbols in Case 2 (when the distances between the base station and terminal A to terminal D are short, as shown in FIG. 60B).

In Case 1, a QPSK modulation method is selected in order to ensure the reception quality of data from the base station in terminal A to terminal D. An example of a QPSK bit assignment method at this time is shown in FIG. 62A (X) and FIG. 62A (Y).

As in the descriptions of Embodiment 1, Embodiment 5, Embodiment 6, and Embodiment 7, #X-Y in FIG. 62 indicates the Y'th bit (bit number Y among 100 bits) of the X'th encoded block (data). For example, #1-1 indicates the 1st bit of the 1st encoded block (data). Similarly, #2-48 indicates the 48th bit of the 2nd encoded block (data).

With the frame configuration in FIG. 62A, data relating to 1st encoded block (data) #1 is transmitted using QPSK bit b1, and data relating to 2nd encoded block (data) #2 is transmitted using QPSK bit b2. In FIG. 62A (X), #1 (encoded block (data) #1) is data transmitted by the base station to terminal A, and #2 (encoded block (data) #2) in FIG. 62A (X) is data transmitted by the base station to terminal B. In FIG. 62A (Y), #1 (encoded block (data) #1) is data transmitted by the base station to terminal C, and #2 (encoded block (data) #2) in FIG. 62A (Y) is data transmitted by the base station to terminal D.

In Case 2, 16QAM is selected in order to ensure the reception quality of data from the base station in terminal A to terminal D. An example of a QPSK bit assignment method at this time is shown in FIG. 62B.

With the frame configuration in FIG. 62B, data relating to 1st encoded block (data) #1 is transmitted using 16QAM bit b1, data relating to 2nd encoded block (data) #2 is transmitted using bit b2, data relating to 3rd encoded block (data) #3 is transmitted using bit b3, and data relating to 4th encoded block (data) #4 is transmitted using bit b4. In FIG. 62B, #1 (encoded block (data) #1) is data transmitted by the base station to terminal A, #2 (encoded block (data) #2) in FIG. 62B is data transmitted by the base station to terminal B, #3 (encoded block (data) #3) in FIG. 62B is data transmitted by the base station to terminal C, and #4 (encoded block (data) #4) in FIG. 62B is data transmitted by the base station to terminal D.

Figure 63B:
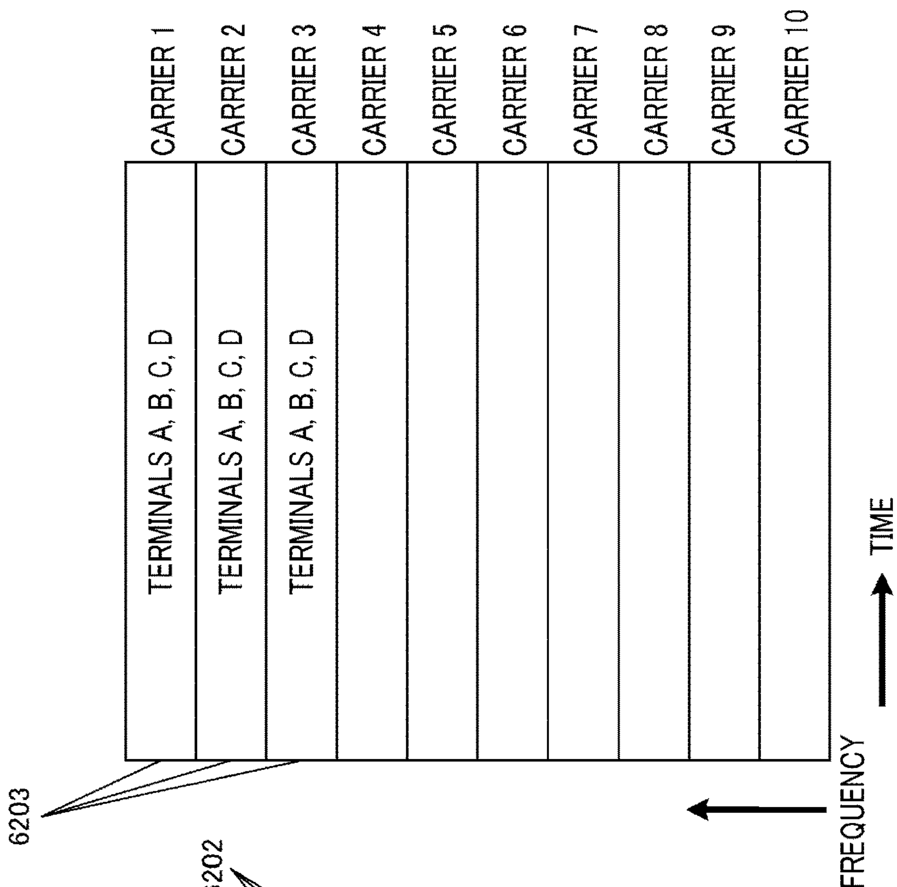
FIG. 63B is a drawing showing an example of a frame configuration when the distances between a base station and terminals are short.
Figure 63A:
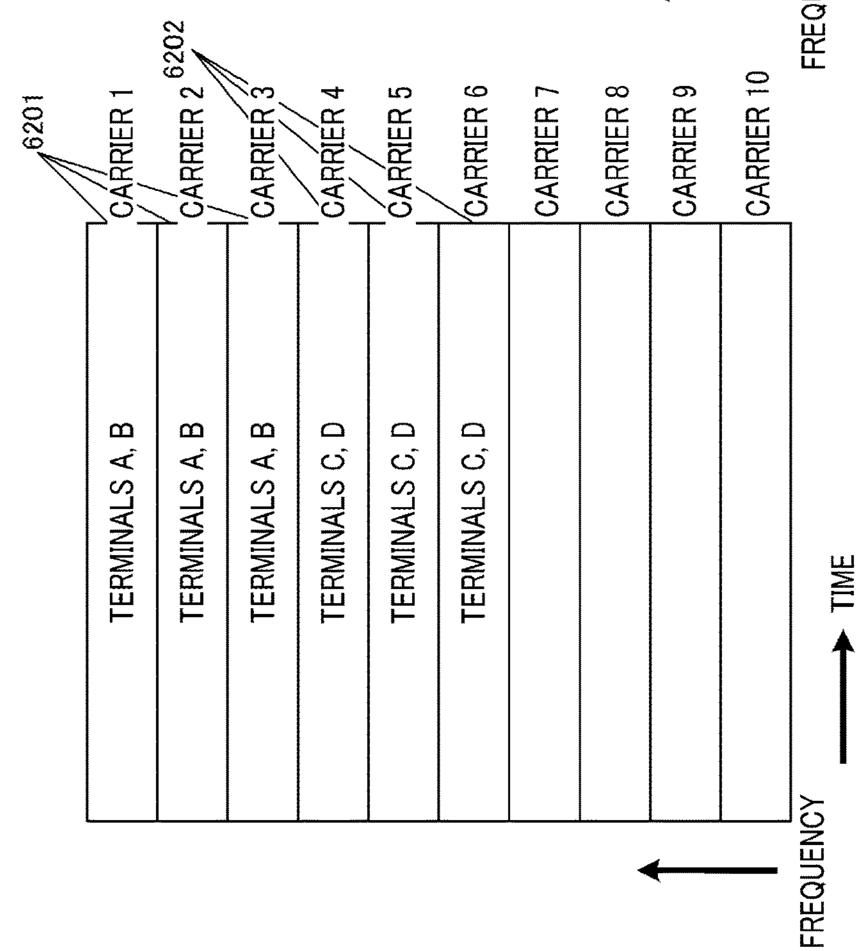
FIG. 63A is a drawing showing an example of a frame configuration when the distances between a base station and terminals are long.

FIG. 63 shows examples of frame configurations on the time-frequency axes of a modulated signal transmitted by a base station when an OFDM method is used. For the sake of simplicity, FIG. 63 shows only frame configurations of data symbols 6006 in FIG. 61. FIG. 63A shows an example of a frame configuration in Case 1 (when the distances between the base station and terminal A to terminal D are long, as shown in FIG. 60A), and FIG. 62B shows an example of a frame configuration in Case 2 (when the distances between the base station and terminal A to terminal D are short, as shown in FIG. 60B).

In Case 1, as illustrated in FIG. 62, the base station configures one QPSK symbol by means of terminal A data and terminal B data, and transmits terminal A data and terminal B data using carrier 1, carrier 2, and carrier 3, as indicated by reference code 6201 in FIG. 63A. Similarly, the base station configures one QPSK symbol by means of terminal C data and terminal D data, and transmits terminal C data and terminal D data using carrier 4, carrier 5, and carrier 6, as indicated by reference code 6202 in FIG. 63A. The other carriers (carrier 7, carrier 8, carrier 9, and carrier 10) are used when transmitting data to terminals other than terminal A to terminal D.

In Case 2, as illustrated in FIG. 62, the base station configures one 16QAM symbol by means of terminal A data, terminal B data, terminal C data, and terminal D data, and transmits terminal A data, terminal B data, terminal C data, and terminal D data using carrier 1, carrier 2, and carrier 3, as indicated by reference code 6203 in FIG. 63B. The other carriers (carrier 4, carrier 5, carrier 6, carrier 7, carrier 8, carrier 9, and carrier 10) are used when transmitting data to terminals other than terminal A to terminal D.

Figure 64:
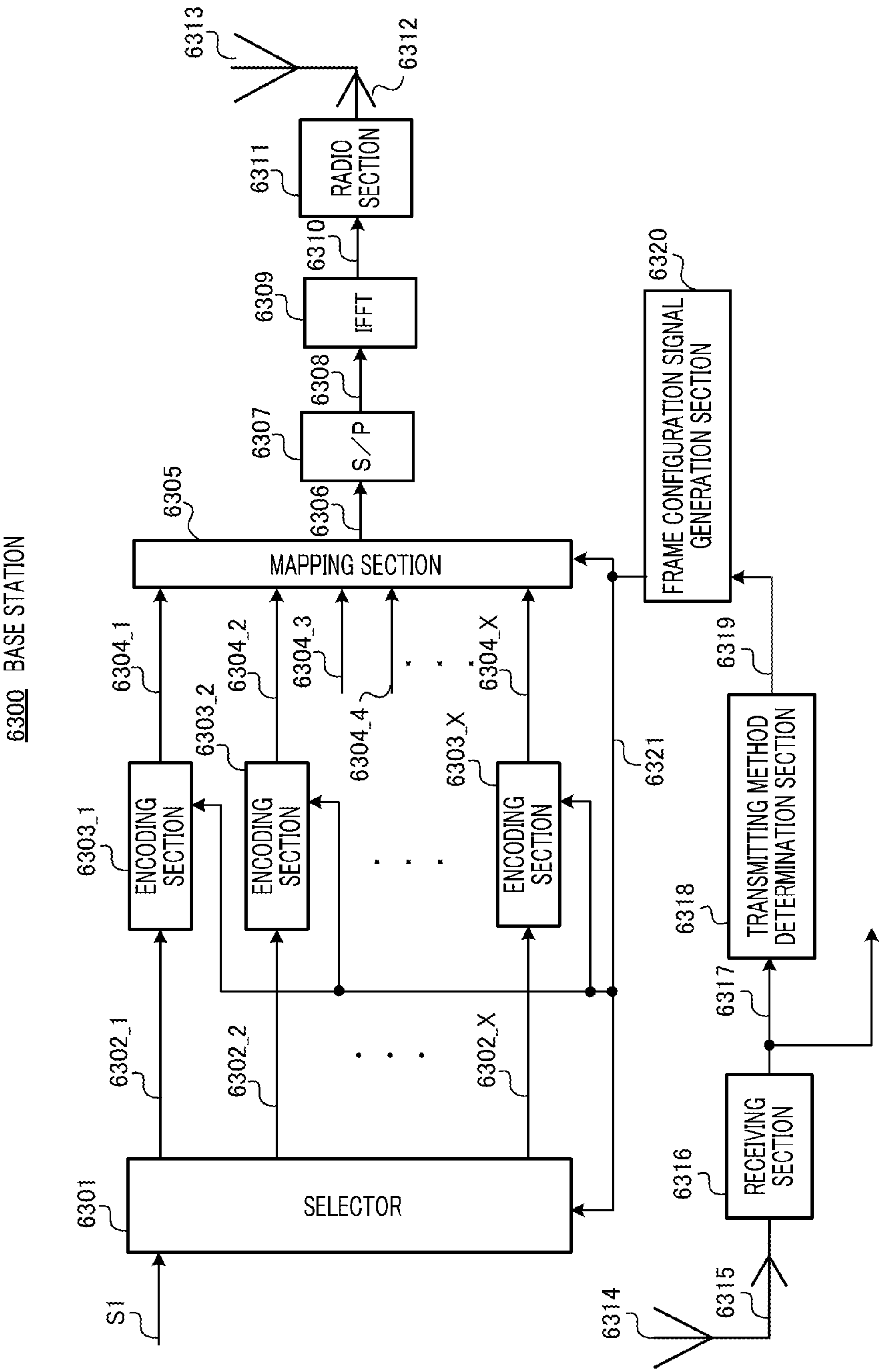
FIG. 64 is a block diagram showing an example of the configuration of a base station of Embodiment 10.

FIG. 64 shows an example of the configuration of a base station for transmitting signals with the frame configurations shown in FIG. 63. Selector 6301 of base station 6300 has data S 1 as input, and distributes data S1 as data of each terminal. Specifically, selector 6301 outputs data 6302_1 for transmission to terminal A, data 6302_2 for transmission to terminal B, . . . , data 6302_X for transmission to terminal X.

Encoding section 6303_1 has data 6302_1 for transmission to terminal A as input, and obtains encoded data 6304_1 for transmission to terminal A. Encoding section 6303_2 obtains encoded data 6304_2 for transmission to terminal B. Similarly, encoded data 6304_3 for transmission to terminal C, encoded data 63044 for transmission to terminal D, . . . , encoded data 6304_X for transmission to terminal X, are obtained.

Mapping section 6305 has encoded data 6304_1 for transmission to terminal A, encoded data 6304_2 for transmission to terminal B, encoded data 63043 for transmission to terminal C, encoded data 6304_4 for transmission to terminal D, . . . , encoded data 6304_X for transmission to terminal X, and frame configuration signal 6321, as input, obtains transmit symbols —that is, baseband signal 6306— by performing mapping so that a frame configuration such as shown in FIG. 61, FIG. 62, or FIG. 63 is created, and outputs this baseband signal 6306.

Serial/parallel conversion section (S/P) 6307 has baseband signal 6306 as input, performs serial/parallel conversion, and outputs parallel signal 6308. Inverse Fourier transform section (IFFT) 6309 has parallel signal 6308 as input, performs an inverse Fourier transform, and outputs post-Fourier-transform signal 6310. Radio section 6311 has post-Fourier-transform signal 6310 as input, executes processing such as frequency conversion and amplification, and outputs transmit signal 6312 thereby obtained. Transmit signal 6312 is output as a radio wave from antenna 6313.

Receiving section 6316 has received signal 6315 received by antenna 6314 as input, executes processing such as frequency conversion, demodulation, and decoding, and outputs received digital signal 6317. Transmitting method determination section 6318 has received digital signal 6317 as input, determines the transmitting method of a signal addressed to each terminal based on feedback information transmitted from a terminal (for example, CSI transmitted by each terminal), and outputs that information 6319.

Frame configuration signal generation section 6320 has transmitting method information 6319 for a signal addressed to each terminal as input, determines a frame configuration (frequency assignment, modulation method, coding rate, and so forth) based on this transmitting method information 6319, and outputs the determined information as frame configuration signal 6321 to selector 6301, encoding sections 6303_1 to 6303_X, and mapping section 6305.

Figure 65:
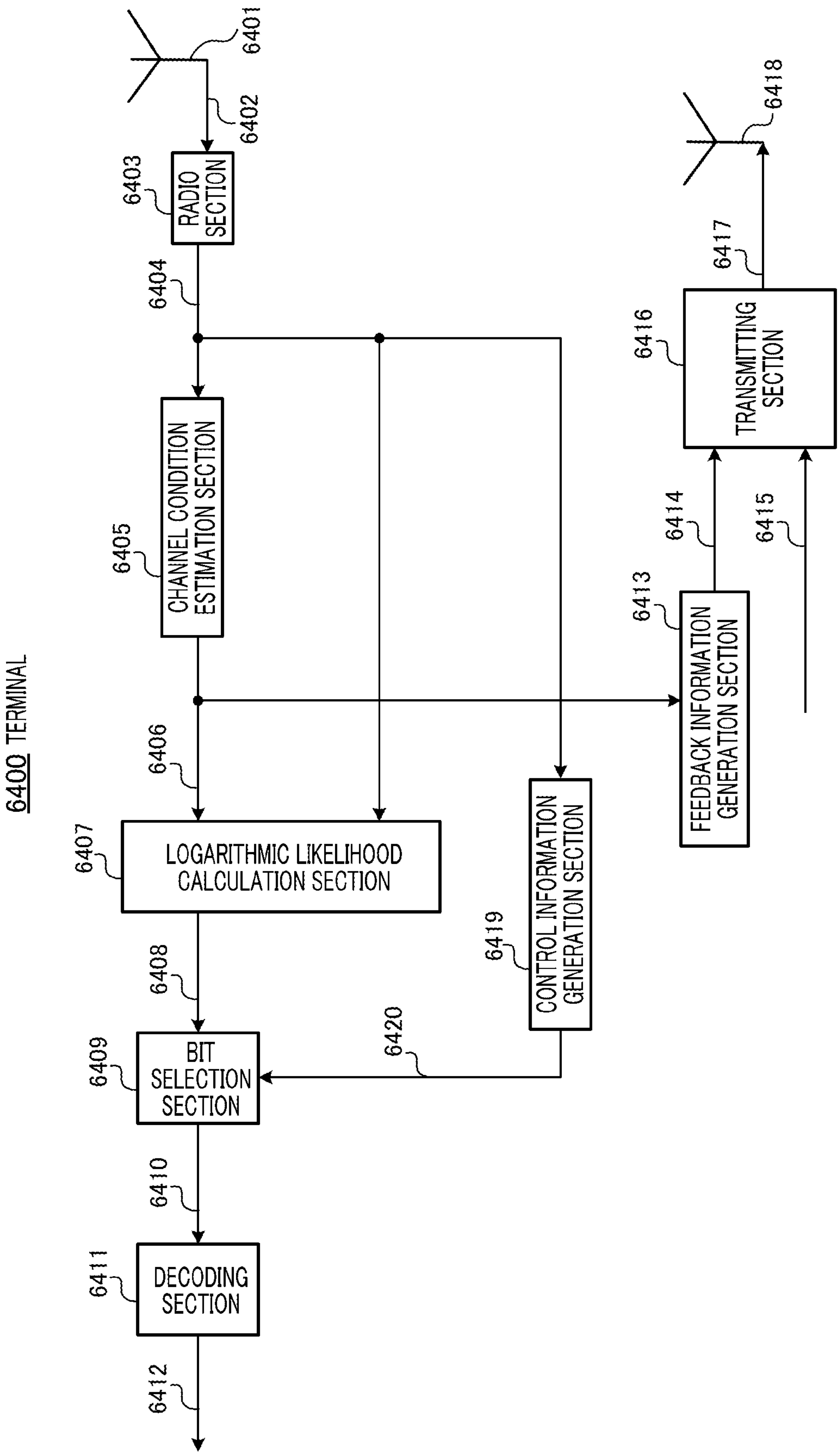
FIG. 65 is a block diagram showing an example of the configuration of a terminal of Embodiment 10.

FIG. 65 shows an example of the configuration of a terminal according to this embodiment. Radio section 6403 of terminal 6400 has received signal 6402 received by antenna 6401 as input, executes processing such as frequency conversion and quadrature demodulation, and outputs baseband signal 6404. Channel condition estimation section 6405 has baseband signal 6404 as input, estimates channel condition based on pilot symbol 6002 (see FIG. 61) included in baseband signal 6404, and outputs channel estimation signal 6406.

Logarithmic likelihood calculation section 6407 has channel estimation signal 6406 as input, performs logarithmic likelihood ratio calculation using a method such as shown in Non-patent Document 3 to Non-patent Document 8, and outputs logarithmic likelihood ratio 6408 of each bit. Bit selection section 6409 has each-bit logarithmic likelihood ratio 6408 and frame configuration signal 6420 as input, selects only a bit addressed to that station in the frame configuration in FIG. 63, and outputs logarithmic likelihood ratio 6410 of the selected bit. Decoding section 6411 has logarithmic likelihood ratio 6410 of the selected bit as input, obtains receive data 6412 by performing decoding, and outputs this receive data 6412.

Feedback information generation section 6413 has channel estimation signal 6406 as input, generates feedback information 6414 based on this channel estimation signal 6406, and outputs this feedback information 6414. Feedback information 6414 may be information in which channel estimation signal 6404 is quantized, or may be information relating to a subcarrier candidate for which transmission to the base station is desired, for example. Furthermore, feedback information 6414 is not limited to the above examples, and may be any information as long as it is information enabling the base station to determine subcarrier placement. For example, feedback information 6414 may also be information relating to a bit error rate or packet error generation (ACK/NACK).

Transmitting section 6416 has feedback information 6414 and transmit data 6415 as input, and obtains modulated signal 6417 addressed to the base station from these. Modulated signal 6417 is output as a radio wave from antenna 6418.

By the above means, a bit assignment method described in Embodiment 1, Embodiment 5, Embodiment 6, or Embodiment 7 can be applied to an OFDM or suchlike multicarrier access method. At this time, in addition to obtaining the effects described in Embodiment 1, Embodiment 5, Embodiment 6, and Embodiment 7, an effect of obtaining frequency diversity gain can be attained for signals addressed to each terminal since signals (bits) addressed to each terminal can be placed on suitable subcarriers.

Figure 66A:
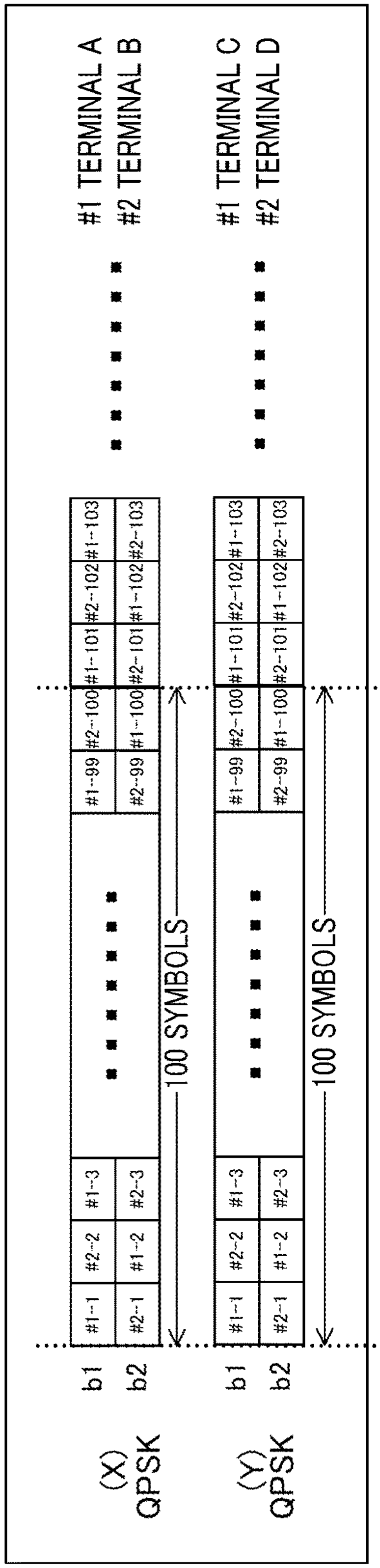
FIG. 66A is a drawing showing an example of a method of bit assignment to symbols when the distances between a base station and terminals are long.
Figure 66B:
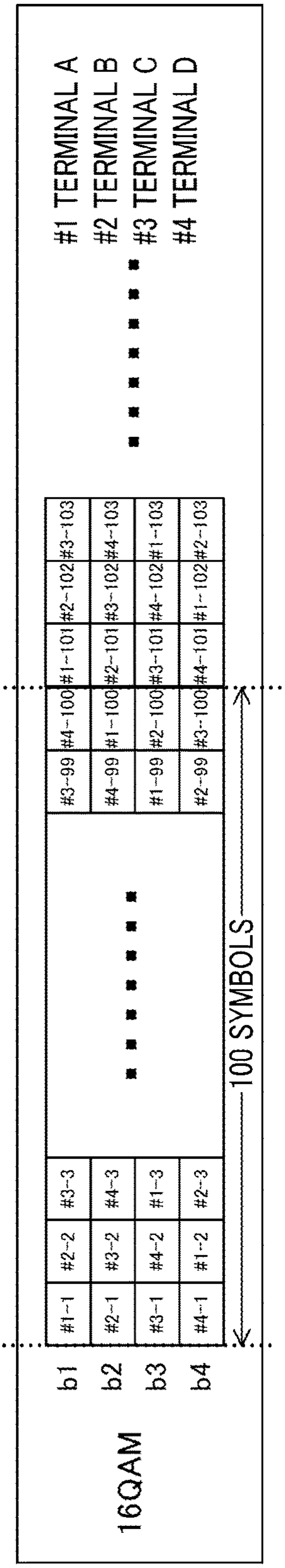
FIG. 66B is a drawing showing an example of a method of bit assignment to symbols when the distances between a base station and terminals are short.

An example of a bit assignment method different from that in FIG. 62 is shown in FIG. 66. FIG. 66 differs from FIG. 66 in that, in the case of QPSK, for example, data of encoded block #1 and encoded block #2 respectively are not placed in a fixed bit (for example, b1 only or b2 only), but are placed in both bits b1 and b2, as shown in FIG. 66A; and similarly, in the case of 16QAM, data of encoded block #1, encoded block #2, encoded block #3, and encoded block #4 respectively are not placed in a fixed bit (for example, b1 only, b2 only, b3 only, or b4 only), but are placed in plurality of bits b1, b2, b3, and b4, as shown in FIG. 66B. This is the same as in FIG. 6.

An example of frame configurations that differ from the frame configurations in FIG. 63 is shown in FIG. 67. The frame configurations in FIG. 67 differ from the frame configurations in FIG. 63 in that subcarriers used vary with time.

Figure 67B:
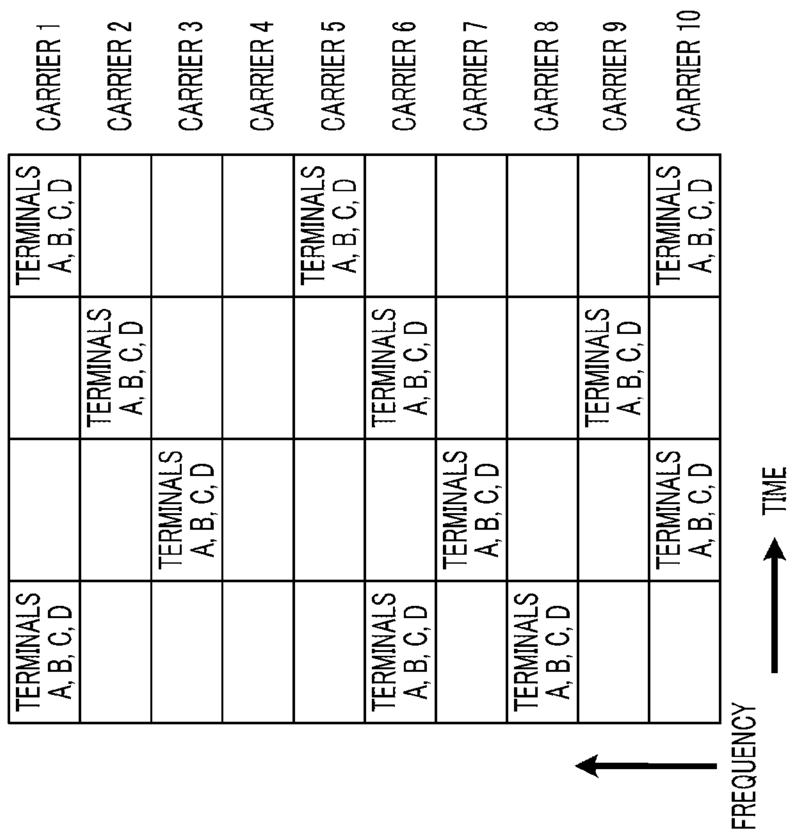
FIG. 67B is a drawing showing an example of a frame configuration when the distances between a base station and terminals are short.
Figure 67A:
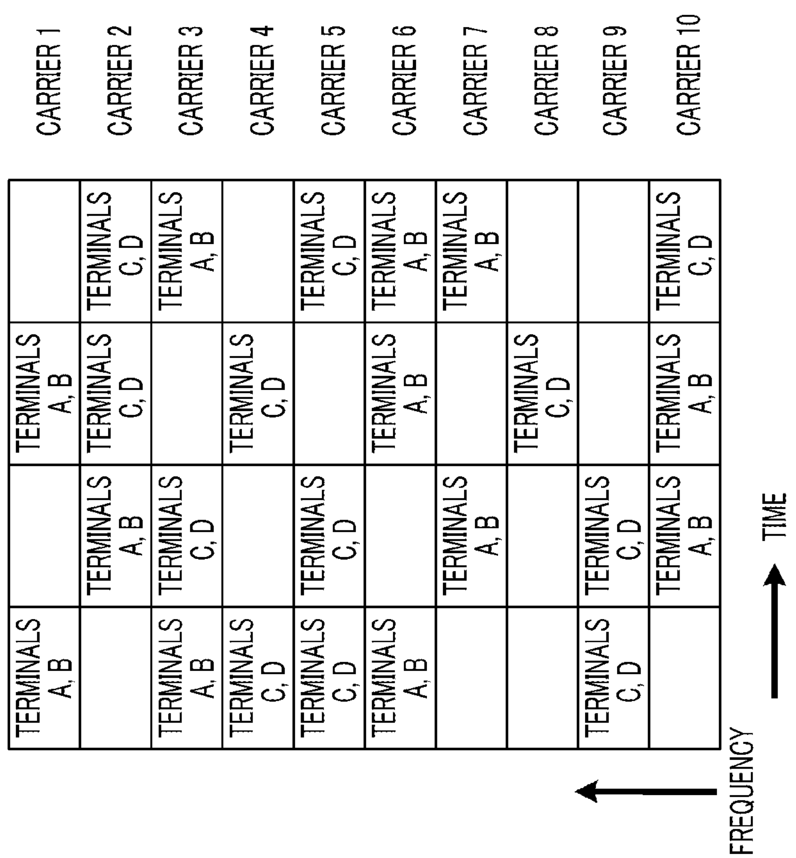
FIG. 67A is a drawing showing an example of a frame configuration when the distances between a base station and terminals are long.

FIG. 67A shows a Case 1 frame configuration. Here, the base station configures one QPSK symbol (corresponding to "TERMINALS A, B" in FIG. 67A) by means of terminal A data and terminal B data, and configures one QPSK symbol (corresponding to "TERMINALS C, D" in FIG. 67A) by means of terminal C data and terminal D data.

FIG. 67B shows a Case 2 frame configuration. Here, the base station configures one 16QAM symbol (corresponding to "TERMINALS A, B, C, D" in FIG. 67B) by means of terminal A data, terminal B data, terminal C data, and terminal D data.

The frame configurations as shown in FIG. 67 can also be implemented in the same way as in FIG. 63.

Other frame configuration methods will now be described. FIG. 68 shows an example of frame configurations different from the above. A characteristic of FIG. 68 is that frequency assignment (subcarrier assignment) is changed with the elapse of time. FIG. 68A shows a Case 1 frame configuration. Here, the base station configures one QPSK symbol (corresponding to "TERMINALS A, B" indicated by reference code 6701 in FIG. 68A) by means of terminal A data and terminal B data, and configures one QPSK symbol (corresponding to "TERMINALS C, D" indicated by reference code 6702 in FIG. 68A) by means of terminal C data and terminal D data. Then, with the elapse of time, subcarrier assignment is changed as shown in FIG. 68A.

Figure 68B:
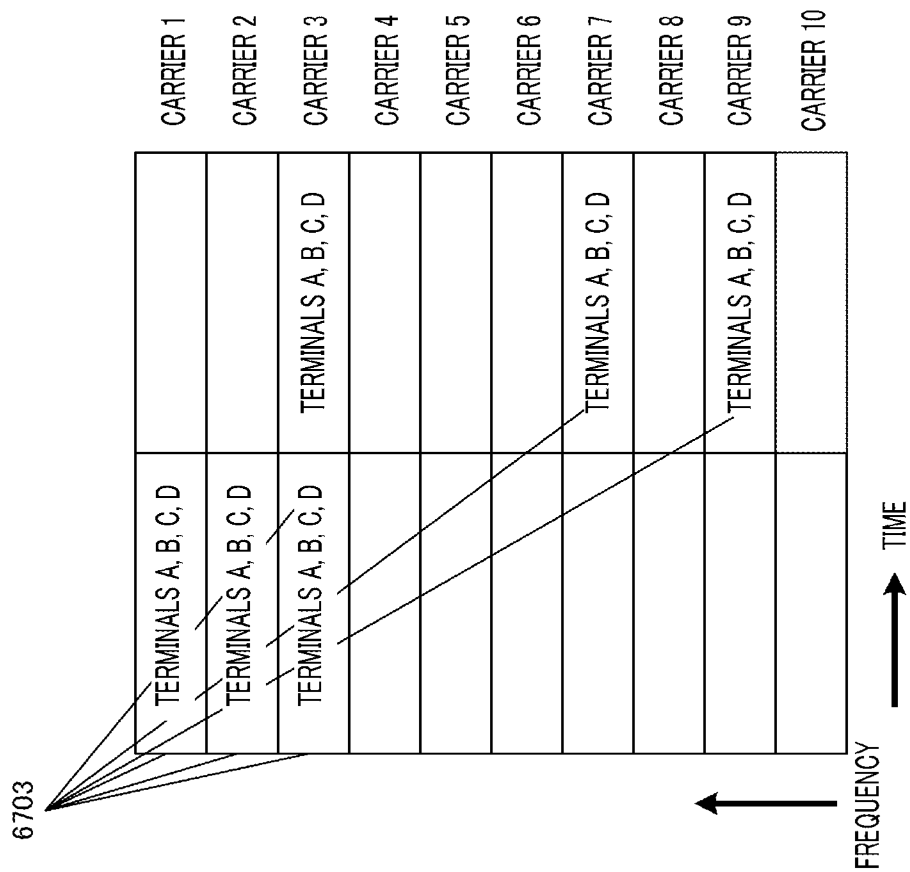
FIG. 68B is a drawing showing an example of a frame configuration when the distances between a base station and terminals are short.
Figure 68A:
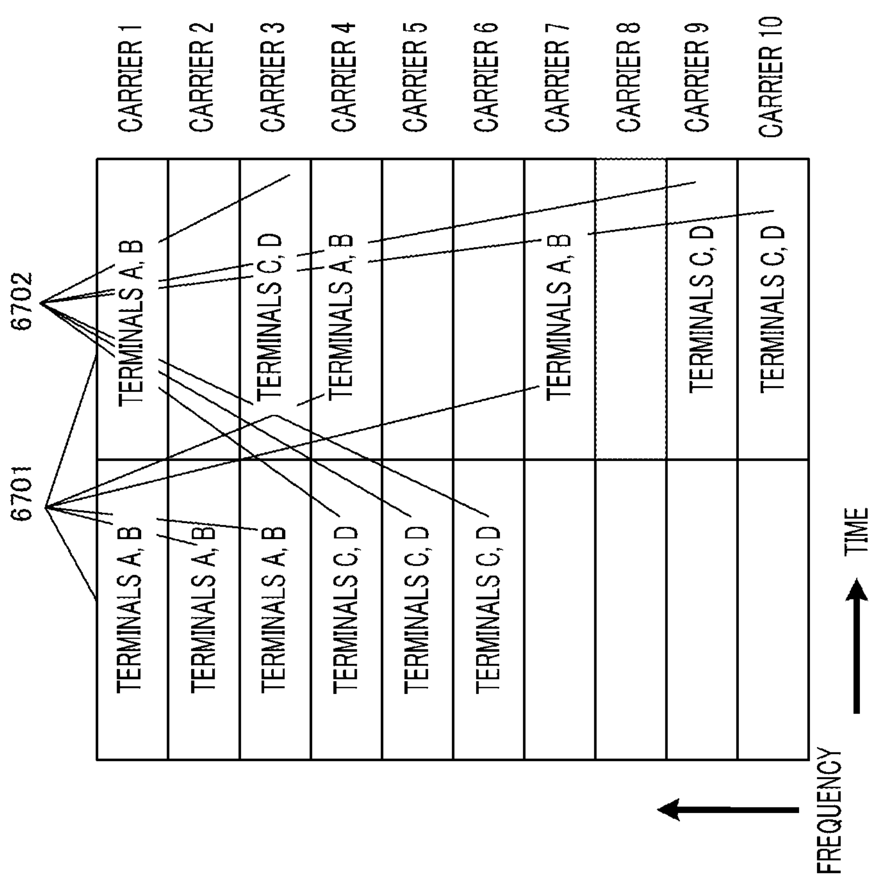
FIG. 68A is a drawing showing an example of a frame configuration when the distances between a base station and terminals are long.

FIG. 68B shows a Case 2 frame configuration. Here, the base station configures one 16QAM symbol (corresponding to "TERMINALS A, B, C, D" indicated by reference code 6703 in FIG. 68B) by means of terminal A data, terminal B data, terminal C data, and terminal D data. Then, with the elapse of time, subcarrier assignment is changed as shown in FIG. 68B.

FIG. 69 shows an example of frame configurations different from the above. A characteristic of FIG. 69 is that frequency assignment (subcarrier assignment) is changed with the elapse of time, and terminal data forming one symbol is also changed with the elapse of time. In FIG. 69, items that are the same as in FIG. 68 are assigned the same reference codes as in FIG. 68.

Figure 69B:
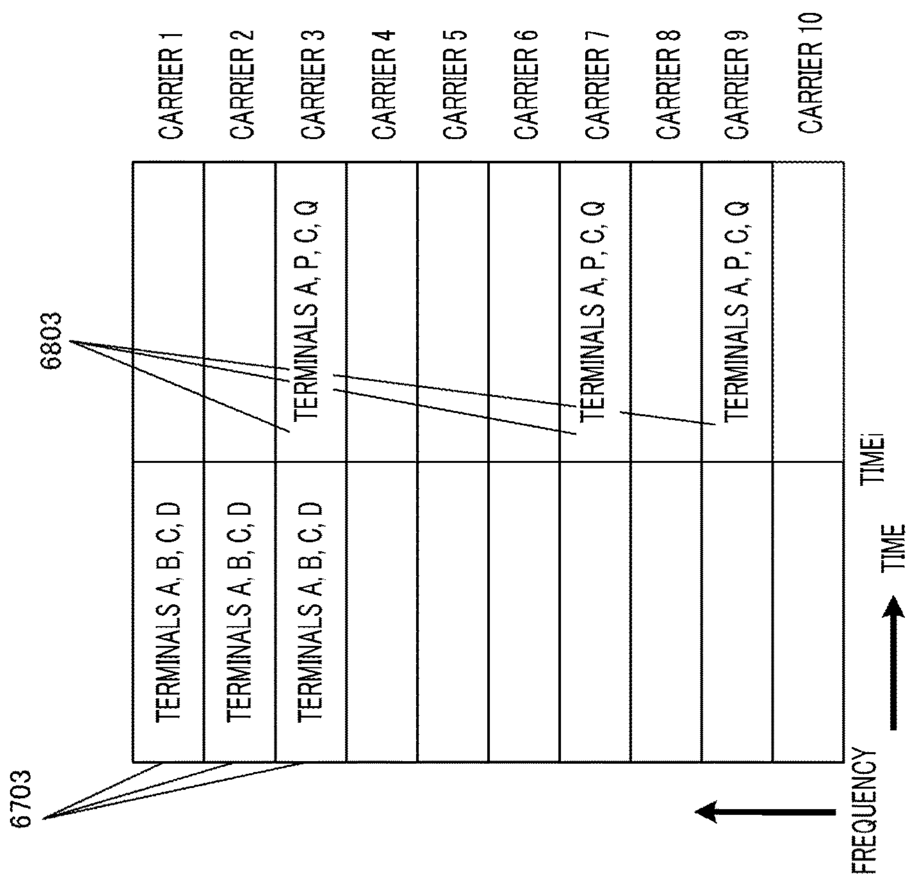
FIG. 69B is a drawing showing an example of a frame configuration when the distances between a base station and terminals are short.
Figure 69A:
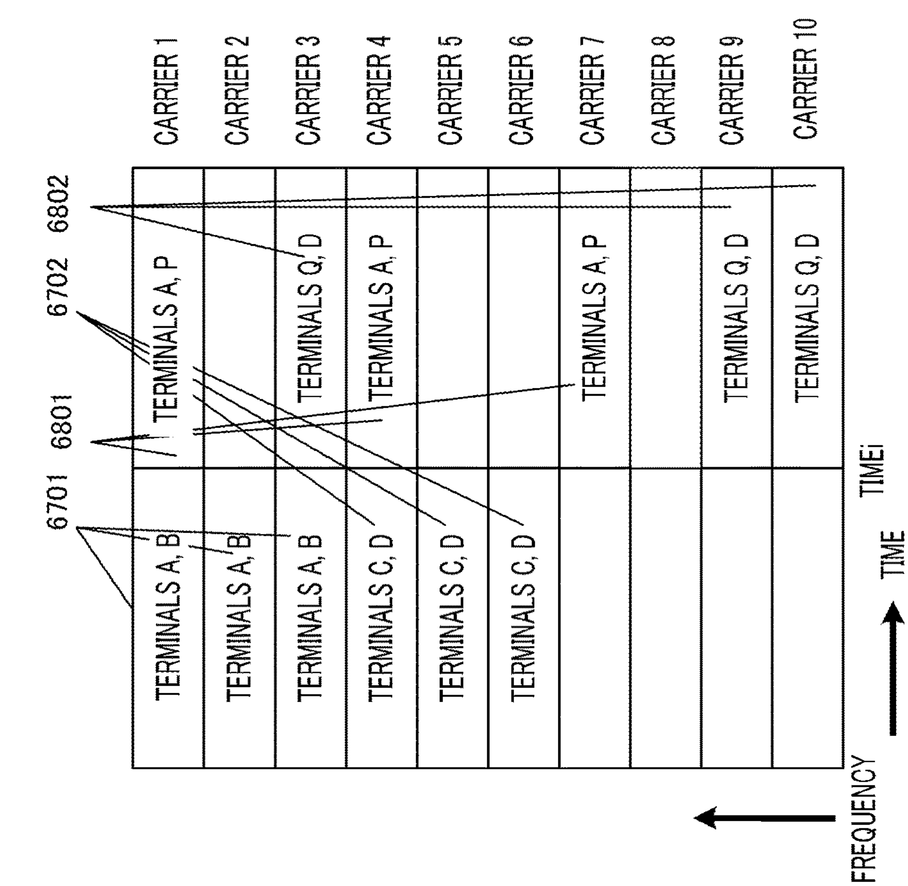
FIG. 69A is a drawing showing an example of a frame configuration when the distances between a base station and terminals are long.

FIG. 69A shows a Case 1 frame configuration. At time i, the base station finishes communication with terminal B and terminal C. Then, it is assumed that the base station newly starts communication with terminal P and terminal Q. At this time, the base station configures one QPSK symbol (corresponding to "TERMINALS A, P" indicated by reference code 6801 in FIG. 69A) by means of terminal A data and terminal P data, and configures one QPSK symbol (corresponding to "TERMINALS Q, D" indicated by reference code 6802 in FIG. 69A) by means of terminal Q data and terminal D data.

FIG. 69B shows a Case 2 frame configuration. At time i, the base station finishes communication with terminal B and terminal D. Then, it is assumed that the base station newly starts communication with terminal P and terminal Q. At this time, the base station configures one 16QAM symbol (corresponding to "TERMINALS A, P, C, Q" indicated by reference code 6803 in FIG. 69B) by means of terminal A data, terminal P data, terminal C data, and terminal Q data.

Figure 70B:
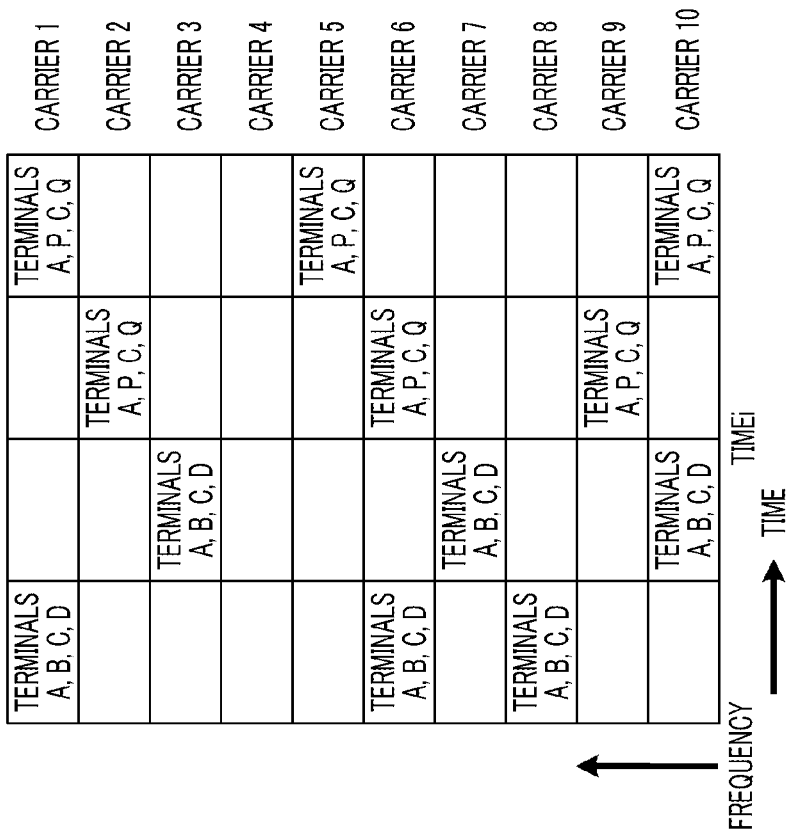
FIG. 70B is a drawing showing an example of a frame configuration when the distances between a base station and terminals are short.
Figure 70A:
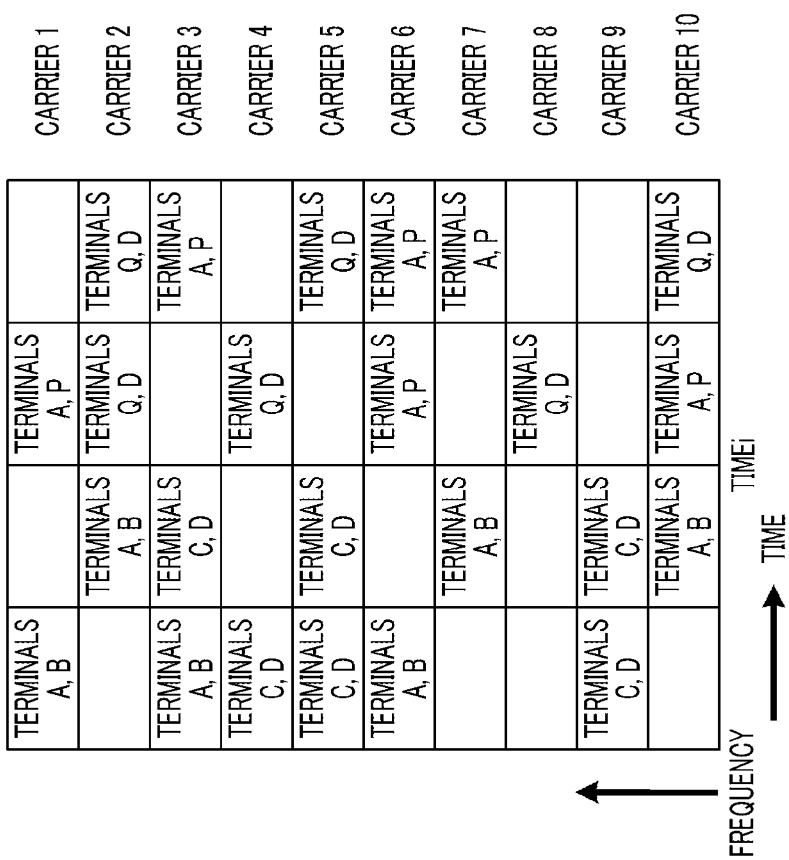
FIG. 70A is a drawing showing an example of a frame configuration when the distances between a base station and terminals are long.

FIG. 70 shows an example of frame configurations different from the above. The frame configurations in FIG. 70 combine the frame configurations in FIG. 67 and FIG. 69. FIG. 70A shows a Case 1 frame configuration. At time i, the base station finishes communication with terminal B and terminal C. Then, it is assumed that the base station newly starts communication with terminal P and terminal Q. FIG. 69B shows a Case 2 frame configuration. At time i, the base station finishes communication with terminal B and terminal D. Then, it is assumed that the base station newly starts communication with terminal P and terminal Q.

Encoded block bit assignment methods different from those in FIG. 62 and FIG. 66 will now be described.

Figure 71A:
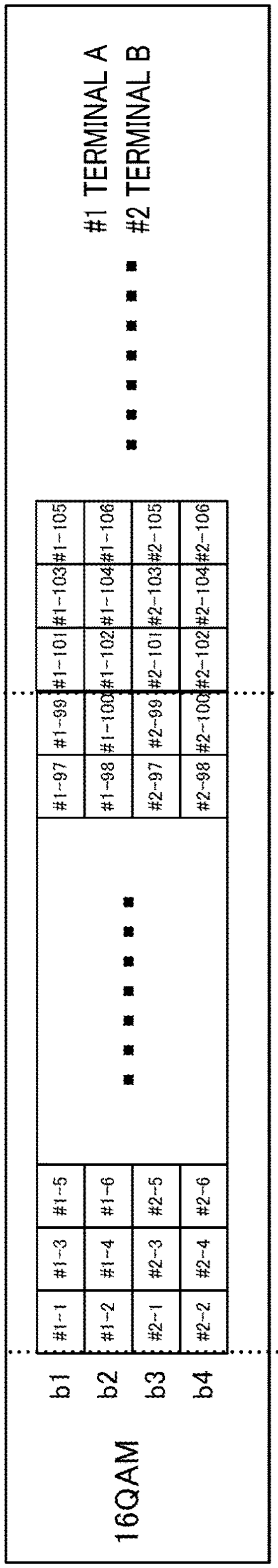
FIG. 71A is a drawing showing an example of a method of bit assignment to symbols when the distances between a base station and terminals are long.
Figure 71B:
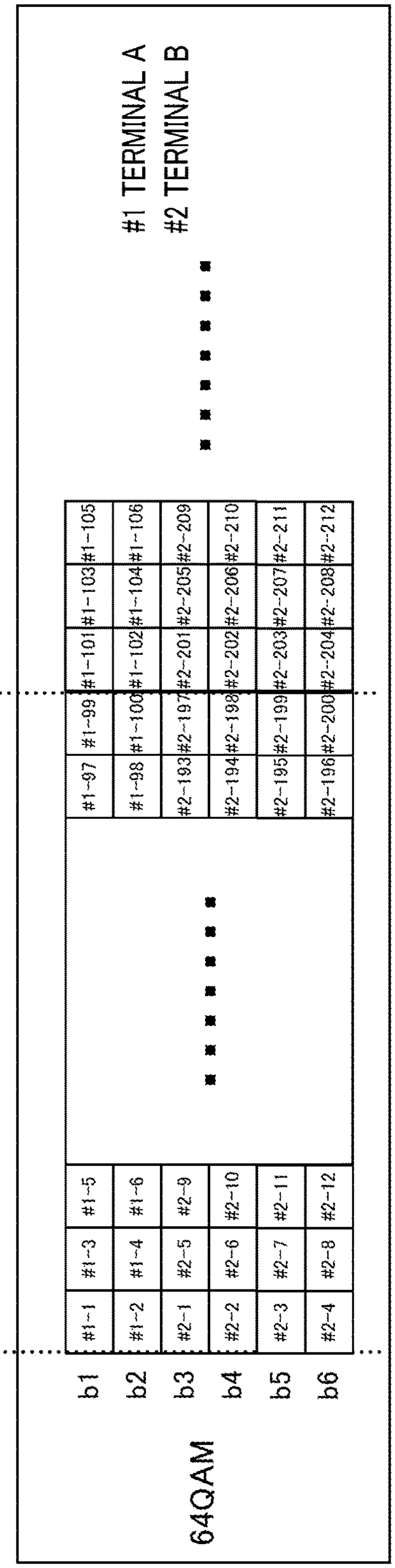
FIG. 71B is a drawing showing an example of a method of bit assignment to symbols when the distances between a base station and terminals are short.

FIG. 71 differs from FIG. 62 and FIG. 66 in that, when the modulation method is 16QAM, one symbol is configured by means of encoded block #1 data and encoded block #2 data. Furthermore, one symbol is also configured by means of encoded block #1 data and encoded block #2 data when the modulation method is 64QAM. Here, encoded block #1 is data transmitted by the base station to terminal A, and encoded block #2 is data transmitted by the base station to terminal #B.

Figure 72B:
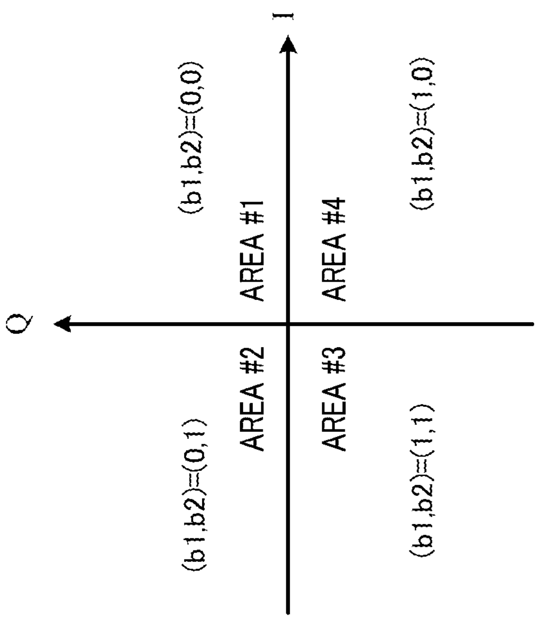
FIG. 72B is a drawing for explaining a method of determining bits b1 and b2.
Figure 72A:
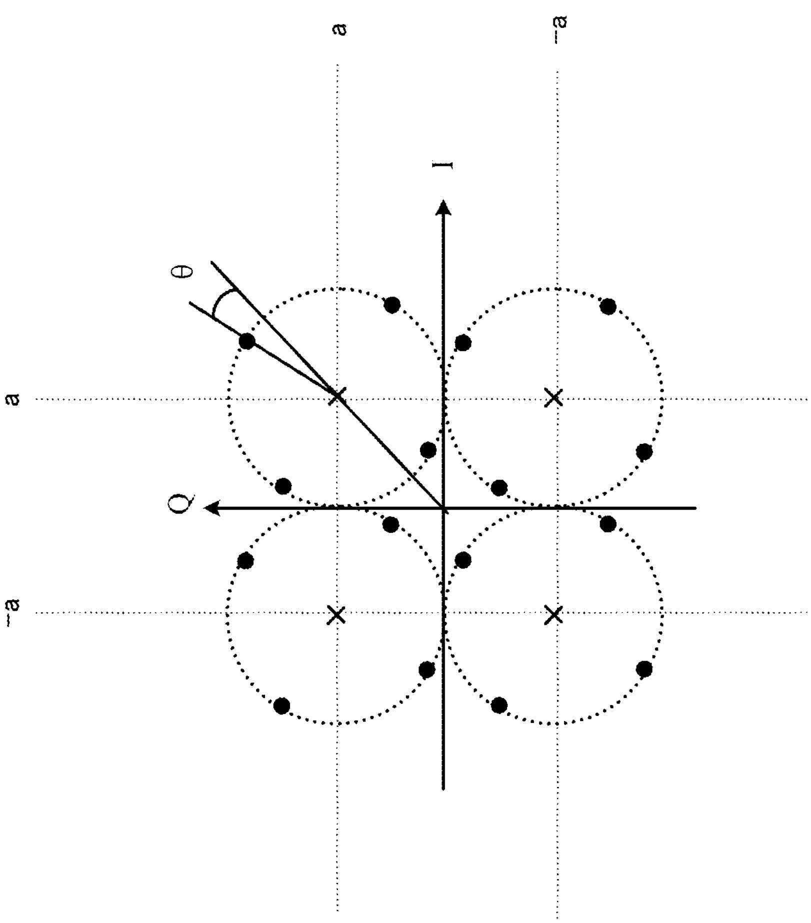
FIG. 72A is a drawing showing an example of signal point arrangement in the in-phase I— quadrature-phase Q plane of a modulation method used instead of 16QAM.

FIG. 72 shows an example of signal point arrangement in the in-phase I—quadrature-phase Q plane of a modulation method used instead of 16QAM in the case of the 16QAM frame configuration in FIG. 71. In FIG. 72A, bits b1 to b4 are assigned to 16 •'s, and "×" symbols indicate a QPSK signal point arrangement. Four points are arranged around one ×, and forms a QPSK arrangement although •'s revolve. Therefore, signal point arrangement (I,Q) in the • in-phase I—quadrature-phase Q plane can be represented as shown in the following equation.

(Equation 39)

$$\begin{pmatrix} I \\ Q \end{pmatrix} = \begin{pmatrix} X \\ Y \end{pmatrix} + \begin{pmatrix} \alpha \\ \beta \end{pmatrix} \quad [39]$$

$$\begin{pmatrix} X \\ Y \end{pmatrix} = \begin{pmatrix} a \\ a \end{pmatrix}, \begin{pmatrix} a \\ -a \end{pmatrix}\begin{pmatrix} -a \\ a \end{pmatrix}\begin{pmatrix} -a \\ -a \end{pmatrix}$$

$$\begin{pmatrix} \alpha \\ \beta \end{pmatrix} = \begin{pmatrix} \cos\varphi & -\sin\varphi \\ \cos\varphi & \cos\varphi \end{pmatrix}\begin{pmatrix} b \\ b \end{pmatrix}$$

$$\varphi = \theta, \theta + \frac{\pi}{2}, \theta + \pi, \theta + \frac{3\pi}{2}$$

FIG. 72B is a drawing for explaining a method of determining bits b1 and b2. The determination is (b1,b2)=(0,0) when a received signal is in area #1, (b1,b2)=(0,1) when in area #2, (b1,b2)=(1,1) when in area #3, and (b1,b2)=(1,0) when in area #4. Bits b3 and b4 are determined from the positional relationship between • and a received signal.

Figure 73B:
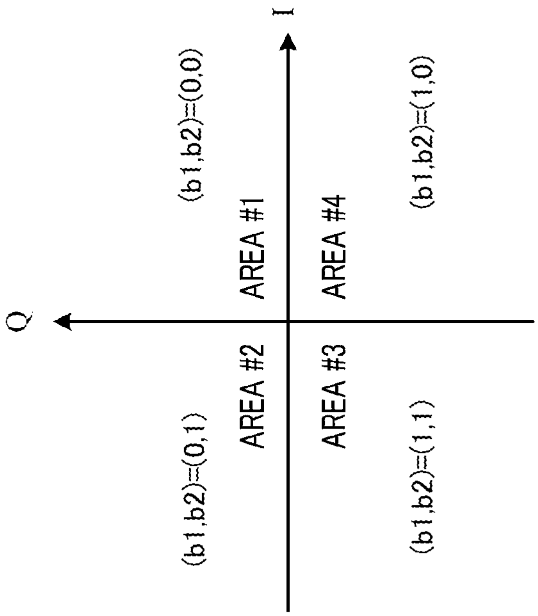
FIG. 73B is a drawing for explaining a method of determining bits b1 and b2.
Figure 73A:
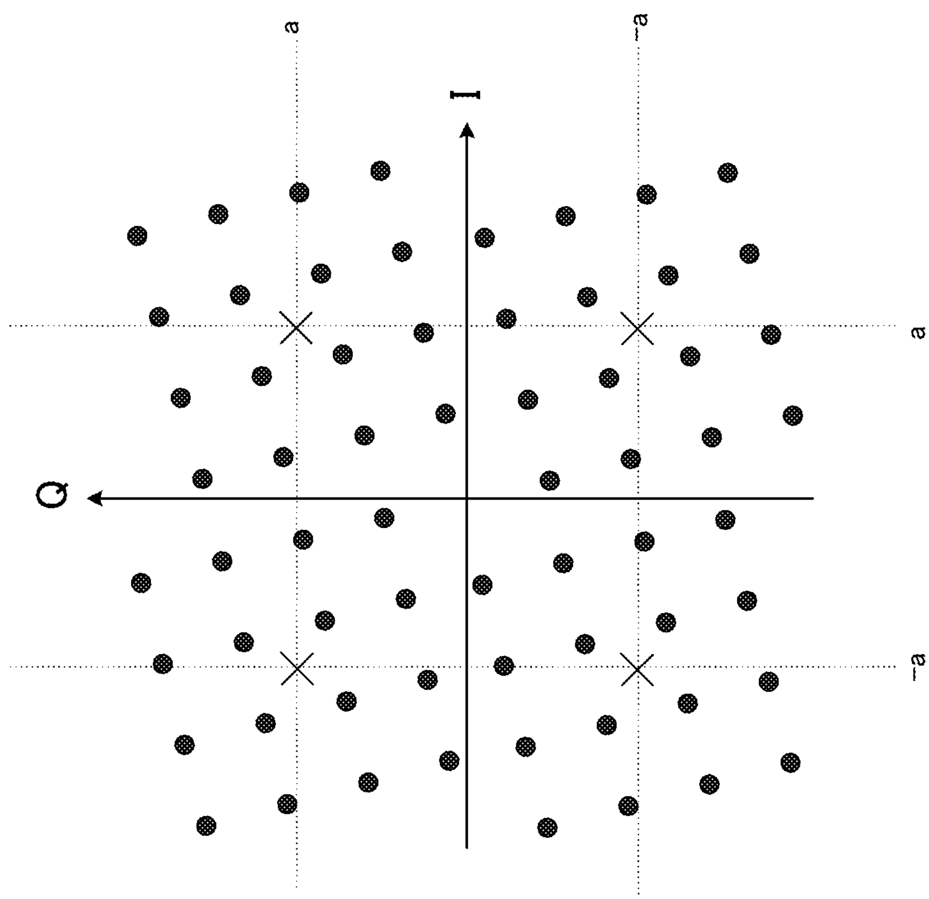
FIG. 73A is a drawing showing an example of signal point arrangement in the in-phase I— quadrature-phase Q plane of a modulation method used instead of 64QAM.

FIG. 73 shows an example of signal points in the in-phase I—quadrature-phase Q plane of a modulation method used instead of 64QAM in the case of the 64QAM frame configuration in FIG. 71. In FIG. 73A, bits b1 to b6 are assigned to 64 •'s, and "×" symbols indicate a QPSK signal point arrangement. Sixteen • points are arranged around one × and forms a 16QAM arrangement although •'s revolve. Therefore, signal point arrangement (I,Q) in the • in-phase I—quadrature-phase Q plane can be represented as shown in the following equation.

(Equation 40)

$$\begin{pmatrix} I \\ Q \end{pmatrix} = \begin{pmatrix} X \\ Y \end{pmatrix} + \begin{pmatrix} \alpha \\ \beta \end{pmatrix} \quad [40]$$

$$\begin{pmatrix} X \\ Y \end{pmatrix} = \begin{pmatrix} a \\ a \end{pmatrix}, \begin{pmatrix} a \\ -a \end{pmatrix}, \begin{pmatrix} -a \\ a \end{pmatrix}, \begin{pmatrix} -a \\ -a \end{pmatrix}$$

$$\begin{pmatrix} \alpha \\ \beta \end{pmatrix} = \begin{pmatrix} \cos\theta & -\sin\theta \\ \cos\theta & \cos\theta \end{pmatrix}\begin{pmatrix} r \\ s \end{pmatrix}$$

$$\begin{pmatrix} r \\ s \end{pmatrix} = \begin{pmatrix} 3b \\ 3b \end{pmatrix}, \begin{pmatrix} 3b \\ b \end{pmatrix}, \begin{pmatrix} 3b \\ -b \end{pmatrix}, \begin{pmatrix} 3b \\ -3b \end{pmatrix}, \begin{pmatrix} b \\ 3b \end{pmatrix}, \begin{pmatrix} b \\ b \end{pmatrix}, \begin{pmatrix} b \\ -b \end{pmatrix}, \begin{pmatrix} b \\ -3b \end{pmatrix}, \begin{pmatrix} -b \\ 3b \end{pmatrix}, \begin{pmatrix} -b \\ b \end{pmatrix}, \begin{pmatrix} -b \\ -b \end{pmatrix}, \begin{pmatrix} -b \\ -3b \end{pmatrix}, \begin{pmatrix} -3b \\ 3b \end{pmatrix}, \begin{pmatrix} -3b \\ b \end{pmatrix}, \begin{pmatrix} -3b \\ -b \end{pmatrix}, \begin{pmatrix} -3b \\ -3b \end{pmatrix}$$

FIG. 73B is a drawing for explaining a method of determining bits b1 and b2. The determination is (b1,b2)=(0,0) when a received signal is in area #1, (b1,b2)=(0,1) when in area #2, (b1,b2)=(1,1) when in area #3, and (b1,b2)=(1,0) when in area #4. Bits b3, b4, b5, and b6 are determined from the positional relationship between • and a received signal.

FIG. 74 is a drawing showing encoded block bit assignment methods different from those in FIG. 62 and FIG. 66.

Figure 74A:
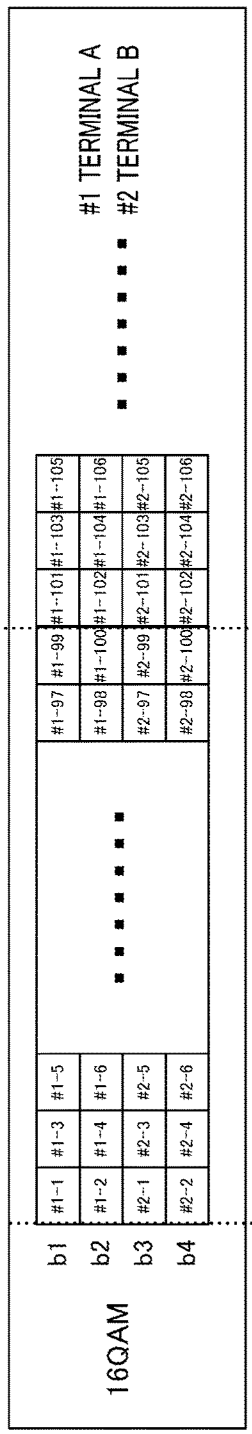
FIG. 74A is a drawing showing an example of a method of bit assignment to symbols when the distances between a base station and terminals are long.

As shown in FIG. 74A, when the modulation method is 16QAM, one symbol is configured by means of encoded block #1 data and encoded block #2 data. Furthermore, one symbol is also configured by means of encoded block #1 data and encoded block #2 data when the modulation method is 64QAM. Here, encoded block #1 is data transmitted by the base station to terminal A, and encoded block #2 is data transmitted by the base station to terminal #B.

Figure 74B:
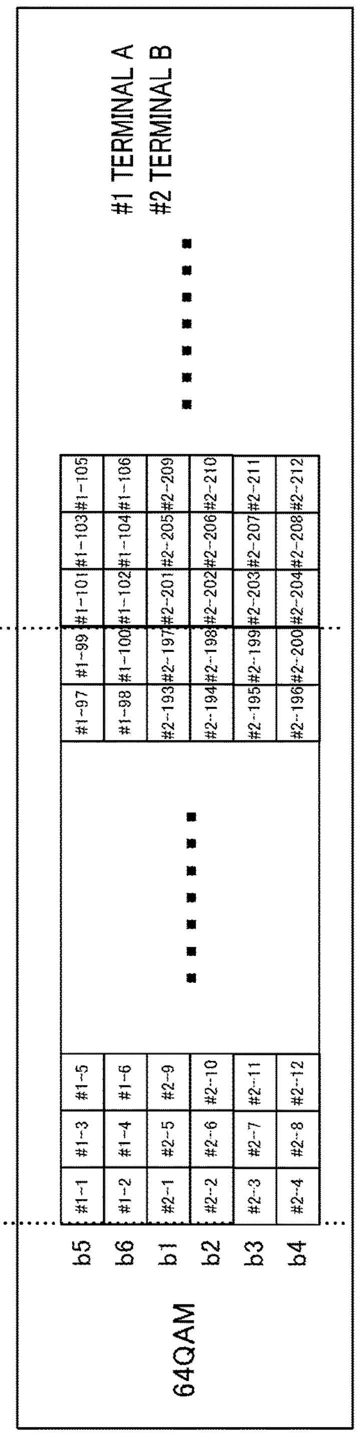
FIG. 74B is a drawing showing an example of a method of bit assignment to symbols when the distances between a base station and terminals are short.
Figure 75B:
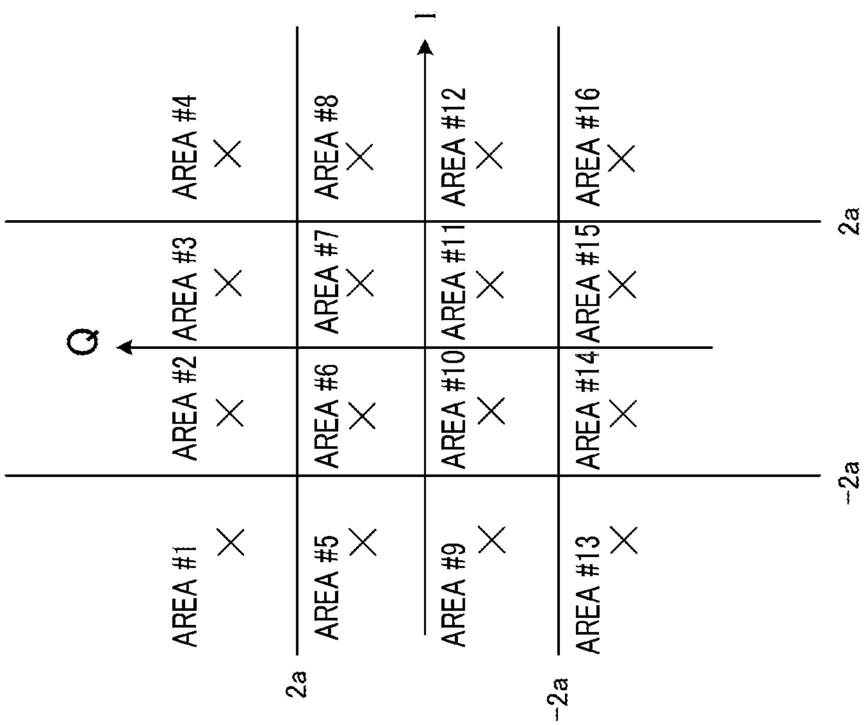
FIG. 75B is a drawing for explaining a method of determining bits b1, b2, b3, and b4.
Figure 75A:
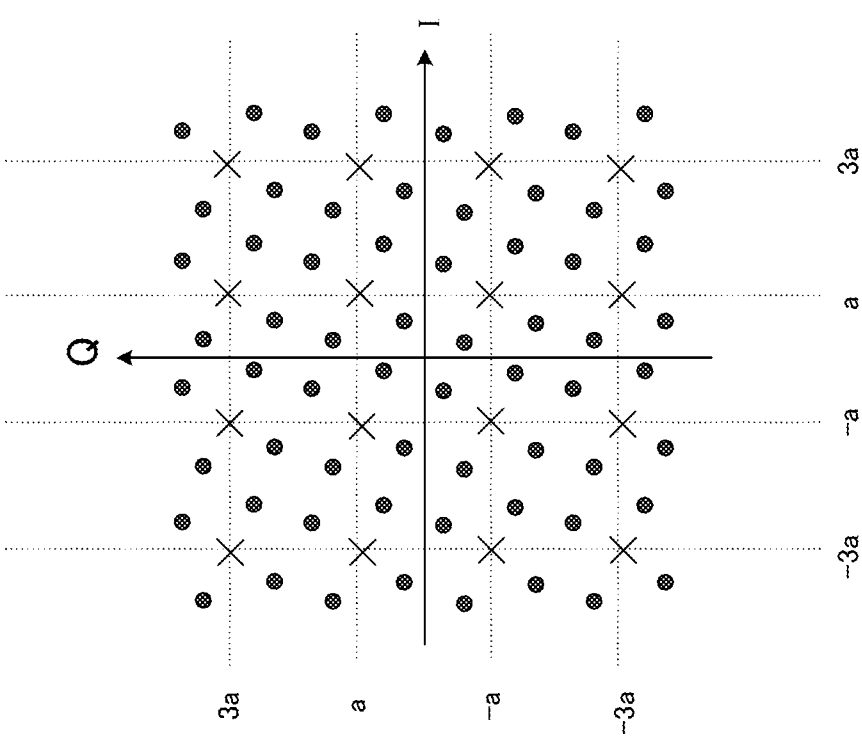
FIG. 75A is a drawing showing an example of signal point arrangement in the in-phase I— quadrature-phase Q plane of a modulation method used instead of 64QAM.

FIG. 75 shows an example of signal point arrangement in the in-phase I—quadrature-phase Q plane of a modulation method used instead of 64QAM in the case of the 64QAM frame configuration in FIG. 74B. In FIG. 75A, bits b1 to b6 are assigned to 64 •'s, and "×" symbols indicate a 16QAM signal point arrangement. Four • points are arranged around one × and forms a QPSK arrangement although •'s revolve. Therefore, signal point arrangement (I,Q) in the • in-phase I—quadrature-phase Q plane can be represented as shown in the following equation.

(Equation 41)

$$\begin{pmatrix} I \\ Q \end{pmatrix} = \begin{pmatrix} X \\ Y \end{pmatrix} + \begin{pmatrix} \alpha \\ \beta \end{pmatrix} \quad [41]$$

$$\begin{pmatrix} X \\ Y \end{pmatrix} = \begin{pmatrix} 3a \\ 3a \end{pmatrix}, \begin{pmatrix} 3a \\ a \end{pmatrix}, \begin{pmatrix} 3a \\ -a \end{pmatrix}, \begin{pmatrix} 3a \\ -3a \end{pmatrix}, \begin{pmatrix} a \\ 3a \end{pmatrix}, \begin{pmatrix} a \\ a \end{pmatrix}, \begin{pmatrix} a \\ -a \end{pmatrix}, \begin{pmatrix} a \\ -3a \end{pmatrix},$$

$$\begin{pmatrix} -a \\ 3a \end{pmatrix}, \begin{pmatrix} -a \\ a \end{pmatrix}, \begin{pmatrix} -a \\ -a \end{pmatrix}, \begin{pmatrix} -a \\ -3a \end{pmatrix}, \begin{pmatrix} -3a \\ 3a \end{pmatrix}, \begin{pmatrix} -3a \\ a \end{pmatrix}, \begin{pmatrix} -3a \\ -a \end{pmatrix}, \begin{pmatrix} -3a \\ -3a \end{pmatrix}$$

$$\begin{pmatrix} \alpha \\ \beta \end{pmatrix} = \begin{pmatrix} \cos\varphi & -\sin\varphi \\ \cos\varphi & \cos\varphi \end{pmatrix} \begin{pmatrix} b \\ b \end{pmatrix}$$

$$\varphi = \theta, \theta + \frac{\pi}{2}, \theta + \pi, \theta + \frac{3\pi}{2}$$

FIG. 75B is a drawing for explaining a method of determining bits b1, b2, b3, and b4. The I-Q plane is divided into 16 areas by straight lines and the I and Q axes. Bits (0,0,0,0) to (1,1,1,1) are determined for (b1, b2, b3, b4) based on the area of area #1 to area #16 in which a received signal is present.

By the above means, a bit assignment method described in Embodiment 1, Embodiment 5, Embodiment 6, or Embodiment 7 can be applied to an OFDM or suchlike multicarrier access method. At this time, in addition to obtaining the effects described in Embodiment 1, Embodiment 5, Embodiment 6, and Embodiment 7, an effect of obtaining frequency diversity gain can be attained for signals addressed to each terminal since signals (bits) addressed to each terminal can be placed on suitable subcarriers.

A transmitting method presented in Embodiment 1, Embodiment 5, Embodiment 6, or Embodiment 7 can also be applied to transmission using MIMO scheme such as shown in Non-patent Document 10. That is to say, a transmitting method presented in Embodiment 1, Embodiment 5, Embodiment 6, or Embodiment 7 can be implemented irrespective of whether transmission using MIMO scheme is or is not performed. Furthermore, implementation is possible irrespective of whether the coding rate of encoded blocks are the same or different.

Embodiment 11

In this embodiment, a retransmission method (ARQ: Automatic Repeat reQuest) is described for a case in which a bit assignment method described in Embodiment 1, Embodiment 5, Embodiment 6, Embodiment 7, or Embodiment 10 is used.

Here, as an example, a case will be described in which terminal #A and terminal #B perform communication, and terminal #A transmits retransmission data to terminal #B.

Figure 76:
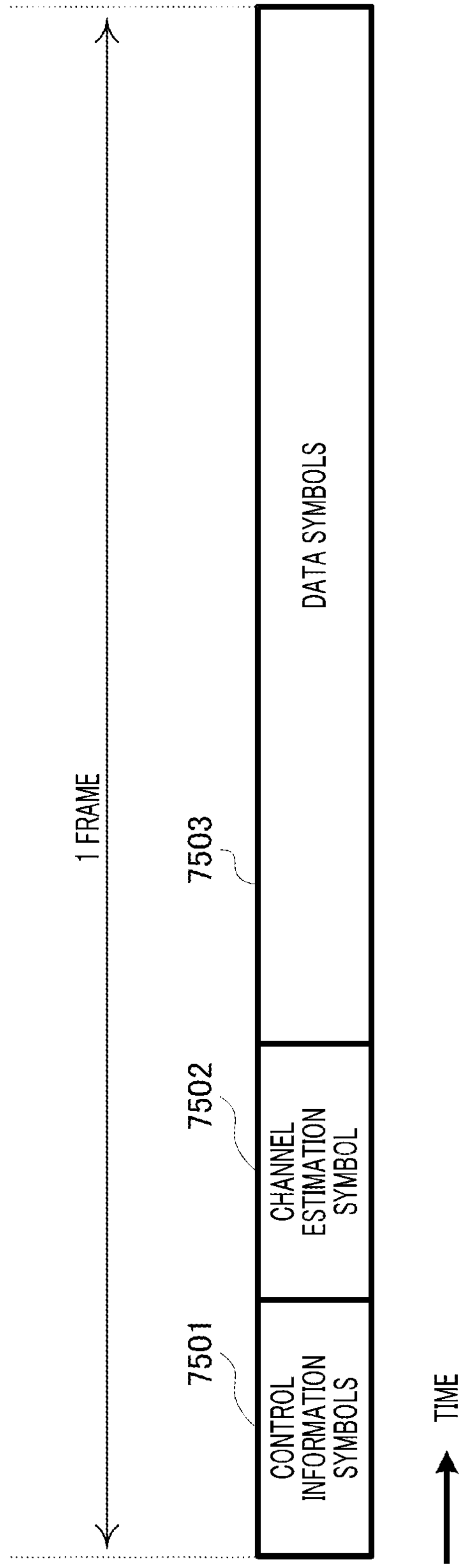
FIG. 76 is a drawing showing an example of a frame configuration in the time domain direction of a signal transmitted by terminal #A.

FIG. 76 shows an example of the frame configuration of one frame in the time domain direction of a signal transmitted by terminal #A. Control information symbols 7501 are symbols for transmitting information other than data that is transmitted to establish communication, such as the transmission counterpart (corresponding to terminal #B) information, the data length, information as to whether or not this is retransmission data, the number of retransmissions, modulation method, error correction method, and so forth, for example. Channel estimation symbol 7502 is a symbol used by communication counterpart terminal #B to estimate propagation environment fluctuation due to fading. Data symbols 7503 are transmitted using a configuration such as shown in FIG. 79. The important point in FIG. 79 is that a CRC (Cyclic Redundancy Check) is added in order to detect a data error. The configurations in FIG. 79 will be described later herein.

Figure 77:
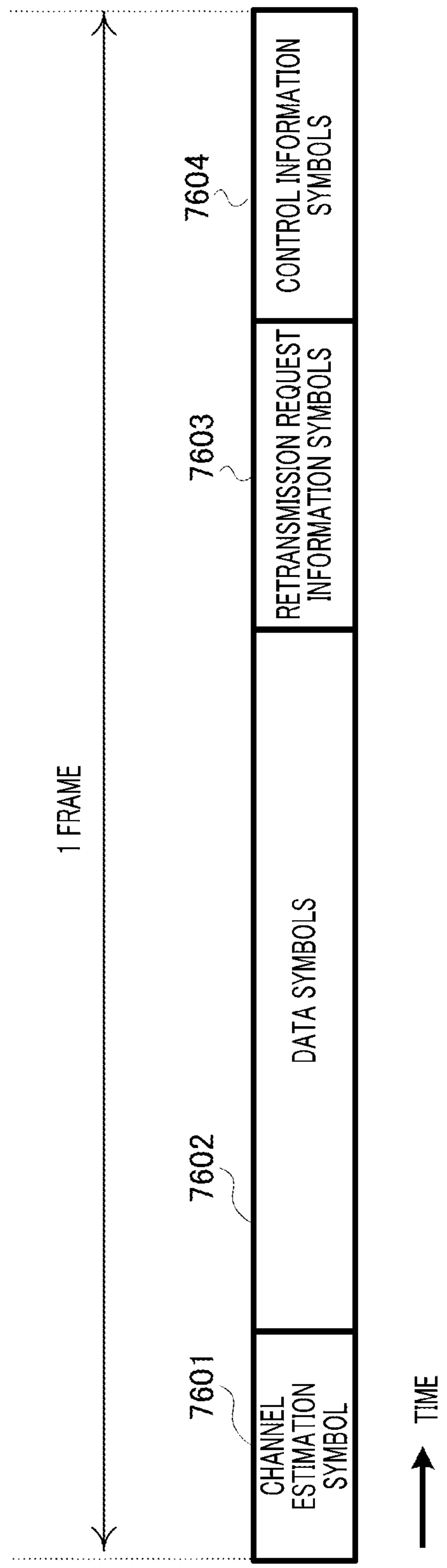
FIG. 77 is a drawing showing an example of a frame configuration in the time domain direction of a signal transmitted by terminal #B.

FIG. 77 shows an example of the frame configuration of one frame in the time domain direction of a signal transmitted by terminal #B. Channel estimation symbol 7601 is a symbol used by communication counterpart terminal #A to estimate propagation environment fluctuation due to fading. After channel estimation symbol 7601, data symbols 7602 are transmitted. Retransmission request information symbols 7603 are symbols for giving information as to whether or not terminal #B requests retransmission, and notifying the communication terminal of the retransmission method. Control information symbols 7604 are symbols for transmitting information other than data that is transmitted to establish communication, such as transmission counterpart (corresponding to terminal #A) information, the data length, modulation method information, coding rate and encoding method information, and so forth, for example.

Figure 78:
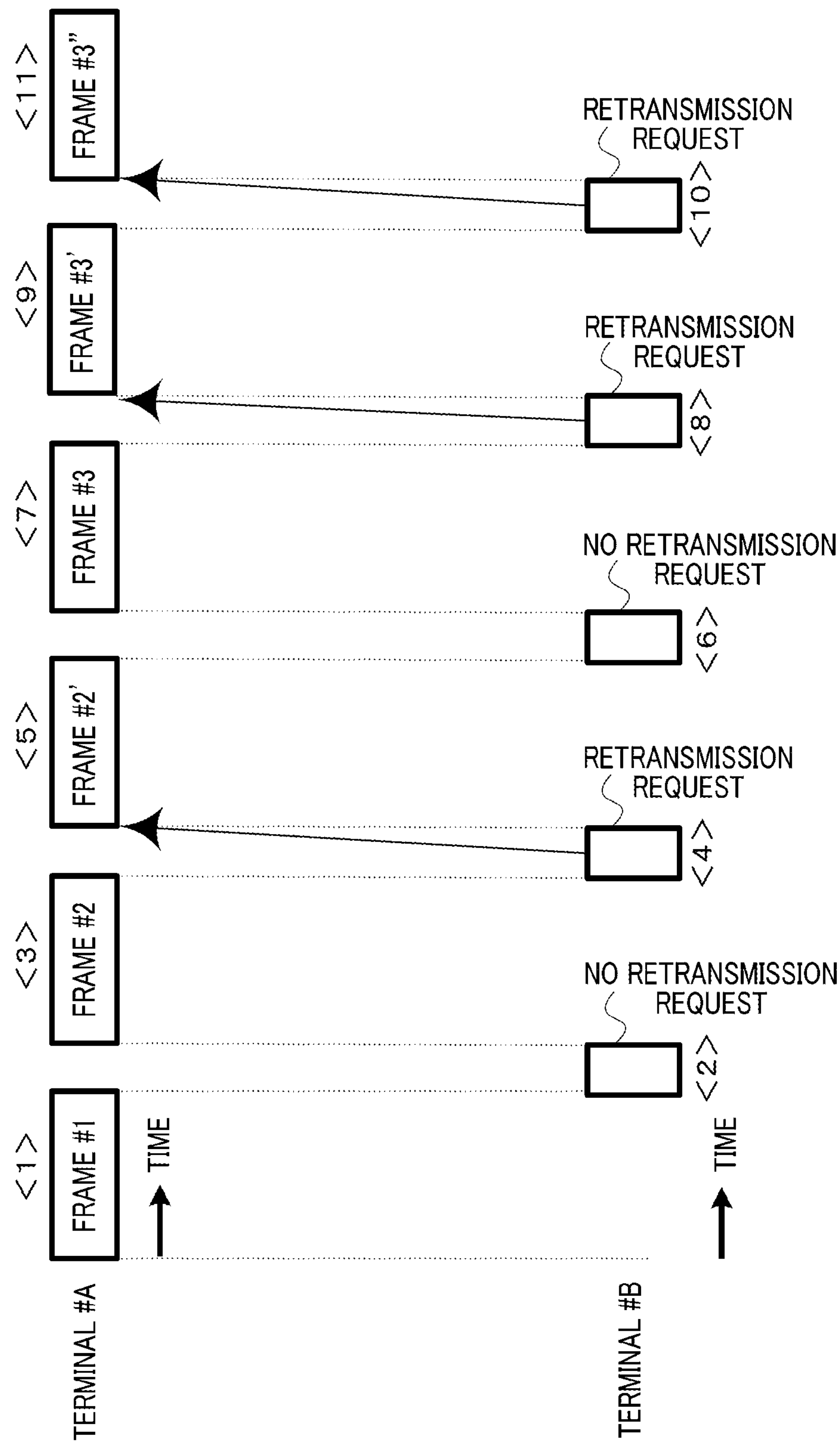
FIG. 78 is a drawing showing an example of data flow between terminal #A and terminal #B in Embodiment 11.

FIG. 78 shows an example of data flow between terminal #A and terminal #B.

FIG. 78<1>: First, terminal #A transmits a frame #1 modulated signal in accordance with the frame configuration in FIG. 76. The data transmitted here is not retransmission data.

FIG. 78<2>: Terminal #B receives the frame #1 signal, and performs demodulation and a CRC check. As the result is that an error has not occurred, a retransmission request is not made to terminal #A.

FIG. 78<3>: Terminal #A transmits a frame #2 modulated signal. The data transmitted here is not retransmission data.

FIG. 78<4>: Terminal #B receives the frame #2 signal, and performs demodulation and a CRC check. As the result is that an error has occurred, a retransmission request is made to terminal #A.

FIG. 78<5>: As terminal #A has received a retransmission request from terminal #B, terminal #A transmits frame #2' corresponding to the data transmitted in frame #2. The meaning of frame #2' will now be explained.

Frame #2' generation methods—that is, typical ARQ methods—include the following, as shown in Non-patent Document 11.

Chase combining method: When this method is used, data identical to the initially transmitted data is transmitted in a retransmission.

Hybrid ARQ: An encoded data line is taken as an original line, and redundant data (puncture data) generated when error correction coding is performed is taken as a parity line. Then the original line is first transmitted, and if a retransmit is requested by the communication counterpart, the parity line is transmitted as retransmission data. A convolutional code puncture data (redundant data) generation method is shown in Non-patent Document 11, for example.

FIG. 78<6>: Terminal #B receives the frame #2' signal, and performs demodulation and a CRC check. As the result is that an error has not occurred, a retransmission request is not made to terminal #A.

FIG. 78<7>: Terminal #A transmits a frame #3 modulated signal.

FIG. 78<8>: Terminal #B receives the frame #3 signal, and performs demodulation and a CRC check. As the result is that an error has occurred, a retransmission request is made to terminal #A.

FIG. 78<9>: As terminal #A has received a retransmission request from terminal #B, terminal #A transmits frame #3' corresponding to the data transmitted in frame #3. Frame #3' generation methods are the same as described above.

FIG. 78<10>: Terminal #B receives the frame #3' signal, and performs demodulation and a CRC check. As the result is that an error has occurred, a retransmission request is made to terminal #A.

FIG. 78<11>: As terminal #A has received a retransmission request from terminal #B, terminal #A transmits frame #3" corresponding to the data transmitted in frame #3. At this time, the frame #3" data may be the data transmitted initially, or may be the same as in frame #3'. That is to say, frame #3" is not limited to a specific ARQ method.

This concludes a description of data flow in a first ARQ method of this embodiment. Next, the configuration method of data symbols 7503 transmitted by terminal #A illustrated in FIG. 76, and the retransmission data generation method, will be described in detail.

FIG. 79 and FIG. 80 show examples of the configuration of data symbols 7503 in FIG. 76. It is possible to select either QPSK or 16QAM as a modulation method. The relationship between the frame configurations in FIG. 79 and FIG. 80 is the same as the relationship between the frame configurations in FIG. 32 and FIG. 36.

Figure 36C:
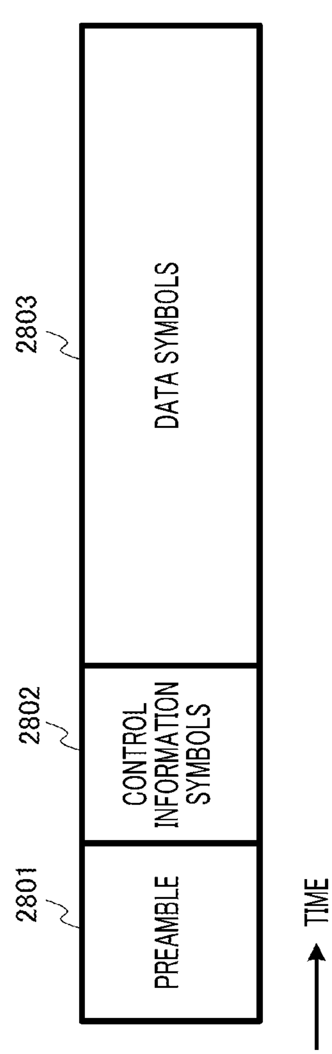
Figure 79A:
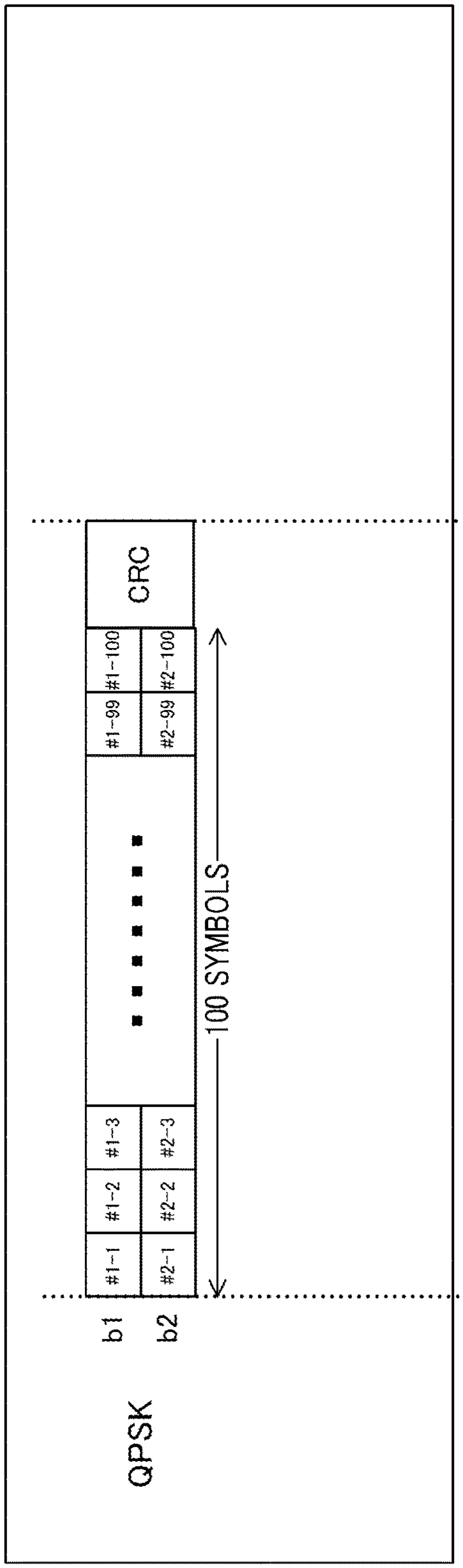
Figure 79B:
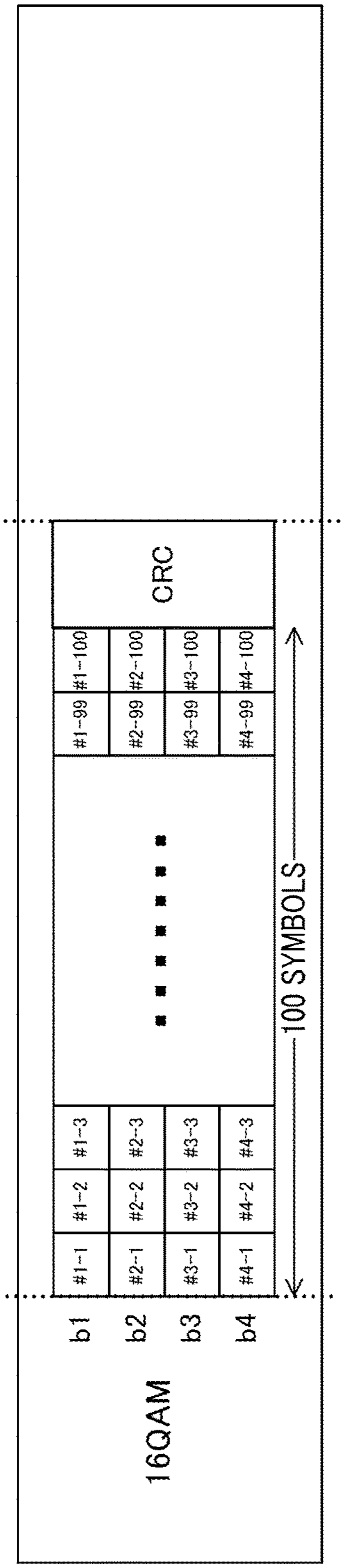
Figure 80A:
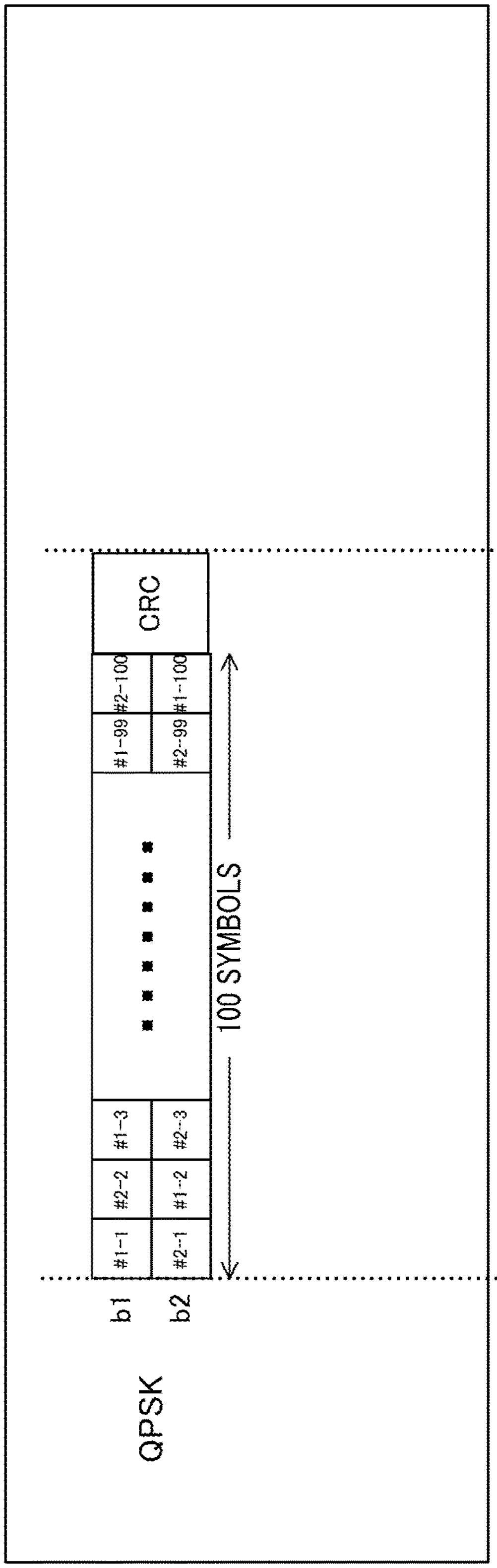

The frame configurations in FIG. 79 and FIG. 80 differ from the frame configurations in FIG. 32 and FIG. 36 in that a CRC is included. In FIG. 79 and FIG. 80, when the modulation method is QPSK (that is, in the case of FIG. 79A and FIG. 80A), whether or not there is an error in encoded block #1 or encoded block #2 can be checked by checking the CRC. However, it is assumed that it is not possible to determine in which of encoded block #1 or encoded block #2 there is an error. Therefore, when retransmission is performed, retransmission data is transmitted for both encoded block #1 and encoded block #2.

Figure 80B:
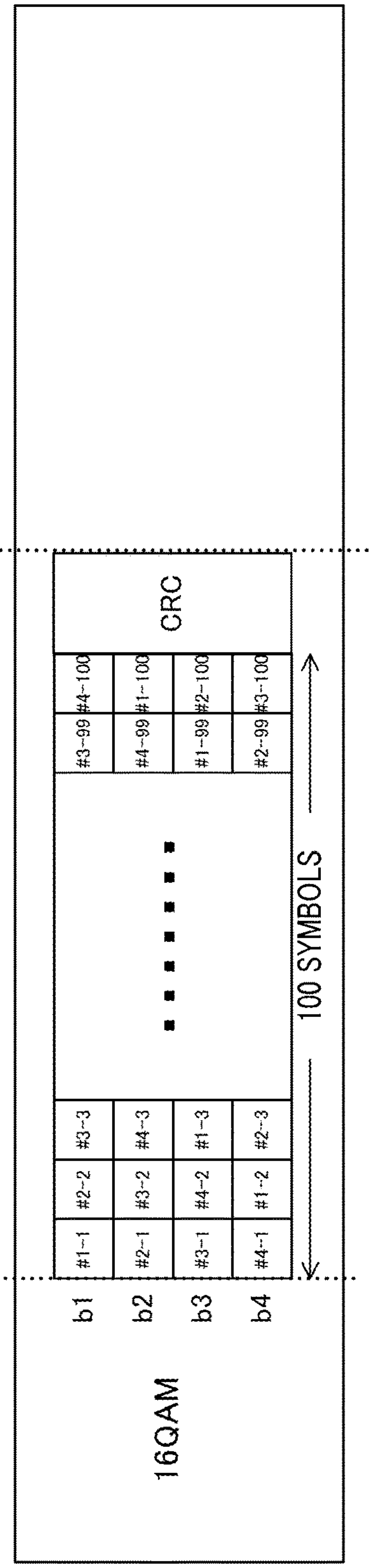

Similarly, in FIG. 79 and FIG. 80, when the modulation method is 16QAM (that is, in the case of FIG. 79B and FIG. 80B), whether or not there is an error in encoded block #1, encoded block #2, encoded block #3, or encoded block #4 can be checked by checking the CRC. However, it is assumed that it is not possible to determine in which of encoded blocks #1, #2, #3, or #4 there is an error. Therefore, when retransmission is performed, retransmission data is transmitted for all of encoded blocks #1, #2, #3, and #4.

Figure 81:
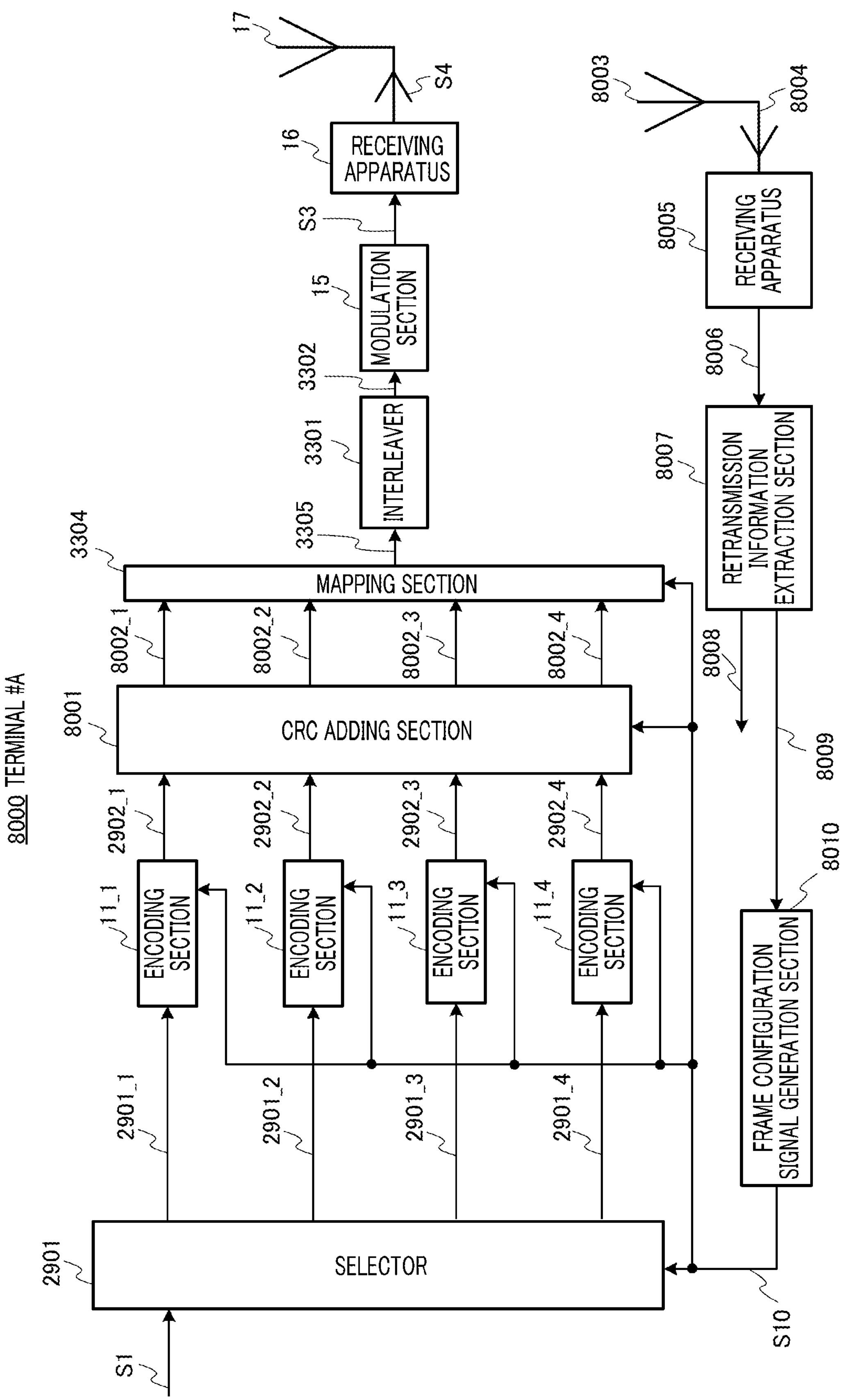
FIG. 81 is a block diagram showing an example of the configuration of terminal #A of Embodiment 11.

FIG. 81 shows an example of the configuration of terminal #A according to this embodiment. In FIG. 81, items that operate in the same way as in FIG. 33 are assigned the same reference codes as in FIG. 33.

In FIG. 81, CRC adding section 8001 has encoded data 2902_1, 2902_2, 2902_3, and 2902_4, and control signal S10, as input, adds a CRC at a predetermined position in a frame in accordance with control signal S10, and outputs post-CRC-addition encoded data 8002_1, 8002_2, 8002_3, and 8002_4.

Receiving apparatus 8005 has received signal 8004 received from receive antenna 8003 as input, performs predetermined processing, and outputs receive data 8006. Retransmission information extraction section 8007 has receive data 8006 as input, extracts retransmission related information—that is, information as to whether or not terminal #B has requested retransmission, information on the number of retransmissions, and so forth—and outputs this as retransmission related information 8009. Retransmission information extraction section 8007 also outputs data 8008 apart from retransmission related information 8009.

Frame configuration signal generation section 8010 has retransmission related information 8009 as input, determines transmission conditions such as whether or not to transmit retransmission data, the modulation method, encoding method, coding rate, and so forth, based on this information 8009, and outputs information relating to the determined transmission conditions as control signal S10.

Figure 82:
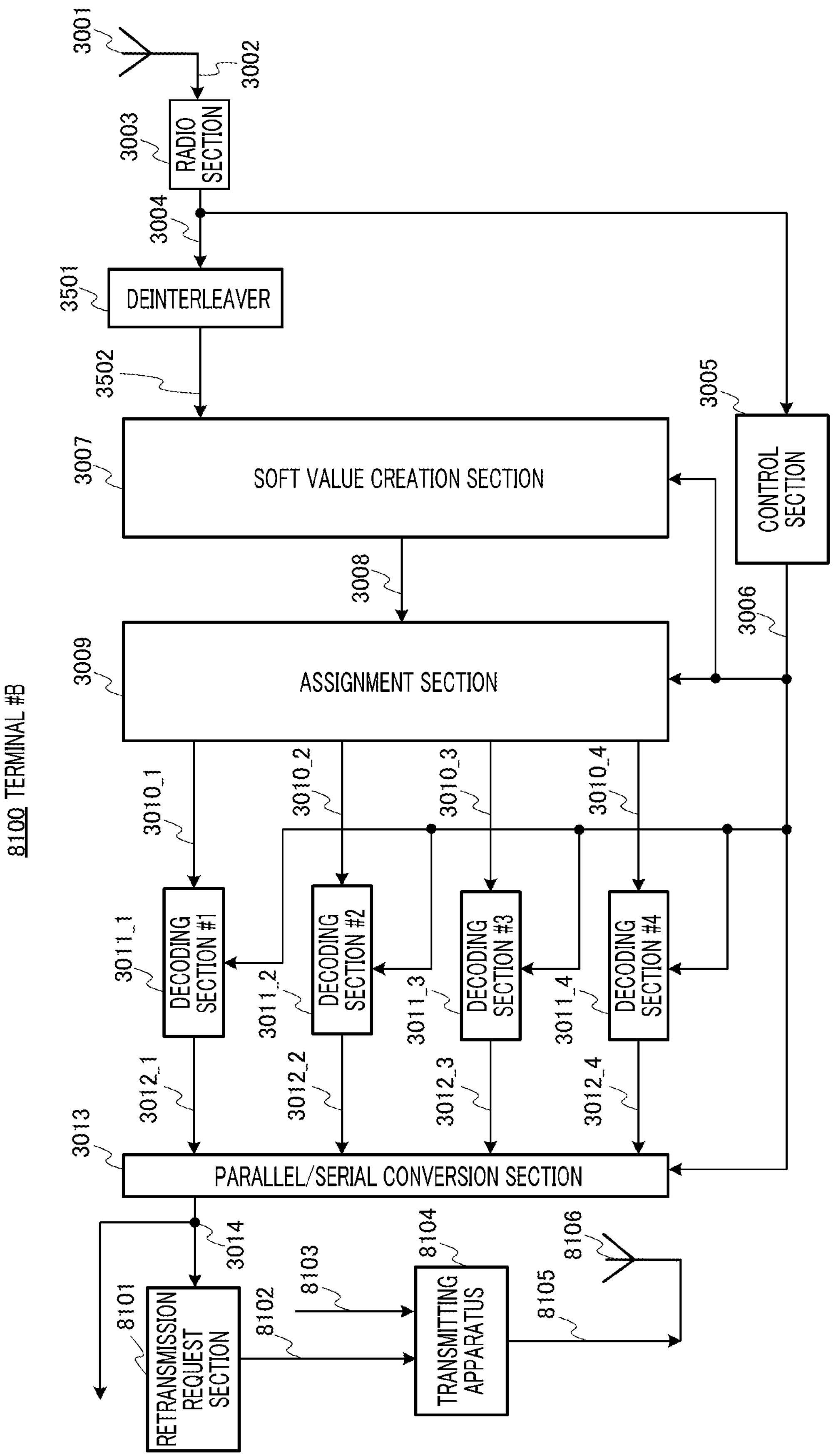
FIG. 82 is a block diagram showing an example of the configuration of terminal #B of Embodiment 11.

FIG. 82 shows an example of the configuration of terminal #B according to this embodiment. In FIG. 82, items that operate in the same way as in FIG. 35 are assigned the same reference codes as in FIG. 35.

In FIG. 82, retransmission request section 8101 has decoded data 3014 as input, determines whether or not to request retransmission by performing a CRC check on the decoded data, and outputs the determination result as retransmission request information 8102.

Transmitting apparatus 8104 has retransmission request information 8102 and transmit data 8103 as input, generates modulated signal 8105 in accordance with the frame configuration in FIG. 77 by executing predetermined processing, and outputs this modulated signal 8105. Modulated signal 8105 is output as a radio wave from antenna 8106.

The above ARQ method can be implemented by means of the configuration as described above.

Next, a second ARQ method different from the above first ARQ method will be described.

FIG. 83 and FIG. 84 show examples of the configuration of data symbols 7503 different from those in FIG. 79 and FIG. 80. FIG. 83 and FIG. 84 show examples of the configuration of data symbols 7503 transmitted by terminal #A in FIG. 76 (see FIG. 76). The frame configurations in FIG. 83 and FIG. 84 differ from the frame configurations in FIG. 79 and FIG. 80 in that CRCs are inserted in encoded block units. This enables checking for the inclusion of an error to be carried out in encoded block units.

Figure 83A:
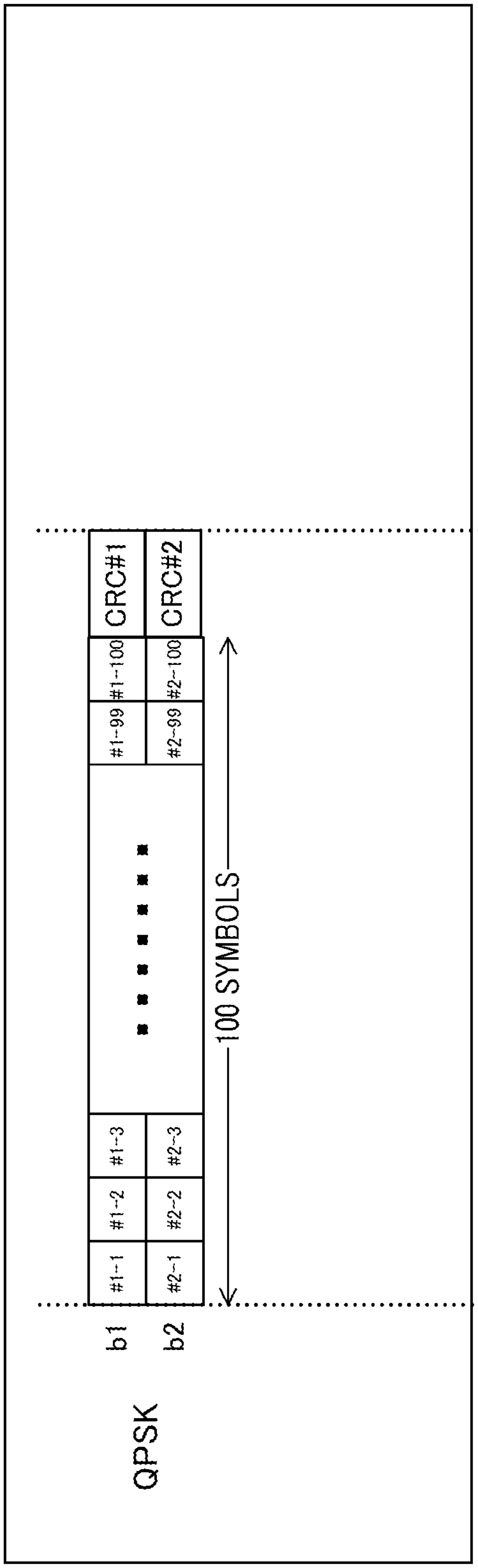
Figure 83B:
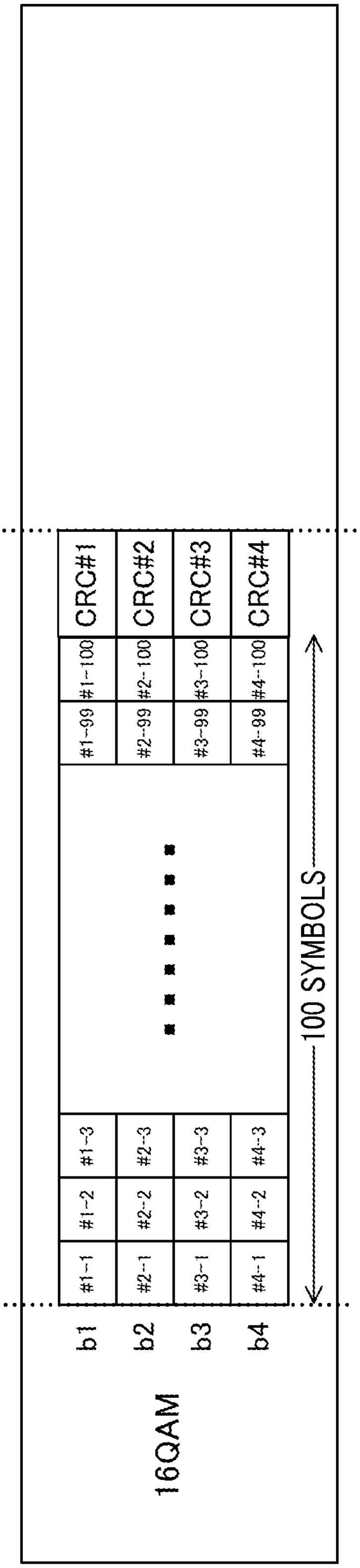
Figure 84A:
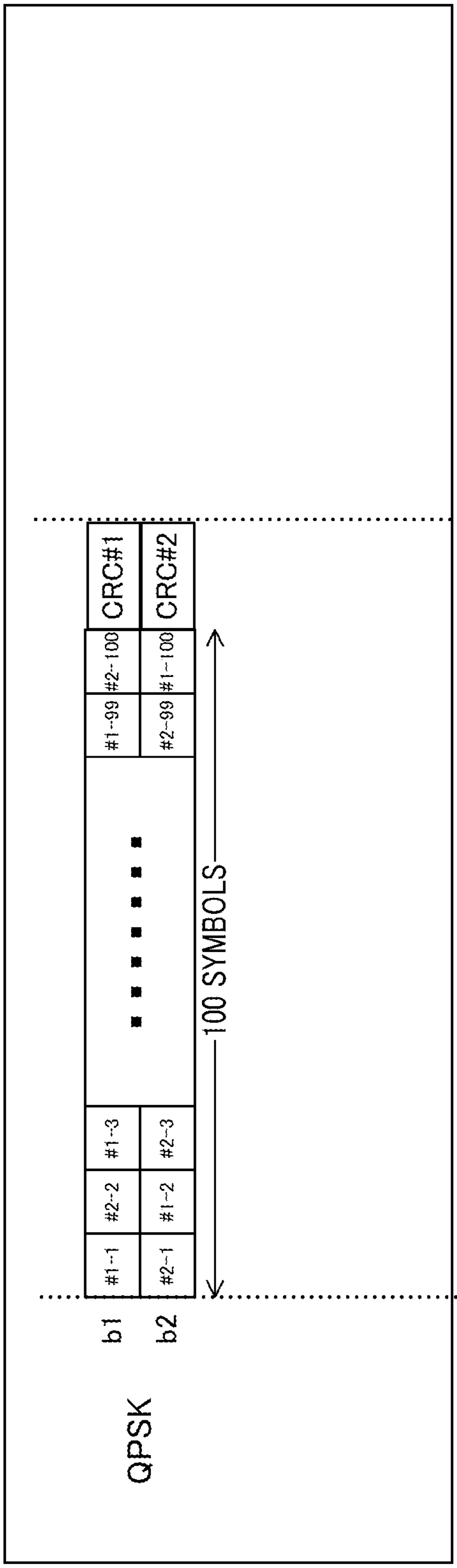
Figure 84B:
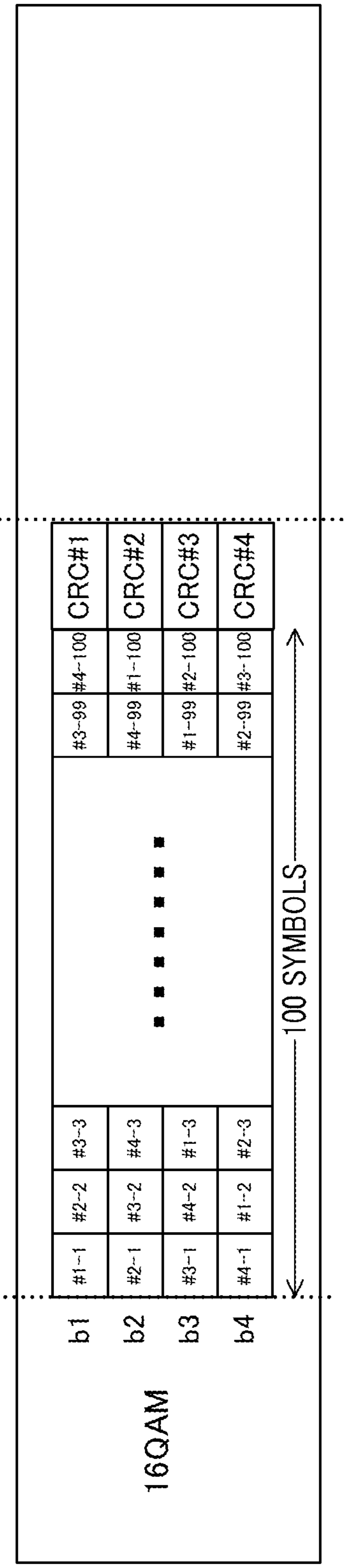

In FIG. 83 and FIG. 84, when the modulation method is QPSK (that is, in the case of FIG. 83A and FIG. 84A), CRC #1 is inserted for error checking of encoded block #1, and CRC #2 is inserted for error checking of encoded block #2. Similarly, when the modulation method is 16QAM (that is, in the case of FIG. 83B and FIG. 84B), CRC #1 is inserted for error checking of encoded block #1, CRC #2 is inserted for error checking of encoded block #2, CRC #3 is inserted for error checking of encoded block #3, and CRC #4 is inserted for error checking of encoded block #4. By this means it becomes possible to check for the presence of an error in encoded block units (that is, to check which block contains an error) with each modulation method.

Terminal #A then transmits retransmission data of only an encoded block in which an error is present, for example. For example, when the modulation method is QPSK, if terminal #B determines that there is an error only in encoded block #1, terminal #A transmits encoded block #1 retransmission data. Similarly, when the modulation method is 16QAM, if terminal #B determines that there are errors in encoded block #1 and encoded block #2, terminal #A transmits encoded block #1 and encoded block #2 retransmission data.

The modulation method used in retransmission may be the same as the modulation method used for transmitting data up to the previous time, or may be different. However, when transmitting retransmission data, also, use of a bit assignment method described in Embodiment 1, Embodiment 5, Embodiment 6, Embodiment 7, or Embodiment 10 is desirable for reasons relating to reception quality and encoder and decoder operating speeds.

By means of the above first ARQ method and second ARQ method, retransmission using a bit assignment method described in Embodiment 1, Embodiment 5, Embodiment 6, Embodiment 7, or Embodiment 10 can be implemented. At this time, CRC information can be reduced if the first ARQ method is used, and the amount of retransmission data can be reduced if the second ARQ method is used.

In this embodiment, two ARQ methods (chase combining and hybrid ARQ) have been described as examples, but this embodiment is not limited to these, and may be widely implemented including in cases in which another ARQ method is used. Also, in this embodiment, a case in which a CRC is inserted has been described as an example, but when an LDPC code is used and Belief Propagation decoding is performed, for example, a CRC need not necessarily be inserted in order to be able to determine the presence or absence of an error.

In this embodiment, single-carrier transmission has been described as an example, but this embodiment is not limited to this, and can also be implemented in a similar way when OFDM or suchlike multicarrier transmission is used. Also, a retransmission method of this embodiment can also be applied to transmission using MIMO scheme such as shown in Non-patent Document 10. That is to say, a retransmission method of this embodiment can be implemented irrespective of whether transmission using MIMO scheme is or is not performed. Furthermore, implementation is possible irrespective of whether the coding rate of encoded blocks are the same or different.

OTHER EMBODIMENTS

In above Embodiment 1, the use of one encoding section 11 was taken as a precondition in the description, but as a different embodiment, the above embodiment can also be similarly implemented when the system supports a code with coding rate R=½ and ⅔ and a block length of 980 bits, as long as implementation is performed separately for coding rate R=½ and ⅔. Furthermore, the same implementation as in the above embodiment can also be achieved when the system supports a code with coding rate R=½ and ⅔ and block lengths of 980 and 1960 bits, as long as implementation is performed separately in each case.

For example, in FIG. 5, FIG. 6, FIG. 7, FIG. 8, FIG. 31, FIG. 32, FIG. 36, FIG. 48, FIG. 49, FIG. 50, FIG. 51, FIG. 55, FIG. 62, FIG. 66, FIG. 71, FIG. 74, FIG. 79, FIG. 80, FIG. 83, and FIG. 84, encoded blocks #1, #2, #3, #4, #5, and #6 may each have a different coding rate. Also, 1st encoded data (#1), 2nd encoded data (#2), 3rd encoded data (#3), and 4th encoded data (#4) may each have a different coding rate. Furthermore, encoded data #1 coding rate R1, encoded data #2 coding rate R2, encoded data #3 coding rate R3, and encoded data #4 coding rate R4 may all be mutually different values, or provision may be made so that R1=R2 and R3=R4, and R1 and R4 are different values. Combinations of encoded data for which the coding rate is the same are not limited to the above. By setting coding rate in this way, a system can be constructed in which different items of data—such as speech data and packet data, video data and packet data, or video data and speech data, for example—can be simultaneously transmitted in parallel using an error correction code with desired error rate robustness (for example, using an coding rate 3/4 error correction code when transmitting speech data, and an coding rate 1/3 error correction code when transmitting packet data).

Also, in FIG. 5, FIG. 6, FIG. 7, FIG. 8, FIG. 31, FIG. 32, FIG. 36, FIG. 48, FIG. 49, FIG. 50, FIG. 51, FIG. 55, FIG. 62, FIG. 66, FIG. 71, FIG. 74, FIG. 79, FIG. 80, FIG. 83, and FIG. 84, if the number of transmit bits per symbol of a modulation method is denoted by n, and there are m items of data (that is, 1st encoded data (#1), 2nd encoded data (#2), m'th encoded data (#m) are present), provision may be made so that m>n (where m and n are both integers). By setting m>n, mutually different encoded data are transmitted in all bits configuring one symbol, and all m items of encoded data are transmitted using more symbols. Consequently, the probability of most encoded data being erroneous in a burst fashion due to a fading notch is low, and data reception quality is improved.

Therefore, in a transmitting apparatus in which switching is possible among a plurality of modulation methods, if the number of bits that can be transmitted in one symbol by the modulation method having the maximum number of modulation multi-values (the maximum number of signal points) is denoted by n max (where n max is an integer), when the transmitting apparatus generates $n_{max}$ or more items of data (that is, 1st encoded data (#1), 2nd encoded data (#2), . . . , $n_{max}$'th encoded data (#m) are present), different encoded data can be transmitted in all bits configuring one symbol in all modulation methods for which switching is possible. Consequently, in all modulation methods for which switching by the transmitting apparatus is possible, the probability of most encoded data being erroneous in a burst fashion due to a fading notch is low, and therefore data reception quality is improved.

In above Embodiments 2 to 4, a case has been described of a MIMO system using spatial multiplexing in which a multi-antenna transmitting apparatus and multi-antenna receiving apparatus each have two antennas, but this is not a limitation, and similar implementation is also possible for a case in which the number of antennas is increased and the number of modulated signals transmitted is increased. Furthermore, the same effect can also be obtained when the present disclosure is applied to a system using a spread spectrum communication method.

A multi-antenna transmitting apparatus of the present disclosure is not limited to the configuration shown in Embodiment 2, and can also be applied, for example, to a MIMO system using an eigenmode. An eigenmode communication method will now be described using FIG. 59.

In a system using MIMO scheme, when Channel State Information (CSI) is known not only on the receiving station side but also on the transmitting station side, a communication method can be implemented whereby the transmitting station transmits a signal vectored using a transmission channel signature vector to the receiving station by means of a transmitting array antenna, and the receiving station detects and demodulates the transmit signal using a reception channel signature vector associated with the transmission channel signature vector from a receiving array antenna received signal.

In particular, as a communication mode in which multiplex transmission of signals configuring a plurality of channels is performed in the communication space, there is an eigenmode that uses a channel matrix singular vector or eigenvector. This eigenmode is a method that uses this singular vector or eigenvector as an aforementioned channel signature vector. Here, a channel matrix is a matrix that has complex channel coefficients of a combination of each antenna element of the transmitting array antenna and all or some of the antenna elements of the receiving array antenna as elements.

As a method whereby the transmitting station obtains downlink channel state information, with TDD using carriers of the same frequency in a radio channel uplink and downlink, it is possible to perform estimating or measuring of channel state information in the transmitting station using the uplink from the receiving station by means of channel reciprocity. On the other hand, with FDD using carriers of different frequencies in the uplink and downlink, accurate downlink CSI can be obtained by the transmitting apparatus by estimating or measuring downlink channel state information in the receiving station and reporting the result to the transmitting station.

A characteristic of an eigenmode is that, particularly when a MIMO system radio channel can be handled as a narrowband flat fading process, MIMO system channel capacity can be maximized. For example, in a radio communication system that uses OFDM, it is usual for design to be carried out so that guard intervals are inserted to eliminate intersymbol interference due to multipath delayed waves, and OFDM subcarriers are flat fading processes. Therefore, when an OFDM signal is transmitted in a MIMO system, using an eigenmode makes it possible, for example, for a plurality of signals to be transmitted spatially multiplexed in each subcarrier.

As communication methods using a MIMO scheme, a number of methods have been proposed whereby, as opposed to an eigenmode in which downlink channel state information is assumed to be known in the transmitting station and receiving station, channel state information for a radio channel is known only in the receiving station. BLAST, for example, is known as a method whereby signals are transmitted spatially multiplexed for the same purpose as in an eigenmode. Also, transmission diversity using a space time code, for example, is known as a method of obtaining an antenna space diversity effect without being intended to sacrifice of the degree of signal multiplexing that is, to increase capacity. Whereas an eigenmode is a beam space mode in which a signal is transmitted vectored from a transmitting array antenna—in other words, a signal is transmitted after being mapped in beam space— BLAST and space diversity can be considered to be antenna element modes due to the fact that a signal is mapped onto an antenna element.

Figure 59:
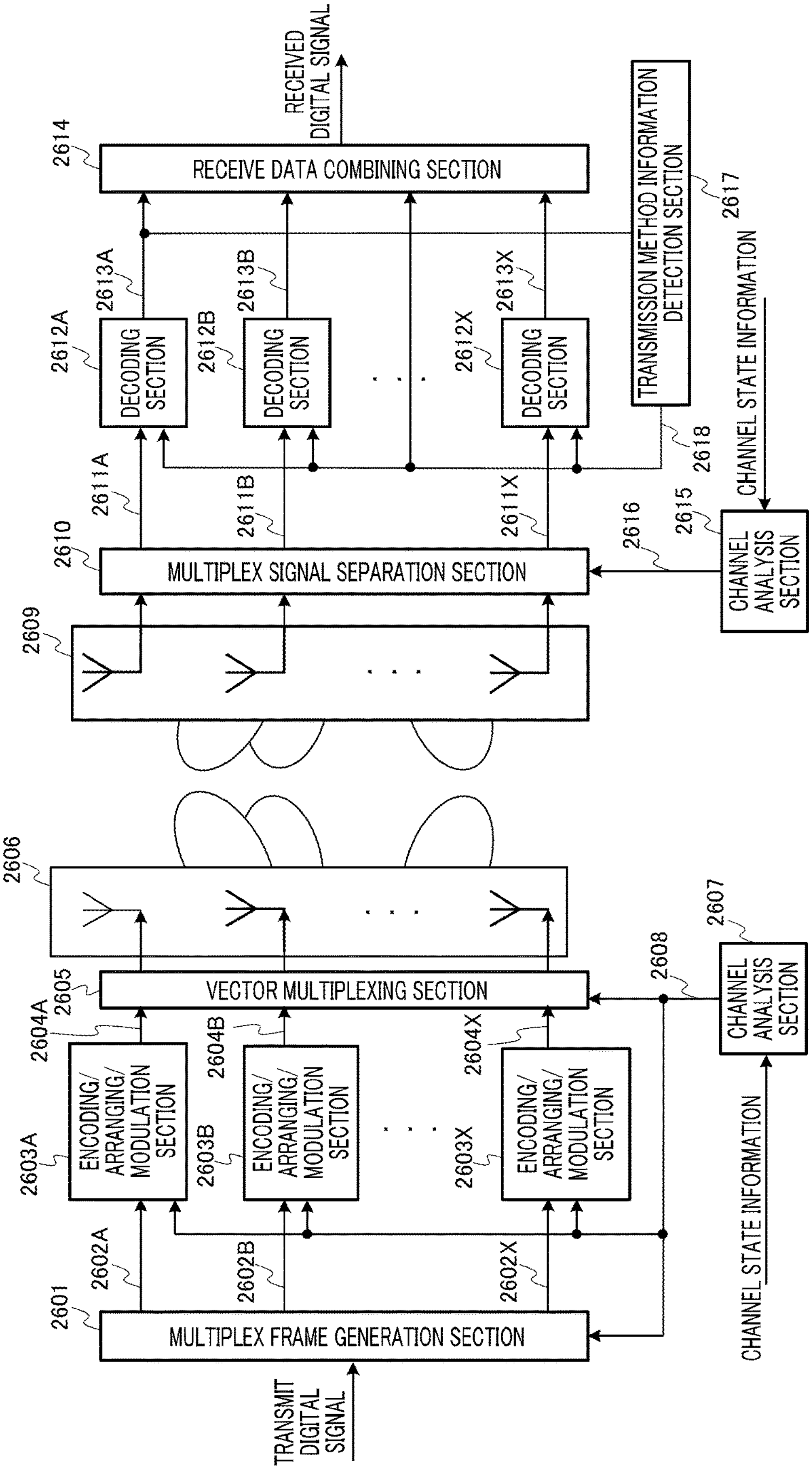
FIG. 59 is a block diagram showing configuration examples when the present disclosure is applied to a system that uses an eigenmode.

FIG. 59 shows examples of the configurations of an eigenmode communication transmitter and receiver. Based on channel state information that is the result of estimation of the propagation channel between the transmitting station and receiving station, transmission channel analysis section 2607 calculates a plurality of transmission channel signature vectors for configuring a multiplex channel, and basing a channel matrix formed by means of the channel state information on SVD (Singular Value Decomposition), finds eigenvalues (for example, λA, λB, λC, . . . , λX), and eigen paths (for example, path A, path B, path C, . . . , path X), and outputs these as control information 2608.

In the transmitting station, multiplex frame generation section 2601 has a transmit digital signal and control information 2608 as input, generates a plurality of transmit frames for mapping onto multiplex channels, and outputs channel A transmit digital signal 2602A, channel B transmit digital signal 2602B, . . . , channel X transmit digital signal 2602X.

Encoding/arranging/modulation section 2603A has channel A transmit digital signal 2602A and control information 2608 as input, determines the coding rate and modulation method based on control information 2608, and outputs channel A baseband signal 2604A. The same operations are also performed for channel B to channel X, and channel B baseband signal 2604B to channel X baseband signal 2604X are obtained. To simplify the drawing, the encoding/arranging/modulation sections are shown as one block in FIG. 59, but in actuality, a configuration such as that in above Embodiments 1 to 3 is used, and block encoded data is arranged so that encoded data within one block is assigned to a plurality of data symbols by a arranging section, and supplied to a modulation section.

Vector multiplexing section 2605 has channel A to channel X baseband signals 2604A to 2604X and control information 2608 as input, multiplies channel A to channel X baseband signals 2604A to 2604X individually by a channel signature vector and performs combining, and then performs transmission to the receiving apparatus from transmitting array antenna 2606.

In the receiving station, reception channel analysis section 2615 calculates in advance a plurality of reception channel signature vectors for separating multiplexed transmit signals based on channel state information that is the result of estimation of the propagation channel between the transmitting station and receiving station. Multiplex signal separation section 2610 has received signals received by receiving array antenna 2609 as input, and generates a plurality of received signals obtained by multiplying the channel signature vectors together—that is, channel A received signal 2611A to channel X received signal 2611X.

Decoding section 2612A has channel A received signal 2611A and transmission method information 2618 as input, performs decoding based on transmission method information 2618 (modulation method and coding rate information), and outputs channel A digital signal 2613A. The same operations are also performed for channel B to channel X, and channel B digital signal 2613B to channel X digital signal 2613X are obtained.

Transmission method information detection section 2617 has channel A digital signal 2613A as input, extracts information on the transmitting method—for example, the modulation method and coding rate—of each channel, and outputs transmission method information 2618.

Receive data combining section 2614 has channel A to channel X digital signals 2613A to 2613X and transmission method information 2618 as input, and generates a received digital signal.

In the above embodiment, the configuration in FIG. 33 has been taken as an example of the configuration of a transmitting apparatus for implementing a transmitting method of the present disclosure, but the configuration of a transmitting apparatus for implementing a transmitting method of the present disclosure is not limited to the example in FIG. 33.

Figure 85:
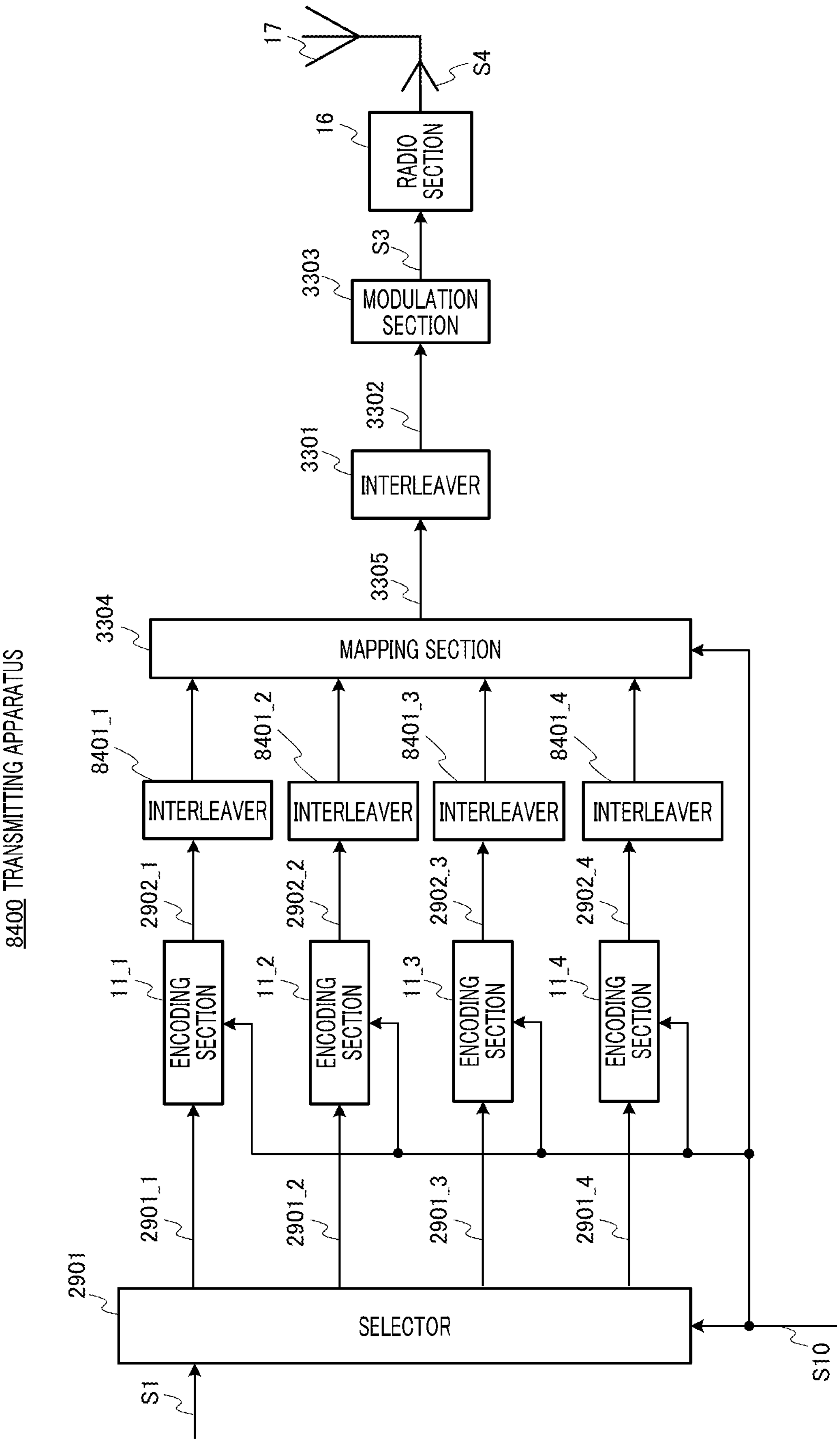
FIG. 85 is a block diagram showing an example of the configuration of a transmitting apparatus of another embodiment.

For example, interleavers 8401_1 to 8401_4 may be provided in a stage subsequent to encoding sections 11_1 to 11_4 as shown in FIG. 85, with encoded data 2902_1 to 2902_4 being bit-interleaved by interleavers 8401_1 to

8401_4 before being input to mapping section 3304. Alternatively, plurality of encoded data 2902_1 to 2902_4 may be interleaved by one interleaver and output to mapping section 3304. Here, too, as stated in Embodiment 8 and Embodiment 9, making the interleave patterns (interleaving methods) different in each of interleavers 8401_1 to 8401_4 enables data reception quality to be improved when the receiving apparatus performs iterative detection.

Figure 86:
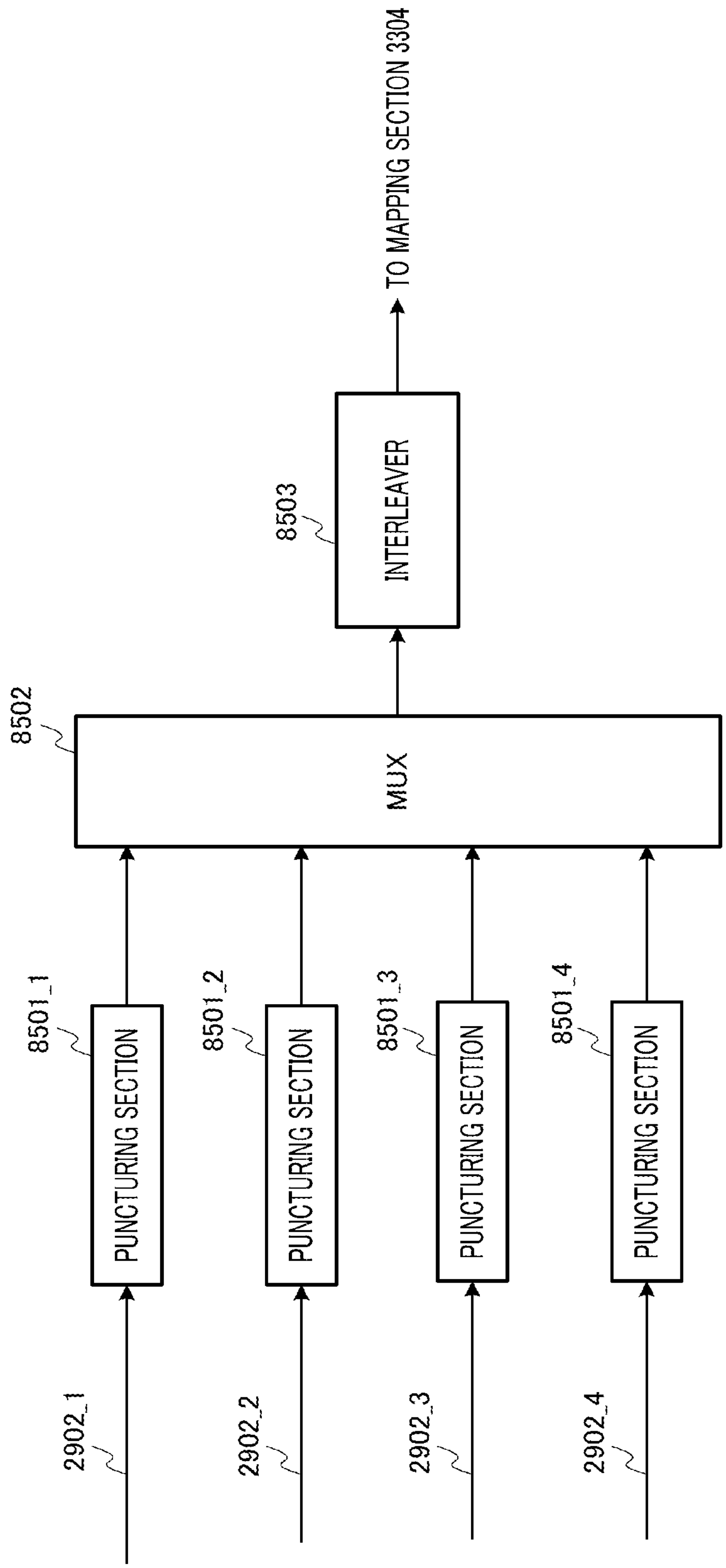
FIG. 86 is a block diagram showing an example of the configuration of a transmitting apparatus of another embodiment.

Also, as shown in simplified form in FIG. 86, for example, puncturing sections 8501_1 to 8501_4, multiplexer (MUX) 8502, and interleaver 8503 may be provided between encoding sections 11_1 to 11_4 and mapping section 3304, with encoded data 2902_1 to 2902_4 being bit-interleaved by interleavers 8401_1 to 8401_4, multiplexed by multiplexer (MUX) 8502, and bit-interleaved by interleaver 8503 before being input to mapping section 3304.

Thus, a transmitting method of the present disclosure can be implemented irrespective of the presence or absence, or location, of interleavers and puncturing sections.

Figure 87:
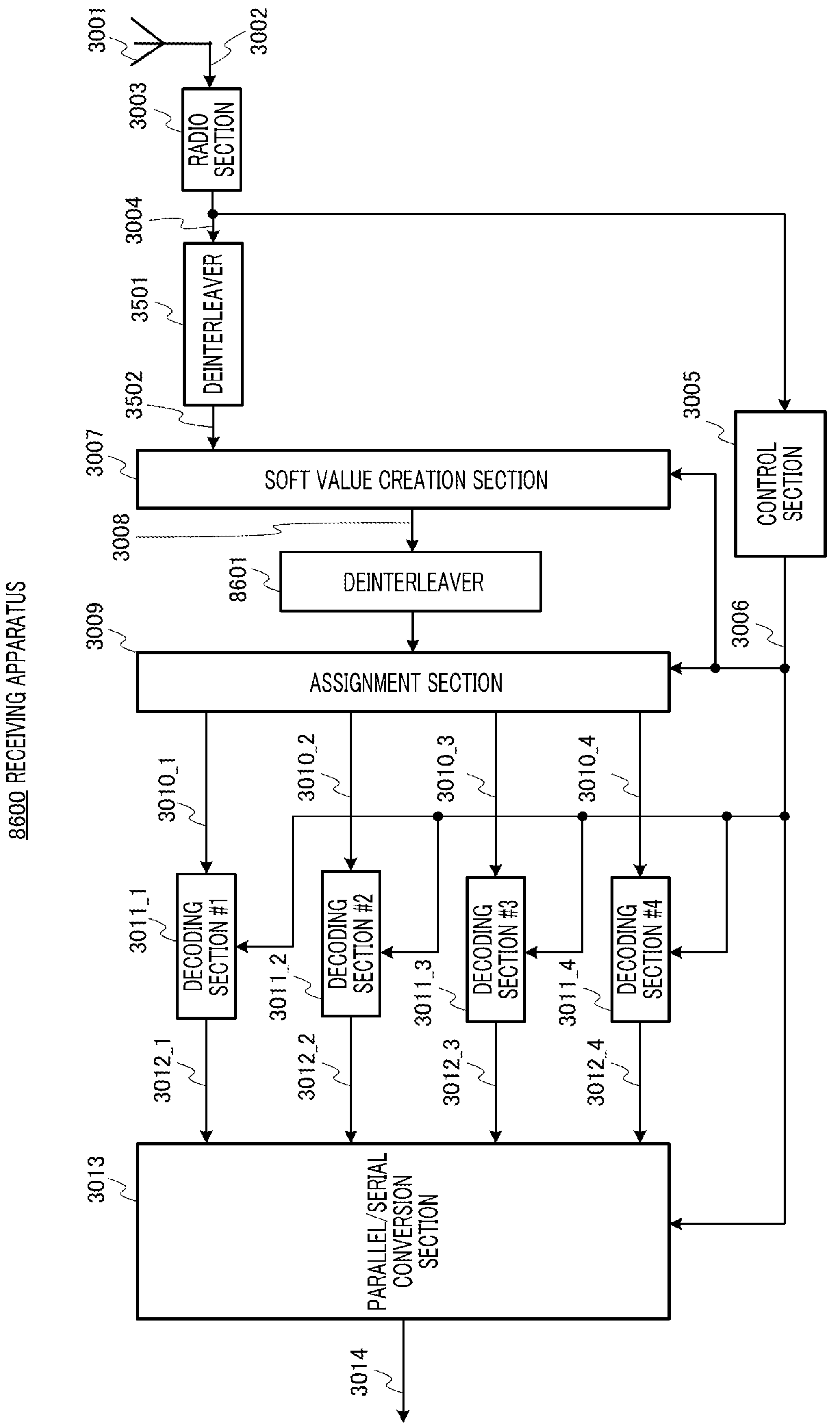
FIG. 87 is a block diagram showing an example of the configuration of a receiving apparatus of another embodiment.

FIG. 87 shows an example of the configuration of a receiving apparatus when the transmitting apparatus is as shown in FIG. 85 or FIG. 86. Parts in FIG. 87 corresponding to those in FIG. 35 are assigned the same reference codes as in FIG. 35. Receiving apparatus 8600 has the same configuration as receiving apparatus 3500 in FIG. 35, except for the provision of deinterleaver 8601 between soft value creation section 3007 and assignment section 3009.

The disclosures of Japanese Patent Application No. 2006-299533, filed on Nov. 2, 2006, Japanese Patent Application No. 2007-173156, filed on Jun. 29, 2007, and Japanese Patent Application No. 2007-284582, filed on Oct. 31, 2007, including the specifications, drawings and abstracts, are incorporated herein by reference in their entirety.

INDUSTRIAL APPLICABILITY

The present disclosure enables error rate performance degradation due to fading or the like to be suppressed by means of a simple configuration, and can be widely applied to communication devices for which high-quality data transmission is required with a low computational complexity, for example.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit comprising:

generation circuitry, which, in operation, controls generating two codeword signals by encoding data, and generates a first mapping signal and a second mapping signal by mapping each of the two codeword signals on at least one of an in-phase/quadrature phase (I-Q) plane corresponding to a quadrature phase-shift keying (QPSK) scheme and an I-Q plane corresponding to a 16 quadrature amplitude modulation (16QAM) scheme, arranges the second mapping signal by using an equation having an angle that is not equal to zero and combines the first mapping signal and the phase-rotated second mapping signal arranged using the equation to generate a combined signal; and transmission circuitry, which is coupled to the generation circuitry and which, in operation, controls transmitting the combined signal from at least an antenna, wherein a first codeword of the two codeword includes a first cyclic redundancy check (CRC) bits relating to the first codeword, and a second codeword of the two codeword includes a second cyclic redundancy check (CRC) bits relating to the second codeword, and the combined signal transmitted from the antenna includes at least one data of the first codeword and one data of the second codeword on each symbol.

2. The circuit according to claim 1, wherein the combined signal is transmitted from two or more antennas.

3. The circuit according to claim 1, wherein each of the first codeword and the second codeword is coded by a Low Density Parity Check (LDPC) code.

4. The circuit according to claim 1, wherein each size of the first codeword and the second codeword is variable.

5. The circuit according to claim 1, wherein the first mapping signal and the second mapping signal are generated by mapping each of the two codeword signals on the I-Q plane corresponding to the QPSK scheme.

6. The circuit according to claim 1, wherein the first mapping signal and the second mapping signal are generated by mapping each of the two codeword signals on the I-Q plane corresponding to the 16QAM scheme.

7. The circuit according to claim 1, wherein the first mapping signal is generated by mapping one of the two codeword signals on the I-Q plane corresponding to the QPSK scheme and the second mapping signal is generated by mapping the other one of the two codeword signals on the I-Q plane corresponding to the 16QAM scheme.

8. The circuit according to claim 1, wherein the angle included in the equation that is used to arrange the second mapping signal in a case (1) where the second mapping signal is generated based on the QPSK scheme is same as that in a case (2) where the second mapping signal is generated based on the 16QAM scheme.

9. A wireless communication apparatus comprising:

circuitry, which, in operation, generates two codeword signals by encoding data, and generates a first mapping signal and a second mapping signal by mapping each of the two codeword signals on at least one of an in-phase/quadrature phase (I-Q) plane corresponding to a quadrature phase-shift keying (QPSK) scheme and an I-Q plane corresponding to a 16 quadrature amplitude modulation (16QAM) scheme, arranges the second mapping signal by using an equation having an angle that is not equal to zero and combines the first mapping signal and the phase-rotated second mapping signal arranged using the equation to generate a combined signal; and a transmitter, which is coupled to the circuitry and which, in operation, transmits the combined signal from at least an antenna, wherein a first codeword of the two codeword includes a first cyclic redundancy check (CRC) bits relating to the first codeword, and a second codeword of the two codeword includes a second cyclic redundancy check (CRC) bits relating to the second codeword, and the combined signal transmitted from the antenna includes at least one data of the first codeword and one data of the second codeword on each symbol.

10. The wireless communication apparatus according to claim 9, wherein the combined signal is transmitted from two or more antennas.

11. The wireless communication apparatus according to claim 9, wherein each of the first codeword and the second codeword is coded by a Low Density Parity Check (LDPC) code.

12. The wireless communication apparatus according to claim 9, wherein each size of the first codeword and the second codeword is variable.

13. A communication method comprising:

generating two codeword signals by encoding data;

generating a first mapping signal and a second mapping signal by mapping each of the two codeword signals on at least one of an in-phase quadrature phase (I-Q) plane corresponding to a quadrature phase-shift keying (QPSK) scheme and an I-Q plane corresponding to a 16 quadrature amplitude modulation (16QAM) scheme;

arranging the second mapping signal by using an equation having an angle that is not equal to zero;

combining the first mapping signal and the second mapping signal arranged using the equation to generate a combined signal; and transmitting the combined signal from at least an antenna, wherein a first codeword of the two codeword includes a first cyclic redundancy check (CRC) bits relating to the first codeword, and a second codeword of the two codeword includes a second cyclic redundancy check (CRC) bits relating to the second codeword, and the combined signal transmitted from the antenna includes at least one data of the first codeword and one data of the second codeword on each symbol.

14. The communication method according to claim 13, wherein the combined signal is transmitted from two or more antennas.

15. The communication method according to claim 13, wherein each of the first codeword and the second codeword is coded by a Low Density Parity Check (LDPC) code.

16. The communication method according to claim 13, wherein each size of the first codeword and the second codeword is variable.

* * * * *